US010650108B2

(12) United States Patent
Chen

(10) Patent No.: US 10,650,108 B2
(45) **Date of Patent: *May 12, 2020**

(54) PDC BITS WITH MIXED CUTTER BLADES

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/185,138

(22) Filed: Nov. 9, 2018

(65) Prior Publication Data

US 2019/0080034 A1 Mar. 14, 2019

Related U.S. Application Data

(60) Continuation of application No. 14/807,396, filed on Jul. 23, 2015, now Pat. No. 10,162,911, which is a (Continued)

(51) Int. Cl.
*G06G 7/48* (2006.01)
*G06F 17/50* (2006.01)
(Continued)

(52) U.S. Cl.
CPC .......... *G06F 17/5009* (2013.01); *E21B 10/42* (2013.01); *E21B 10/43* (2013.01); (Continued)

(58) Field of Classification Search
None
See application file for complete search history.

(56) References Cited

U.S. PATENT DOCUMENTS 4,889,017 A 12/1989 Fuller et al.
4,981,184 A 1/1991 Knowlton et al.
(Continued)

FOREIGN PATENT DOCUMENTS

| | | | |
|---|---|---|---|
| GB | 2478496 | 9/2011 | |
| GB | 2478496 A * | 9/2011 | ............. E21B 10/43 |
| WO | 09/067263 | 6/2010 | ............... G06G 7/48 |

OTHER PUBLICATIONS

ReedHycalog, “Transformation Bits: Sharp Solution”, 2004, ReedHycalog. (Year: 2004).*
(Continued)

*Primary Examiner* — Cedric Johnson
(74) *Attorney, Agent, or Firm* — Baker Botts L.L.P.

(57) ABSTRACT

Downhole drilling tools designed and manufactured to minimize or reduce imbalance forces and wear by disposing cutting elements in cutter groups and cutter sets in a level of force balance and by placing impact and/or wear resistant cutters on blades subject to high impact forces and/or large loadings. Manufacturing costs may be reduced by placing inexpensive cutters on blades not subject to high impact forces and/or loadings. Some embodiments comprise designing downhole tools with combinations of thicker blades to receive high impact forces and/or loadings with thinner blades. Some embodiments comprise designing downhole drilling tools with optimized fluid-flow properties. Designing methods may comprise performing simulations on a designed tool, evaluating respective forces acting on cutters during simulated engagement with a downhole (uniform and transitional) and/or evaluating wear on cutters and bit, and/or CFD simulations to evaluate fluid-flow optimization on a tool. Various cutter layout procedures and algorithms are described.

20 Claims, 59 Drawing Sheets

Related U.S. Application Data division of application No. 12/969,122, filed on Dec. 15, 2010, now Pat. No. 9,115,552.

(51) Int. Cl.

| | |
|---|---|
| ***E21B 10/55*** | (2006.01) |
| ***E21B 10/43*** | (2006.01) |
| ***E21B 10/42*** | (2006.01) |
| ***E21B 10/54*** | (2006.01) |

(52) U.S. Cl.

CPC .............. *E21B 10/54* (2013.01); *E21B 10/55* (2013.01); *G06F 17/5086* (2013.01)

(56) References Cited

U.S. PATENT DOCUMENTS

| | | | | | |
|---|---|---|---|---|---|
| 5,595,252 | A | 1/1997 | O'Hanlon | | |
| 5,787,022 | A | 7/1998 | Tibbitts et al. | | |
| 6,003,623 | A | 12/1999 | Miess | | |
| 6,302,224 | B1 | 10/2001 | Sherwood, Jr. | | |
| 6,435,058 | B1 | 8/2002 | Matthias et al. | | |
| 6,481,511 | B2 | 11/2002 | Matthias et al. | | |
| 6,785,641 | B1 | 8/2004 | Huang | | |
| 6,845,828 | B2 | 1/2005 | Boyce | | |
| 7,083,010 | B2 | 8/2006 | Eppink et al. | | |
| 7,251,590 | B2 | 7/2007 | Huang et al. | | |
| 7,455,125 | B2 | 11/2008 | Sinor et al. | | |
| 7,621,348 | B2 | 11/2009 | Hoffmaster et al. | | |
| 7,729,895 | B2 | 7/2010 | Chen | | |
| 7,778,777 | B2 | 8/2010 | Chen | | |
| 2002/0157869 | A1* | 10/2002 | Glass | E21B 10/16 | 175/40 |
| 2007/0029113 | A1* | 2/2007 | Chen | E21B 7/04 | 175/45 |
| 2009/0030658 | A1* | 1/2009 | Durairajan | E21B 10/42 | 703/1 |
| 2010/0211362 | A1* | 8/2010 | Huang | E21B 10/00 | 703/1 |
| 2010/0312370 | A1* | 12/2010 | Lind | E21B 41/00 | 700/98 |
| 2012/0152624 | A1* | 6/2012 | Chen | E21B 10/43 | 175/428 |

OTHER PUBLICATIONS

Brett J.F, Warren T.M. and Behr S.M., "Bit Whirl: A new Theory of PDC bit Failure", SPE 19571, Oct. 1989.

Clayton et al., "Development of a Whirl—Resistant PDC Bit", *SPE* 26594, (1994) 625-637, 1994.

Weaver G.E., Clayton R., "A New PDC Cutting Structure Improves Bit Stabilization and Extends Application into Harder Rock Types", SPE/IADC 25734, 1993.

Besson A., et al., "On the Cutting Edge", Oilfield Review, Autumn, 2000, p. 36-57, 2000.

TransFormation Bits, ReedHycalog, 2004.

Glowka D.A., "Use of Single-Cutter Data in the Analysis of PDC Bit Designs: Part 1—Development of a PDC Cutting Force Model," *SPE Journal of Petroleum Technology*, 41 (1989) pp. 797-849, 1989.

Behr S.M., Warren T.M., Sinor L.A., Brett, J.F, ., "3D PDC Bit Model Predicts Higher Cutter Loads", SPE Drilling & Completion, No. 4, vol. 8, Mar. 1993.

Clayton R., Chen S. and Lefort G., "New Bit Design, Cutter Technology Extend PDC Applications to Hard Rock Drilling", SPE/IADC 91840, Feb. 2005.

Chen S., Arfele R., Glass K., "Modeling of the Effects of Cutting Structure, Impact Arrestor, and Gage Geometry on PDC Bit Steerability", paper AADE-07-NTCE-10 presented at 2007 AADE Technical Conference held in Houston, TX, Apr. 10-12, 2007.

Chen S., Collins G.J., Thomas M.B., "Reexamination of PDC Bit Walk in Directional and Horizontal Wells", IADC/SPE 112641, Mar. 2008.

ReedHycalog, "Transformation Bits: Sharp Solution", 2004, ReedHycalog, 2004.

* cited by examiner

*FIG. 22A*
*(PRIOR ART)*
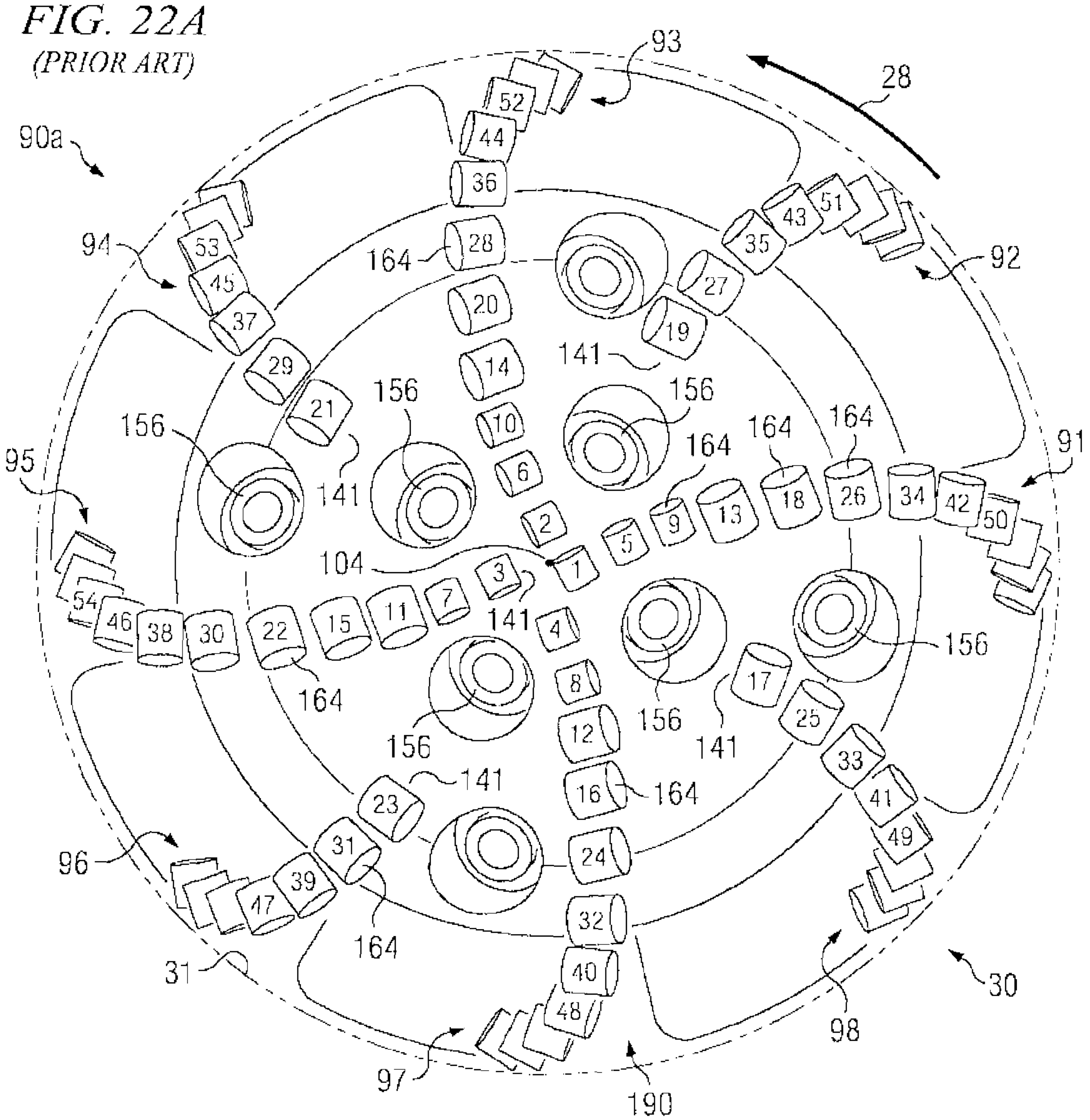
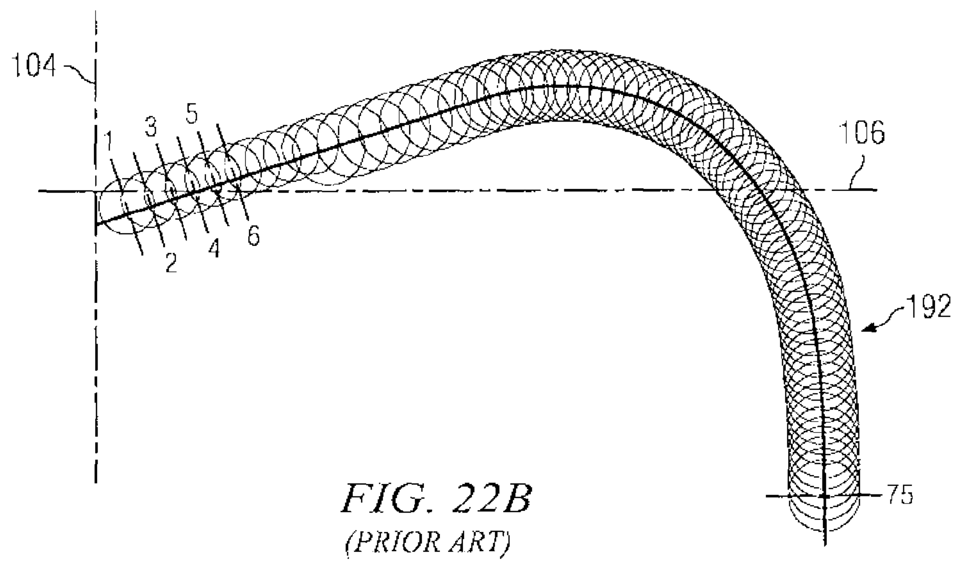
*FIG. 22B*
*(PRIOR ART)*

TO FIG. 24J-2

EXAMPLE MATCH OF MAJOR BLADES, ALGORITHMS AND CUTTER SETS

| N. BLD | MAJOR BLADES | ALGORITHM | BLADE GROUPS | CUTTER SET | PREFERRED MATCH |
|---|---|---|---|---|---|
| 4 | 1,3 | TWO GROUP | (1,3), (2,4) | [(1,3), (2,4)] | YES |
| 5 | 1,3,5 | TWO GROUP | (1,3,5), (2,4) | [(1,3,5), (2,4)] | YES |
| | 1,3,4 | TWO GROUP | (1,3,4), (2,5) | [(1,3,4), (2,5)] | |
| 6 | 1,3,5 | TWO GROUP | (1,3,5), (2,4,6) | [(1,3,5), (2,4,6)] | YES |
| | 1,4 | PAIR GROUP | (1,4), (2,5), (3,6) | [(1,4), (3,6), (2,5)] | YES |
| 7 | 1,3,5,7 | TWO GROUP | (1,3,5,7), (2,4,6) | [(1,3,5,7), (2,4,6)] | YES |
| | 1,3,5 | TWO GROUP | (1,3,5), (2,4,6,7) | [(1,3,5), (2,4,6,7)] | YES |
| | 1,4,6 | TWO GROUP | (1,4,6), (2,5,3,7) | [(1,4,6), (2,5,3,7)] | |
| | 1,4,6 | THREE GROUP | (1,4,6), (2,5), (3,7) | [(1,4,6), (2,5), (3,7)] | |
| 8 | 1,3,5,7 | TWO GROUP | (1,3,5,7), (2,4,6,8) | [(1,3,5,7), (2,4,6,8)] | |
| | 1,3,5,7 | PAIR GROUP | (1,5), (2,6), (3,7), (4,8) | [(1,5), (3,7), (2,6), (4,8)] | YES |
| | 1,4,7 | THREE GROUP | (1,4,7), (2,6), (3,5,8) | [(1,4,7), (3,5,8), (2,6)] | |
| 9 | 1,4,7 | THREE GROUP | (1,4,7), (2,5,8), (3,6,9) | [(1,4,7), (2,5,8), (3,6,9)] | YES |
| | 1,4,7 | FOUR GROUP | (1,4,7), (2,6), (3,8), (5,9) | [(1,4,7), (3,8), (5,9), (2,6)] | |
| 10 | 1,4,6,9 | PAIR GROUP | (1,6), (2,7), (3, 8), (4,9), (5,10) | [(1, 6), (4,9), (2,7), (5,10), (3,8)] | YES |
| | 1,4,6,9 | THREE GROUP | (1,4,6,9), (2, 5, 8), (3,7,10) | [(1,4,6,9), (3,7,10), (2, 5, 8)] | |
| | 1,4,7 | FOUR GROUP | (1,4,7),(2,6,9), (3, 8), (5,10) | [(1,4,7), (3, 8), (5,10), (2,6,9)] | |
| 11 | 1,3,7,9 | THREE GROUP | (1,3,7,9), (2,5,8,11), (4,6,10) | [(1,3,7,9), (2,5,8,11), (4,6,10)] | YES |
| | 1,5,9 | FOUR GROUP | (1,5,9), (2,8), (3,6,10), (4,7,11) | [(1,5,9), (3,6,10), (4,7,11), (2,8)] | |
| | 1,4,7,10 | FIVE GROUP | (1,7), (2,5,9), (3,8), (4,10), (6,11) | [(1,7), (4,10), (6,11), (3,8), (2,5,9)] | |

EXAMPLE MATCH OF MAJOR BLADES, ALGORITHMS AND CUTTER SETS

| N. BLD | MAJOR BLADES | ALGORITHM | BLADE GROUPS | CUTTER SET | PREFERRED MATCH |
|---|---|---|---|---|---|
| 12 | 1,4,7,10 | PAIR GROUP | (1,7), (2,8), (3,9), (4,10), (5,11), (6,12) | [(1,7), (4,10), (2,8), 5,11), (3,9), (6,12 )] | YES |
| | 1,4,7,10 | THREE GROUP | (1,4,7,10), (2,5,8,11), (3,6,9,12) | [(1,4,7,10), (2,5,8,11), (3,6,9,12)] | |
| | 1,5,9 | FOUR GROUP | (1,5,9), (2, 6,10), (3,7,11), (4,8,12), | [(1,5,9), (2, 6,10), (3,7,11), (4,8,12)] | YES |
| | 1,4,7,10 | FIVE GROUP | (1,7), (4,10), (6,12), (2,5,9), (3,8,11) | [(1,7), (4,10), (6,12), (3,8,11), (2,5,9)] | |
| 13 | 1,5,8,11 | FOUR GROUP | (1, 5, 8,11), (2,6,10), (3,7,12), (4, 9,13 ) | [(1, 5, 8,11), (4, 9,13 ), (3,7,12), (2,6,10)] | |
| | 1,5,10 | FIVE GROUP | [(1,5,10), (3,9), (6,12), (4,8,13), (2,7,11)] | [(1,5,10), (3,9), (4,8,13), (6,12), (2,7,11)] | YES |
| | 1,5,9 | SIX GROUP | (1,5,9), (2,8), (3,10), (4,11), (6,12) , (7,13) | [ (1,5,9), (3,10), (4,11), (6,12) , (7,13), (2,8) ] | |
| 14 | 1,5,8,12 | PAIR GROUP | (1, 8), (2,9), (3,10), (4.,11), (5,12), (6,13), (7,14) | [(1,8), (5,12), (3,10), (6,13), (2,9), (7,14), (4.,11)] | YES |
| | 1,5,8,12 | FOUR GROUP | (1,5,8,12), (2,6,9,13), (3,7,11), (4,10,14) | [(1,5,8,12), (3,7,11), (4,10,14), (2,6,9,13)] | |
| | 1,5,10 | FIVE GROUP | (1,5,10), (2,9), (3,7,12), (4,8,13),(6,11,14) | [(1,5,10), (3,7,12), (4,8,13),(6,11,14), (2,9)] | |
| | 1,5,10 | SIX GROUP | (1,5,10), (2,9), (3,8,12), (4,11), (6,13), (7,14) | [(1,5,10), (4,11), (3,8,12), (6,13), (7,14) , (2,9)] | YES |
| 15 | 1,5,9,13 | FOUR GROUP | (1, 5, 9, 13), (2, 6,11), (3,7,10,14), (4, 8,12,15) | [(1, 5, 9, 13), (3,7,10,14), (4, 8,12,15), (2, 6,11)] | |
| | 1,6,11 | FIVE GROUP | (1,6,11), (2,7,12), (3,8,13), (4,9,14), (5,10,15) | [(1,6,11), (2,7,12), (3,8,13), (4,9,14), (5,10,15)] | YES |
| | 1,6,11 | SIX GROUP | (1,6,11), (2,9), (4,12), (3,8,13), (5,10,15), (7,14) | [(1,6,11), (2,9), (4,12), (3,8,13), (5,10,15), (7,14)] | |
| | 3,8,13 | SEVEN GROUP | (1,9), (2,10), (3,8,13), (4,11), (5,12), (6,14), (7,15) | [(3,8,13), (7,15), (5,12), (6,14), (4,11), (1,9), (2,10)] | |

PREFERRED MATCH OF MAJOR BLADES, ALGORITHMS AND FOUR-LEVEL FORCE BALANCED CUTTER SETS

| N. BLD | MAJOR BLADES | ALGORITHM | LEVEL FOUR FORCED BALANCED CUTTER SET | CONSECUTIVE CUTTERS IN A CUTTER SET WITH MINIMIZED IMBALANCE FORCE |
|---|---|---|---|---|
| 5 | 1,3,5 | TWO GROUP | [(1,3,5), (2,4)] | 1,2,3; 2,3,4; 3,4,5; |
| 6 | 1,4 | PAIR GROUP | [(1,4),(3,6), (2,5)] | 1,2,3,4; 2,3,4,5; 3,4,5,6; |
| 7 | 1,3,5,7 (OR 1,3,5) | TWO GROUP | [(1,3,5,7), (2,4,6)] | 1,2,3,4; 2,3,4,5; 3,4,5,6; 4,5,6,7; |
| 8 | 1,3,5,7 | PAIR GROUP | [(1,5), (3,7), (2,6), (4,8)] | 1,2,3,4; 2,3,4,5; 3,4,5,6; 4,5,6,7; |
| 9 | 1,4,7 | THREE GROUP | [(1,4,7), (2,5,8), (3,6,9,)] | 1,2,3; 2,3,4; 3,4,5; 4,5,6; 5,6,7; 6,7,8; 7,8,9; |
| 10 | 1,4,6,9 | PAIR GROUP | [(1, 6), (4,9), (2,7), (5,10), (3,8)] | 1,2,3,4; 2,3,4,5; 3,4,5,6; 4,5,6,7; 5,6,7,8; 6,7,8,9; 7,8,9,10; |
| 11 | 1,3,7,9 | THREE GROUP | [(1,3,7,9), (2,5,8,11), (4,6,10)] | 1,2,3,4; 2,3,4,5; 3,4,5,6; 4,5,6,7; 5,6,7,8; 6,7,8,9; 7,8,9,10; 8,9,10,11; |
| 12 | 1,4,7,10 | PAIR GROUP | [(1,7), (4,10), (2,8), (5,11), (3,9), (6,12 )] | 1,2,3,4; 2,3,4,5; 3,4,5,6; 4,5,6,7; 5,6,7,8; 6,7,8,9; 7,8,9,10; 8,9,10,11; 9,10,11,12; |
| 12 | 1,5,9 | FOUR GROUP | [(1,5,9), (2, 6,10), (3,7,11), (4,8,12)] | 1,2,3; 2,3,4; 3,4,5; 4,5,6; 5,6,7; 6,7,8; 7,8,9; 8,9,10; 9,10,11; 10,11,12; |
| 13 | 1,5,10 | FIVE GROUP | [(1,5,10), (3,9), (6,12), (4,8,13), (2,7,11)] | 1,2,3,4; 2,3,4,5; 3,4,5,6; 4,5,6,7; 5,6,7,8; 6,7,8,9; 7,8,9,10 8,9,10,11; 9,10,11,12; 10,11,12,13; |
| 14 | 1,5,8,12 | PAIR GROUP | [(1, 8), (5,12), (3,10), (6,13), (2,9), (7,14), (4.,11)] | 1,2,3,4; 2,3,4,5; 3,4,5,6; 4,5,6,7; 5,6,7,8; 6,7,8,9; 7,8,9,10; 8,9,10,11; 9,10,11,12; 10,11,12,13; 11,12,13,14; |
| 15 | 1,6,11 | FIVE GROUP | [(1,6,11), (2,7,12), (3,8,13), (4,9,14), (5,10,15)] | 1,2,3; 2,3,4; 3,4,5; 4,5,6; 5,6,7; 6,7,8; 7,8,9; 8,9,10; 9,10,11; 10,11,12; 11,12,13; 12,13,14; 13,14,15; |

PDC BITS WITH MIXED CUTTER BLADES

CROSS REFERENCE TO RELATED APPLICATION

This application is a continuation application of U.S. patent application Ser. No. 14/807,396 filed Jul. 23, 2015, now U.S. Pat. No. 10,162,911, which is a divisional application of U.S. patent application Ser. No. 12/969,122 filed Dec. 15, 2010, now U.S. Pat. No. 9,115,552, the contents of which are hereby incorporated in their entirety by reference.

FIELD OF THE DISCLOSURE

The present disclosure is related to downhole drilling tools including, but not limited to, rotary drill bits, core bits, and reamers and more particularly to design, manufacture and/or selection of such downhole drilling tools based at least in part on placing impact resistant cutters (e.g., high impact resistant cutters) and/or wear resistant cutters (e.g., high wear resistant cutters) on blades that are subject to high impact and/or high loadings and/or blades that remove larger rock volume while drilling and further in part on laying out cutting elements in a level of force balance to optimally balance forces associated during initial contact with the downhole end of a wellbore and during transition drilling.

BACKGROUND OF THE DISCLOSURE

Various types of downhole drilling tools including, but not limited to, rotary drill bits, reamers, core bits, and other downhole tools have been used to form wellbores in associated downhole formations. Examples of such rotary drill bits include, but are not limited to, fixed cutter drill bits, drag bits, PDC drill bits, and matrix drill bits associated with forming oil and gas wells extending through one or more downhole formations.

Various techniques and procedures have been used to stabilize such downhole drilling tools and improve their drilling performance. See for example: Brett J. F., Warren T. M. and Behr S. M., "Bit Whirl: A new Theory of PDC bit Failure", SPE 19571, October, 1989; Warren T. M, Brett J. F. and Sinor L. A., "Development of a Whirl—Resistant Bit", *SPE Drilling Engineering,* 5 (1990) 267-274; Weaver G. E., Clayton R., "A New PDC Cutting Structure Improves Bit Stabilization and Extends Application into Harder Rock Types", SPE/IADC 25734, 1993; Besson A., et al., "On the Cutting Edge", Oilfield Review, Autumn, 2000, p 36-57; and TransFormation Bits, ReedHycalog, 2004.

Placement of different types of cutting elements in different bit profile zones of a drill bit has been used to improve performance. For example, U.S. Pat. No. 5,787,022 describes placing different types of cutters on various regions (zones) of a bit face to accommodate anticipated mechanical loadings. U.S. Pat. No. 6,435,058 describes layout of at least two types of cutters with different abrasion resistance based on the wear rate of cutters along the bit profile. U.S. Pat. No. 6,481,511 describes placing cutters in a series of concentric rings (zones) wherein cutters in each concentric ring have a respective wear resistance and that the wear resistance of cutters in different concentric rings are different. According to these previous methods at least two different types of cutters may be placed on each blade. However, placing different types of cutters in different bit profile zones may lead to catastrophic cutter failure and/or create "ring out" at those zones with lower abrasion resistance cutters. The "ring out" on bit face may be easily created at the transition between two zones. Once "ring out" is created, bit performance may be significantly reduced. Therefore, there is still a need for downhole drilling tools having different types of cutters that can better withstand impact loadings and resist wear and reduce cost without sacrificing bit performance.

SUMMARY

In accordance with teachings of the present disclosure, rotary drill bits and other downhole drilling tools may be designed and manufactured with various characteristics and features including, but not limited to, disposing high impact resistant and/or high wear resistant cutting elements (strong cutters which may be expensive) on blades that are subject to high impact loadings and/or on blades that remove more rock than other blades, i.e., blades subject to more loadings or high impact blades. In some embodiments, rotary drill bits and other downhole tools may be further designed by laying out cutters on blades in cutter groups comprised of cutter sets having at least a level of force balance (in some embodiments, having multilevel force balance). This may advantageously reduce or eliminate wear related damage to drilling tools and may also improve drilling performance by reducing impact and force imbalance related decreases in drilling performance. Costs of manufacture and operations may be reduced by placing low impact and/or low wear resistance cutters (weaker cutters which may be inexpensive) on blades that are not subject to high impact and/or on blades that are subject to lower loading.

Accordingly, at least two different types of cutting elements may be placed on different blades based on the function and location of blade. A first type of cutting element may comprise a high wear resistant cutting element and/or a high impact resistant cutting element that may be more expensive. In some embodiments, at least one high impact blade may have only a first type of cutting element. A second type of cutting element may comprise a low wear resistance and/or low impact resistance cutter that may be less expensive. In some embodiments, at least one low impact blade may have only a second type of cutting element.

In some embodiments, second type of cutting elements may be cheaper thereby offsetting manufacturing costs when combined with one or more expensive first type cutting elements in accordance with the present disclosure.

In some embodiments, high impact blades, i.e., blades subject to more loadings and/or blades subject to higher impact and/or blades that remove higher rock volume (or formation material) during drilling may be determined in part based on simulations of drilling in a desired downhole formation. In some embodiments, simulations to determine high impact blades may be carried out following laying out of cutters in a level of force balance. In some embodiments, simulations to determine high impact blades may be carried out first to determine which blades would be suitable candidates to receive a first type or a second type of cutting element. Following this, additional simulations may be performed to determine locations for laying out of the first or second type of cutting element according to criteria for a level of force balance in force balanced cutter sets and groups. Methods and algorithms for designing and manufacturing rotary drill bits and other downhole tools in accordance with teachings of the present disclosure are described later in the application.

Laying out of cutting elements in a level of force balance may comprise selecting locations for laying out cutting elements to provide substantially uniform force balancing during initial contact with the downhole end of a wellbore and during transition drilling through a first downhole formation and into an adjacent second downhole formation. Respective forces acting on each cutting element may be evaluated as a function of drilling distance as each respective cutting element engages the end of a wellbore or as each cutting element engages a second downhole formation after drilling through an adjacent first downhole formation. Such drill bits and other downhole drilling tools may sometimes be described as having a level of force balance. Several levels of force balance including a first level of force balance, a second level of force balance, a third level of force balance, a fourth level of force balance, a fifth level of force balance and multilevel force balancing are described in co-pending PCT Patent Application entitled "Multilevel Force Balanced Downhole Drilling Tools and Methods," Serial No. PCT/US09/067263, filed Dec. 4, 2009.

In some embodiments, blades subject to more loadings and/or more impact during drilling may be further designed to have a respective thickness more than the respective thickness of a blade that is subject to lesser loadings and/or lower impact forces. Since junk slots are located between two adjacent blades, modification of blade thickness may result in modification of junk slot volume of a well drilling tool of the disclosure.

In some embodiments, designing of downhole drilling tools according to the present disclosure may comprise designing blade thickness to obtain optimized fluid flow in associated junk slots. Some embodiments may comprise, placing one or more nozzles in respective junk slots to optimize fluid flow. Some embodiments may comprise placing one or more diffusers adjacent to nozzles to optimize fluid flow characteristics of the well tool.

Some embodiments of the present disclosure describe drill bits and other downhole tools having cutting elements having one or multiple levels of force balance which may be referred to as having "a level of force balance" or "multilevel force balanced," and further having at least a first type of cutting elements disposed on blades with higher loading and/or on blades subject to high impact during drilling and at least second type of cutting elements disposed on blades that are not subject to high loading and/or high impact and further modification of thickness of blades subject to more loadings or higher impact, thereby modifying (optimizing) fluid flow characteristics of a well tool.

Downhole drilling tools including, but not limited to, fixed cutter rotary drill bits, core bits and reamers may be designed and manufactured in accordance with teachings of the present disclosure. Teachings of the present disclosure may be used to optimize the design of various features of a rotary drill bit and other downhole drilling tools in combination with modifying features such as but not limited to the number of blades, dimensions and configurations of each blade, thickness of blades, configuration and dimensions of cutting elements, the number, location, orientation and type of cutting elements disposed on each blade and any other feature of an associated cutting structure.

In accordance with the present teachings, layout of cutting elements based on a level of force balance and layout of either a first type of cutting elements or a second type of cutting elements on a blade based on the function of a blade such as but not limited to loadings or rock volume removed by a blade and impact and downhole forces that a blade is subject to during drilling may advantageously reduce imbalance forces associated with each cutting element of the drill bit and improve impact resistance of the well tool. In some embodiments, teachings may advantageously improve wear resistance of a well tool of the disclosure. In some embodiments, teachings may advantageously improve wear distributions of cutting elements of a well tool of the disclosure. In some embodiments, teachings may advantageously improve fluid-flow characteristics of well tools of the disclosure. Teachings of the present disclosure may provide rotary drill bits and other downhole drilling tools having substantially optimized fluid flow properties.

In accordance with some embodiments, rotary drill bits and other downhole drilling tools incorporating teachings of the present disclosure may be satisfactorily used to form a wellbore extending through multiple downhole formations in less time and with greater stability as compared with rotary drill bits and other downhole drilling tools designed based, at least in part, on assuming that all associated cutting elements are engaged with a generally uniform downhole formation. Embodiments comprising levels of force balancing may improve bit lateral stability by minimizing lateral imbalance forces including drag lateral imbalance forces and radial lateral forces. Vibration and/or force imbalances associated with initial contact with the downhole end of a wellbore, transition drilling from a first downhole formation layer into a second downhole formation layer or drilling through other types of non-uniform downhole formations may be substantially reduced or eliminated by use of multilevel force balanced downhole drilling tools incorporating teachings of the present disclosure.

Fixed cutter drill bits and other downhole drilling tools which are designed and manufactured based, at least in part, on force balancing techniques which assume that all cutting elements are engaged with the same, generally uniform downhole formation may not be force balanced during many common, non-uniform downhole drilling conditions such as, but not limited to, initial contact with the end of wellbore or drilling from a first downhole formation into a second, harder downhole formation.

Some embodiments of the disclosure may provide one or more of the following technical advantages. A technical advantage of some embodiments may include substantially reducing or minimizing imbalance forces of cone cutters. A technical advantage of some embodiments may include substantially decreasing, reducing or minimizing impact forces on the well tool during drilling. Teachings of the present disclosure may provide rotary drill bits and other downhole drilling tools having substantially optimized fluid flow properties.

A technical advantage of some embodiments may include improving impact resistance of the well tool. A technical advantage of some embodiments may include substantially reducing or minimizing wear of a well tool. A technical advantage of some embodiments may include an even wear distribution on cutting elements of a well tool. A technical advantage of some embodiments may include substantially improve fluid-flow characteristics of well tools of the disclosure. A technical advantage of some embodiments may include minimizing or substantially reduce erosion due to improved fluid flow. A technical advantage of some embodiments may prevent accumulation of downhole debris during drilling due to optimized fluid flow.

Various embodiments of the disclosure may include none, some, or all of the above technical advantages. One or more other technical advantages may be readily apparent to one skilled in the art from the figures, descriptions, and claims included herein.

This summary contains only a limited number of examples of various embodiments and features of the present disclosure. For a better understanding of the disclosure and its advantages, reference may be made to the description of exemplary embodiments that follows.

BRIEF DESCRIPTION OF THE DRAWINGS

A more complete and thorough understanding of the various embodiments and advantages thereof may be acquired by referring to the following description taken in conjunction with the accompanying drawings, in which like reference numbers indicate like features, and wherein:

FIGS. 7A-7D are schematic drawings showing one example for selecting blades for installing different types of cutting elements (e.g., $\mathbf{60}_h$ or $\mathbf{60}_l$), on a fixed cutter rotary drill bit in accordance with the present disclosure wherein:

FIG. 7A shows a schematic view of a bit face with six blades $\mathbf{130}_1$-$\mathbf{130}_6$ wherein cutting elements are installed having multilevel force balancing in two cutter groups, with cutter set [(1 3 5), (2 4 6)];

FIG. 7B depicts a bit face profile of cutting elements on bit face of FIG. 7A showing the location of cutting elements along bit profile;

FIG. 7C is a schematic drawing depicting the volume of rock removed by each respective blade of the six blade bit of FIG. 7A wherein blades $\mathbf{130}_1$, $\mathbf{130}_3$, and $\mathbf{130}_5$ are identified as blades that remove larger volumes of rock as compared to blades $\mathbf{130}_2$, $\mathbf{130}_4$, and $\mathbf{130}_6$ by simulation methods (such as those described in FIGS. 6A and 6B), according to one example embodiment of the disclosure; and FIG. 7D is a graph that shows the total impact force (loading) on each cutter located on each respective blade of the six blade bit and shows that cutters on blades $\mathbf{130}_1$, $\mathbf{130}_3$, and $\mathbf{130}_5$ are subject to more impact forces than cutters on blades $\mathbf{130}_2$, $\mathbf{130}_4$, and $\mathbf{130}_6$, as identified by simulation methods (such as those described in FIGS. 6A and 6B), according to one example embodiment of the disclosure;

FIGS. 8A-8D are schematic drawings showing one example for selecting blades for installing different types of cutting elements (e.g., $\mathbf{60}_h$ or $\mathbf{60}_l$), on a fixed cutter rotary drill bit in accordance with the present disclosure, wherein:

FIG. 8A shows a schematic view of a bit face with nine blades $\mathbf{130}_1$-$\mathbf{130}_9$ having cutting elements installed according to multilevel force balancing criteria in three cutter groups, with cutter set [(1 4 7), (2 5 8), (3 6 9)];

FIG. 8B depicts a bit face profile of cutting elements on bit face of FIG. 8A showing the location of cutting elements along bit profile;

FIG. 8C is a schematic drawing depicting the volume of rock removed by each respective blade of the nine blade bit of FIG. 8A wherein blades $\mathbf{130}_1$, $\mathbf{130}_4$, $\mathbf{130}_7$ are identified by simulation methods (such as those described in FIGS. 6A and 6B) as blades that remove more volume than other blades, according to one example embodiment of the disclosure;

FIG. 8D is a graph that shows the total impact force (loading) on each cutter located on each respective blade of the six blade bit and shows that cutters on blades $\mathbf{130}_1$, $\mathbf{130}_4$, $\mathbf{130}_7$ and $\mathbf{130}_8$ are subject to more impact forces than cutters on blades $\mathbf{130}_2$, $\mathbf{130}_3$, $\mathbf{130}_5$, $\mathbf{130}_6$ and $\mathbf{130}_9$, as identified by simulation methods (such as those described in FIGS. 6A and 6B), according to one example embodiment of the disclosure;

FIGS. 9A-9D are schematic drawings showing one example for selecting blades for installing different types of cutting elements (e.g., $60_h$ or $\mathbf{60}_l$), on a fixed cutter rotary drill bit in accordance with the present disclosure, wherein:

FIG. 9A shows a schematic view of a bit face with eight blades $\mathbf{130}_1$-$\mathbf{130}_8$ having cutting elements installed according to multilevel force balancing criteria in pair cutter groups, with cutter set [(1 5), (3 7), (2 6), (4, 8)];

FIG. 9B depicts a bit face profile of cutting elements on bit face of FIG. 9A showing location of cutting elements along bit profile;

FIG. 9C is a schematic drawing depicting the volume of rock removed by each respective blade of the eight blade bit of FIG. 9A wherein blades $\mathbf{130}_1$, $\mathbf{130}_3$, $\mathbf{130}_5$ and $\mathbf{130}_7$ are blades that remove larger volumes of rock as compared to blades $\mathbf{130}_2$, $\mathbf{130}_4$, $\mathbf{130}_6$ and $\mathbf{130}_8$, identified by simulation methods (such as those described in FIGS. 6A and 6B), according to one example embodiment of the disclosure;

FIG. 9D is a graph that shows the total impact force (loading) on each cutter located on each respective blade of the eight blade bit and shows that cutters on blades $\mathbf{130}_1$, $\mathbf{130}_2$, $\mathbf{130}_5$, $\mathbf{130}_6$ and $\mathbf{130}_7$, are subject to more impact forces than cutters on blades $\mathbf{130}_3$, $\mathbf{130}_4$, and $\mathbf{130}_8$, by simulation methods (such as those described in FIGS. 6A and 6B), according to one example embodiment of the disclosure;

FIGS. 22A and 22B are schematic drawings showing one example of prior art techniques for selecting locations for installing cutting elements on a fixed cutter rotary drill bit;

FIGS. 24J-1 and 24J-2 are graphs showing level four force balancing of the drill bit shown in FIGS. 23A and 23B in accordance with teachings of the present disclosure;

FIGS. 26A and 26B are tables showing examples of matching major blades, cutter groups, blade groups and cutter sets for use in multilevel force balancing of fixed cutter rotary drill bits or other downhole drilling tools in accordance with teachings of the present disclosure;

FIG. 27 is a table showing preferred matches of major blades, cutter groups, blade groups and cutter sets during design of multilevel force balance fixed cutter rotary drill bits or other downhole drilling tools in accordance with one example embodiment of the present disclosure;

DETAILED DESCRIPTION

Figure 1:
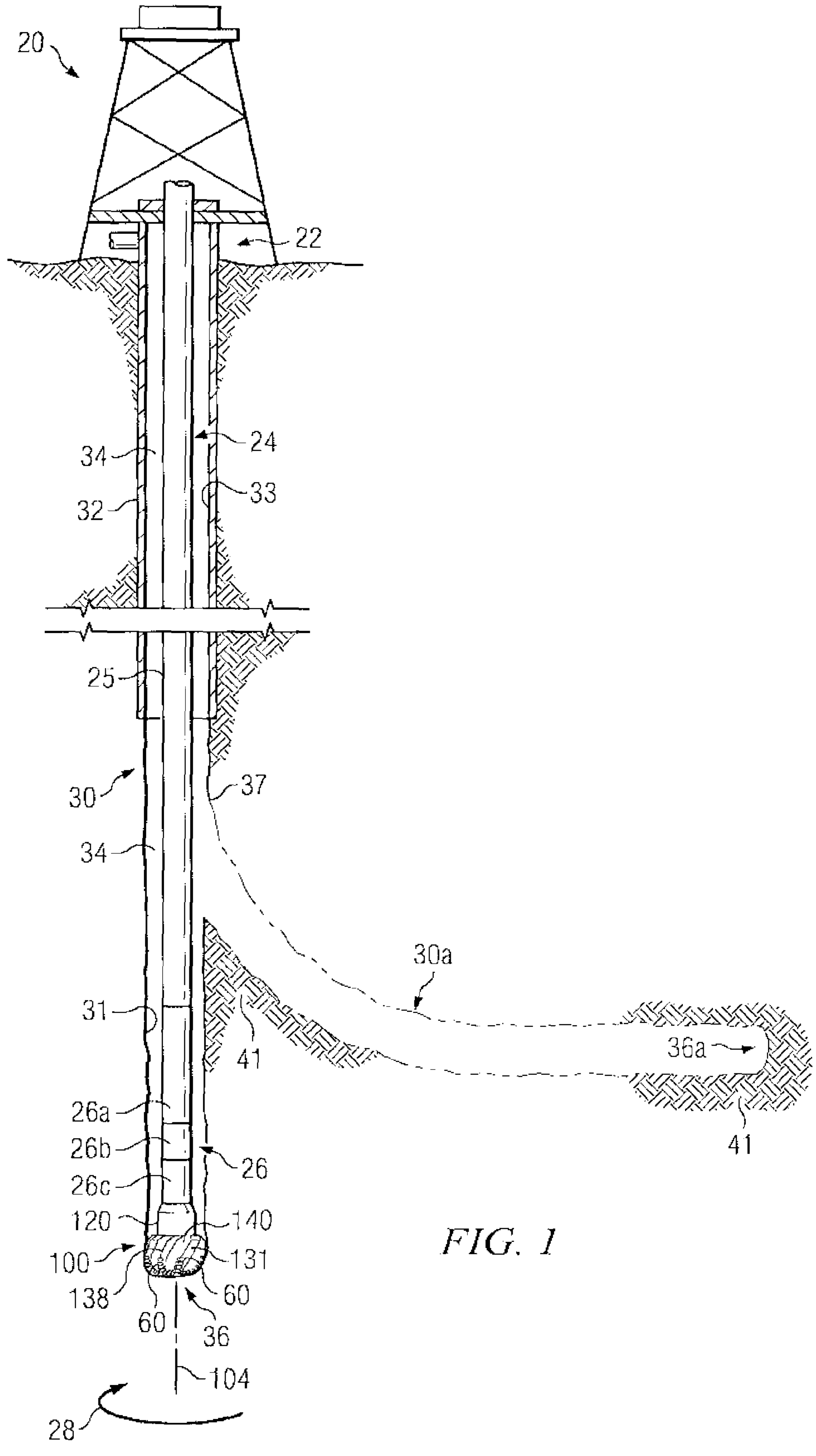
FIG. 1 is a schematic drawing in section and in elevation with portions broken away showing examples of wellbores which may be formed in downhole formations by a rotary drill bit or other downhole drilling tools incorporating teachings of the present disclosure.

Preferred embodiments and various advantages of the disclosure may be understood by reference to FIGS. 1A-34 wherein like numbers refer to same and like parts.

The terms "downhole" and "uphole" may be used in this application to describe the location of various components of a downhole drilling tool relative to portions of the downhole drilling tool which engage the bottom or end of a wellbore to remove adjacent formation materials. For example an "uphole" component may be located closer to an associated drill string or bottom hole assembly as compared to a "downhole" component which may be located closer to the bottom or end of an associated wellbore.

The terms "downhole drilling tool" or "downhole drilling tools" or "well tool" may include rotary drill bits, matrix drill bits, drag bits, reamers, near bit reamers, hole openers, core bits and other downhole tools having cutting elements and/or cutting structures operable to remove downhole formation materials while drilling a wellbore.

The term "rotary drill bit" may be used in this application to include various types of fixed cutter drill bits, fixed cutter rotary drill bits, PDC bits, drag bits, matrix drill bits, steel body drill bits and core bits operable to form at least portions of a wellbore in a downhole formation. Rotary drill bits and associated components formed in accordance with teachings of the present disclosure may have many different designs, configurations and/or dimensions.

The terms "reamer" and "reamers" may be used in the application to describe various downhole drilling tools including, but not limited to, near bit reamers, winged reamers and hole openers.

The terms "bottom hole assembly" or "BHA" may be used in this application to describe various components and assemblies disposed proximate one or more downhole drilling tools disposed proximate the downhole end of a drill string. Examples of components and assemblies (not expressly shown) which may be included in various cutting structures such as in a bottom hole assembly or BHA include, but are not limited to, a bent sub, a downhole drilling motor, sleeves, stabilizers and downhole instruments. A bottom hole assembly may also include various types of well logging tools (not expressly shown) and other downhole tools associated with directional drilling of a wellbore. Examples of such logging tools and/or directional drilling tools may include, but are not limited to, acoustic, neutron, gamma ray, density, photoelectric, nuclear magnetic resonance, rotary steering tools and/or any other commercially available well tool.

The term "gage" or "gage pad" as used in this application may include a gage, gage segment, gage portion or any other portion of a rotary drill bit. Gage pads may be used to help define or establish a nominal inside diameter of a wellbore formed by an associated rotary drill bit. The layout of locations for installing cutting elements on exterior portions of a blade may terminate proximate an associated gage pad.

The terms "cutting element" "cutting elements" and "cutters" may be used in this application to include, but are not limited to, various types of cutters, compacts, buttons, and inserts satisfactory for use with a wide variety of rotary drill bits and other downhole drilling tools. Impact arrestors, gage cutters, secondary cutters and/or back up cutters may also be included as part of the cutting structure of rotary drill bits and other downhole drilling tools formed in accordance with teachings of the present disclosure. Polycrystalline diamond compacts (PDC) and tungsten carbide inserts are often used to form cutting elements for rotary drill bits, reamers, core bits and other downhole drilling tools. Various types of other hard, abrasive materials may also be satisfactorily used to form cutting elements for rotary drill bits.

According to some embodiments of the disclosure, various types of cutting elements or cutters may be used to design and manufacture downhole drilling tools such as rotary drill bits. For example, at least a "first type of cutting element" also referred to as a "first type of cutter" may comprise a strong cutter which may include one or more of the following characteristics: high wear resistant and/or high impact resistant. A "second type of cutting element" also referred to as a "second type of cutter" used in some embodiments of design and manufacture in accordance to the present disclosure may comprise a relatively weak cutter and may include one or more of the following characteristics: low wear resistant and/or low impact resistant. In some embodiments, a first type of cutter may be more abrasion resistant, have a greater toughness and/or have a greater durability as compared to a second type of cutter. A "first type of cutting element" may be more expensive than a "second type of cutting element".

The terms "cutting face," "bit face profile," "cutting face profile" and "composite cutting face profile" describe various components, segments or portions of a downhole drilling tool operable to engage and remove formation materials to form an associated wellbore. The cutting face of a downhole drilling tool may include various cutting structures such as one or more blades with respective cutting elements disposed on exterior portions of each blade. A cutting face may also include impact arrestors, back up cutters, gage cutters and/or an associated gage pad. The cutting face of a fixed cutter rotary drill bit may also be referred to as a "bit face."

The terms "cutting face profile" and "composite cutting face profile" may also describe various cutting structures including blades and associated cutting elements projected onto a radial plane extending generally parallel with an associated bit rotational axis. The cutting face profile of a fixed cutter rotary drill bit and/or a core bit may also be referred to as a "bit face profile" or "composite bit face profile." A bit face profile may be comprised of various segments or zones that represent structures on the bit such as but not limited to the cone, nose, shoulder, gage and transit zones.

The term "cutting structure" may be used in this application to include various combinations and arrangements of cutting elements, impact arrestors, backup cutters and/or gage cutters formed on exterior portions of a rotary drill bit or other downhole drill tools. Some rotary drill bits and other downhole drilling tools may include one or more blades extending from an associated bit body with respective cutting elements disposed of each blade. Such blades may sometimes be referred to as "cutter blades."

The terms "blade" and "blades" may be used in this application to include, but are not limited to, various types of projections extending outwardly from a generally cylindrical body. Blades formed in accordance with teachings of the present disclosure may have a wide variety of configurations including, but not limited to, helical, spiraling, tapered, converging, diverging, symmetrical, and/or asymmetrical. Various configurations of blades may be used to form cutting structures for a rotary drill bit incorporating teachings of the present disclosure.

One or more blades may be disposed on exterior portions of a rotary bit body. A plurality of cutting elements may be disposed on exterior portions of each blade. One or more blades may generally have an arcuate configuration extending from the bit rotational axis such that the arcuate configuration may be defined in part by a generally concave, recessed shaped portion extending from the bit rotational axis and a generally convex, outwardly curved portion disposed between the concave, recessed portion and exterior portions of each blade which correspond generally with the outside diameter of the rotary drill bit.

A common drill bit design may comprise at least three blades that may be oriented approximately 120 degrees relative to each other with respect to the bit rotational axis. These at least three blades may be referred to as primary blades and may provide stability. Multiple secondary blades may be disposed between primary blades. The number and location of secondary blades and primary blades may vary substantially. The blades may be disposed symmetrically or asymmetrically with regard to each other and the bit rotational axis based on the downhole drilling conditions of the drilling environment.

A blade of the present disclosure may comprise a first end disposed proximate an associated bit rotational axis and a second end disposed proximate exterior portions of the rotary drill bit (i.e., disposed generally away from the bit rotational axis and toward uphole portions thereof). Each blade may comprise a leading surface disposed on one side of the blade in the direction of rotation of a rotary drill bit and a trailing surface disposed on an opposite side of the blade away from the direction of rotation of the rotary drill bit. A respective junk slot may be disposed between a trailing surface of one blade and a leading surface of a following blade.

In accordance with the teachings of the disclosure, for some applications, blade geometry or configuration may be modified or changed such that blades that are subject to more impact, and/or higher loadings and/or blades that remove higher volume of rock may be designed to be thicker. Accordingly, a respective junk slot configuration and size may be changed by changing blade size or configuration. In some embodiments of the disclosure, methods to change junk slot volumes may comprise increasing the size or thickness of a blade and may result in changing fluid-flow characteristics of a resulting drill bit or other well tool. These aspects are described in detail later in the application.

Various computer programs and computer models may be used to design cutting elements, blades, cutting structure, junk slots and/or associated downhole drilling tools in accordance with teachings of the present disclosure. Examples of such programs and models which may be used to design and evaluate performance of downhole drilling tools incorporating teachings of the present disclosure are shown in copending U.S. Patent Applications entitled "Methods and Systems for Designing and/or Selecting Drilling Equipment Using Predictions of Rotary Drill Bit Walk," application Ser. No. 11/462,898, filing date Aug. 7, 2006 (now U.S. Pat. No. 7,778,777); copending U.S. Patent Application entitled "Methods and Systems for Designing and/or Selecting Drilling Equipment With Desired Drill Bit Steerability," application Ser. No. 11/462,918, filed Aug. 7, 2006 (now U.S. Pat. No. 7,729,895); copending U. S. Patent Application entitled "Methods and Systems for Design and/or Selection of Drilling Equipment Based on Wellbore Simulations," application Ser. No. 11/462,929, filing date Aug. 7, 2006 (now U.S. Pat. No. 7,827,014); copending PCT Patent Application entitled "Rotary Drill Bits and Other Well Tools with Fluid Flow Paths Optimizing Downhole Drilling Performance," Application Serial No. PCT/US08/058097, filing date Jan. 14, 2010, claiming priority to U.S. Provisional Application Ser. No. 61/144,562, filed Jan. 14, 2009; and PCT Patent Application entitled "Multilevel Force Balanced Downhole Drilling Tools and Methods," Serial No. PCT/US09/067263, filed Dec. 4, 2009.

In embodiments relating to blade thickness modification and junk slot modification, commercially available computer programs and algorithms may be used to simulate and evaluate complex fluid interactions to improve and enhance fluid flow characteristics of a downhole drilling tool such as a rotary drill bit. The terms "computational fluid dynamics" and/or "CFD" may be used in this application to describe such computer programs and algorithms. Such simulations may include calculation of heat and/or mass transfer, turbulence, velocity changes and other characteristics associated with multiphase, complex fluid flow. Such fluids may often be a mixture of liquids, solids and/or gases with varying concentrations of each. For some applications, CFD programs may be used to determine optimum locations on one or more blades to change the thickness of one or more blades (and the geometry of adjacent junk slots) to obtain optimized fluid flow based on the particular application or downhole formation in accordance with the teachings of this disclosure. CFD programs may be tailored based on anticipated fluid flow for the type/size of pump that may be used on a drilling rig. CFD programs may be also modeled based on the size of the drill bit that may be used.

Various aspects of the present disclosure may be described with respect to downhole drilling tools such as shown at least in FIGS. 1, 2A, 2B, 3, 4, and 11. Examples of such downhole drilling tools may include, but are not limited to, rotary drill bits 90, 100, 100*a*, and 100*b*, core bit 500 and reamer 600. Teachings however recognize that the disclosure is not limited to these downhole drilling tools.

Rotary drill bits 100, 100*a*, 100*b* and 100*c*, core bit 500 and reamer 600 may include a plurality of blades with respective cutting elements disposed at selected locations on associated blades in accordance with teachings of the present disclosure. The teachings of the present disclosure are not limited to rotary drill bits 90 and/or 100*a*, 100*b* and 100*c*, core bit 500 or reamer 600.

FIG. 1 shows an exemplary wellbore or bore hole which may be formed by downhole drilling tools incorporating teachings of the present disclosure. The present disclosure describes rotary drill bits 100 as an exemplary downhole drilling tool, however teachings recognize that the disclosure is not limited to rotary drill bits 100 and other downhole drilling tool or well tools such as but not limited to a core bit, a reamer, a fixed cutter drill bit, a drag bit, a PDC drill bit, and a matrix drill bit, may be designed according to the present teachings.

Rotary drill bit 100 may be designed and manufactured in accordance with teachings of the present disclosure by selecting locations for laying out different types of cutting elements 60 on different blades 130 of the rotary drill bit, to improve impact resistance and/or wear resistance of the drill bit. In some example embodiments, a plurality of a first type of cutting elements $\mathbf{60}_h$ may be disposed on a plurality of high impact blades $\mathbf{130}_h$ that are subject to high impact during downhole drilling and/or subject to more loadings and/or blades that remove more rock volume during drilling, while a plurality of a second type of cutting elements $\mathbf{60}_l$ may disposed on one or more low impact blades $\mathbf{130}_1$ that are subject to lower impact during downhole drilling and/or subject to lower loadings and/or blades that remove lesser rock volume during drilling (see FIGS. 7A, 7B, 8A, 8B, 9A and 9B). In some embodiments, rotary drill bit 100 may be further designed and manufactured based on multilevel force balancing techniques in accordance with teachings of the present disclosure to substantially reduce and/or minimize imbalance forces which may result from contact between rotary drill bit 100 and downhole end 36 of wellbore 30 or downhole end 36*a* of wellbore 30*a*, including one or multiple downhole formations as may be seen in transitional drilling. Aspects of multilevel force balancing are also described in copending PCT Patent Application entitled "Multilevel Force Balanced Downhole Drilling Tools and Methods," Serial No. PCT/US09/067263, filed Dec. 4, 2009.

Blades $\mathbf{130}_h$ that are subject to high impact during downhole drilling and/or subject to more loadings and/or blades that remove more rock volume during drilling, may be referred to herein as "blades subject to high impact," "high impact blades" or as "$\mathbf{130}_h$." Blades $\mathbf{130}_1$ that are subject to lower impact during downhole drilling and/or subject to lower loadings and/or blades that remove lesser rock volume during drilling as compared to the $\mathbf{130}_h$ blades may be referred to herein as "blades subject to low impact," blades subject to less impact" or "low impact blades" or "$\mathbf{130}_1$."

In some embodiments, a downhole drilling tool such as a rotary drill bit 100 may be further designed and manufactured where the respective thickness of each blade 130 may be varied such that blades that are subject to high impact $\mathbf{130}_h$ during downhole drilling have a greater respective thickness than blades subject to less impact $\mathbf{130}_1$ during downhole drilling to improve fluid-flow characteristics and/or to alter junk slot 140 configuration (see FIGS. 7A, 7B, 8A, 8B, 9A and 9B).

In some embodiments, a downhole drilling tool such as rotary drill bit 100 may be designed and manufactured based on various combinations of the embodiments described above relating to: 1) placing different types of cutters ($\mathbf{60}_h$ or $\mathbf{60}_l$) on different blades 130 based on the impact that a respective blade may be subject to during downhole drilling (e.g., a $\mathbf{130}_h$ or a $\mathbf{130}_1$ blade); and 2) multilevel force balancing; 3) blades 130 with different respective thickness.

Figure 11A:
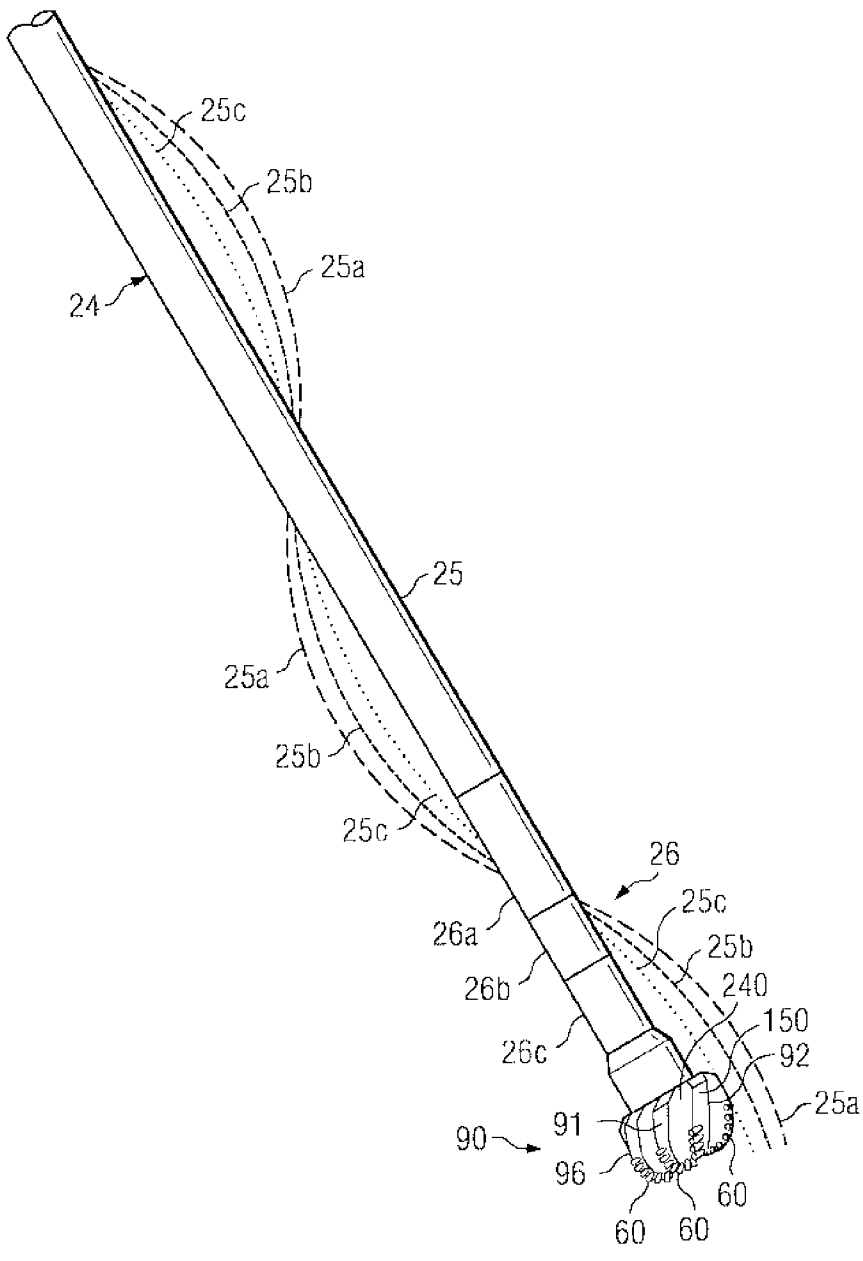
FIG. 11A is a schematic drawing in elevation with portions broken away showing one example of possible effects from bit imbalance forces applied to a prior art rotary drill bit which has not been multilevel force balanced.
Figure 11B:
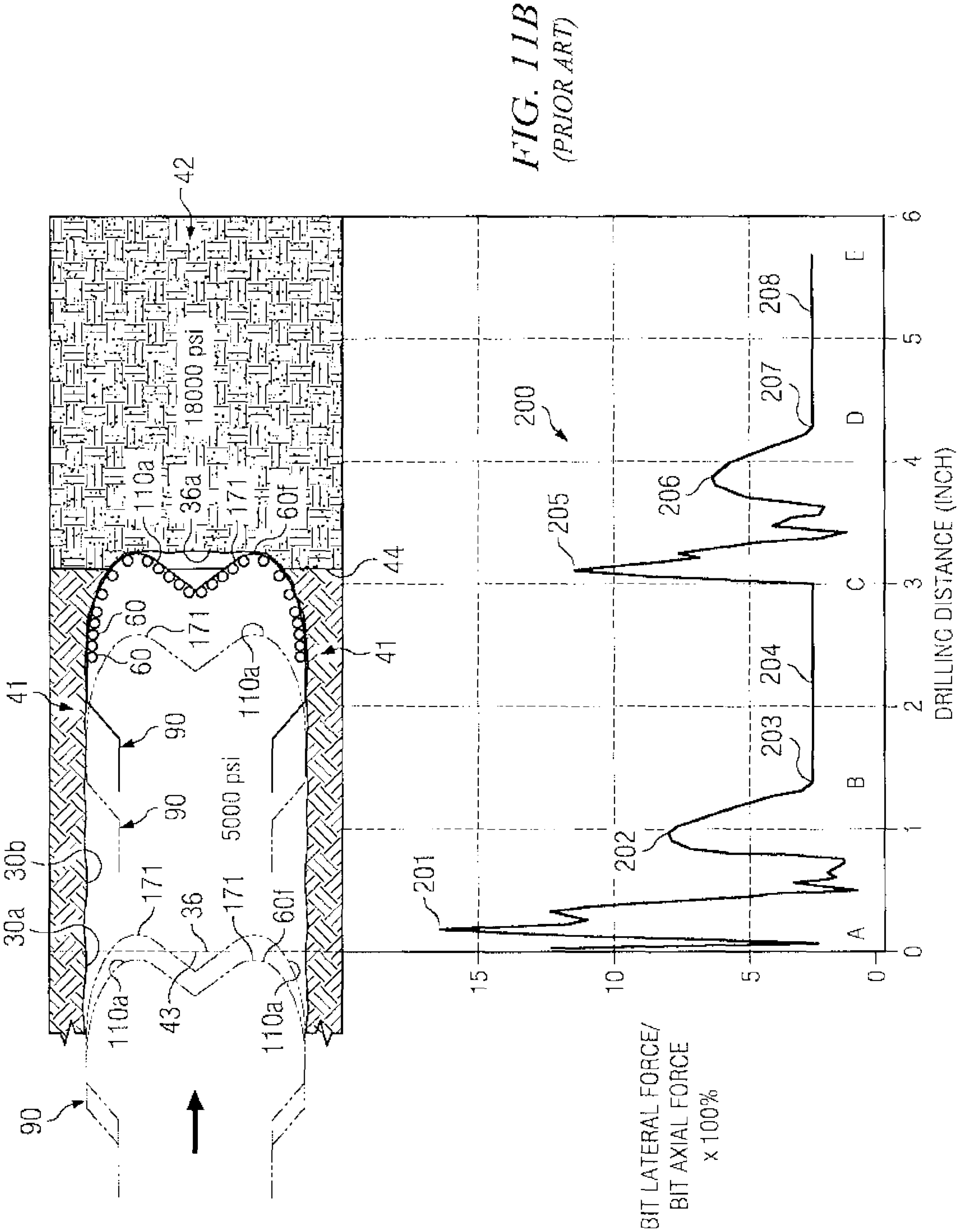
FIG. 11B is a schematic drawing showing one example of a prior art fixed cutter drill bit forming a wellbore and a chart showing imbalance forces versus drilling depth associated with transition drilling or non-uniform downhole drilling conditions.

Various aspects of the present disclosure may be described with respect to drilling rig 20, drill string 24 and attached rotary drill bit 100 as shown in FIG. 1. Cutting elements 60, according to the present disclosure, may be disposed at selected locations on exterior portions of selected blades 131-139 or $\mathbf{130}_1$-$\mathbf{130}_{10}$ to substantially reduce bit cost and improve bit performance. Cutting elements 60, according to the present disclosure, may also be disposed at selected locations on exterior portions of selected blades 131-139 or $\mathbf{130}_1$-$\mathbf{130}_{10}$ to have even wear distribution of cutting elements along bit profile. Cutting elements 60, according to the present disclosure, may be disposed at selected locations on exterior portions of selected blades 131-139 or $\mathbf{130}_1$-$\mathbf{130}_{10}$ to substantially reduce (a) impact forces on a respective blade, (b) imbalance forces on a respective blade, and (c) imbalance forces on a respective blade group during uniform downhole drilling, non-uniform downhole drilling conditions and/or transition drilling conditions. Layout of cutting elements according to the present disclosure may improve or increase durability and performance of a downhole drilling tool such as a drill bit. Bit imbalance forces associated with non-uniform downhole drilling conditions are discussed in more detail with respect to rotary drill bit 90 as shown in FIGS. 11A and 11B, and rotary drill bit 90*a* as shown in FIG. 22A. Bit imbalance forces may cause vibration of drill string 24 when rotary drill bit 100 initially contacts end 36 of wellbore 30 or end 36*a* of horizontal wellbore 30*a*. See FIG. 1. Such vibration may extend from rotary drill bit 100 throughout the length of drill string 24. See FIG. 1. Imbalance forces acting on a downhole drilling tool may also result during transition drilling from a first generally soft formation layer into a second, generally harder downhole formation layer. See, for example, FIG. 5A and FIGS. 11A-F. Imbalance forces acting on a downhole drilling tool may also result from drilling a first downhole formation into a second downhole formation where the second downhole formation may be tilted at an angle other than normal to a wellbore formed by a downhole drilling tool. See, for example, FIGS. 12A-C.

Figure 5A:
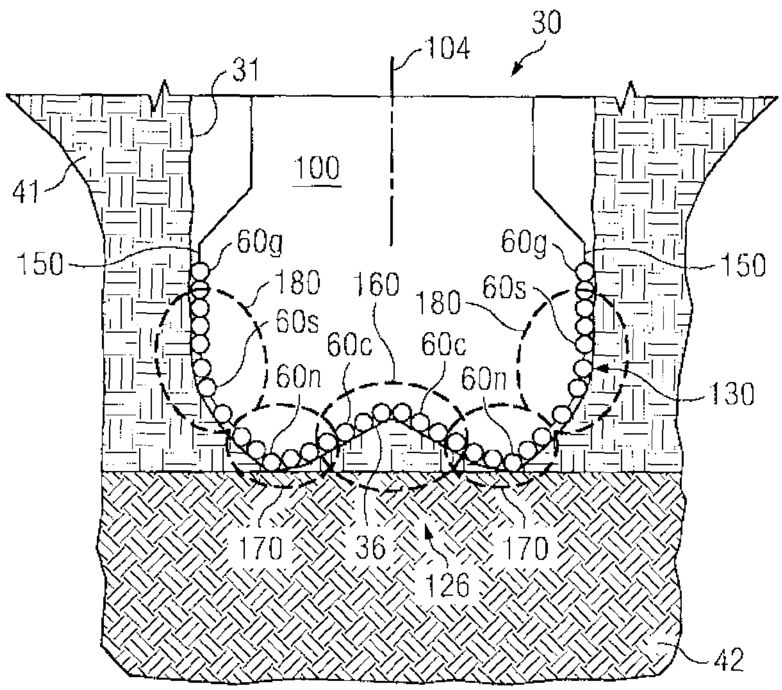
FIG. 5A is a schematic drawing in section and in elevation with portions broken away showing the rotary drill bit of FIG. 1 drilling a wellbore through a first downhole formation and into an adjacent second downhole formation depicting zones on a bit face profile.

Wellbores 30 and/or 30*a* may often extend through one or more different types of downhole formation materials or formation layers. As shown in FIG. 5A, rotary drill bit 100 may be used to extend wellbore 30 through first formation layer 41 and into second formation layer 42. For some applications, first formation layer 41 may have a compressive strength or hardness less than the compressive strength or hardness of second formation layer 42.

During transition drilling between first layer 41 and second layer 42, significant imbalance forces may be applied to a downhole drill tool resulting in undesired vibration of an associated downhole drill string. Vibration and/or imbalance forces associated with initial contact with a downhole formation at the end of a wellbore, transition drilling from a first formation layer into a second formation layer and other non-uniform downhole drilling conditions will be discussed in more detail in FIGS. 11A-11F, 12A-12C and 22A-22I.

Various types of drilling equipment such as a rotary table, mud pumps and mud tanks (not expressly shown) may be located at well surface or well site 22. Drilling rig 20 may have various characteristics and features associated with a "land drilling rig". However, downhole drilling tools incorporating teachings of the present disclosure may be satisfactorily used with drilling equipment located on offshore platforms, drill ships, semi-submersibles and drilling barges (not expressly shown).

Bottomhole assembly (BHA) 26 may be formed from a wide variety of components. For example, components 26*a*, 26*b* and 26*c* may be selected from the group consisting of, but not limited to, drill collars, rotary steering tools, directional drilling tools and/or downhole drilling motors. The number of components such as drill collars and different types of components included in a BHA will depend upon anticipated downhole drilling conditions and the type of wellbore which will be formed by drill string 24 and rotary drill bit 100.

Drill string 24 and rotary drill bit 100 may be used to form a wide variety of wellbores and/or bore holes such as generally vertical wellbore 30 and/or generally horizontal wellbore 30*a* as shown in FIG. 1. Various directional drilling techniques and associated components of BHA 26 may be used to form horizontal wellbore 30*a*. For example, lateral forces may be applied to rotary drill bit 100 proximate kickoff location 37 to form horizontal wellbore 30*a* extending from generally vertical wellbore 30.

Excessive amounts of vibration or imbalance forces applied to a drill string while forming a directional wellbore may cause significant problems with steering drill string and/or damage one or more downhole components. Such vibration may be particularly undesirable during formation of directional wellbore 30*a*. Designing and manufacturing rotary drill bit 100 and/or other downhole drilling tools by selecting respective blades 130 for laying out different types of cutting elements, such as but not limited to at least 60$_h$ or 60$_l$, based on the impact forces a respective blade 130 may be subject to, and/or loadings on a respective blade 130, and/or rock volume removed by a respective blade 130, incorporating teachings of the present disclosure and in some embodiments further using multilevel force balancing techniques may substantially enhance wear resistance, impact resistance, stability and/or steerability of rotary drill bit 100 and other downhole drilling tools.

Wellbore 30 defined in part by casing string 32 may extend from well surface 22 to a selected downhole location. Portions of wellbore 30 as shown in FIG. 1 which do not include casing 32 may be described as "open hole". Various types of drilling fluid may be pumped from well surface 22 through drill string 24 to attached rotary drill bit 100. Such drilling fluids may be directed to flow from drill string 24 to respective nozzles 156 provided in rotary drill bit 100. Nozzles 156 are depicted in FIGS. 2A-2B, 3, 4, 7A-7B, 8A-8B, 9A-9B, 22A, 23A, 28-30 and 32-34. The drilling fluid may be circulated back to well surface 22 through annulus 34 defined in part by outside diameter 25 of drill string 24 and inside diameter 31 of wellbore 30. Inside diameter 31 may also be referred to as the "sidewall" of wellbore 30. Annulus 34 may also be defined by outside diameter 25 of drill string 24 and inside diameter 33 of casing string 32.

Drilling fluids supplied to such rotary drill bits may perform several functions including, but not limited to, removing formation materials and other downhole debris from the bottom or end of a wellbore, cleaning associated cutting elements and cutting structures and carrying formation cuttings and other downhole debris upward to an associated well surface.

Fluid flow paths also referred to as "junk slots" 140 and fluid flow characteristics associated with fixed cutter rotary drill bits have previously been modified by changing the location, number, size and/or orientation nozzles that supply drilling fluids and other fluids to exterior portions of such drill bits. The location, depth and/or geometry of junk slots 140 disposed on exterior portions of such drill bits have also been modified to improve associated fluid flow characteristics. The width, height, length, configuration and/or number of blades disposed on exterior portions of fixed cutter rotary drill bits have also been previously modified to improve associated fluid flow characteristics.

According to some embodiments of the present disclosure, a downhole drilling tool such as a rotary drill bit 100 may be designed and manufactured where the respective thickness of each blade 130 may be varied such that blades that are subject to high impact 130$_h$ during downhole drilling are designed to have a greater respective thickness than blades subject to less impact 130$_l$ during downhole drilling to alter junk slot 140 configuration. An alteration of junk slot configuration may change the fluid flow characteristics of a rotary drill bit. According to some embodiments of the present disclosure, blade thickness may be modified to improve/optimize fluid-flow characteristics (as depicted in FIGS. 31-34). Optimizing fluid flow characteristics over exterior portions of a drill bit according to the present disclosure may improve cleaning of associated cutting structures and/or improve removal of formation materials and other downhole debris and/or reduce erosion, abrasion and/or wear on exterior portions of a drill bit along thereby increasing rate of penetration (ROP) and/or increasing downhole drilling life of a drill bit or other downhole drilling tool.

Rate of penetration (ROP) of a rotary drill bit is often a function of both weight on bit (WOB) and revolutions per minute (RPM). Drill string 24 may apply weight on drill bit 100 and also rotate drill bit 100 to form wellbore 30. For some applications a downhole motor (not expressly shown) may be provided as part of BHA 26 to also rotate rotary drill bit 100.

Figure 2A:
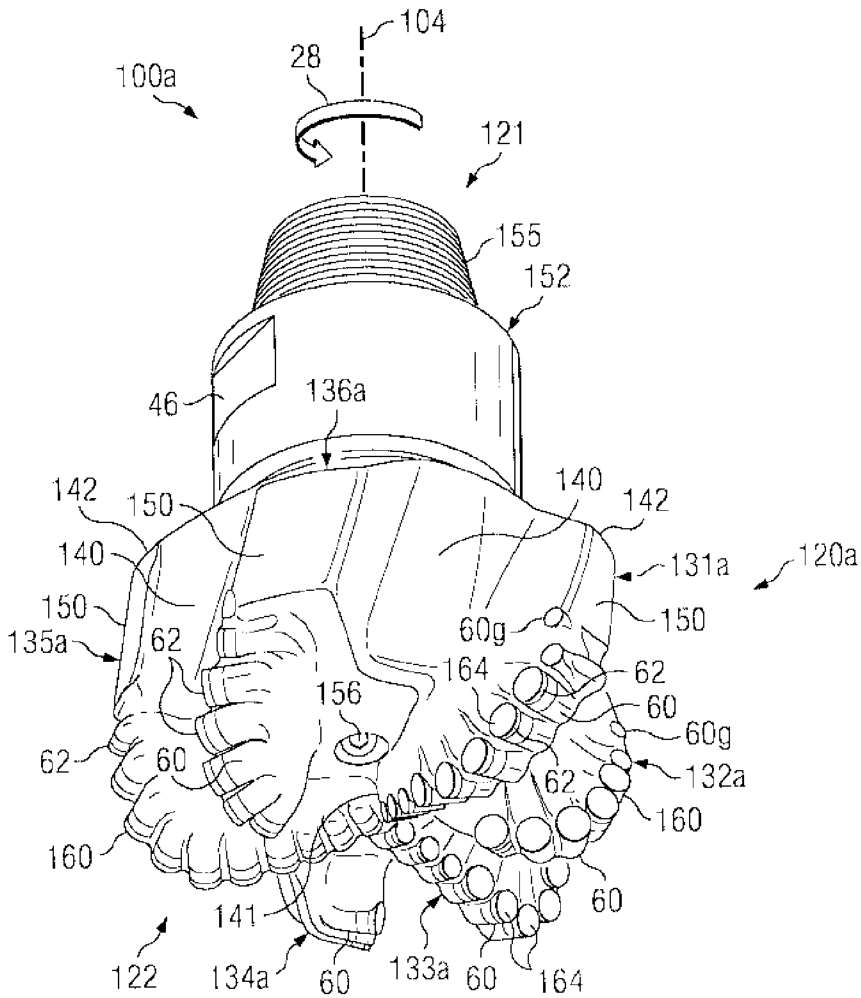
FIG. 2A is a schematic drawing showing an isometric view of a fixed cutter drill bit oriented in a generally downhole direction which may incorporate teachings of the present disclosure.
Figure 2B:
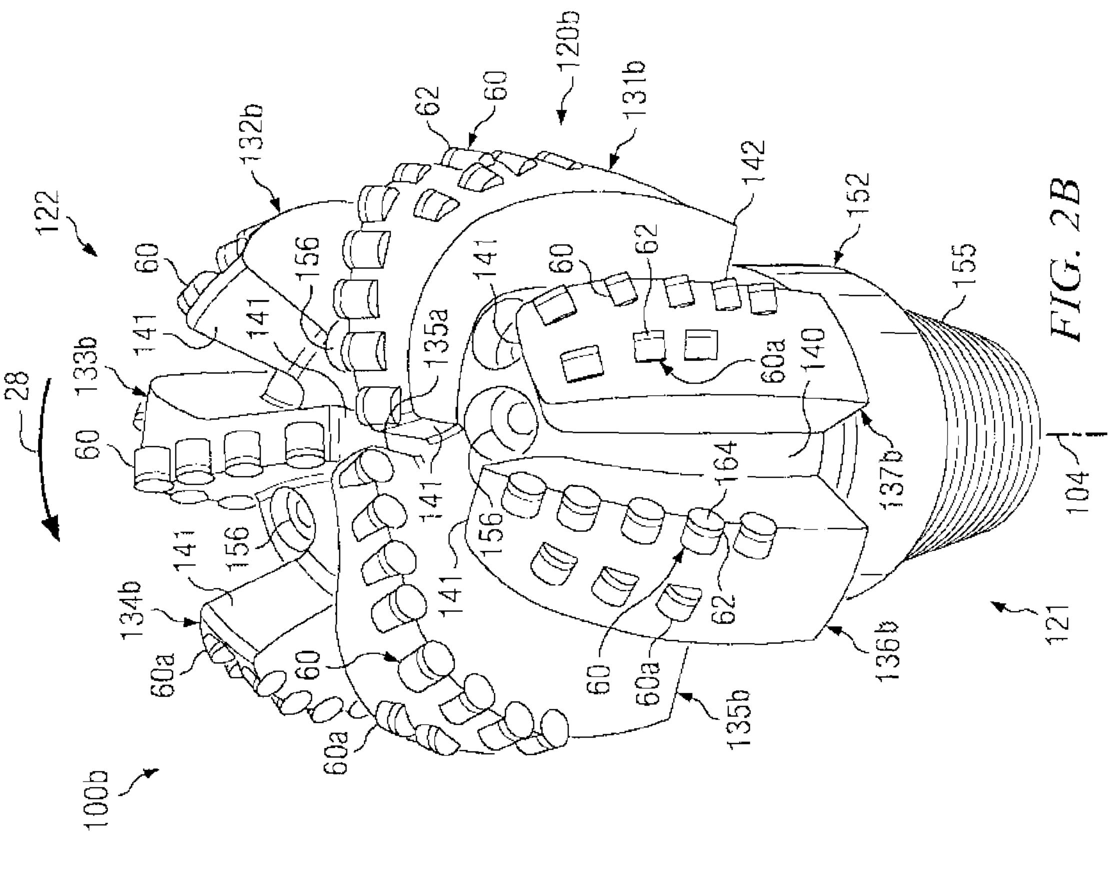
FIG. 2B is a schematic drawing showing an isometric view of a fixed cutter drill bit incorporating teachings of the present disclosure and oriented upwardly in a manner often used to model or design fixed cutter drill bits.

FIGS. 2A and 2B show rotary drill bits 100*a* and 100*b* which may be designed and manufactured using laying out a first type of cutter $60_h$ (not expressly shown), such as but not limited to a high impact resistant cutter and/or a high wear resistant cutter, on blades that are subject to high impact and at least a second type of cutter 601 (not expressly shown), such as but not limited to low impact resistant cutters and/or low wear resistant cutter on blades that are not subject to high impact during drilling and where cutters may further be laid out at locations to substantially reduce and/or eliminate imbalance forces based on multilevel force balancing techniques in accordance with teachings of the present disclosure. Rotary drill bits 100*a* and 100*b* have respective bit bodies 120*a* and 120*b*. Respective blades 131*a*-136*a* and 131*b*-136*b* may be disposed on exterior portions of bit bodies 120*a* and 120*b*.

For some applications, bit bodies 120*a* and 120*b* may be formed in part from a respective matrix of very hard materials associated with matrix drill bits. For other applications, bit bodies 120*a* and 120*b* may be machined from various metal alloys satisfactory for use in drilling wellbores in downhole formations. First end or uphole end 121 of each bit body 120*a* and 120*b* may include shank 152 with American Petroleum Institute (API) drill pipe threads 155 formed thereon. Threads 155 may be used to releasably engage respective rotary drill bit 100*a* and 100*b* with BHA 26 whereby each rotary drill bit 100*a* and 100*b* may be rotated relative to bit rotational axis 104 in response to rotation of drill string 24. Bit breaker slots 46 may be formed on exterior portions of upper portion or shank 152 for use in engaging and disengaging each rotary drill bits 100*a* and 100*b* with drill string 24. An enlarged bore or cavity (not expressly shown) may extend from first end 121 through shank 152 and into each bit body 120*a* and 120*b*. The enlarged cavity may be used to communicate drilling fluids from drill string 24 to one or more nozzles 156.

Second end or downhole end 122 of each bit body 120*a* and 120*b* may include a plurality of blades 131*a*-136*a* and 131*b*-136*b* with respective junk slots or fluid flow paths 140 disposed therebetween. Exterior portions of blades 131*a*-136*a* and 131*b*-136*b* and respective cutting elements 60 disposed thereon may define in part bit face disposed on exterior portions of bit body 120*a* and 120*b* respective proximate second end 122.

Blades 131*a*-136*a* may extend from second end or downhole end 122 towards first end or uphole end 121 of bit body 120*a* at an angle relative to exterior portions of bit body 120 and associated bit rotational axis 104. Blades 131*a*-136*a* may be described as having a spiral or a spiraling configuration relative to associated bit rotational axis 104. Blades 131*b*-136*b* disposed on exterior portions of bit body 120*b* may extend from second end or downhole end 122 towards first end or uphole end 121 aligned in a generally parallel configuration with respect to each other and associated bit rotational axis 104. See FIG. 2B.

Respective cutting elements 60 may be disposed on exterior portions of blades 131*a*-136*a* and 131*b*-136*b* in accordance with teachings of the present disclosure. Rotary drill bit 100*b* may include a plurality of secondary cutters or backup cutters 60*a* disposed on exterior portions of associated blades 131*b*-136*b*. For some applications each cutting element 60 and backup cutting element 60*a* may be disposed in a respective socket or pocket (not expressly shown) formed on exterior portions of associated blade 131*a*-136*a* or 131*b*-136*b* at locations selected in accordance with teachings of the present disclosure. Impact arrestors (not expressly shown) may also be disposed on exterior portions of blades 131*a*-136*a* and/or 131*b*-136*b* in accordance with teachings of the present disclosure. Additional information concerning impact arrestors may be found in U.S. Pat. Nos. 6,003,623, 5,595,252 and 4,889,017.

Fixed cutter rotary drill bits 100 and 100*a* may be described as having a "single blade" of cutting elements 60 disposed on the leading edge of each blade. Fixed cutter rotary drill bits 100*b* may be described as having "dual blades" of cutting elements disposed on exterior portions of each blade. Many of the features of the present disclosure are described with respect to fixed cutter rotary drill bits and other downhole drilling tools having a "single blade" of cutting elements. However, teachings of the present disclosure may also be used with fixed cutter rotary drill bits and downhole drilling tools such as reamers and hole openers which have "dual blades" of cutting elements disposed on associated blades. See FIGS. 2B and 4.

Cutting elements 60 may include respective substrates (not expressly shown) with respective layer 62 of hard cutting material disposed on one end of each respective substrate. Layer 62 of hard cutting material may also be referred to as "cutting layer" 62. Cutting surface 164 on each cutting layer 62 may engage adjacent portions of a downhole formation to form wellbore 30. Each substrate may have various configurations and may be formed from tungsten carbide or other materials associated with forming cutting elements for rotary drill bits.

Tungsten carbides include monotungsten carbide (WC), ditungsten carbide ($W_2C$), macrocrystalline tungsten carbide and cemented or sintered tungsten carbide. Some other hard materials which may be used include various metal alloys and cermets such as metal borides, metal carbides, metal oxides and metal nitrides. For some applications, cutting layers 62 and an associated substrate may be formed from substantially the same materials. For some applications, cutting layers 62 and an associated substrate may be formed from different materials. Examples of materials used to form cutting layers 62 may include polycrystalline diamond materials including synthetic polycrystalline diamonds. One or more of cutting element features including, but not limited to, materials used to form cutting elements 60 may be modified based on simulations using method 500*a*, 500*b* or method 600.

For some applications respective gage pads 150 may be disposed on exterior portions of each blade 131*a*-136*a* and 131*b*-136*b* proximate respective second end 142. For some applications gage cutters 60*g* may also be disposed on each blade 131*a*-136*a*. Additional information concerning gage cutters and hard cutting materials may be found in U.S. Pat. Nos. 7,083,010, 6,845,828, and 6,302,224.

Rotary drill bit 100*a* as shown in FIG. 2A may be generally described as having three primary blades 131*a*, 133*a* and 135*a* and three secondary blades 132*a*, 134*a* and 136*a*. Blades 131*a*, 133*a* and 135*a* may be described as "primary blades" or "major blades" because respective first ends 141 of each blade 131*a*, 133*a* and 135*a* may be disposed closely adjacent to associated bit rotational axis 104. Blades 132*a*, 134*a* and 136*a* may be generally described as "secondary blades" or "minor blades" because respective first ends 141 may be disposed on downhole end 122 spaced from associated bit rotational axis 104.

Rotary drill bit 100*b* as shown in FIG. 2B may be generally described as having three primary blades 131*b*, 133*b* and 135*b*. Rotary drill bit 100*b* may also include four secondary blades 132*b*, 134*b*, 136*b* and 137*b*. However the present disclosure is not limited to drill bits having the described number of primary or secondary blades and additional numbers of primary or secondary blades may be present such as but not limited to the embodiments depicted in FIGS. 7A-7B, 8A-8B, 9A-9B, 22A, 24A, 28-30 and 32-34.

Blades 131*a*-136*a* and 131*b*-137*b* may be generally described as having an arcuate configuration extending radially from associated bit rotational axis 104. The arcuate configuration of the blades 131*a*-136*a* and 131*b*-137*b* may cooperate with each other to define in part generally cone shaped or recessed portion 160 disposed adjacent to and extending radially outward from associated bit rotational axis 104. Recessed portion 160 may also be described as generally cone shaped. Exterior portions of blades 131-136 associated with rotary drill bit 100 along with associated cutting elements 60 disposed thereon may also be described as forming portions of the bit face or cutting disposed on second or downhole end 122. Junk slots 140 may be disposed between two adjacent blades such as 131 and 132, 131 and 136 and others.

Various configurations of blades and cutting elements may be used to form cutting structures for a rotary drill bit or other downhole drilling tool in accordance with teachings of the present disclosure. See, for example, rotary drill bits 100, 100*a* and 100*b*, core bit 500 and reamer 600. For some applications, the layout or respective locations for installing each cutting element on an associated blade may start proximate a nose point on one of the primary blades (not expressly depicted).

Figure 3:
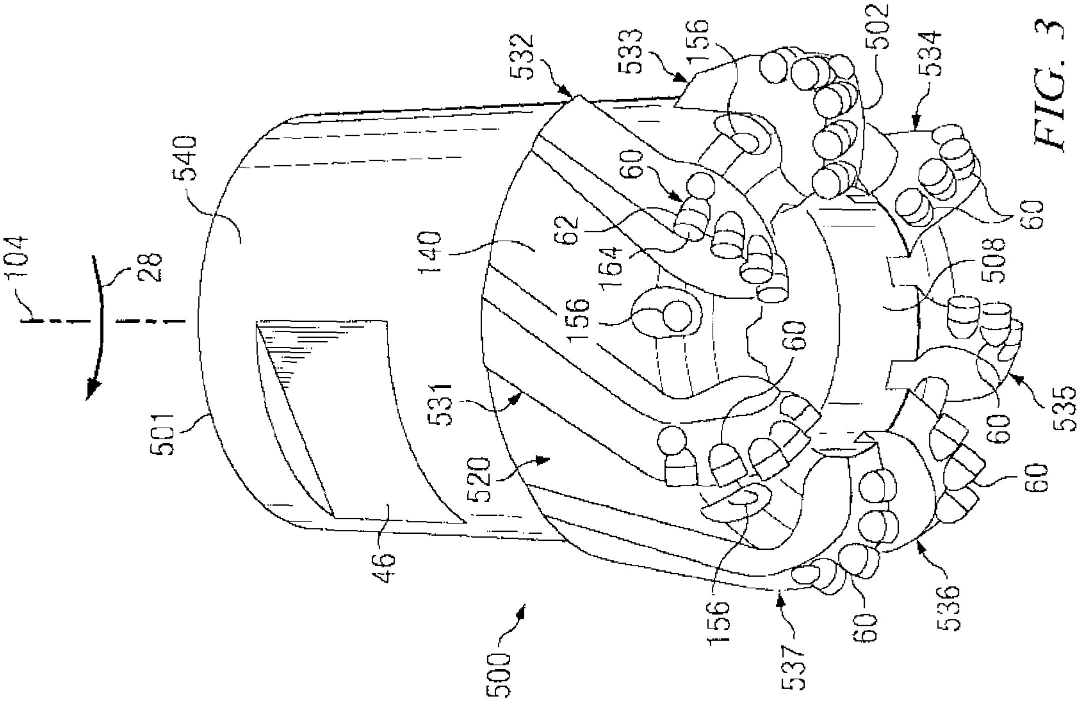
FIG. 3 is a schematic drawing in elevation showing one example of a core bit incorporating teachings of the present disclosure.

Core bit 500 as shown in FIG. 3 may be generally described as having bit body 520 with shank 540 extending therefrom. Core bit 500 may have a generally longitudinal bore or passageway 508 extending from first end 501 through core bit 500 to second end 502. The longitudinal bore 508 may be generally aligned and disposed consistent with associated bit rotational axis 104. Interior portions of longitudinal bore 508 (not expressly shown) may be modified to retain a sample or "core" from a downhole formation therein. A plurality of blades 531-537 may be disposed on exterior portions of bit body 520. Junk slots 140 may be disposed therebetween. A plurality of at least two types of cutting elements, such as but not limited to $60_h$ and $60_l$ may be disposed on exterior portions of blades 531-537 in accordance with teachings of the present disclosure. Placing different types of cutting elements on exterior portions of respective blades 530 depicted as blades numbered as 531-537 using teachings of the present disclosure based on the impact on each respective blade and in some embodiments further in combination with multilevel force balancing techniques such as those described in copending PCT Patent Application entitled "Multilevel Force Balanced Downhole Drilling Tools and Methods," Serial No. PCT/US09/067263, filed Dec. 4, 2009, may reduce or eliminate effects of impact forces and/or reduce wear on a core bit and/or substantially reduce bit imbalance forces and excessive vibration of the drill string. According to some embodiments of the disclosure, blades $530_h$ that are subject too high impact may be designed to be thicker than blades $530_1$ that are not subject to high impact, thereby changing the geometry and configuration of junk slots 140 and changing or modifying fluid flow characteristics of core bit 500.

Figure 4:
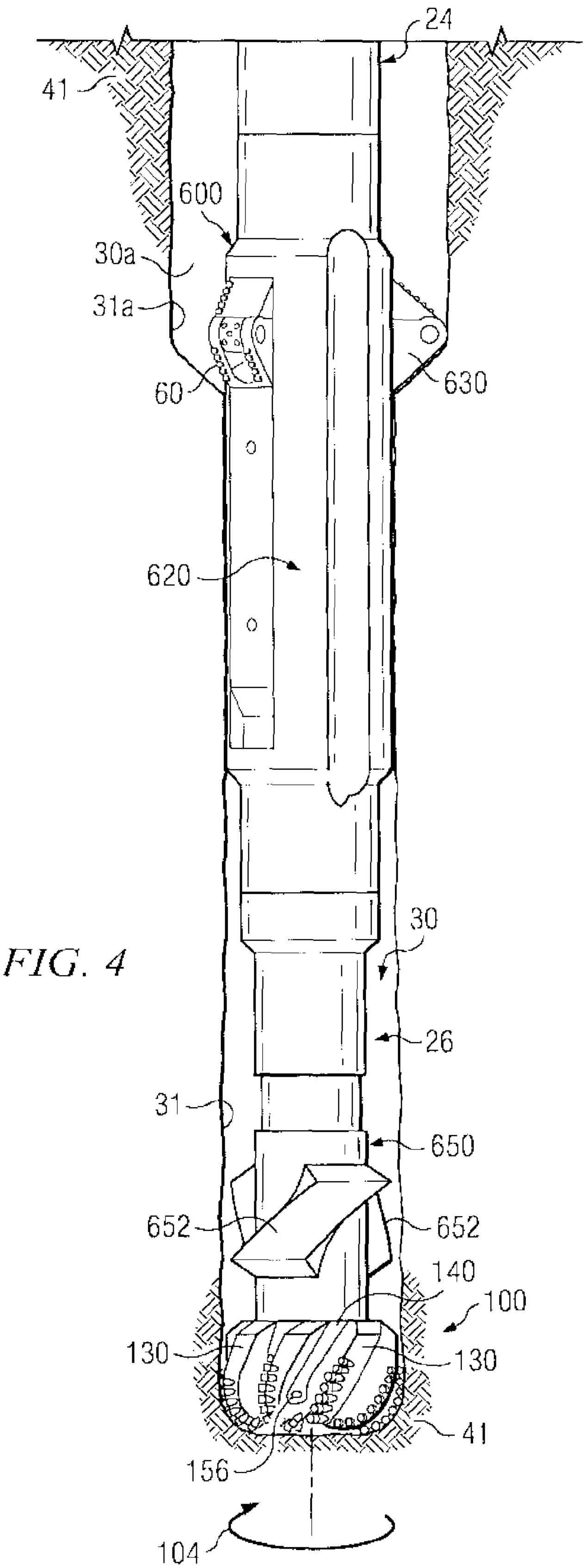
FIG. 4 is a schematic drawing in elevation and in section with portions broken away showing various downhole drilling tools including, but not limited to, a reamer or hole opener and a fixed cutter drill bit incorporating teachings of the present disclosure.

Reamer 600 as shown in FIG. 4 may sometimes be referred to as a "hole opener". Reamer 600 may include generally cylindrical body 620 with a plurality of retractable arms 630 may be disposed on exterior portions thereof. Generally cylindrical body 620 may include a longitudinal bore extending therethrough (not expressly shown) to communicate drilling fluids from drill string 24 to rotary drill bit 100. Cylindrical body 620 may also include a rotational axis (not expressly shown) generally aligned with rotational axis 104 of rotary drill bit 100 while drilling portions of a straight wellbore such as wellbore 30 shown in FIG. 1. Various mechanisms and techniques may be satisfactorily used to extend and retract retractable arms 630 relative to generally cylindrical body 620.

A plurality of at least two types of cutting elements 60, such as but not limited to $60_h$ and $60_l$, may be disposed on exterior portions of blades 130 in accordance with teachings of the present disclosure based on the impact on and/or loading and/or volume of rock removed by each respective blade 130 while drilling. Respective cutting elements 60 may be further disposed on each blade 130 at respective locations based at least in part on multilevel force balancing techniques. Junk slots 140 may be disposed between two adjacent blades 130. According to some embodiments of the disclosure, blades $130_h$ that are subject to high impact may be designed to be thicker than blades $130_1$ that are not subject to high impact, thereby changing the geometry and configuration of junk slots 140 and changing or modifying fluid flow characteristics of reamer 600. Retractable arms 630 may extend radially outward so that engagement between cutting elements 60 and adjacent portions of downhole formation may large or increase the diameter of wellbore 30. The increased diameter portion is designated as 31*a* in FIG. 4.

Various downhole drilling tools including, but not limited, near bit sleeve or near bit stabilizer 650 may be disposed between reamer 600 and rotary drill bit 100. Stabilizer 650 may include a plurality of blades 652 extending radially therefrom. Engagement between exterior portions of blades 652 and adjacent portions of wellbore 30 may be used to maintain desired alignment between rotary drill bit 100 and adjacent portions of BHA 26.

FIG. 5A shows rotary drill bit 100 forming wellbore 30 through first formation layer 41 into second formation layer 42. Formation layer 41 may be described as "softer" or "less hard" when compared with downhole formation layer 42. Various details associated with designing and manufacturing rotary drill bit 100 by selecting locations for laying out cutting elements 60 on different zones (locations) of a bit face profile in relation to a spiral direction of bit rotation about bit rotational axis 104 and in some embodiments by further using multilevel force balancing techniques incorporating teachings of the present disclosure will be further discussed at least with respect to FIGS. 5A, 13A-27.

As shown in FIG. 5A, exterior portions of rotary drill bit 100 which contact adjacent portions of a downhole formation may be described as a "bit face" or "bit face profile." Bit face profile 126 of rotary drill bit 100 may include various zones or segments such as but not limited to a generally cone shaped segment or cone zone 160, nose segment or nose zone 170, shoulder or outer segment 180, gage or gage zone 150, each zone or segment on a bit face defined in part by respective portions of associated blades. Different blades 131-138 or $130_1$-$130_{10}$ are shown at least in FIGS. 3A-3B, 7A-7B, 8A-8B, 9A-9B, 22A, 23A, 25A, 28-30 and 32-34.

Generally convex or outwardly curved nose segment or nose zone 170 may be formed on exterior portions of each blade 131-138 or $\mathbf{130_1}$-$\mathbf{130_{10}}$ adjacent to and extending from cone shaped segment 160. Respective shoulder segments 180 may be formed on exterior portions of each blade 131-138 or $\mathbf{130_1}$-$\mathbf{130_{10}}$ extending from respective nose segments 170. Each shoulder segment 180 may terminate proximate a respective gage cutter 60*g* or gage pad 150 on each blade 131-138 or $\mathbf{130_1}$-$\mathbf{130_{10}}$. In accordance with teachings of the present disclosure, as shown in FIG. 5A, a plurality of cone cutters 60*c* may be disposed on cone or cone zone 160, a plurality of nose cutters 60*n* may be disposed on nose segment or nose zone 170, a plurality of shoulder cutters 60*s* may be disposed on shoulder or shoulder zone or outer segment 180 and a plurality of gage cutters 60*g* may be disposed on gage or gage zone 150. Cutters 60*c*, 60*n*, 60*g* and 60*s* may be selected from a first type of cutter or a second type cutter based on placement of cutters on blades subject to high impact or blades subject to low impact.

Exterior portions of blades 131-138 or $\mathbf{130_1}$-$\mathbf{130_{10}}$ and cutting elements 60 may be projected onto a radial plane to form a bit face profile or a composite bit face profile. Composite bit face profile 110 associated with rotary drill bit 100 are shown at least in FIGS. 5B, 12A-12C, 13B, 13D, 13F, 13H 14B, 16B, 16D, 18A, 22B, 23B and 25B.

Figure 5B:
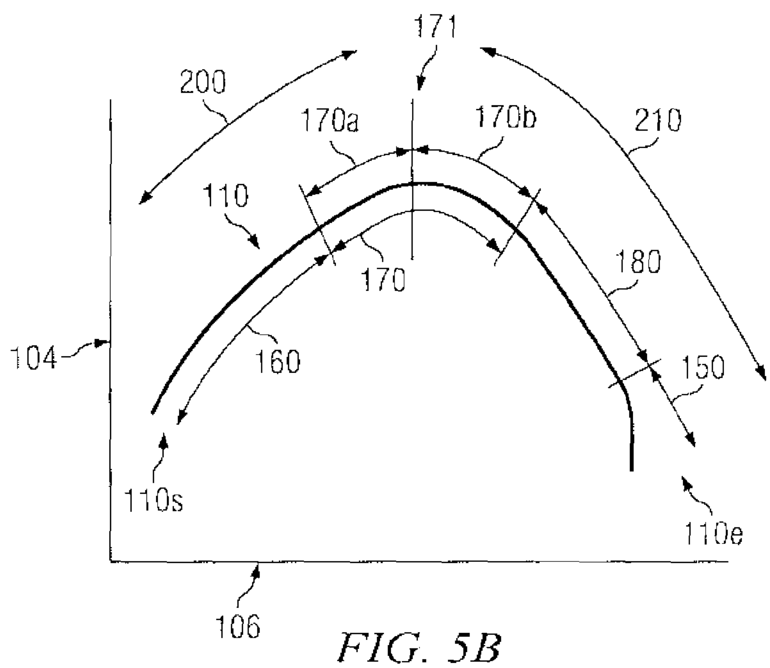
FIG. 5B is a schematic drawing showing an example bit face profile, during downhole drilling, depicting the location of various zones and respective cutting elements such as inner zone, outer zone, cone zone, nose zone, shoulder zone and gage zone used to depict one example of prior techniques for installing different types of cutting elements in different zone on a fixed cutter rotary drill bit.

FIG. 5B depicts a bit face profile 110 also referred to as a cutting face profile describing various cutting structures including blades and associated cutting elements projected onto a radial plane extending generally parallel with an associated bit rotational axis 104 and depicts various zones on a bit face including cone zone 160, nose zone 170, shoulder zone 180 and gage zone 150 with respect to bit rotational axis 104 and nose point 171. Nose point 171 may be defined as the location on bit face profile 110 within nose zone 170 with maximum elevation as measured on bit rotational axis 104 (y axis) from reference line 106 (x axis). Nose zone 170 may be comprise at least two portions, a first portion 170*a* comprising locations from the nose point toward the bit rotational axis 104 or the beginning of bit face profile 110*s* and a second portion 170*b* comprising locations from nose point 171 toward end of the bit face profile 110*e*. "Inner zone" 200 may comprise portions of bit profile 110 beginning from 110*s* up to nose point 171 and "outer zone" 210 may comprise portions of bit profile 110 beginning from nose point 171 up to 110*e*.

"Inner cutters" 60*i* may be described as cutters that are placed on the inner side of nose point 171 and "outer cutters" 60*o* may be described as cutters that are placed on the outer side of nose point 171, (i.e., cutters 60 that may be placed on bit face profile 110 from nose point 171 to the end of bit profile 110*e*), and may include nose cutters 60*nb* that are located on second portion 170*b* of nose zone 170, cutters 60*s* of shoulder zone 180, and gage cutters 60*g*.

Cutting elements or nose cutters 60*n* may be disposed at selected locations on nose segments 170 of respective blades 131-138 in accordance with teachings of the present disclosure to initially contact a downhole formation and avoid creating undesired imbalance force acting on drill bit 100. In some embodiments, two or more cutting elements may be optimally located on respective blades to make approximately simultaneous contact with the downhole end of a wellbore and substantially reduce and/or eliminate imbalance forces and/or vibrations acting on an associated drill bit and drill string.

The present disclosure, in some embodiments, describes design methods for designing rotary drill bits and other well bore tools comprising simulations of rotary drill bits 90 or 100 or other downhole drilling tools such as core bit 500 or reamer 600 for forming wellbores and may comprise: 1) inputting downhole formation characteristics and drilling tool characteristics (such as but not limited to formation properties, bit size, International Association of Drilling Contractors code (IADC code), number of blades etc.); 2) inputting drilling parameters or drilling conditions (such as but not limited to RPM, ROP, WOB, formation compressive strength etc.); and 3) simulating downhole drilling motion based on these parameters. Simulations of drilling may be analyzed to: 4) determine which blades are subject to maximum impact or high impact and/or higher loadings and/or which blades remove larger volumes of rock or formation material (i.e., determine blades $\mathbf{130_h}$) and to determine which blades are subject to lower levels of impact during drilling and/or lower loadings and/or which blades remove smaller volumes of rock or formation material (i.e., determine blades $\mathbf{130_l}$). This information may then be used to: 5) determine which type of cutters (such as high or low impact resistant, high or low wear resistant, expensive or inexpensive cutters) may be placed on each respective blade based on if the respective blade is a $\mathbf{130_l}$ or a $\mathbf{130_h}$ blade. For example, in one embodiment, high impact-resistant cutters such as $\mathbf{60_h}$ may be places on blades $\mathbf{130_h}$ that are subject to high impact during the drilling simulation and cutters such as $\mathbf{60_l}$ that may be inexpensive and/or not built for impact resistance may be places on blades $\mathbf{130_l}$ that are not subject to high impact during the drilling simulation.

A simulation method may also comprise at step 2) further laying out cutters based on criteria for multilevel force balance as described in copending PCT patent application entitled "Multilevel Force Balanced Downhole Drilling Tools and Methods," Serial No. PCT/US09/067263, filed Dec. 4, 2009, to reduce or eliminate effects of impact forces and/or substantially reduce or eliminate bit imbalance forces and excessive vibration of the drill string.

Once a determination of blades for laying out different types of cutters is made, the method may comprise: 6) laying out different types of cutters on different blades based on the determination in steps 4) and 5); and 7) running another simulation to determine drilling performance following placement of cutters as in step 6). The second simulation may be also used to modify and adjust cutter layout and/or determination of blades for laying out different cutters.

For some embodiments fixed cutter rotary drill bits and other downhole drilling tools may be designed and manufactured based on simulations of non-uniform downhole drilling. In such embodiments, another step may involve 8) performing additional drilling simulations to evaluate non-uniform drilling and/or transition drilling (such as drilling from a first downhole formation into a second downhole formation). This simulation may be used to determine blades that are subject to high impact upon entry into a second formation. This may be used to modify layout of different types of cutters on different respective blades based on impact to blades during non-uniform drilling. In some embodiments, the second series of simulations may also be used to evaluate layout of cutters for multilevel force balancing during the non-uniform drilling. Evaluating the simulations for non-uniform downhole formations may result in modification of cutter layout based on 1) impact to blades as well as in some embodiments further based on 2) multilevel force balance.

A series of iterative simulations may be performed to determine ideal locations for cutters based on 1) layout of different types of cutters on different blades based on the amount of impact a respective blade is subject to during the drilling (into a first formation and then into a second formation) and in some embodiments also based on 2) laying out of cutters into cutter groups and cutter sets based on one or more levels of force balance. Function of rotary drill bits and other downhole drilling tools, including forces acting on the downhole tool, performance, efficiency and/or wear of a well tool may then be evaluated based on such a simulation. Embodiments relating to simulations based on designing thicker blades based on the impact on a blade and thereby modifying junk slot and fluid flow characteristics of well tools are described later in FIGS. 31-34.

In general, simulations of rotary drill bits 90 and 100 or other downhole drilling tools such as core bit 500 or reamer 600 forming wellbores may use at least six parameters or conditions to define or describe downhole drilling motion. See FIGS. 6A and 6B and also FIG. 31. These parameters include rotational speed in revolutions per minutes (RPM) and rate of penetration (ROP) relative to an associated rotational axis. Tilt rate relative to an x axis and a y axis extending from an associated rotational axis 104 may be used during simulation of directional drilling. See wellbore 30*a* in FIG. 1. The rate of lateral penetration along an x axis and the rate of lateral penetration along a y axis may also be used to simulate forming a wellbore in accordance with teachings of the present disclosure. The x axis and y axis may extend perpendicular from each other and from an associated bit rotational axis 104. For simulation purposes, rate of penetration may remain constant and weight on bit (WOB) may vary. During actual drilling of a wellbore at a field location, weight on bit may often be maintained relatively constant and rate of penetration may vary accordingly depending upon various characteristics of associated downhole formations.

In embodiments where a simulation method of the present disclosure may comprise selecting locations for laying out cutters based on criteria for multilevel force balance simulations may include assigning associated cutting elements to respective "cutter groups" such as two cutter groups or pair cutter groups, three cutter groups, four cutter groups, five cutter groups, etc. as described in PCT Patent Application entitled "Multilevel Force Balanced Downhole Drilling Tools and Methods," Serial No. PCT/US09/067263, filed Dec. 4, 2009. For example, cutting elements in each cutter group may be force balanced, which may be referred to as "level one force balancing." Cutting elements in each neighbor cutter group may also be force balanced, which may be referred to as "level two force balancing." Cutting elements disposed on exterior portions of the associated rotary drill bit or other downhole drilling tool may then be divided into respective cutter sets. Each cutter set may include at least two force balanced cutter groups. Cutting elements in each cutter set may also be force balanced, which may be referred to as "level three force balancing." Neighbor cutting elements disposed on an associated bit face profile or cutting face profile may be divided into respective groups of either three or four cutting elements per group. The cutting elements in each neighbor cutter group may be force balanced, which may be referred to as "level four force balancing." A final level or "level five force balancing" may include simulating forces acting on all cutting elements when engaged with a generally uniform and/or a generally non-uniform downhole formation, which may be referred to as "all cutter force level balancing." Other details on multilevel force balancing techniques are described later in this application at least in FIGS. 10A-27.

Force balancing may be evaluated after each level of force balancing. One or more downhole drilling tool characteristics may be modified and simulations repeated to optimize downhole drilling tool characteristics such as size, type, number and location of associated cutting elements and other characteristics of fixed cutter rotary drill bits or other downhole drilling tools to substantially reduce or eliminate imbalance forces during transition drilling or non-uniform downhole drilling. Variations in forces acting on each cutting element and resulting imbalance forces versus depth of penetration of an associated downhole drilling tool may be used to design associated cutting elements, cutting structures and other downhole tool characteristics.

Further aspects of the present disclosure may include one or more algorithms or procedures for laying out or selecting locations for installing respective cutting elements on exterior portions of a rotary drill bit or other downhole drilling tool based on the present teachings. A fixed cutter rotary drill bit, core bit, reamer or other downhole drilling tool that may have different types of cutting elements disposed on different blades based on the impact a blade is subject to during drilling may reduce or minimize impact forces on the downhole drilling tool and wherein the downhole drilling tool may be further multilevel force balanced to have increased stability and a higher rate of penetration for the same general downhole drilling conditions (weight on bit, rate of rotation, etc.) as compared with a more traditionally designed tool where different types of cutters may be placed based on bit profile zone rather than on different blades and based on more traditional forced balanced drilling tools.

Many prior fixed cutter rotary drill bits and other downhole drilling tools may be described as having different types of cutters placed in different bit profile zones, such as inner zone, nose zone and outer zone. Prior art drill bits and other downhole tools may be force balanced for only one level or one set of downhole drilling conditions and often assuming uniform drilling conditions rather than non-uniform downhole drilling.

Figure 6A:
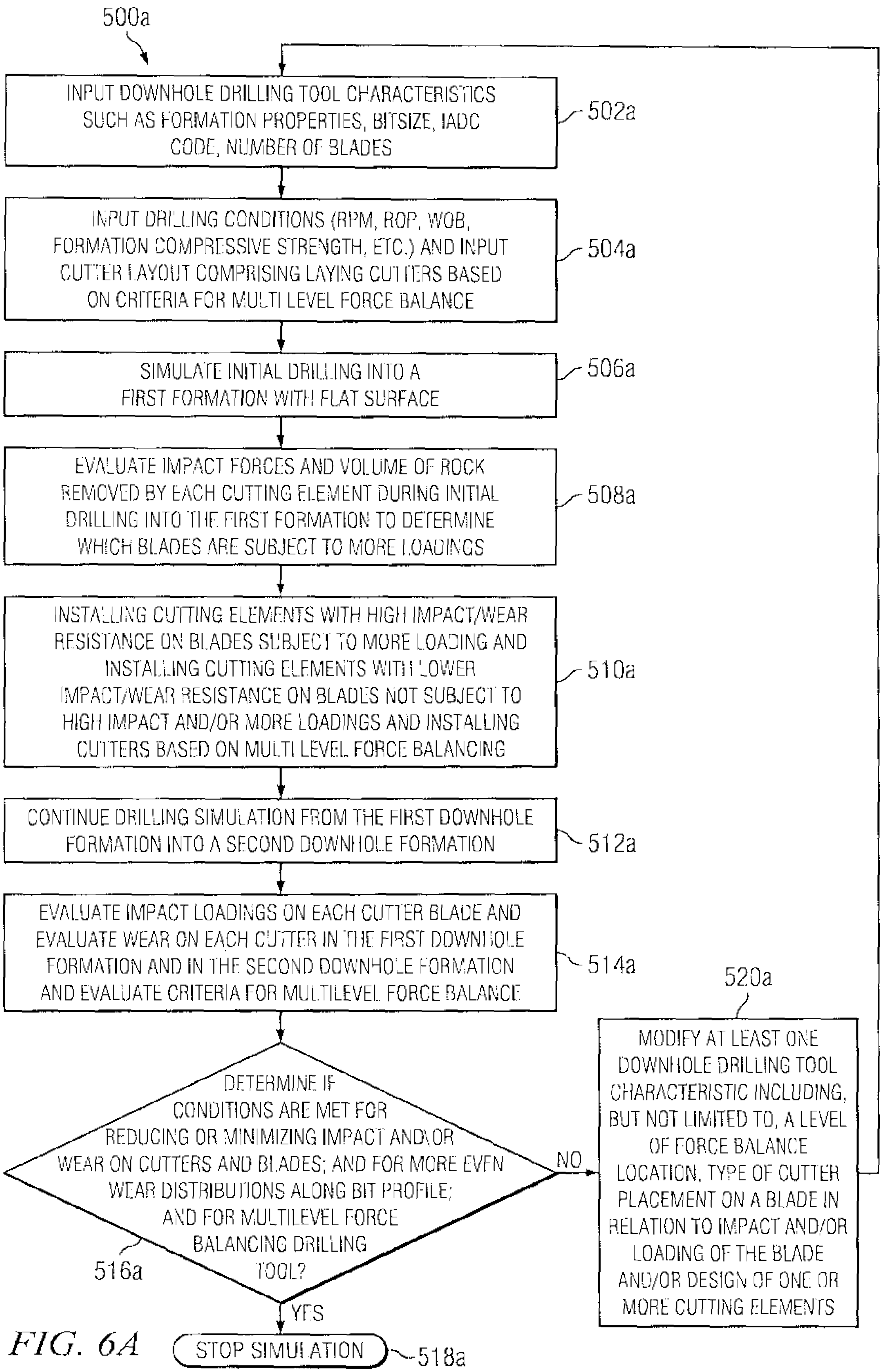
FIGS. 6A and 6B are process diagrams showing an example each of techniques or procedures which may be used to design various downhole drilling tools in accordance with teachings of the present disclosure.
Figure 6B:
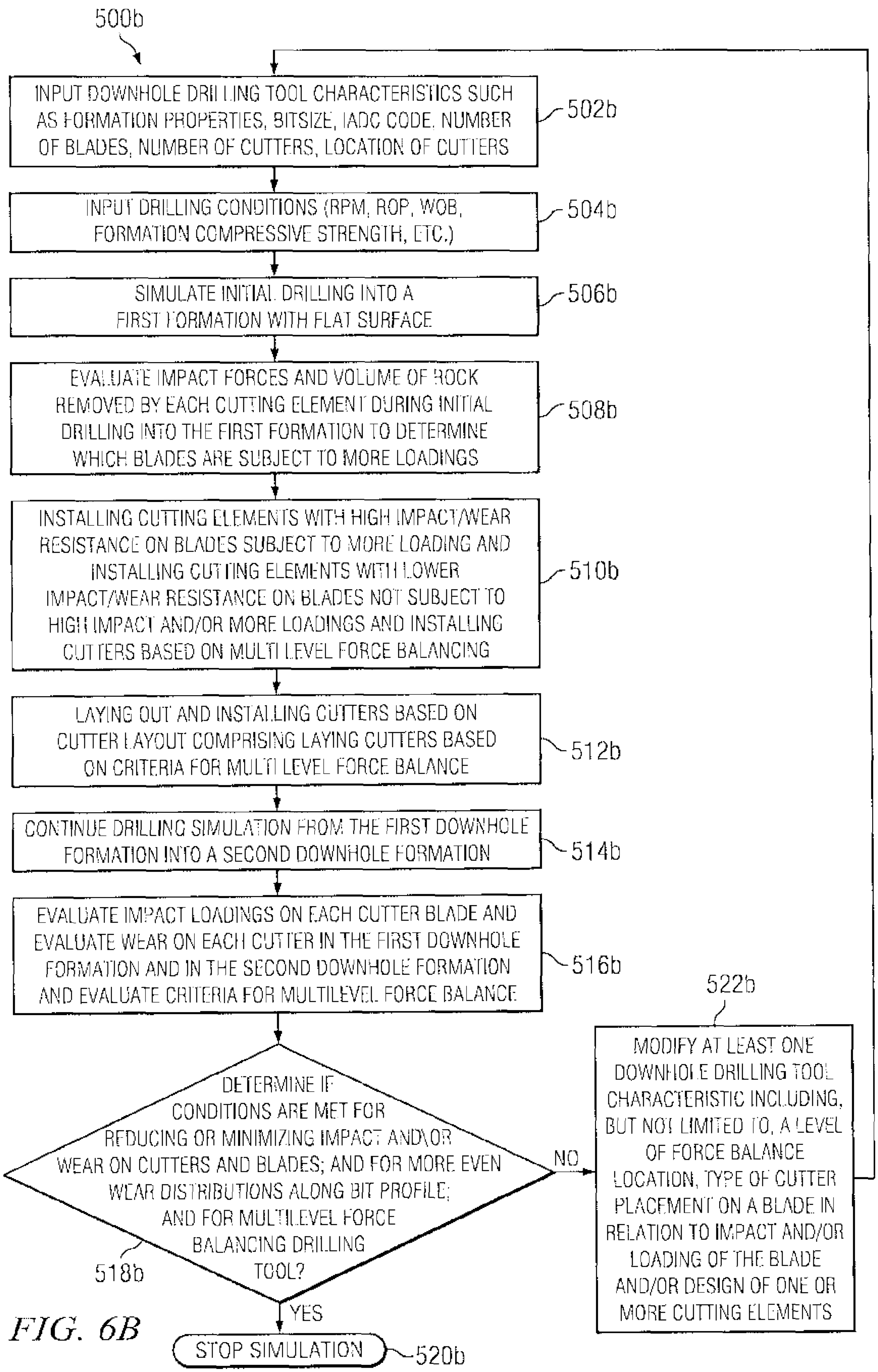

Accordingly, in some embodiments, the present disclosure describes methods to design and manufacture a rotary drill bit operable to form a wellbore. FIGS. 6A and 6B show example embodiments of simulation methods which may be used to design fixed cutter rotary drill bits and other downhole drilling tools based at least in part on laying out a plurality of a first type of cutters $\mathbf{60}_h$ and a plurality of a second type of cutters $\mathbf{60}_l$ on different blades based on the impact the respective blade is subject during drilling, the loading a respective blade is subject to and/or the volume of rock removed by a respective blade to substantially reduce, minimize impact forces and to substantially reduce, minimize wear on cutters and other parts of a rotary drill bit and other downhole drilling tools.

As shown in FIG. 6A, an example method 500*a* may begin at step 502*a* by inputting into a computer (a general purpose computer or a special purpose computer (not expressly shown)) various characteristics of a downhole drilling tool such as rotary drill bits 100, core bit 500 and/or reamer 600 such as but not limited to bit size, IADC code, number of blades. Examples of such downhole drilling tool characteristics are shown in Appendix A at the end of this Written Description.

At step 504*a* various downhole drilling conditions such as RPM, ROP, WOB, formation compressive strength, may be inputted into a computer. Examples of such downhole drilling conditions are shown in Appendix A. In some embodiments, at step 504*a*, additional conditions that may be inputted into a computer may comprise inputting layout of cutters based on criteria for multilevel force balancing including laying out cutters in cutter groups and cutter sets.

At step 506*a* a drilling simulation may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi.

Parameters such as impact on each blade, volume of rock removed by each blade and loadings on each blade may be evaluated at step 508*a* during the simulated drilling onto the first downhole formation. Respective forces acting on cutting elements disposed on the fixed cutter drill bit or other downhole drilling tool may also be evaluated at step 508*a* during initial contact between each cutting element and the first downhole formation. Step 508*a* may also comprise evaluating respective forces acting on each cutting element versus depth of penetration of the rotary drill bit or other downhole drilling tool into the first downhole formation. The resulting forces acting on the associated rotary drill bit or other downhole drilling tool may then be calculated as a function of drilling depth for multilevel force balancing criteria (step not expressly shown).

Step 510*a* may comprise installing a first type of cutting elements having impact resistance and/or wear resistance in blades that are subject to more impact and/or more loadings and/or blades that remove more rock volume and cutting elements having lower impact resistance or inexpensive cutters may be installed on blades that are subject to low impact and/or less loadings and/or blades that remove lesser rock volume and installing cutters further based on multilevel force balancing criteria.

The drilling simulation may continue to step 512*a* corresponding with forming the wellbore through the first downhole formation and into a second downhole formation.

Step 514*a* may comprise evaluating parameters such as impact on each blade, volume of rock removed by each blade and loadings on each blade may be evaluated at during the simulated drilling in the first downhole formation and in the second downhole formation. Step 514*a* may also comprise evaluating respective forces acting on each cutting element engaged with the first downhole formation and respective forces acting on each cutting element engaged with the second downhole formation may then be evaluated. Resulting forces acting on the fixed cutter rotary drill bit or other downhole drilling tool may then be evaluated as a function of drilling depth (step not expressly depicted). Resulting forces acting on the fixed cutter rotary drill bit or other downhole drilling tool may be displayed as a function of drilling depth (step not shown).

If the resulting forces acting on the fixed cutter rotary drill bit or other downhole drilling tool meet design requirements for minimized, decreased or reduced impact forces and resultant wear on the bit and/or cutters and optimized force balancing of the drilling tool at step 516*a*, the simulation may stop at step 518*a*. The downhole drill tool characteristics may then be used to design and manufacture the fixed cutter rotary drill bit or other downhole drilling tool in accordance with teachings of the present disclosure.

If the resulting forces acting on the fixed rotary cutter drill bit or other downhole drilling tool do not meet design requirements for a drilling tool having impact forces, reduced, decreased or minimized wear, and optimized force balance at step 516*a*, the simulation may proceed to step 520*a* and at least one downhole drilling tool characteristic may be modified. For example parameters such as but not limited to, the type of cutter disposed on a respective blade may be varied; material of cutter, type of cutter, layout of cutter with respect force balanced cutter groups or cutter sets may be modified. Additionally, the configuration, dimensions and/or orientation of one or more blades disposed on exterior portions of the downhole drilling tool may be modified. In addition, the number of cutters, location of cutters may also be modified.

The simulation may then return to step 502*a* and method 500*a* may be repeated. If the simulations based on the modified downhole drilling tool characteristics are satisfactory at step 516*a*, the simulation may stop. If the conditions for a drilling tool having optimized balanced forces and optimized wear resistance of blades and/or impact resistance are not satisfied at step 516*a*, further modifications may be made to at least one downhole drilling tool characteristic at step 520*a* and the simulation continued starting at step 502*a* and method 500*a* repeated until the conditions for minimized impact forces, minimized wear and optimized force balance at a level of force balance of a downhole drilling tool are met at step 516*a*.

Another example method 500*b* is shown in FIG. 6B which may begin at step 502*b* by inputting into a computer (a general purpose computer or a special purpose computer (not expressly shown)) various characteristics of a downhole drilling tool such as rotary drill bits 100, core bit 500 and/or reamer 600 such as but not limited to bit size, IADC code, number of blades, number of cutters, location of cutters. Examples of such downhole drilling tool characteristics are shown in Appendix A at the end of this Written Description.

At step 504*b* various downhole drilling conditions such as RPM, ROP, WOB, formation compressive strength, may be inputted into a computer. Examples of such downhole drilling conditions are shown in Appendix A.

At step 506*b* a drilling simulation may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi.

Parameters such as impact on each blade, volume of rock removed by each blade and loadings on each blade may be evaluated at step 508*b* during the simulated drilling onto the first downhole formation.

Step 510*b* may comprise installing a first type of cutting elements having impact resistance and/or wear resistance in blades that are subject to more impact and/or more loadings and/or blades that remove more rock volume and cutting elements having lower impact resistance or inexpensive cutters may be installed on blades that are subject to low impact and/or less loadings and/or blades that remove lesser rock volume and installing cutters further based on multilevel force balancing criteria.

Step 512*b* may comprise laying out different type of cutting elements of step 510*b* based on criteria for multilevel force balancing including laying out cutters in cutter groups and cutter sets.

The drilling simulation may continue to step 514*b* corresponding with forming the wellbore through the first downhole formation and into a second downhole formation.

Step 516*b* may comprise evaluating parameters such as impact on each blade, volume of rock removed by each blade and loadings on each blade may be evaluated during the simulated drilling in the first downhole formation and in the second downhole formation. Step 516*b* may also comprise evaluating respective forces acting on each cutting element engaged with the first downhole formation and respective forces acting on each cutting element engaged with the second downhole formation may then be evaluated. Resulting forces acting on the fixed cutter rotary drill bit or other downhole drilling tool may then be evaluated as a function of drilling depth for multilevel force balancing criteria (step not shown).

If the resulting forces acting on the fixed cutter rotary drill bit or other downhole drilling tool meet design requirements for minimized, decreased or reduced impact forces and resultant wear on the bit and/or cutters and optimized force balancing of the drilling tool at step 518*b*, the simulation may stop at step 520*b*. The downhole drill tool characteristics may then be used to design and manufacture the fixed cutter rotary drill bit or other downhole drilling tool in accordance with teachings of the present disclosure.

If the resulting forces acting on the fixed rotary cutter drill bit or other downhole drilling tool do not meet design requirements for a drilling tool having impact forces, reduced, decreased or minimized wear, and optimized force balance at step 518*b*, the simulation may proceed to step 522*b* and at least one downhole drilling tool characteristic may be modified. For example parameters such as but not limited to, the type of cutter disposed on a respective blade may be varied; material of cutter, type of cutter, layout of cutter with respect force balanced cutter groups or cutter sets may be modified. Additionally, the configuration, dimensions and/or orientation of one or more blades disposed on exterior portions of the downhole drilling tool may be modified. In addition, the number of cutters, location of cutters may also be modified.

The simulation may then return to step 502*b* and method 500*b* may be repeated. If the simulations based on the modified downhole drilling tool characteristics are satisfactory at step 518*b*, the simulation may stop. If the conditions for a drilling tool having optimized balance forces and optimized cutting and wear on blade are not satisfied at step 518*b*, further modifications may be made to at least one downhole drilling tool characteristic at step 522*b* and the simulation continued starting at step 502*b* and method 500*b* repeated until the conditions for minimized impact forces, minimized wear and optimized force balance at a level of force balance of a downhole drilling tool are met at step 518*b*.

Figure 7A:
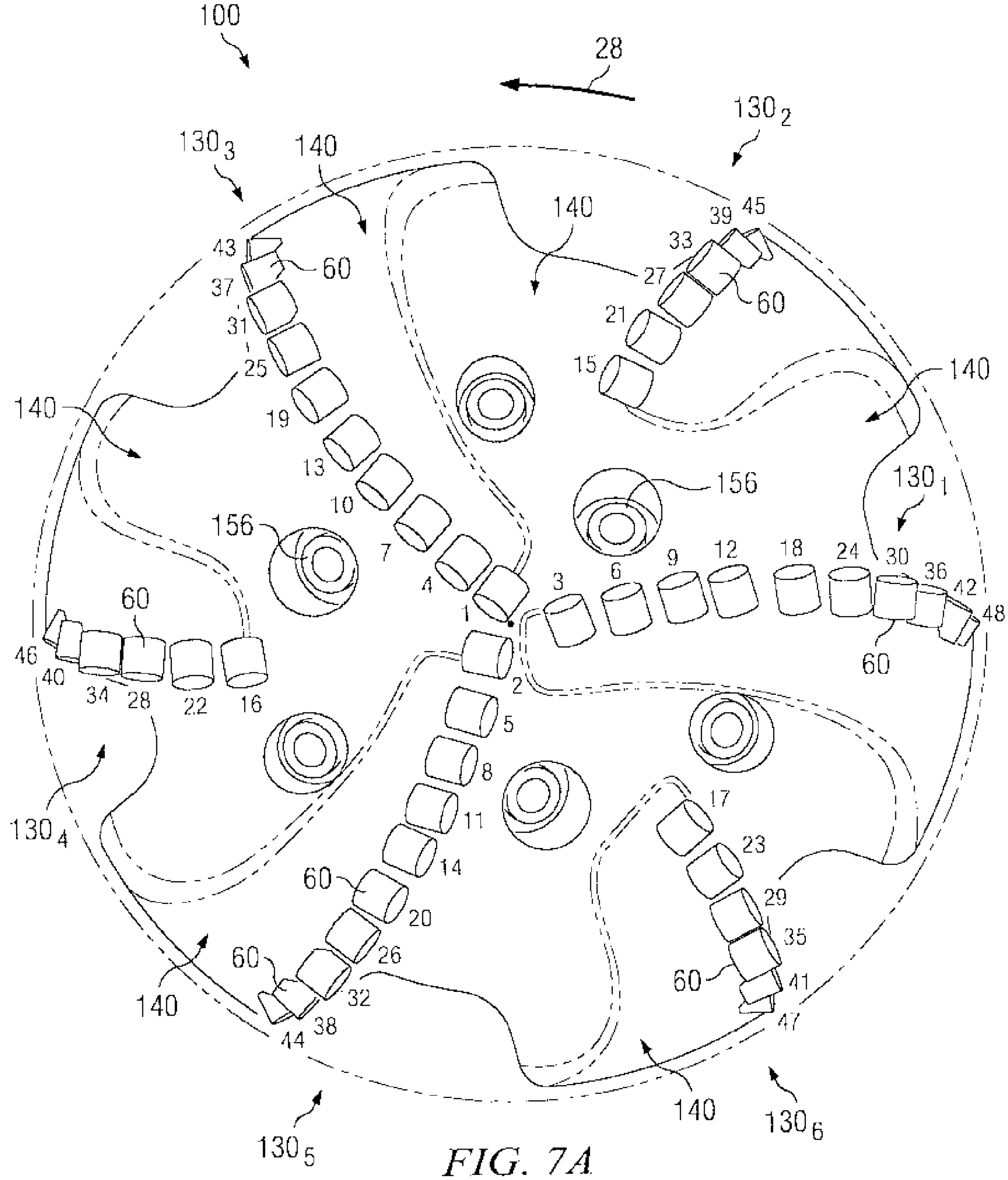

Simulations as described in methods 500*a* and 500*b* may be used for installing different cutting element on different blades as shown in an example depicted in FIGS. 7A-7D. FIG. 7A shows a schematic view of a bit face 100 with six blades 1301-1306 having cutting elements 60 numbered from 1-49 installed starting from the nose zone and having a multilevel force balancing with two cutter groups, with cutter set [(1 3 5), (2 4 6)] such as shown in method 500*a* (step 504*a*).

Figure 7B:
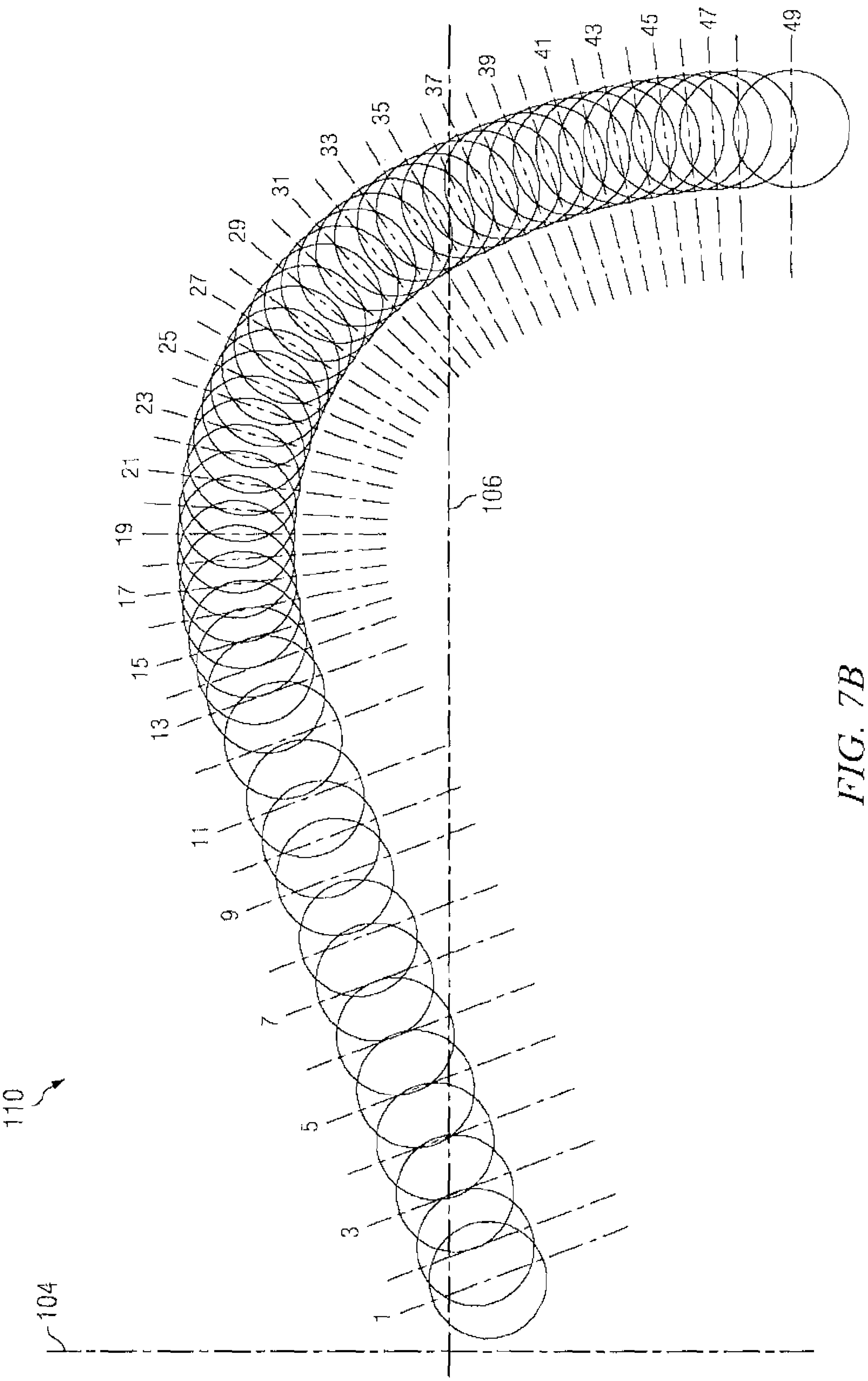

FIG. 7B depicts a schematic drawing showing the bit face profile 110 of cutting elements 60 located on bit face 100 of FIG. 7A showing location of various cutting elements 60 on different locations (zones) on a bit profile.

A composite bit face profile 110 as shown in FIG. 7B may be generally described as a projection of blades 130 (130$_1$-130$_6$) and associated cutting element 60 onto a radial plane passing through bit rotational axis 104.

Figure 7C:
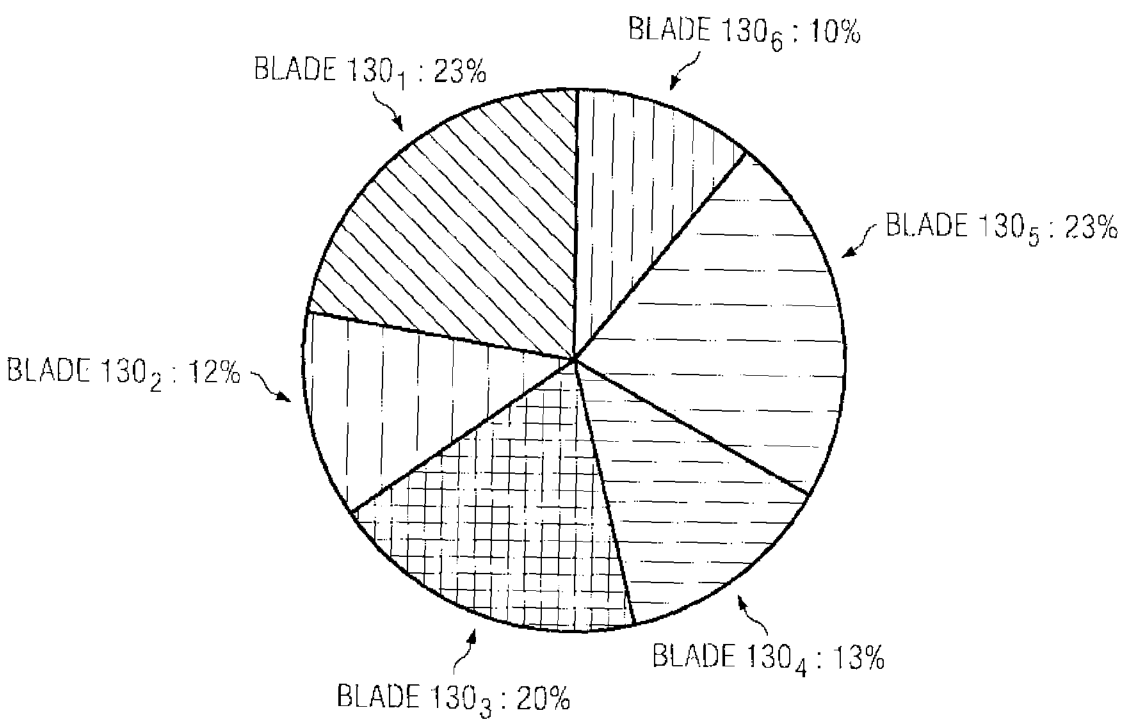

Following a drilling simulation and evaluation (e.g., steps 504 and 506 of method 500*a*/500*b*) to determine various parameters such as volume of rock removed by each of the six blades 130$_1$-130$_6$, FIG. 7C depicts volume of rock removed by each respective blade 130$_1$-130$_6$ of the six blade bit 100 shown in FIG. 7A.

FIG. 7C shows that for a specific example, blades 130$_1$, 130$_3$, and 130$_5$ are blades identified by a drilling simulation blades that remove maximum volume of rock, wherein blade 130$_1$ and blade 130$_5$ remove 23% of the total rock volume each and blade 130$_3$ removes 20% of the total rock volume. Blades 130$_2$, 130$_4$, and 130$_6$ in this example are blades identified by a drilling simulation that remove lesser volume of rock, wherein blade 130$_4$ removes 13% of total rock volume, blade 130$_2$ remove 12% of the total rock volume and blade 130$_6$ removes 10% of the total rock volume.

Figure 7D:
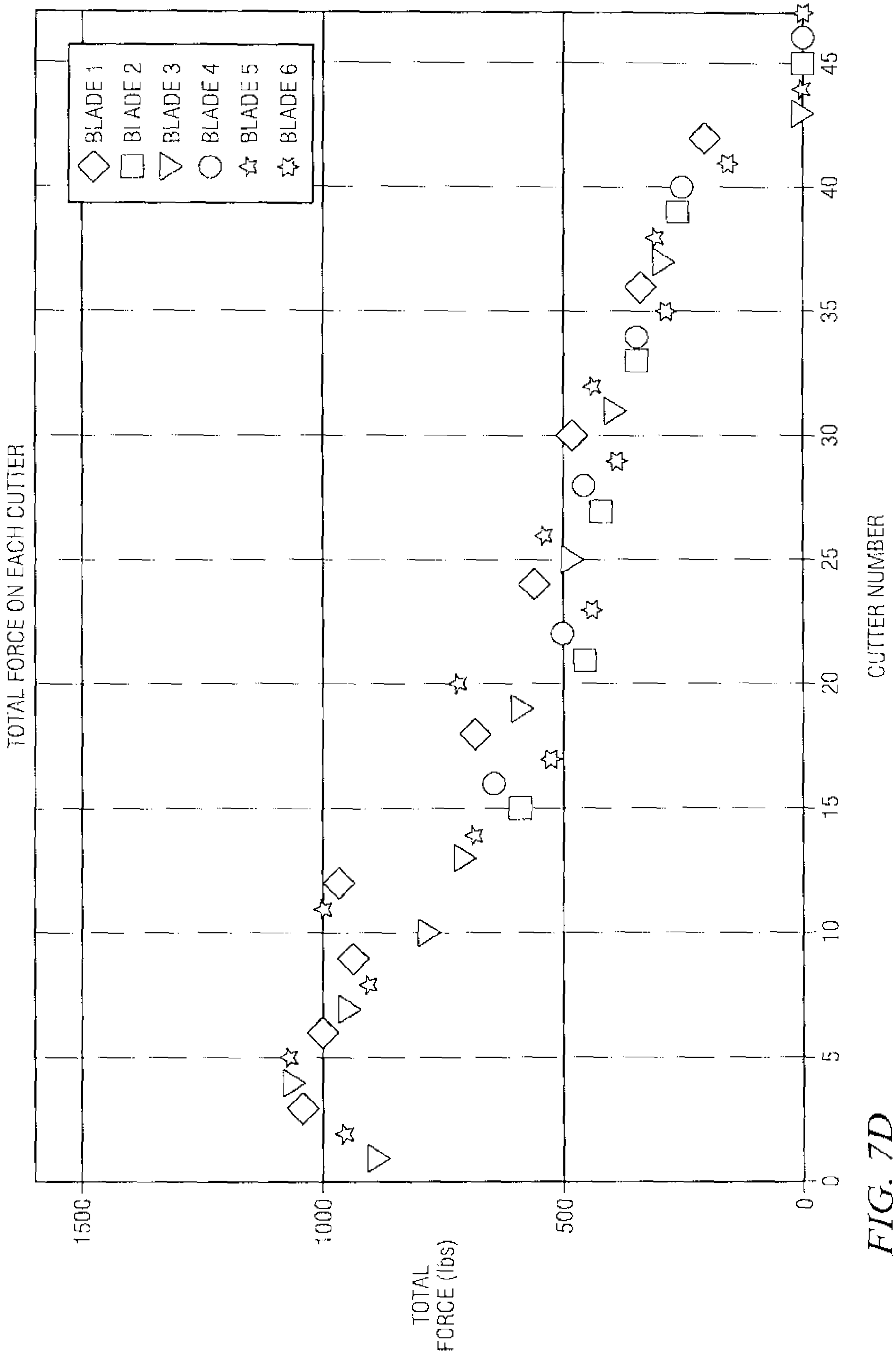

FIG. 7D shows a graphical analysis following a simulated drilling and evaluation of parameters such as impact on each blade and/or loading on each blade, (e.g., steps 504 and 506 of method 500*a*/500*b*), total impact force or total loadings on each cutter located on each respective blade 130$_1$-130$_6$ of the six blade bit 100 of FIG. 7D and shows that cutters on blades 130$_1$, 130$_3$, and 130$_5$ are subject to more loadings (impact forces) than cutters on blades 130$_2$, 130$_4$, and 130$_6$.

Accordingly, simulation analysis in FIGS. 7A-7D reveals blades 130$_1$, 130$_3$, and 130$_5$ remove maximum rock volume, are subject to more loadings, and higher impact forces on cutters, than blades 130$_2$, 130$_4$, and 130$_6$. In this example embodiment, blades removing maximum rock volume and/or subject to higher loadings and/or higher impact forces are the major blades or primary blades and blades removing lower rock volumes and subject to lower impact forces and/or loadings are secondary or minor blades. Design and manufacture of a drill bit, according to this example of the present disclosure, may comprise placing a first type of cutters such as 60$_h$ (which may be more wear resistant and/or more impact resistant cutters) on blades 130$_1$, 130$_3$, and 130$_5$ and placing a second type of cutters such as 60$_l$ (which may be inexpensive, and relatively less wear resistant and/or relatively less impact resistant cutters) on blades 130$_2$, 130$_4$, and 130$_6$.

Figure 8A:
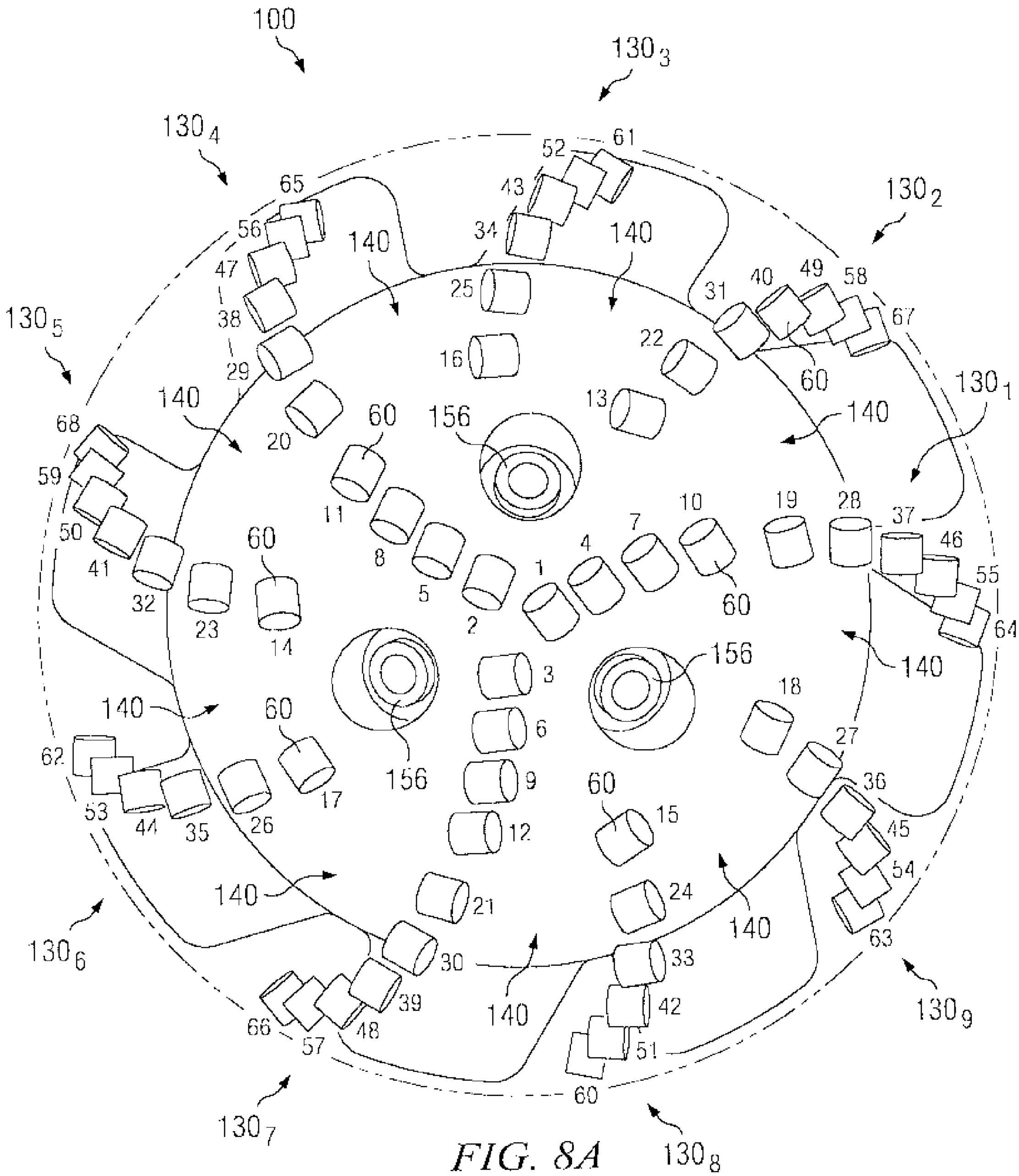
Figure 8B:
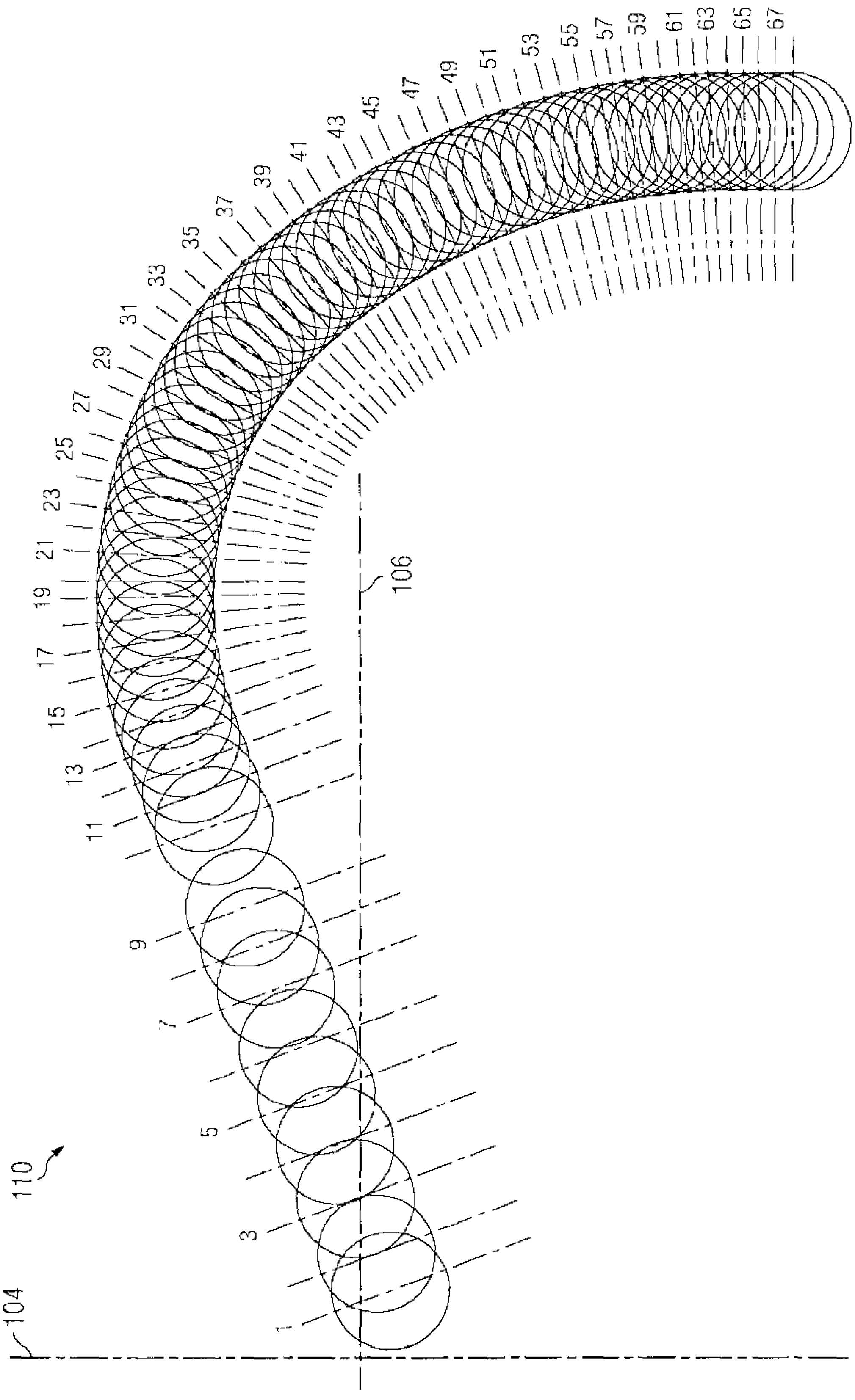

In another example, simulation methods such as described in methods 500*a* and/or 500*b* in FIGS. 6A and 6B may be used for installing different cutting element on different blades as shown in FIGS. 8A-8D. FIG. 8A shows a schematic view of a bit face 100 with nine blades 130$_1$-130$_9$ having cutting elements 60 numbered from 1-67 installed starting from the nose zone and having a multilevel force balancing with three cutter groups, with cutter set [(1 4 7), (2 5 8), (3 6 9)] and FIG. 8B depicts a schematic drawing showing the bit face profile 110 of cutting elements 60 on bit face 100 of FIG. 8A showing location of various cutting elements 60 on different locations (zones) on bit profile 110 on which each cutting element 60 numbered 1-67 is located.

Figure 8C:
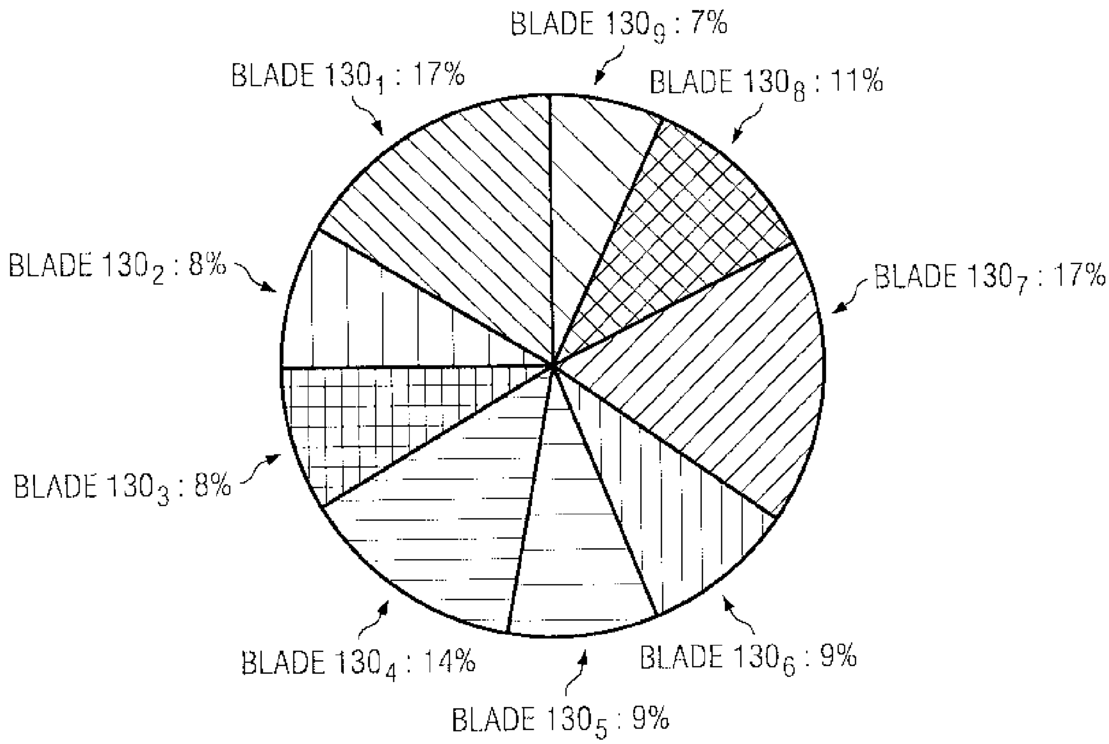

Simulation method 500*a* or 500*b* may be used to determine the volume of rock removed by each of the nine blades 130$_1$-130$_9$ and additional parameters such as impact on each blade/cutter, loading on each blade/cutter. FIG. 8C depicts volume of rock removed by each respective blade 130$_1$-130$_9$ of nine blade bit 100 shown in FIG. 8A. FIG. 8C shows that for a specific example, blades 130$_1$, 130$_4$, and 130$_7$ are blades identified by a drilling simulation as blades that remove maximum volume of rock, wherein blade 130$_1$ and blade 130$_7$ remove 17% of the total rock volume each and blade 130$_4$ removes 14% of the total rock volume. Blades 130$_2$, 130$_3$, 130$_5$, 130$_6$, 130$_8$ and 130$_9$ in this example are blades identified by a drilling simulation that remove lesser volume of rock, wherein blades 130$_2$ and 130$_3$ each remove 8% of total rock volume, blades 130$_5$ and 130$_6$ remove 9% of the total rock volume each, blade $130_8$ removes 11% of the total rock volume, and blade $130_9$ removes 7% of the total rock volume.

Figure 8D:
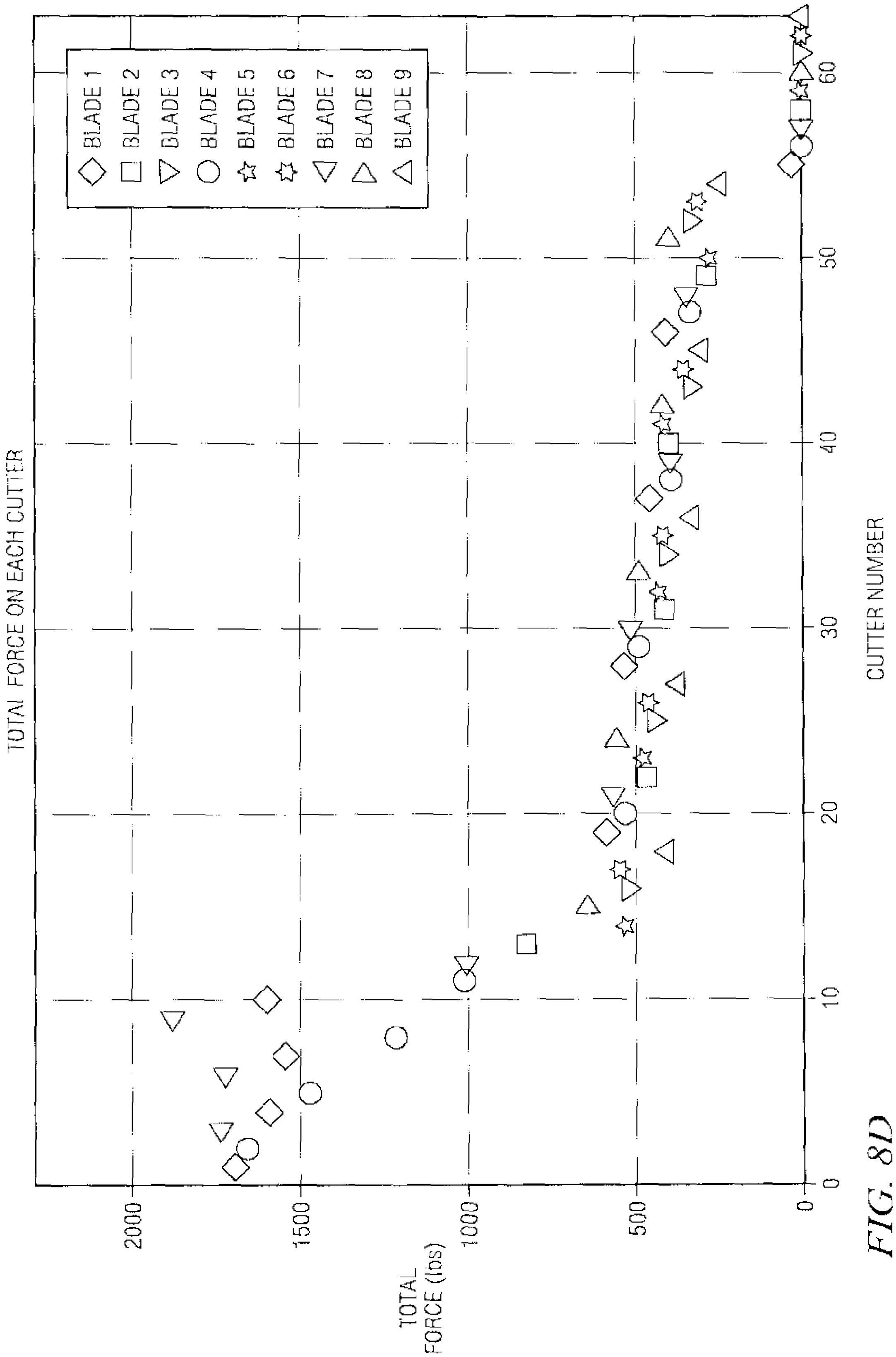

FIG. 8D shows a graphical analysis following a simulated drilling showing total impact force (or total loadings) on each cutter located on each respective blade $130_1$-$130_9$ of nine cutter blade bit 100 of FIG. 8A and shows that cutters located on blades $130_1$, $130_4$, $130_7$ and $130_8$ are subject to more loadings (impact forces) than cutters on blades $130_2$, $130_3$, $130_5$, $130_6$, and $130_9$.

Accordingly, simulation analysis shown in FIGS. 8A-8D reveals blades $130_1$, $130_4$, and $130_7$ remove maximum rock volume, and blades $130_1$, $130_4$, $130_7$ and $130_8$ are subject to more loadings, and higher impact forces on cutters, than blades $130_2$, $130_3$, $130_5$, $130_6$, and $130_9$. Design and manufacture of a drill bit according to this example of the present disclosure may comprise placing a first type of cutters such as $60_h$ (which may be more wear resistant and/or more impact resistant cutters) on blades $130_1$, $130_4$, $130_7$ and $130_8$ and placing a second type of cutters such as $60_l$ (which may be inexpensive, and relatively less wear resistant, and/or relatively less impact resistant cutters) on blades $130_2$, $130_3$, $130_5$, $130_6$, and $130_9$.

Figure 9A:
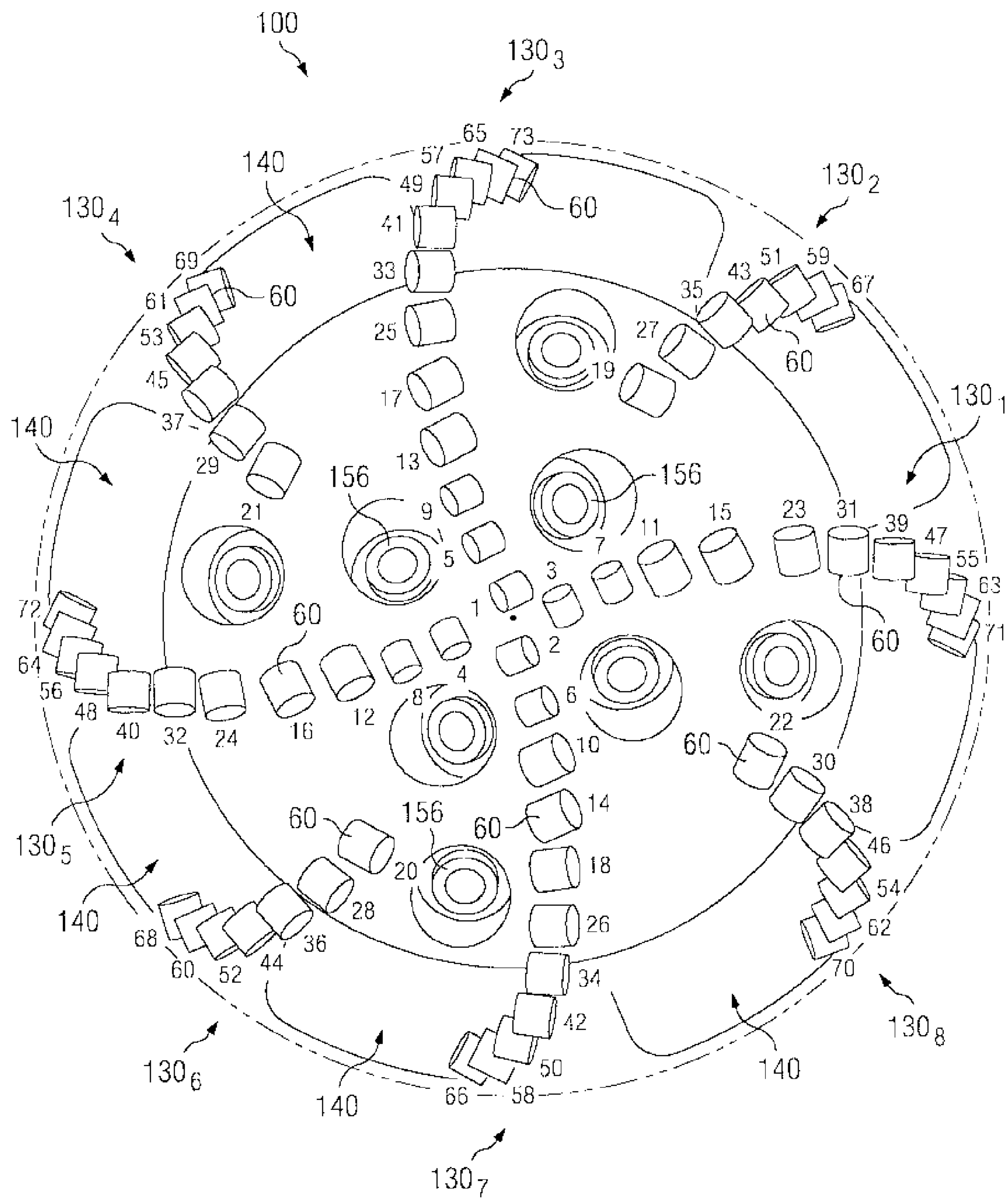
Figure 9B:
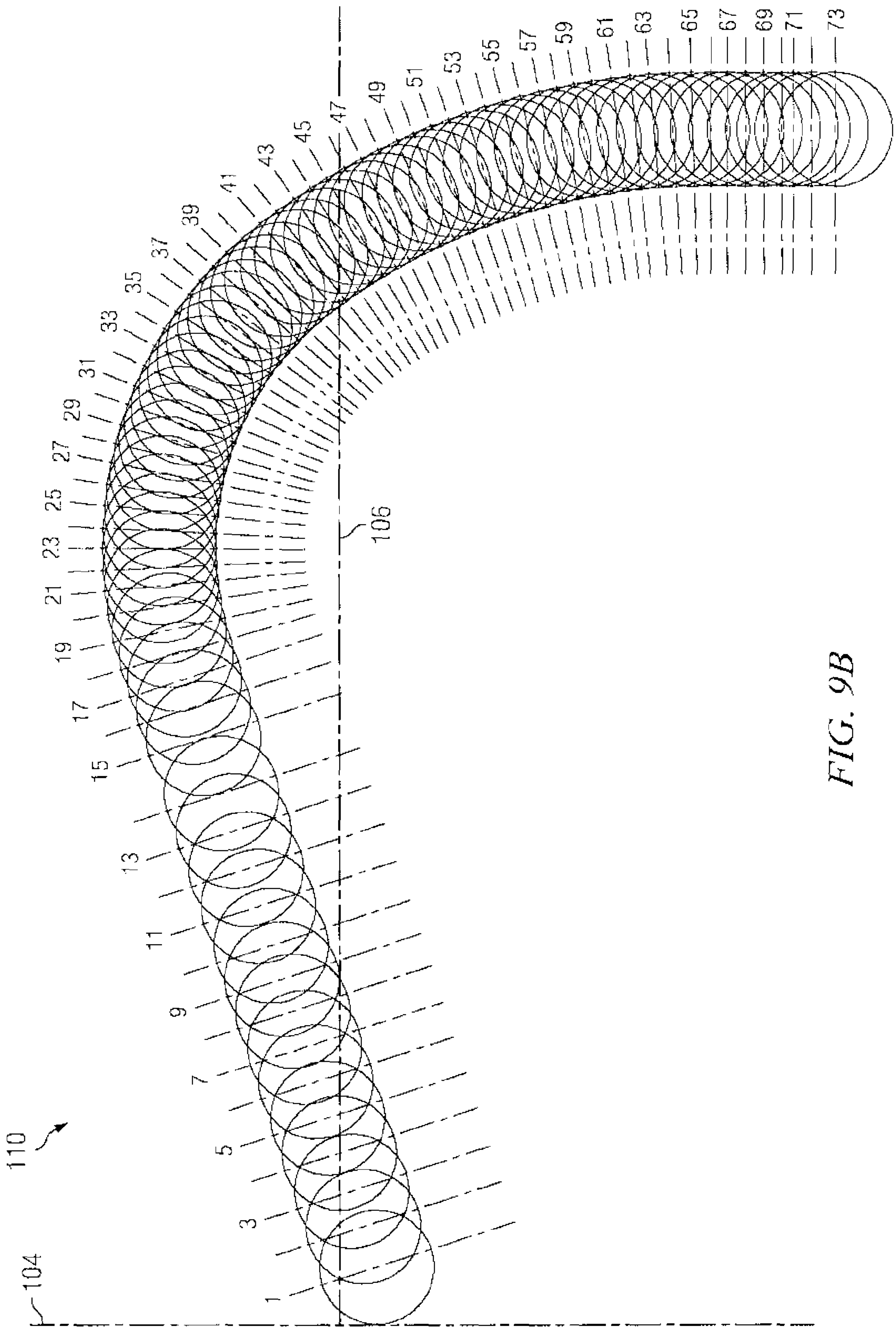

In yet another example, simulation methods such as described in methods 500*a* or 500*b* may be used for installing different cutting element on different blades as shown in an example depicted in FIGS. 9A-9D. FIG. 9A shows a schematic view of a bit face 100 with eight blades $130_1$-$130_8$ having cutting elements 60 numbered from 1-73 installed starting from the nose zone and having a multilevel force balancing with cutting elements installed in pair cutter groups, with cutter set [(1 5), (3 7), (2 6), (4, 8)] (as outlined in step 500*a* of FIG. 6A) and FIG. 9B depicts a schematic drawing showing the bit face profile 110 of cutting elements 60 on bit face 100 of FIG. 9A showing location of various cutting elements 60 on different locations (zones) on bit profile 110 on which each cutting element 60 numbered 1-73 is located.

Figure 9C:
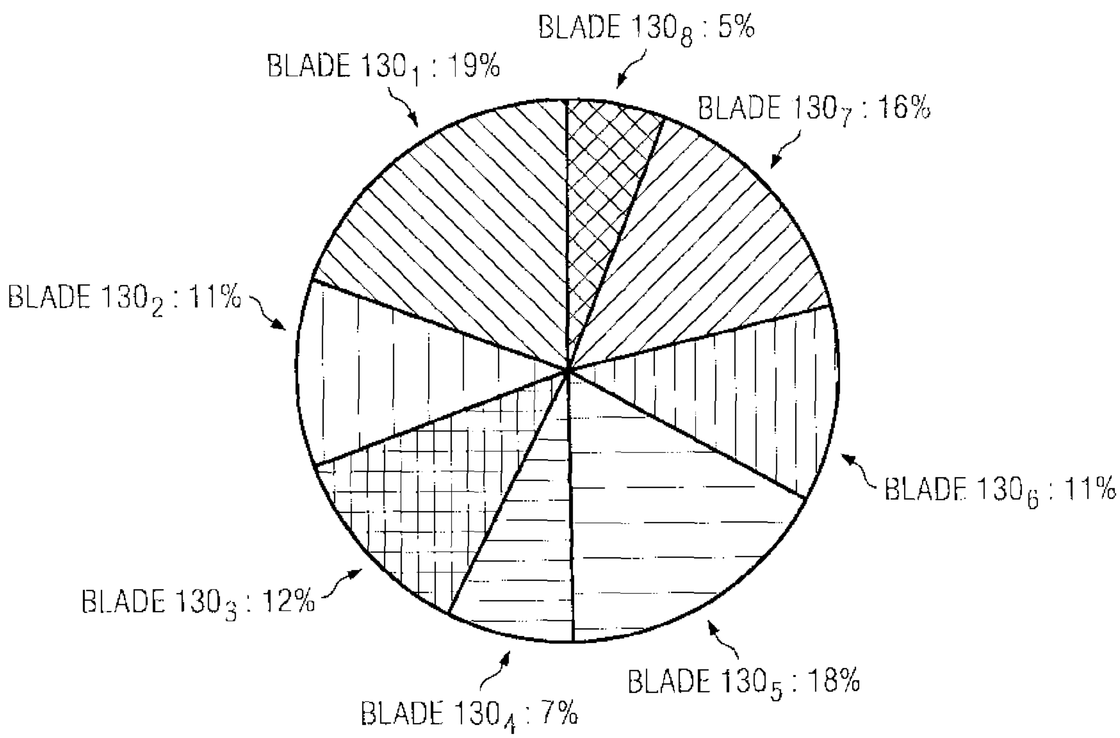

Simulation methods 500*a* or 500*b* as shown in FIG. 6A or 6B may be used to determine the volume of rock removed by each of the eight blades $130_1$-$130_8$ and additional parameters such as impact on each blade/cutter, loading on each blade/cutter. FIG. 9C depicts volume of rock removed by each respective blade $130_1$-$130_8$ of eight blade bit 100 of FIG. 9A. FIG. 9C shows that for this specific example, blades $130_1$, $130_3$, $130_5$, and $130_7$ are blades identified by drilling simulation and evaluations as blades that remove maximum volume of rock, wherein blade $130_1$ removes 19% of the total rock volume, and blade $130_3$ removes 12% of the total rock volume, blade $130_5$ removes 18% of the total rock volume and blade $130_7$ removes 16% of the total rock volume. Blades $130_2$, $130_4$, $130_6$ and $130_8$ in this example are blades identified by a drilling simulation that remove lesser volume of rock, wherein blades $130_2$ and $130_6$ each remove 11% of total rock volume, blade $130_4$ removes 7% of the total rock volume each, blade $130_8$ removes 5% of the total rock volume.

Figure 9D:
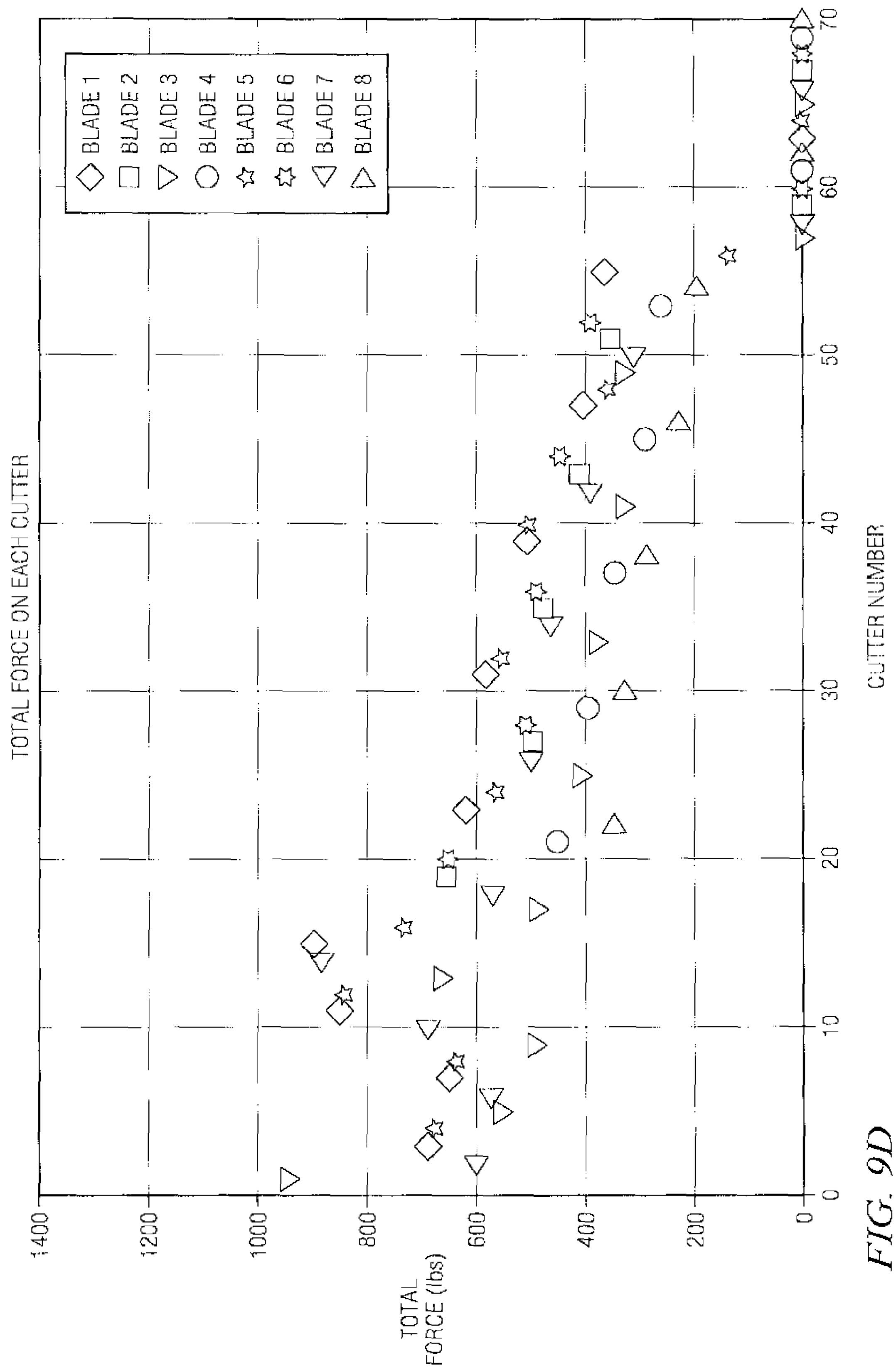

FIG. 9D shows a graphical analysis following a simulated drilling showing total impact force (or total loadings) on each cutter located on each respective blade $130_1$-$130_8$ of eight cutter blade bit 100 of FIG. 9A and shows that cutters on blades $130_1$, $130_2$, $130_5$, $130_6$ and $130_7$ are subject to more loadings (impact forces) than cutters on blades $130_3$, $130_4$, and $130_8$.

Accordingly, simulation analysis of drill bit 100 shown in FIGS. 8A-8D reveals blades $130_1$, $130_3$, $130_5$, and $130_7$ remove more rock volume, than blades $130_2$, $130_4$, $130_6$ and $130_8$ and blades $130_1$, $130_2$, $130_5$, $130_6$ and $130_7$ are subject to more loadings (impact forces) than cutters on blades $130_3$, $130_4$, and $130_8$. Design and manufacture of a drill bit, according to the present disclosure, may comprise placing a first type of cutters such as $60_h$ (which may be stronger, more wear resistant, more impact resistant cutters) on blades $130_1$, $130_2$, $130_3$, $130_5$ and $130_7$ and placing a second type of cutters such as $60_l$ (which may be inexpensive, and relatively less strong, less wear resistant, and less impact resistant cutters) on blades $130_3$, $130_4$, and $130_8$ as identified by simulation methods 500*a* or 500*b*.

The present disclosure, in some embodiments, describes rotary drill bits and other downhole well tools that in addition to having different types of cutters placed on respective blades based on the rock volume removed by a respective blade and/or the loadings on cutters of a respective blade and/or on the impact forces on a respective blade may further comprise selecting locations for placing cutters one or more groups of cutters in a level of force balanced groups and may be balanced at one or more levels. Some examples of force balanced cutters are shown in FIGS. 7A, 8A and 9A for six, nine and eight bit blades respectively. The terms "force balanced" and "force balancing" may be used in this application to describe various methods, procedures and techniques associated with designing rotary drill bits and other downhole drilling tools. FIGS. 10A-27 described below relate to various aspects of multilevel force balancing which are also described in detail in copending PCT Patent Application entitled "Multilevel Force Balanced Downhole Drilling Tools and Methods," Serial No. PCT/US09/067263, filed Dec. 4, 2009.

Figure 10C:
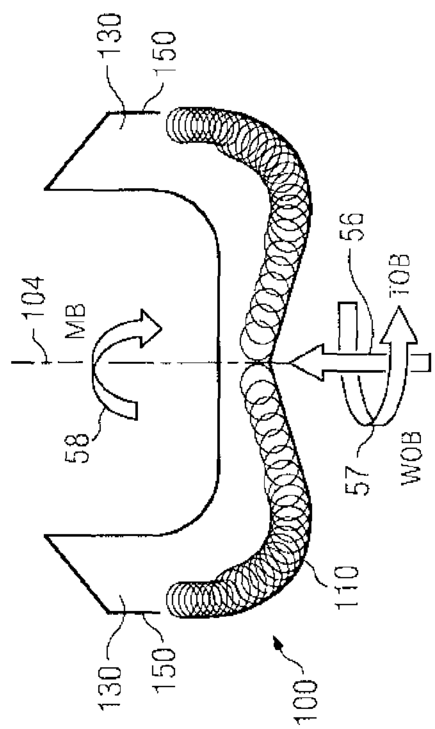
FIGS. 10C and 10D are schematic drawings showing a summation of forces or resulting forces such as bit axial force, torque on bit (TOB), moment on bit (MB) and bit lateral force acting on the rotary drill bit of FIGS. 10A and 10B.
Figure 10D:
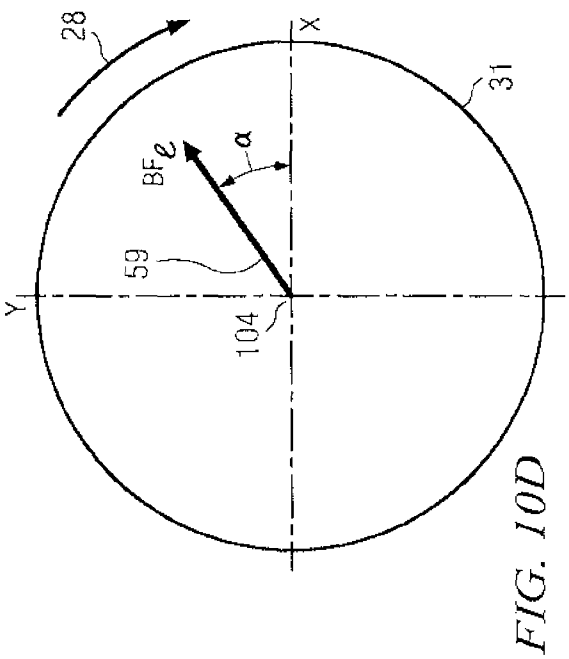
Figure 10A:
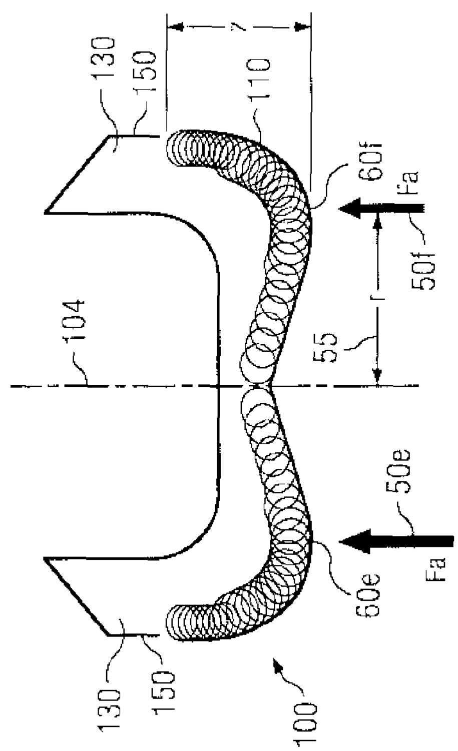
FIGS. 10A and 10B are schematic drawings showing examples of forces which may act on respective cutting elements while forming a wellbore using fixed cutter rotary drill bit.
Figure 10B:
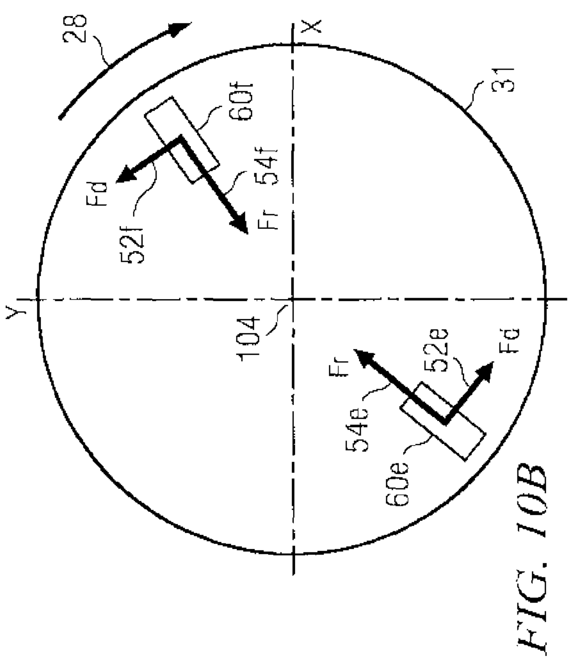

FIGS. 10A and 10B are schematic drawings showing basic forces which act on respective cutting elements 60 disposed on exterior portions of fixed cutter rotary drill bit 100. FIGS. 10C and 10D are schematic drawings showing resulting bit forces or reactive bit forces acting on fixed cutter rotary drill bit 100. FIGS. 10A and 10C show a composite bit face profile 110 associated with fixed cutter rotary drill bit 100. Composite bit face profile 110 may be generally described as a projection of blades 131-136 and associated cutting elements 60 onto a radial plane passing through bit rotational axis 104.

Three basic forces (penetration force or axial force ($F_a$), cutting force or drag force ($F_d$), and side force or radial force ($F_r$)) generally act on each cutting element of a downhole drilling tool engaged with adjacent portions of a downhole formation. For cutting elements 60*e* and 60*f* respective penetration forces or axial forces ($F_a$) are represented by arrows, 50*e* and 50*f*. See FIG. 10A. Respective cutting forces or drag forces ($F_d$) acting on cutting elements 60*e* and 60*f* are represented by arrows 52*e* and 52*f*. Respective side forces or radial forces ($F_r$) acting on cutting elements 60*e* and 60*f* are represented by arrows 54*e* and 54*f*. See FIG. 10B.

Resulting bit forces or reactive bit forces acting on rotary drill bit 100 include bit axial force ($BF_a$) represented by arrow 56. The bit axial force ($BF_a$) may correspond generally with weight on bit (WOB). Resulting forces or reactive forces acting on rotary drill bit 100 also include torque on bit (TOB) represented by arrow 57 and bit moment (MB) represented by arrow 58. See FIG. 10C. Bit lateral force ($BF_1$) represented by arrow 59 in FIG. 10D in the summation of cutting element 60 drag forces and radial forces. Reactive forces acting on bit 100 correspond with the summation of respective forces ($F_a$, $F_d$ and $F_r$) applied to each cutting element 60 disposed on exterior portions of fixed cutter rotary drill bit 100.

Bit lateral force ($BF_1$) represented by arrow 59 in FIG. 10D may be further divided into two component vectors bit lateral drag force ($BF_d$) and bit lateral radial force ($BF_1$). Bit lateral drag force ($BF_d$) represents the sum of all drag forces ($F_d$) acting on all cutting elements 60 and bit lateral radial force ($BL_r$) represents the sum of all radial forces ($F_r$) acting on all cutting elements 60.

Bit moment (MB) may be divided into two vectors: bit axial moment ($MB_a$) corresponding with the sum of axial moments acting on all cutting elements 60 and bit lateral moment ($MB_1$) corresponding with the sum of all lateral moments acting on all cutting elements 60. The respective axial moment associated with each cutting element 60 may be determined by multiplying the radius from each cutting element to bit rotational axis 104 by the respective axial force ($F_a$). For cutting element 60*f*, the associated cutting element axial moment is equal to radius 55 multiplied by axial force ($F_a$). See FIG. 10A.

The lateral moment for each cutting element 60 is equal to the respective radial force ($F_r$) applied to each cutting element multiplied by a distance from each cutting element 60 to a pre-determined point on bit rotational axis 104.

Forces acting on each cutting element may be a function of respective cutting element geometry, location and orientation relative to associated bit body 120, bit rotational axis 104, respective downhole formation properties and associated downhole drilling conditions. See Appendix A. For some applications each cutting element 60 may be divided into multiple cutlets and the bit forces summarized for each cutlet on the associated cutting element 60. Design and manufacture of fixed cutter rotary drill bit 100 with cutting elements 60 disposed at selected locations to minimize both bit lateral forces and bit moments based at least in part on laying out inner cutters 60*i* and outer cutters 60*o* in different spiral directions in relation to bit rotation around bit rotational axis 104 to substantially reduce and/or eliminate imbalance forces such as axial forces and torque acting on a rotary drill bit and other downhole drilling tools and, in some embodiments, further based on multilevel force balancing may result in satisfactorily managing associated bit imbalance forces.

Fixed cutter rotary drill bits have often been designed to be force balanced based in part on computer models or programs which assume that all associated cutting elements are engaged with a generally uniform downhole formation while forming a wellbore. This traditional type of force balancing generally provides only one level of force balancing. As a result rotary drilling bits and other downhole drilling tools designed by traditional type of force balancing methods may experience large imbalance forces during transition drilling when all associated cutting elements are not engaged with a generally uniform downhole formation.

FIG. 11A depicts the effect of imbalance forces on rotary drill bit 90 designed by traditional type of force balancing during transitional drilling. Vibration and/or bit imbalance forces may be transmitted from rotary drill bit 90 to drill string 24. Undesirable changes in inside diameter 31 of wellbore 30 and/or excessive wear on rotary drill bit 90 and/or components of drill string 24 may occur. Such vibration may even damage equipment located at well surface 22. Dotted lines 25*a*, 25*b* and 25*c* show examples of vibration which may occur based in part on the magnitude of imbalance forces applied to rotary drill bit 90. See also FIGS. 11B and 11C-11F. Since rotary drill bit 90 and BHA 26 are generally disposed in a wellbore that limits lateral movement, the potential for damage to rotary drill bit 90 and/or components of BHA 26 may significantly increase as imbalance forces applied to rotary drill bit 90 increase (BHA 26 is depicted in FIGS. 1 and 4). Fixed cutter rotary drill bit 90 may remain generally force balanced during drilling conditions such as all cutting elements 60 engaged with generally uniform downhole formation layer 42 (see FIG. 11B).

FIG. 11B is a schematic drawing showing portions of wellbore 30 and various locations of a prior art fixed cutter rotary drill bit 90 within wellbore 30. FIG. 11B also includes graph 200 showing initial engagement of drill bit 90 with a first formation layer 41 and imbalance forces associated with drill bit 90 contacting a second downhole formation layer 42 adjacent to first downhole formation layer 41. Graph 200 demonstrates that prior rotary drill bits with only one level of force balancing, such as all cutting elements engaged with a generally uniform downhole formation, may experience substantial lateral imbalance forces during initial contact with the downhole end of a wellbore and/or during transition drilling from a first downhole formation into a second downhole formation. Transient imbalance forces (bit drag lateral imbalance, bit radial lateral imbalance, bit lateral imbalance and bit axial moment) are typically used with traditional one level force balancing techniques associated with fixed cutter rotary drill bits and other downhole drilling tools.

Chart or graph 200 is also shown adjacent to the schematic drawing of wellbore segments 30*a* and 30*b* and downhole formation layers 41 and 42 in FIG. 11B. Graph 200 shows substantial imbalance forces that may be applied to a fixed cutter rotary drill bit when a single cutter or a few cutters engage a downhole formation or when the rotary drill bit transits from a first downhole formation into a second downhole formation. Transient imbalance forces (bit drag lateral imbalance, bit radial lateral imbalance, bit lateral imbalance and bit axial moment) are typically used with traditional one level force balancing techniques associated with fixed cutter rotary drill bits and other downhole drilling tools. Design criteria used to evaluate traditional force balanced fixed cutter rotary drill bits and other downhole drilling tools may include:

bit drag lateral imbalance force less than 2.5% of total bit axial force;

bit radial lateral imbalance force less than 2.5% of bit axial force;

bit lateral imbalance force less than 4% of bit axial force; and bit axial moment less than 4% of bit torque.

Various computer models and computer programs such as listed in Appendix A at the end of the present application are available to evaluate forces acting on each cutting element 60 and any bit imbalance forces.

Chart or graph 200 is also shown adjacent to the schematic drawing of wellbore segments 30*a* and 30*b* and downhole formation layers 41 and 42 in FIG. 11B. Graph 200 shows substantial imbalance forces that may be applied to a fixed cutter rotary drill bit when a single cutter or a few cutters engage a downhole formation or when the rotary drill bit transits from a first downhole formation into a second downhole formation. See also FIGS. 22C-F.

The portion of wellbore 30 designated as 30*a* may have been drilled or formed prior to inserting rotary drill bit 90. Simulations were conducted based on inserting rotary drill bit 90 and an associated drill string through previously formed wellbore portion 30*a* until the extreme downhole end of rotary drill bit 90 contacts surface 43 to drill or form wellbore segment 30*b* extending through first downhole formation layer 41 and into second downhole formation layer 42. Surface 43 may be described as generally flat and extending substantially normal relative to rotary drill bit 90.

Various techniques may be used to simulate drilling wellbore 30*b* using rotary drill bit 90 and an attached drill string (not expressly shown) starting with contact between the extreme downhole end of rotary drill bit 90 and surface 43 of first layer 41.

First downhole formation layer 41 may have compressive strength less than the compressive strength of the second downhole formation layer 42. For some simulations, first downhole formation layer 41 may have a compressive strength of approximately 5,000 psi. During the simulation the thickness of the first downhole formation layer 41 may be greater than the length of rotary drill bit 90 such that all cutting elements 60 may be fully engaged with first downhole formation layer 41 prior to the downhole end or rotary drill bit 90 contacting second downhole formation layer 42.

Second downhole formation layer 42 may have a compressive strength greater than the compressive strength of the first downhole formation layer 41. For some simulations second downhole formation layer 42 may have a compressive strength of approximately 18,000 psi. The thickness of the second downhole formation may be greater than the length of rotary drill bit 90 such that all cutting elements may be fully engaged with second downhole formation layer 42.

Some prior fixed cutter drill bits such as rotary drill bit 90 may have only one cutting element 60*f* disposed on one blade at or near associated nose point 171. If single cutting element 60*f* is the only point of initial contact between rotary drill bit 90 and generally flat surface 43 at the downhole end of wellbore segment 30*a*, substantial lateral impact forces may be applied to rotary drill bit 90 and drill string 24. See FIG. 11A.

As drilling depth of rotary drill bit 90 increases into first downhole formation layer 41, substantial imbalance forces may occur as additional cutters 60 engage adjacent portions of first formation layer 41. See peak 201 on graph 200. Peaks 201 and 202 on graph 200 correspond with substantial increases in bit lateral imbalance forces as compared with bit axial force. With increasing depth of drilling or penetration into first formation layer 41, imbalance forces acting on fixed cutter rotary drill bit 90 may gradually reduce. See point 203 on graph 200. A substantially force balanced condition may be met when all cutting elements 60 are engaged with adjacent portions of generally uniform first formation layer 41.

For the example shown in FIG. 11B, the ratio of bit lateral imbalance forces relative to total bit axial force applied to rotary drill bit 90 may be relatively constant at a value of approximately 2.5% as represented by generally flat segment 204 of graph 200. Rotary drill bit 90 may be generally be described as force balance for only one level or one condition when all cutting elements 60 are engaged with a generally uniform downhole formation.

Peaks 201, 202, 205 and 206 are representative of the magnitude of transient imbalance forces which may be applied to rotary drill bit 90 during transition drilling through non-uniform downhole drilling conditions represented by first layer 41 and second layer 42 as shown in FIG. 11B.

The one level force balanced rotary drill bit 90 may be violated when downhole end 122 of rotary drill bit 90 initially contacts second downhole formation layer 42. See peak 205 on graph 200. As shown by graph 200, bit lateral imbalance forces may spike or peak if only one cutting element 60 or a relatively small number of cutting elements 60 engage generally harder second formation layer 42 and the other cutting elements 60 remain engaged with relatively softer first downhole formation layer 41.

Simulations show that lateral imbalance force applied to rotary drill bit 90 may occur at peaks 205 and 206 as the depth of drilling increases with additional cutting element 60 engaging harder second downhole formation layer 42. At point 207 on graph 200 all cutting elements 60 disposed on exterior portions of rotary drill bit 90 may be engaged with generally uniform second downhole formation layer 42. Generally horizontal or flat segment 208 of graph 200 represents a generally constant, relatively low amount of bit lateral imbalance force as compared with bit axial force applied to rotary drill bit 90.

Forces on each cutting element 60 engaged with adjacent formation material may be evaluated. Forces acting on various cutter groups selected in accordance which are engaged with the formation material may also be evaluated. Associated bit forces including bit lateral force, bit axial force and bit axial moment may also be calculated and graphed as a function of drilling distance.

The graphs may start from the time the associated rotary drill bit 90 first touches generally flat surface 43 and/or generally flat surface 44. A visual display of all bit forces as a function of drilling distance may then be displayed. See Graph 200 in FIG. 11B. Standard default downhole drilling conditions which in step 402 may include RPM equal to 120, rate of penetration equal to 30 ft. per hour, compressive strength of the first downhole formation equal to 5,000 psi and compressive strength of a second formation equal to 18,000 psi.

FIGS. 11C-11F show various imbalance forces acting on fixed cutter rotary drill bit 90 during initial contact with the downhole end of wellbore 30*a* and imbalance forces associated drilling from first downhole formation layer 41 into harder, second downhole formation layer 42.

Figure 11C:
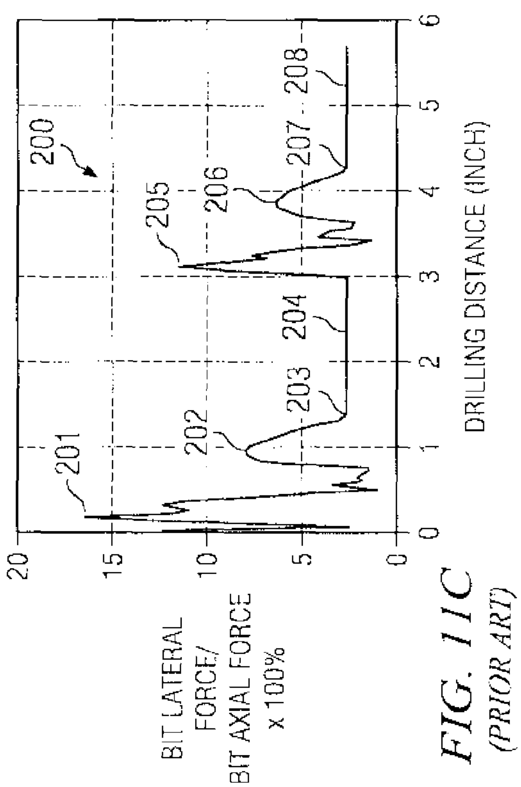
FIGS. 11C-11F are graphical representations of imbalance forces associated with transition drilling such as shown in FIG. 11B.

FIG. 11C shows graph 200 of total transient bit lateral imbalance forces as a percentage of transient bit axial force as FIG. 11B. The maximum lateral imbalance force represented by peak 201 may be greater than fifteen percent (15%) of total bit axial force.

Figure 11D:
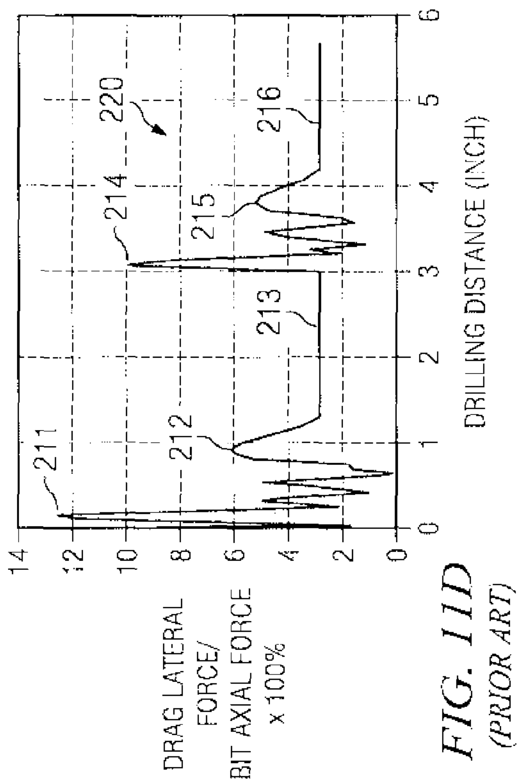

FIG. 11D shows graph 220 of transient bit drag lateral force as a percentage of transient bit axial force versus drilling distance. The maximum drag lateral imbalance force represented by peak 211 may be greater than 12% of total bit axial force. Peaks 212, 214 and 215 correspond generally with similar peaks shown in FIG. 11C.

Figure 11E:
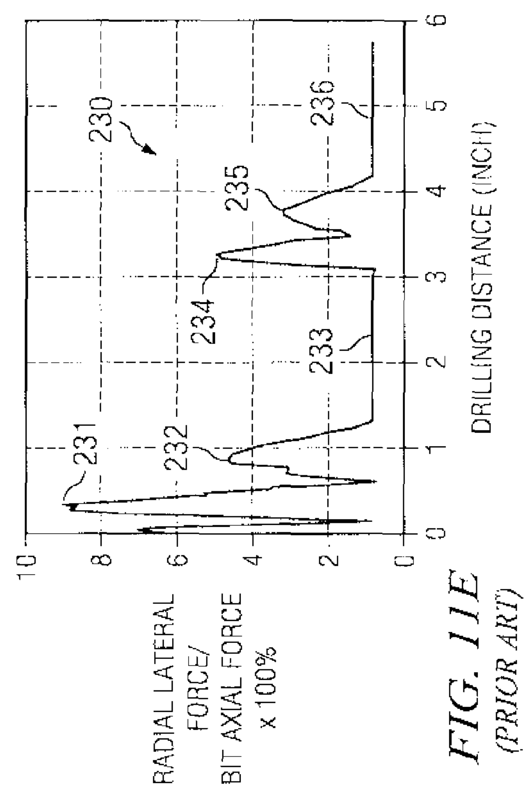

FIG. 11E shows graph 230 of transient bit radial lateral force as a percentage of transient bit axial force versus drilling distance. Peak 231 indicates that maximum transient radial lateral force may be greater than 8% of total bit axial force. Again, peaks 232, 234 and 235 correspond generally with peaks 202, 205 and 206 in FIG. 11C.

Figure 11F:
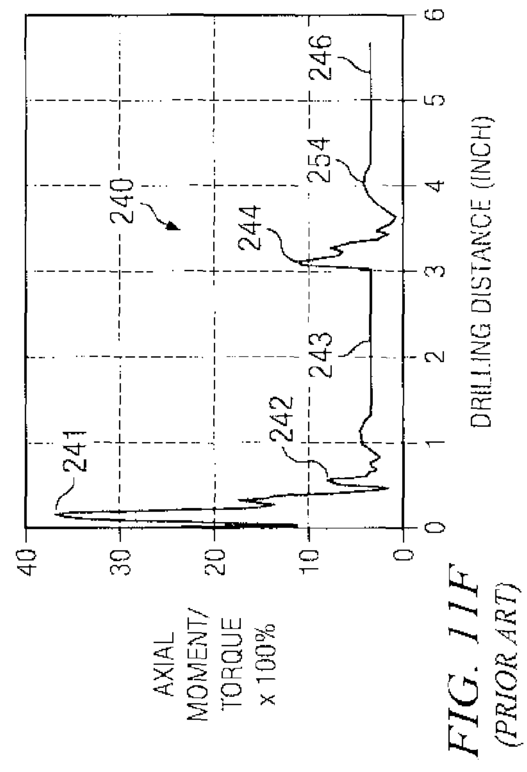

FIG. 11F shows graph 240 of transient bit axial moment as a percentage of transient bit torque versus drilling distance. Peak 241 indicates that the maximum transient axial bending moment may be as high as 35% of bit torque during initial engagement with downhole formation layer 41. Peaks 242 and 244 of graph 240 generally correspond with similar peaks shown in FIG. 11C. Graphs 220, 230 and 240 indicate that fixed cutter rotary drill bit 90 may be described as relatively balanced when all cutting elements are engaged with a generally uniform downhole formation. See for example generally flat segments 213 and 216 in FIG. 11D, generally flat segments 233 and 236 in FIG. 11E and generally flat segments 243 and 246 in FIG. 11F.

Figure 12A:
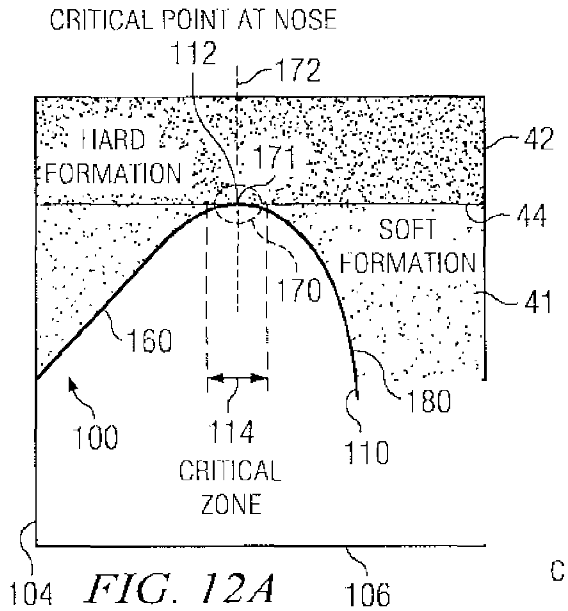
FIGS. 12A, 12B and 12C are schematic drawings showing examples of non-uniform downhole drilling conditions or transition drilling conditions which may effect bit imbalance forces acting on an associated rotary drill bit.
Figure 12B:
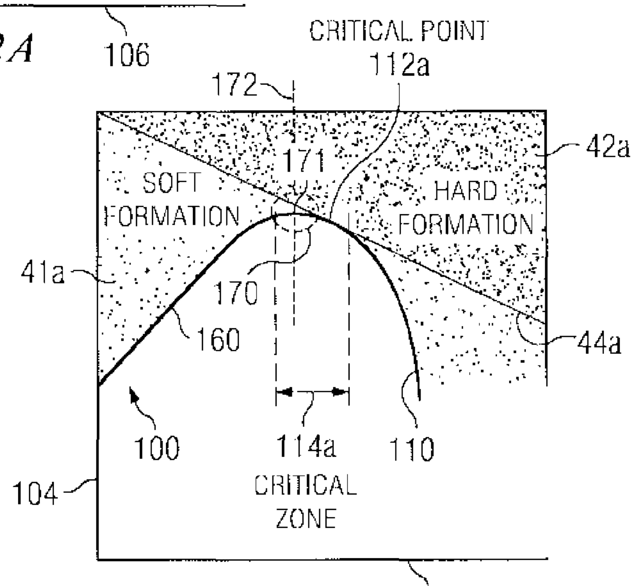
Figure 12C:
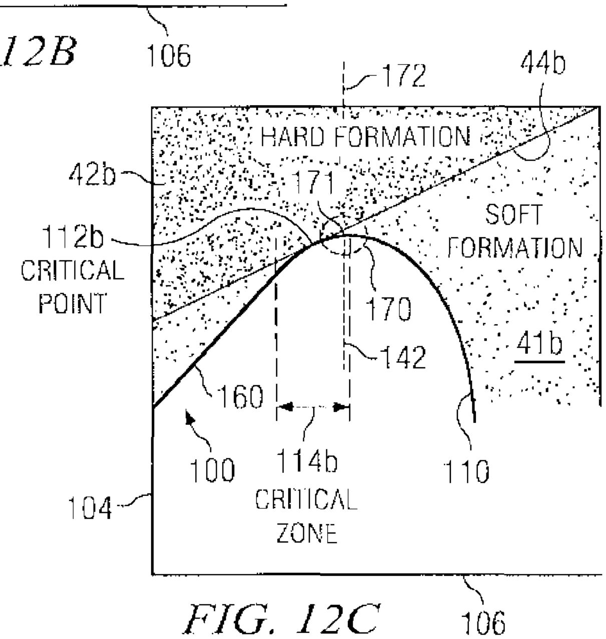

FIGS. 12A-12C show examples of a downhole drilling tool engaging a first, softer downhole formation and an adjacent, harder downhole formation where the formations have different spatial layouts. FIGS. 12A, 12B and 12C show examples of a "critical point" or an initial point of contact between a downhole drilling tool and downhole formation layers disposed at various angles with respect to each other. Multilevel force balancing techniques may satisfactorily determine selected locations for installing cutting elements on exterior portions of blades on the downhole drilling tool based at least in part on variations in the hardness of adjacent downhole formations and/or variations in the angle of contacting the two adjacent downhole formations.

A critical point of contact between a downhole drilling tool and respective downhole formations may depend upon orientation of the layers with respect to each other and with respect to the cutting face of a downhole drilling tool during engagement with the respective downhole formations. The critical point may be determined based on dip angle (up dip or down dip) of a transition between a first downhole formation and a second downhole formation relative to the cutting face of the downhole drilling tool.

Simulations of contact between the cutting face of a downhole drilling tool and a first downhole formation layer and a second downhole formation layer may indicate a critical zone with respect to the critical point. See critical zones 114, 114*a* and 114*b* in FIGS. 12A, 12B and 12C respectively. The dimensions and location of each critical zone relative to the point of initial contact may depend on various characteristics of the respective downhole formations and characteristics of the cutting face profile on the downhole drilling tool.

Composite bit face profile 110, as shown in FIGS. 12A-12C, extending from bit rotational axis 104 may include various segments defined relative to nose point 171 and nose axis 172 extending therethrough. Nose axis 172 may be aligned generally parallel with bit rotational axis 104. As described earlier bit face profile 110 may be divided into various segments or zones starting from nose point 171 and/or nose axis 172. Such segments or zones may include, but are not limited to, cone zone 160, nose segment 170 represented by a dotted oval and outer segment 180 and each zone may have respective cutting elements 60 disposed thereon including "inner cutters" 60*i* and "outer cutters" 60*o* as described in sections above.

In FIG. 12A, first downhole formation layer 41 and second downhole formation layer 42 are shown disposed generally parallel with each other and extending generally perpendicular relative to associated bit rotational axis 104 and nose axis 172. For such downhole drilling actions critical point 112 or the initial point of contact between fixed cutter drill bit 100 and surface 44 on second downhole formation layer 42 may correspond approximately with the location of nose point 171 on composite bit face profile 110. As discussed later in this application, the present teachings, in some embodiments, may be substantially benefited by placing one or more groups of cutting elements within nose segment 170 symmetrically or pseudo-symmetrically aligned with each other relative to nose axis 172. Embodiments relating to placing one or more groups of cutting elements within nose segment 170 symmetrically or pseudo-symmetrically aligned with each other relative to nose axis 172 may be also found in copending U.S. Provisional Patent Application entitled "Fixed Cutter Drill Bits With Improved Stability," Ser. No. 61/121,723 filed Dec. 11, 2008 and to U.S. Provisional Application entitled "Instant Balancing Fixed Cutter Drill Bits, Reamers, Core Bits and Design Methods," Ser. No. 61/174,769 filed May 1, 2009 and in copending PCT Patent Application entitled "Multilevel Force Balanced Downhole Drilling Tools and Methods," Ser. No. PCT/US09/067263, filed Dec. 4, 2009.

For downhole drilling conditions represented by FIG. 12B, first downhole formation layer 41*a* and second downhole formation layer 42*a* may be inclined relative to each other and with respect to bit rotational axis 104. Surface 44*a* disposed between first layer 41*a* and second layer 42*a* may be generally described as having a "up dip" angle relative to bit rotational axis 104 and an associated wellbore (not expressly shown) formed by rotary drill bit 100.

For downhole drilling conditions such as represented by FIG. 12B, initial point of contact 112*a* between rotary drill bit 100 and surface 44*a* may move radially outward from nose point 171 as measured from bit rotational axis 104. The location of critical point 112*a* may depend in part on the up dip or angle of inclination of surface 44*a* relative to bit rotational axis 104 and the dimensions and configuration of blades 131-138 and cutting element 60 disposed on rotary drill bit 100.

For downhole drilling conditions such as shown in FIG. 12C, first formation 41*b*, second formation 42*b*, and surface 44*b* may be inclined at an angle described as a "down dip" relative to each other and with respect to bit rotational axis 104 and an associated wellbore formed by rotary drill bit 100. As a result, critical point 112*b* may move radially inward as measured from bit rotational axis 104.

Prior force balancing techniques which use only one level of force balancing (such as all cutting elements engaged with a generally uniform downhole formation) may not adequately describe forces acting on a rotary drill bit or other downhole drilling tools during initial contact with the downhole end of a wellbore, during transition drilling between a first downhole formation and a second downhole formation and any other downhole drilling conditions which do not include all cutting elements engaged with a generally uniform downhole formation. Rotary drill bits designed at least in part based on this assumption may experience significant imbalance forces during non-uniform downhole drilling conditions. In accordance with the present teachings, in addition to designing and manufacturing drill bits and other downhole tools based on determining blades subject to high impact $\mathbf{130}_h$ and laying out a first type of cutting elements, such as stronger cutting elements $\mathbf{60}_h$ on blades that are subject to high impact, such as $\mathbf{130}_h$, and laying out at least a second type of cutting elements, such as $\mathbf{60}_l$, on other blades, such as $\mathbf{130}_1$, cutters may be further placed or installed based on multilevel force balancing criteria as described in these sections.

The terms "multilevel force balanced" and "multilevel force balancing" may include, but are not limited to, various methods, techniques and procedures to simulate or evaluate imbalance forces acting on downhole drilling tools while forming a wellbore with non-uniform downhole drilling conditions. Multilevel force balancing generally includes the use of respective cutter groups and cutter sets and is not limited to a single set of all cutting elements of a downhole drilling tool engaged with a generally uniform downhole formation. Multilevel force balancing may also include evaluating bit imbalance forces as a function of drilling depth.

The terms "multilevel force balance" and "multilevel force balancing" may also include, but are not limited to, various levels of force balancing such as level one through level five. First level or level one may include balancing forces acting on all cutting elements in each respective cutter group. Each cutter group may have 2, 3, 4 or 5 cutters. Cutter groups are described in sections below and also in copending PCT Patent Application entitled "Multilevel Force Balanced Downhole Drilling Tools and Methods," Ser. No. PCT/US09/067263, filed Dec. 4, 2009.

In addition to layout of different types of cutters on different respective blades according to the present disclosure, in embodiments that also comprise performing level one force balancing, the cutters in each cutter group may be in a uniform formation. For some applications multilevel force balancing may be conducted with respective groups of more than five neighbor cutters. FIGS. 13A-13H depict a first level or level one balancing.

Figure 14A:
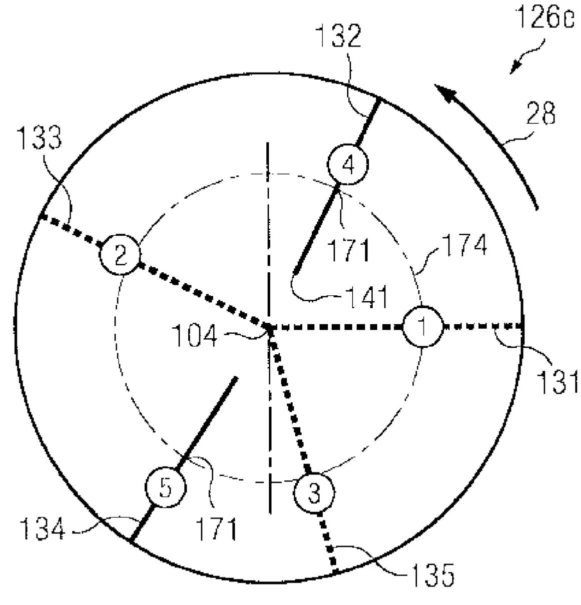
FIGS. 14A and 14B are schematic drawings showing various techniques to select or layout locations for installing respective cutting elements in a cutter set used to multilevel force balance a downhole drilling tool according to one example embodiment of the present disclosure.
Figure 14B:
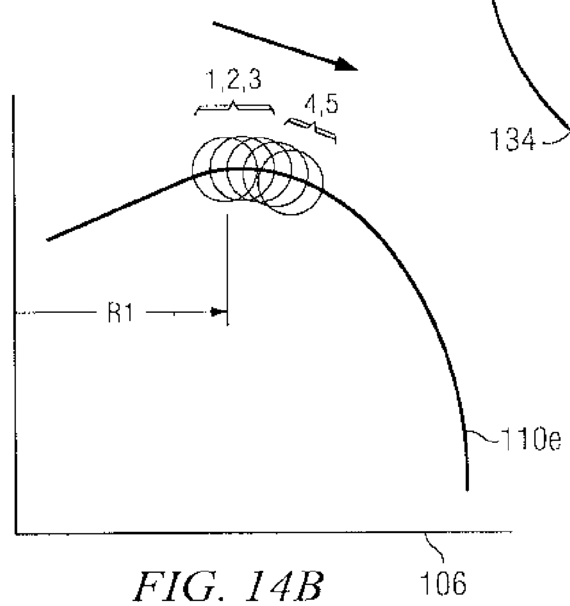

Second level or level two force balancing may include balancing forces acting on each cutting element in any two neighbor cutter groups on an associated composite cutting face profile. In addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure, when performing level two force balancing, the cutters in the two groups may be in a uniform formation. Imbalance forces resulting from any two neighbor cutter groups on an associated composite cutting face profile may be substantially minimized or eliminated (balanced). FIGS. 14A and 14B depict a second level or level two balancing.

Third level or level three force balancing may include balancing forces acting on all cutting elements in each cutter set. The number of cutters within each cutter set may equal the number of blades on an associated downhole drilling tool. A cutter set may include at least two force balanced neighbor cutter groups. In addition to layout of different types of cutters (e.g., $\mathbf{60}_l$ or $\mathbf{60}_h$) on different respective blades (e.g., $\mathbf{130}_h$ or $\mathbf{130}_1$) based on the impact and/or loadings on a respective blade and/or rock volume removed by a respective blade according to the present disclosure, when performing level three force balancing, the cutters in the set may be in a uniform formation. Imbalance forces resulting from all cutters in each cutter set are minimized or eliminated (balanced). FIGS. 15A-15D depict third level balancing. Depending on the number of primary blades and the starts of secondary blades, one or more cutter sets may be incomplete due to minor blades. For example, the first cutter set listed in FIG. 241 has only two cutters (1,2) on blades (3,7), respectively.

Fourth level or level four force balancing may include balancing forces acting on any group of N (N=3 or N=4) consecutive cutters on an associated composite cutting face profile. In addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure, when performing level four force balancing, the cutters may be in a uniform formation. Respective imbalance forces resulting from each group of N (N=3 or N=4) neighbor cutters may be substantially minimized or eliminated (e.g., balanced). See FIGS. 24J-1 and 24J-2. The number of N (N=3 or N=4) depends on the number of blades and the cutter set used to layout the cutters. See FIG. 27.

In addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure, fifth level or level five force balancing may include balancing forces acting on all cutting elements of a composite bit face profile based on simulating all cutting elements engaged with a generally uniform and/or a generally non-uniform downhole formation.

In embodiments where in addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure, when a generally uniform formation is drilled, level five force balancing may be similar to prior one level force balancing techniques.

For some downhole drilling tools, following layout of different cutters on different blades based on the impact and/or loadings on a blade and/or rock volume removed by a blade according to the present disclosure, only levels one, two, three and five force balancing may be conducted. However, following layout of different cutters on different blades based on the impact and/or loadings on a blade and/or rock volume removed by a blade according to the present disclosure, level four force balancing may be preferred for many downhole drilling tools. Levels one, two, three and five force balancing may be accomplished using cutter layout algorithms as shown in FIGS. 26A, 26B and 27 starting from the nose point of an associated composite cutting face profile. Similar algorithms are also described in copending PCT Patent Application entitled "Multilevel Force Balanced Downhole Drilling Tools and Methods," Ser. No. PCT/US09/067263, filed Dec. 4, 2009.

Level One Force Balancing

For example, FIGS. 13A, 13C, 13E and 13G are schematic drawings showing various components of respective bit faces or cutting faces 126*a*, 126*b*, 126*c* and 126*d* disposed on the downhole end of a fixed cutter rotary drill bit or other downhole drilling tool. FIGS. 13B, 13D, 13F and 13H are schematic drawings showing portions of a composite bit face profile or composite cutting face profile corresponding with the components shown in respective FIGS. 13A, 13C, 13E and 13G. Blades and associated cutting elements discussed with respect to FIGS. 13A-13H may be disposed on exterior portions of fixed cutter rotary drill bit 100, core bit 500 and/or reamer 600, in addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure. FIGS. 13A-13H show various examples of selecting respective cutter groups for level one multilevel force balancing on associated downhole drilling tool in addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure. The following discussions on various cutter groups and cutter sets assume that cutters are laid out in a spiral direction following bit rotation.

Pair Cutter Group

Figure 13A:
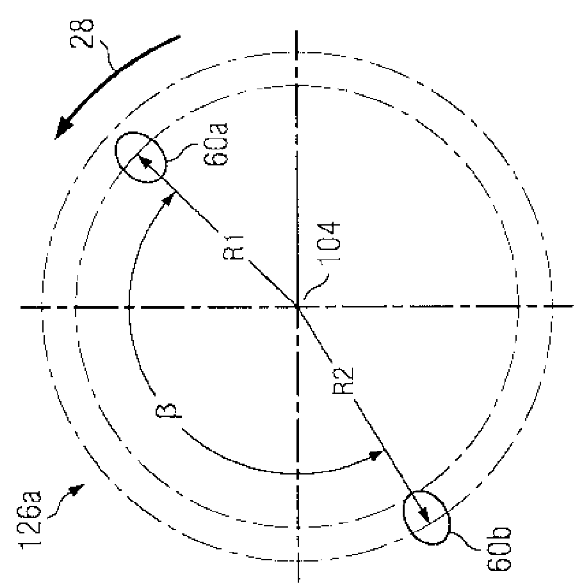
FIGS. 13A and 13B are schematic drawings showing various techniques to select a pair group of cutters which may be used to multilevel force balance a downhole drilling tool according to one example embodiment of the present disclosure.

A pair cutter group such as shown in FIG. 13A, may be defined as a pair of cutting elements disposed on exterior portions of an associated cutting face spaced radially between approximately 160° and 200° from each other relative to an associated bit rotational axis. The preferred angular spacing or optimum angle of separation for the first and second cutting elements in a pair cutter group is approximately 180°. The first cutting element and the second cutting element selected for a pair cutter group must be neighbor cutters on an associated composite cutting face profile with less than 100% overlap between associated cutting surfaces. The radius from the second cutting element to the associated bit rotational axis must be greater than the radius from the first cutting element to the associated bit rotational axis.

Figure 13B:
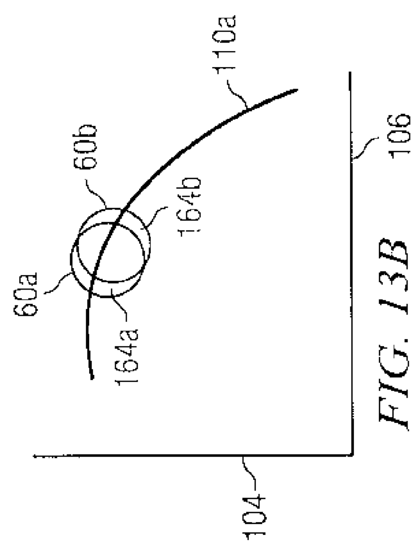

FIGS. 13A and 13B show one example of a "pair cutter group" represented by cutting elements 60*a* and 60*b*, which may be comprised of one or more types of cutting elements such as $\mathbf{60}_l$ and $\mathbf{60}_h$ based on the rock volume removed by the respective blade(s) and/or on the loadings and/or impact force on cutters of the respective blade(s) on which 60*a* and 60*b* are located, according to the present disclosure. Cutting elements 60*a* and 60*b* represent only one example of a pair cutter group satisfactory for use in level one force balancing an associated downhole drilling tool using multilevel force balancing procedures in accordance with teachings of the present disclosure.

As shown in FIG. 13, radial distance R2 from bit rotational axis 104 to cutting element 60*b* is greater than the radial distance R1 from bit rotational axis 104 to first cutting element 60*a*. Angle β between cutting element 60*a* and 60*b* relative to rotational axis 104 is approximately 170° which is greater than 160° and less than 200°.

As shown in FIG. 13B, cutting elements 60*a* and 60*b* satisfy the definition of "neighbor cutters" because cutting element 60*a* and cutting element 60*b* are disposed immediately adjacent to each other on cutting face profile 110*a* with less than 100% overlap between respective cutting surfaces 164 and cutting elements 60*a* and 60*b*.

Three Cutter Group

Figure 13C:
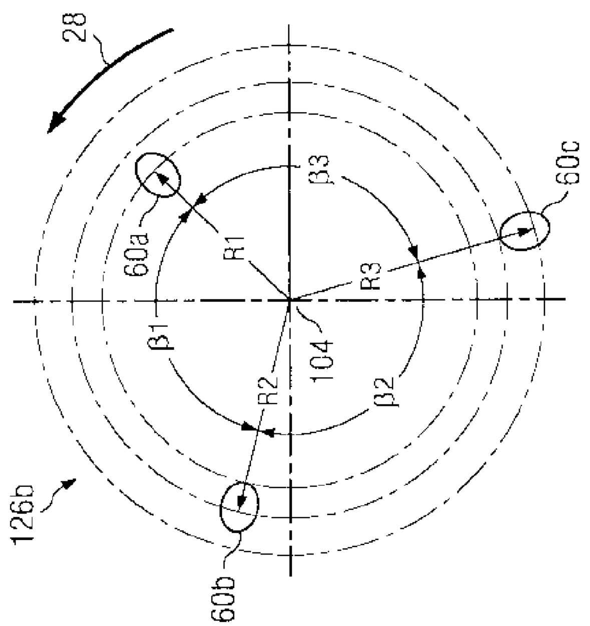
FIGS. 13C and 13D are schematic drawings showing various techniques to select a three cutter group which may be used to multilevel force balance a downhole drilling tool according to one example embodiment of the present disclosure.

For some embodiments, in addition to layout of one or more types of cutting elements such as $\mathbf{60}_l$ and $\mathbf{60}_h$ on different blades based on the rock volume removed by a respective blade(s) and/or on the loadings and/or impact force on cutters of the respective blade(s) on which 60*a* and 60*b* are located according to the present disclosure, cutting elements on a bit face or cutting face may be assigned to respective three cutter groups for multilevel force balancing an associated downhole drilling tool. A three cutter group (cutting elements 60*a*, 60*b*, and 60*c*) as shown in FIG. 13C may be defined as three cutting elements disposed on exterior portions of an associated cutting face spaced radially from each other between approximately 100° and 140° relative to an associated bit rotational axis. As described in the present disclosure, cutting elements 60*a*, 60*b* and 60*c*, may be comprised of one or more types of cutting elements selected from cutters such as $\mathbf{60}_h$ and $\mathbf{60}_l$. The preferred angular spacing or optimum angle of separation for the cutting elements in a three cutter group is approximately 120°. The first, second and third cutting elements selected for a three cutter group must be neighbor cutters on an associated composite cutting face profile with less than 100% overlap between associated cutting surfaces. The radius from the third cutting element to the associated bit rotational axis must be greater than the radius from the second cutting element to the associated bit rotational axis. The radius from the second cutting element to the associated bit rotational axis must be greater than the radius from the first cutting element to the associated bit rotational axis.

Figure 13D:
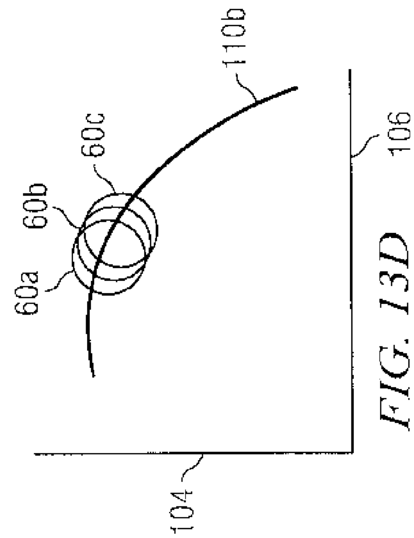

FIGS. 13C and 13D show one example of a "three cutter group" represented by cutting elements 60*a*, 60*b* and 60*c* which may be disposed on exterior portions of respective blades (not expressly shown). Cutting elements 60*a*, 60*b* and 60*c* represent only one example of a three cutter group satisfactory for use in level one force balancing and associated downhole drilling tools using multilevel force balancing procedures following layout of different types of cutting elements 60 (such as $\mathbf{60}_l$, or $\mathbf{60}_h$) on different blades based on loading and/or impact forces on the blades and/or rock volume removed by the respective blade according to the present disclosure. Angle $\beta_1$ between cutting elements 60*a* and 60*b*, angle $\beta_2$ between cutting elements 60*a* and 60*c* and angle $\beta_3$ between cutting element 60*c* and 60*a* are each greater than 100° and less than 140°. As shown in FIG. 13C radial distance $R_3$ from third cutting element 60*c* and bit rotational axis 104 is greater than radial distance $R_2$ from second cutting element 60*b* and bit rotational axis 104. Radial distance $R_2$ between cutting element 60*c* and bit rotational axis 104 is greater than radial distance $R_1$ between cutting element 60*a* and bit rotational axis 104.

As shown in FIG. 13D, cutting elements 60*a*, 60*b* and 60*c* satisfy the definition of "neighbor cutters" since cutting elements 60*a*, 60*b* and 60*c* are disposed adjacent to each other on composite cutting face profile 110*b* with less than 100% overlap to respective cutting surfaces 164 on the associated composite bit face profile 110.

Four Cutter Group

Figure 13G:
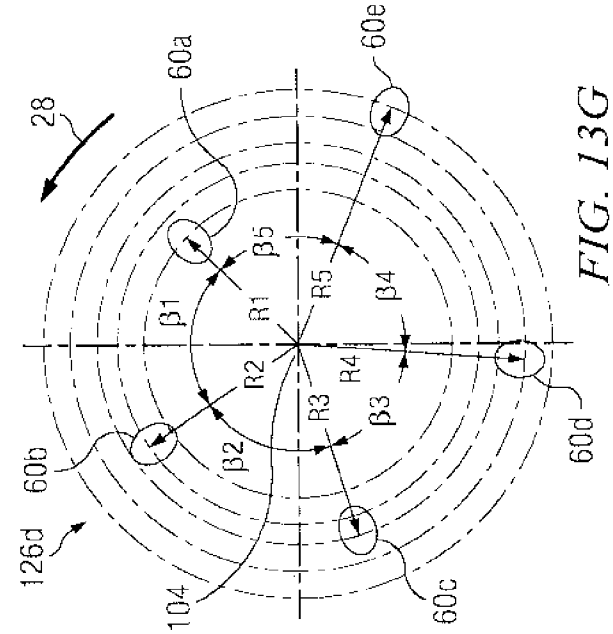
FIGS. 13G and 13H are schematic drawings showing various techniques to select a five cutter group which may be used to multilevel force balance a downhole drilling tool according to one example embodiment of the present disclosure.
Figure 13H:
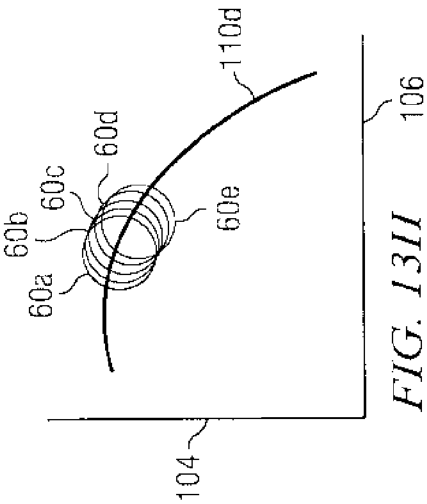
Figure 13E:
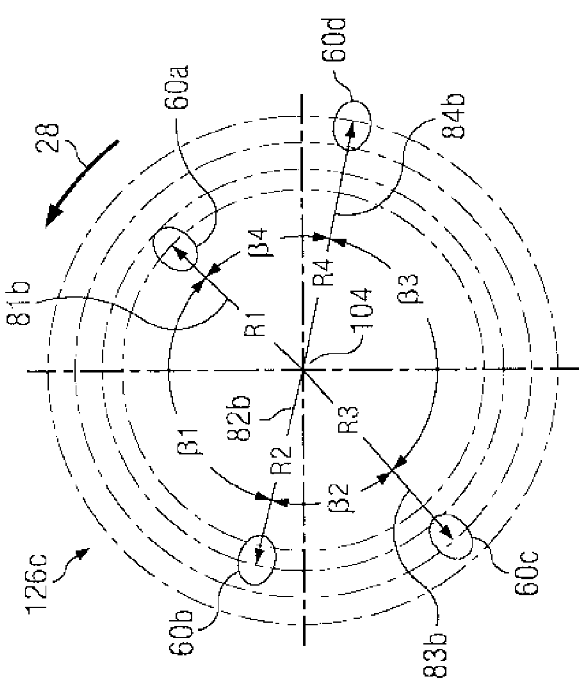
FIGS. 13E and 13F are schematic drawings showing various techniques to select a four cutter group which may be used to multilevel force balance a downhole drilling tool according to one example embodiment of the present disclosure.

For some applications, cutting elements 60*a* and 60*b* (selected from cutters such as $\mathbf{60}_l$ or $\mathbf{60}_h$ based different respective blades (e.g., $\mathbf{130}_h$ or $\mathbf{130}_l$) on which such cutters may be disposed), disposed on the cutting face of a downhole drilling tool may be divided into respective four cutter groups. A four cutter group such as shown in FIG. 13E, may be defined as four cutting elements disposed on exterior portions have an associated cutting face spaced radially from each other with approximately with the angle of separation between the first and second cutter and approximately equal to the angle of separation between the third and fourth cutting element. The angle of separation between the second and third cutting element should be approximately equal to the angle of separation between the fourth cutting element and the first cutting element.

The first, second, third and fourth cutting elements of a four cutter group should be neighbor cutters on the associated cutting face profile with less than 100% overlap. The fourth cutting element should be spaced at a greater radial distance from the associated bit rotational axis than the third cutting element. The third cutting element should be spaced at a greater radial distance from the associated bit rotational axis than the second cutting element. The second cutting element should be spaced at a greater radial distance from the associated bit rotational axis distance than the first cutting element.

Figure 13F:
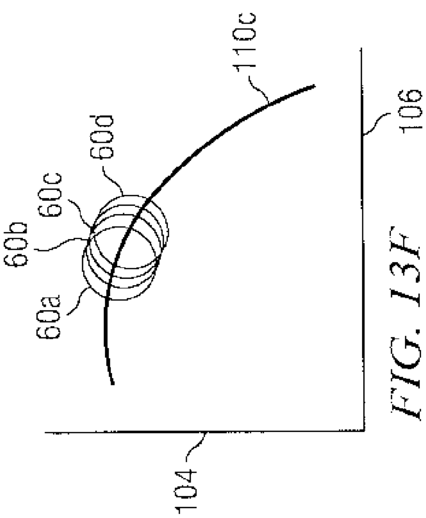

As shown in FIGS. 13E and 13F angle $\beta_1$ between cutting element 60*a* and 60*b* may be approximately equal to angle $\beta_3$ between cutting elements 60*c* and 60*d*. Angle $\beta_2$ between cutting element 60*b* and 60*c* may be approximately equal to angle $\beta_4$ between cutting elements 60*d* and 60*a*. Radius R4 extending between bit rotational axis 104 and cutting element 60*d* is greater than radius R3 extending from bit rotational axis to cutting element 60*c*. Radius R3 associated with cutting element 60*c* is greater than radius R2 from bit rotational axis 104 and cutting element 60*b*. The length of radius R2 between bit rotational axis 104 and cutting element 60*b* is greater than the length of radius R1 extending between bit rotational axis 104 and cutting element 60*a*. Cutters 60*a*-60*d* on bit face profile 110*c* as shown in FIG. 13H have less than 100% overlap. Cutting elements 60*a*, 60*b*, 60*c* and 60*d* are neighbor cutters on the associated bit face profile 110*c*. See FIG. 13F.

Five Cutter Group

For some applications, in addition to layout of one or more types of cutting elements such as $\mathbf{60}_h$ and $\mathbf{60}_l$ based on the rock volume removed by the respective blade(s) and/or on the loadings and/or impact force on cutters of the respective blade(s) on which 60*a*-60*e* are located according to the present disclosure, the cutting elements disposed on exterior portions of downhole drilling tool may be divided into five cutter groups. The angle of separation (β) between each cutting element and a five cutter group may be approximately 72° plus or minus 20°. The first, second, third, fourth and fifth cutting elements of a five cutter group should be neighbor cutters on an associated cutting face profile with less than 100% overlap. The fifth cutting element should be spaced a greater radial distance from the associated bit rotational axis than the fourth cutting element. The fourth cutting element should be spaced at a greater radial distance from the associated bit rotational axis than the third cutting element. The third cutting element should be spaced at a greater radial distance from the associated bit rotational axis than the second cutting element. The second cutting element should be spaced at a greater radial distance from the associated bit rotational axis than the first cutting element. For the example of a five cutter group as shown in FIGS. 13G and 13H cutting elements 60*a*-60*e* satisfy the above rules.

The type of cutters $60_l$ or $60_h$ for each of the previously discussed cutter groups were selected based on the rock volume removed by a respective blade on which each cutter is laid out and/or the loadings and/or impact forces on each cutter of the respective blade as set forth in sections above and at least in FIGS. 7A-9D.

Blade Groups

Following layout of one or more types of cutting elements such as $60_l$ and $60_h$ based on the rock volume removed by the respective blade(s) and/or on the loadings and/or impact force on cutters of the respective blade(s) according to the present disclosure, according to the present disclosure, the number of blades on a downhole drilling tool may be divided into groups depending on the type of cutter groups used for level one force balancing. See Table 301 in FIGS. 26A and 26B. The following examples demonstrate dividing blades into blade groups.

EXAMPLE 1

The blades of a five blade downhole drilling tool as shown in FIG. 14A may be divided into two blade groups: (1,3,5) and (2,4), where blades 131, 133 and 135 form the first blade group and blades 132 and 134 form the second blade group. The preferred match for a five blade downhole drilling tool is (1,3,5) (2,4) on Table 301 in FIG. 26A. A three cutter group may be laid out on the first blade group (1,3,5). Imbalance forces created by the three cutter group may be balanced or minimized. A pair cutter group may be laid out on the second blade group (2,4). Imbalance forces created by the pair cutter group may be balanced or minimized.

EXAMPLE 2

The blades of an eight blade downhole drilling tool as shown in FIGS. 15A-D may be divided into four blade groups: (1,5), (2,6), (3,7), (4,8). Four pair cutter groups may be laid out on the four blade groups. Imbalance forces created by each pair cutter group may be balanced or minimized.

Cutter Set

Following or prior to layout of one or more types of cutting elements such as $60_l$ and $60_h$ based on the rock volume removed by the respective blade(s) and/or on the loadings and/or impact force on cutters of the respective blade(s) on which the respective cutters are located according to the present disclosure, cutter sets may be force balanced according to the multilevel balancing embodiments. A cutter set includes at least two force balanced neighbor cutter groups. The number of cutters in one cutter set may equal the number of blades on an associated downhole drilling tool. As shown in Table 301 of FIG. 26A, a cutter set for a five blade downhole drilling tool may be [(1,3,5) (2,4)] and a cutter set for a eight blade downhole drilling tool may be [(1,5) (2,6) (3,7) (4,8)].

FIGS. 14A and 14B show one example of cutting elements laid out for cutter set [(1,3,5) (2,4)]. FIGS. 14A and 14B are schematic drawings showing portions of cutting face 126*e* and composite cutting face profile 110*e* of a downhole drilling tool with five blades 131-135 disposed thereon. Cutting elements 1, 2 and 3 in the first cutter group may be installed on primary blades 131, 133 and 135 and cutting elements 4 and 5 in the second cutter group may be installed on secondary blades 132 and 134.

Cutting elements 1, 2, 3 of the first cutter group are neighbor cutters. Cutting elements 4, 5 in the second cutter group are also neighbor cutters. See composite cutting face profile 110*e* in FIG. 14B. Imbalance forces created by respective cutting elements in each cutter group may be balanced or minimized by adjusting respective cutter locations, cutter orientations such as back rake, side rake, cutter size and phase angle.

The term "neighbor cutters" may be used in this application to include cutting elements disposed immediately adjacent to each other (e.g., consecutively numbered) on an associated cutting face profile or bit face profile with less than 100% overlap between respective cutting surfaces of the immediately adjacent cutting elements.

The term "force balanced cutter group" includes, but is not limited to, that the magnitude of the imbalance forces associated with the cutters in the group is smaller than that associated with each individual cutter in the same group.

The term "force balanced two neighbor cutter groups" includes, but is not limited to, that the magnitude of the imbalance forces associated with the two neighbor cutter groups is smaller than that associated with each individual cutter in the same two neighbor cutter groups.

The term "force balanced cutter set" includes, but is not limited to, that the magnitude of the imbalance forces associated with the cutters in the set is smaller than that associated with each individual cutter in the same set.

The term "force balanced N (N=3 or N=4) consecutive neighbor cutters" includes, but is not limited to, that the magnitude of the imbalance forces associated with N consecutive neighbor cutters is smaller than the maximum imbalance forces associated with each cutter of N consecutive cutters.

Level Three and Level Four Force Balanced Cutter Sets

In addition to layout of one or more types of cutting elements such as $60_h$ and $60_l$ based on the rock volume removed by the respective blade(s) and/or on the loadings and/or impact force on cutters of the respective blade(s) on which respective cutters are located according to the present disclosure, imbalance forces associated with each cutter set may be balanced at three levels in accordance with teachings of the present disclosure similar to level four force balanced drilling tools. Level one force balancing of a cutter set balances forces associated with the cutting elements in each cutter group. See, for example, FIGS. 13A-13H. Level two force balancing of a cutter set balances forces associated with the cutting elements in any two neighbor cutter groups in the cutter set. See, for example, FIGS. 14A and 14B.

Level three force balancing of a cutter set balances forces associated with all cutting elements in the cutter set.

Figure 15A:
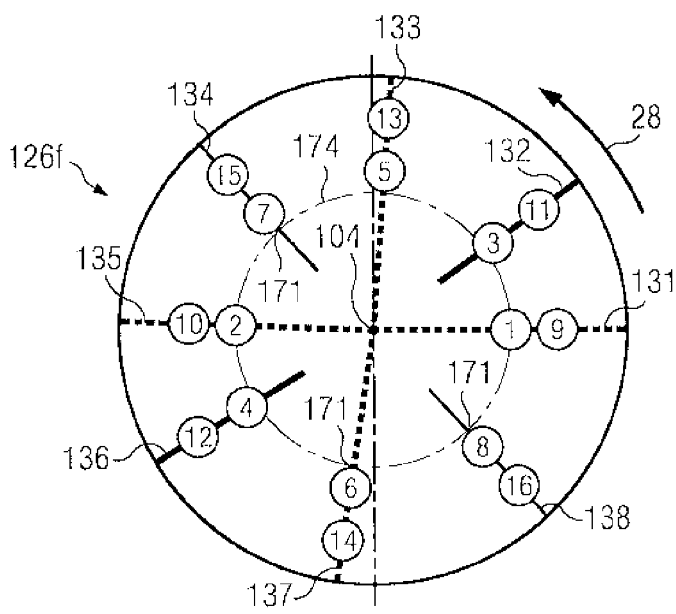
FIGS. 15A-15D are schematic drawings showing various techniques to select or layout locations for installing respective cutting elements in a cutter set which may be used to multilevel force balance a downhole drilling tool having four respective cutter sets according to one example embodiment of the present disclosure.

For example, cutter set [(1,3,5) (2,4)] of a five blade downhole drilling tool shown in FIGS. 14A and 14B and cutter set [(1,5) (2,6) (3,7) (4,8)] of an eight blade downhole drilling tool shown in FIG. 15A are level three force balanced cutter sets.

In addition to layout of different types of cutters (e.g., $\mathbf{60}_l$ or $\mathbf{60}_h$) on different respective blades (e.g., $\mathbf{130}_h$ or $\mathbf{130}_l$) based on the impact and/or loadings on a respective blade and/or rock volume removed by a respective blade according to the present disclosure, some cutter sets may in addition be level four force balanced cutters sets. Level four force balancing of a cutter set calls for balancing forces associated with an N (N=3 or N=4) consecutive cutting elements in the cutter set. As shown in FIGS. 15A-15D, a downhole drilling tool with eight blades 131-138 has four basic pair blade groups [(1,5), (2,6), (3,7), (4,8)]. Depending on the order of the blade groups in each cutter set, at least six cutter sets may be formed if blade group (1,5) is always kept as the first group:

Cutter Set A: [(1,5) (2,6) (3,7) (4,8)]
Cutter Set B: [(1,5) (2,6) (4,8) (3,7)]
Cutter Set C: [(1,5) (3,7) (4,8) (2,6)]
Cutter Set D: [(1,5) (3,7) (2,6) (4,8)]
Cutter Set E: [(1,5) (4,8) (3,7) (2,6)]
Cutter Set F: [(1,5) (4,8) (2,6) (3,7)]

The following description discusses imbalance forces associated with any four consecutive cutting elements (1,2,3,4), (2,3,4,5), (3,4,5,6), (4,5,6,7), (5,6,7,8).

As shown in FIG. 15A, cutter set A [(1,5) (2,6) (3,7) (4,8)] is used to layout cutters on bit face 126*f*. Imbalance forces associated with cutters (2,3,4,5) may not be balanced because these four cutters are located on one side of the bit face 126*f*. Imbalance forces associated with cutters (4,5,6,7) also may not be balanced for the same reason. Therefore, cutter set A [(1,5) (2,6) (3,7) (4,8)] is not a level four force balanced cutter set.

Figure 15B:
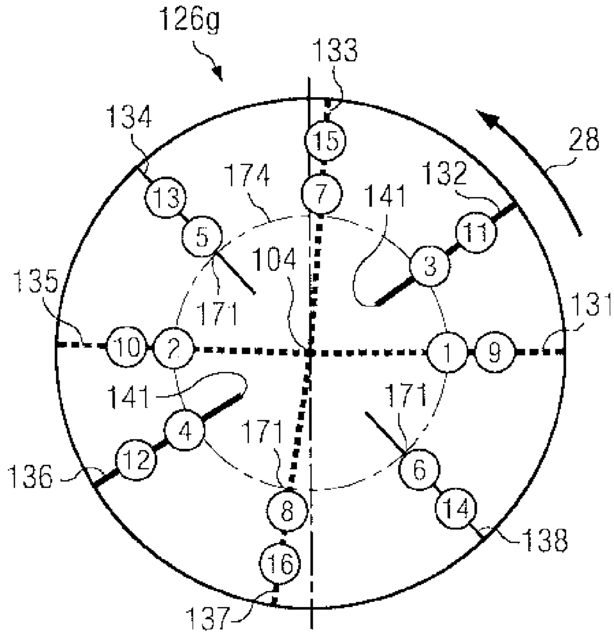

As shown in FIG. 15B, cutter set B [(1,5) (2,6) (4,8) (3,7)] is used to layout cutters on bit face 126*g*. Imbalance forces associated with cutters (2,3,4,5) and imbalance forces associated with cutters (6,7,8,9) may not be balanced because these cutters are located on one side of bit body, respectively. Therefore, cutter set B [(1,5) (2,6) (4,8) (3,7)] is not a level four force balanced cutter set.

Figure 15C:
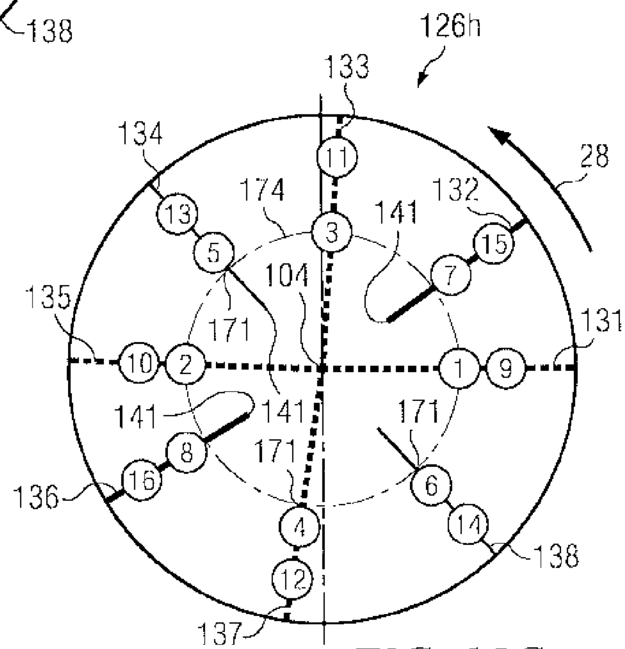

As shown in FIG. 15C, cutter set C [(1,5) (3,7) (4,8) (2,6)] is used to layout cutters on bit face 126*h*. Imbalance forces associated with cutters (2,3,4,5) and imbalance forces associated with cutters (6,7,8,9) may not be balanced because these cutters are located on the same side of cutting face 126*h*. Therefore, cutter set C [(1,5) (3,7) (4,8) (2,6)] is not a level four force balanced cutter set.

Figure 15D:
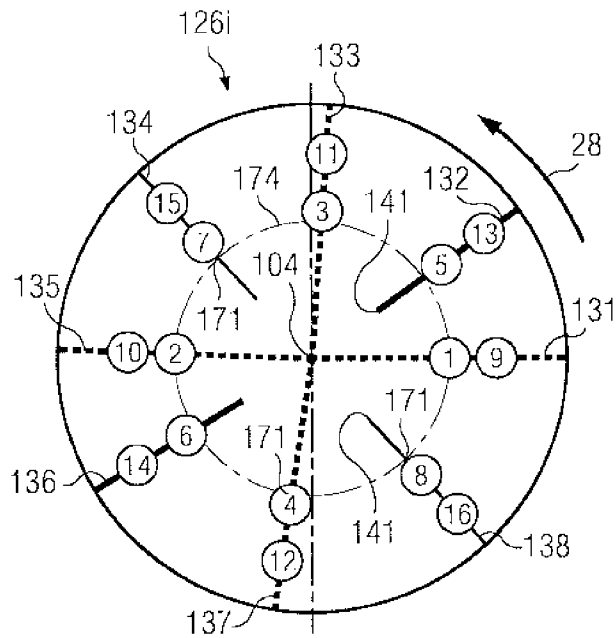

As shown in FIG. 15D, cutter set D [(1,5) (3,7) (2,6) (4,8)] is used to layout cutters on bit face 126*i*. Imbalance forces associated with neighbor cutter groups (1,2,3,4), (3,4,5,6) and (5,6,7,8) may be well balanced. Respective imbalance forces associated with cutters (2,3,4,5) and (4,5,6,7) may be minimized because the angle between these cutters is over 220 degrees. Therefore, cutter set D [(1,5) (3,7) (2,6) (4,8)] may be a level four force balanced cutter set.

Table 302 in FIG. 27 shows the preferred match for an eight blade downhole drilling tool. In addition to layout of one or more types of cutting elements such as $\mathbf{60}_h$ and $\mathbf{60}_l$ based on the rock volume removed by the respective blade(s) and/or on the loadings and/or impact force on cutters of the respective blade(s) on which respective cutters are located according to the present disclosure, cutter layout using cutter set D for an eight blade downhole drilling tool may lead to more stable balanced drilling than cutter sets A, B and C and therefore is the preferred cutter set.

The cutting faces shown in FIG. 15A-15D demonstrate that the order of neighbor cutter groups within a cutter set may play a significant role in design of multilevel force balanced downhole drilling tools in accordance with the present disclosure. If several cutter sets exist for a given number of blades, then level four force balanced cutter sets should first be considered for laying out cutter locations. For downhole drilling tools with only three or four blades, level four force balanced cutter sets may not exist. Only level three force balanced cutter sets may be available.

For a given number of blades, Table 301 in FIGS. 26A and 26B lists possible cutter sets. Table 302 in FIG. 27 lists preferred level four force balanced cutter sets for a given number of blades. The number of consecutive cutting elements N (N=3 or N=4) used for level four force balancing depends on the number of blades and cutter sets. For example, for a nine blade drill bit, if cutter set [(1,4,7) (2,5,8) (3,6,9)] is used to layout cutters, then N=3. See FIG. 26.

Outer Cutter Set

Figure 16C:
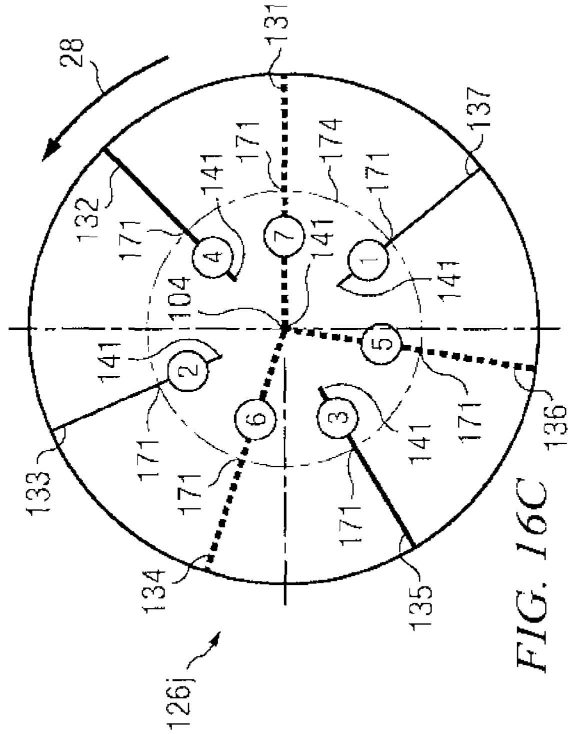
FIGS. 16C and 16D are schematic drawing showing one example of an inner cutter set of multilevel force balanced cutting elements disposed on a fixed cutter rotary drill bit incorporating teachings of the present disclosure.
Figure 16D:
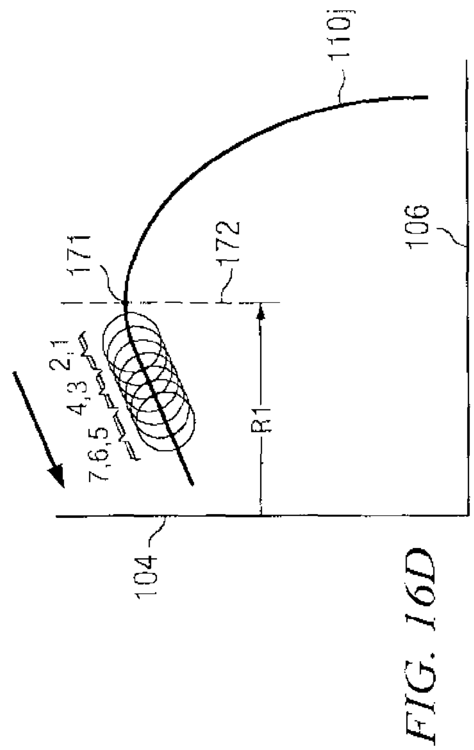
Figure 16A:
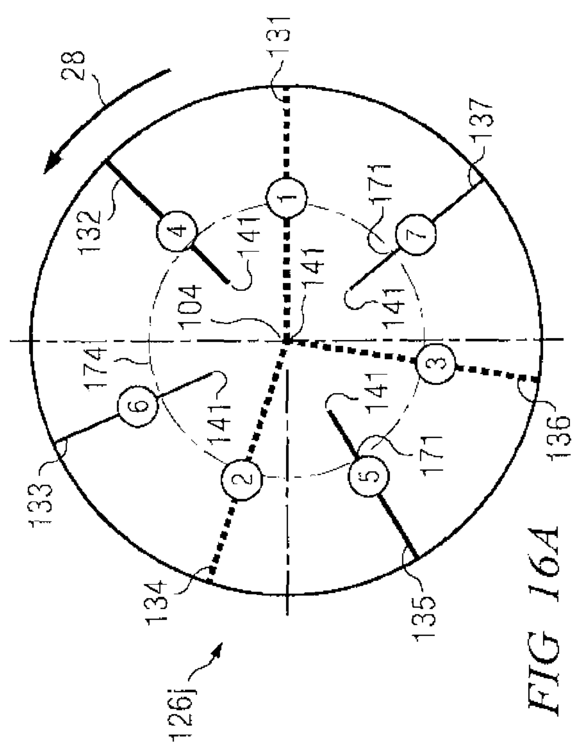
FIGS. 16A and 16B are schematic drawings showing one example of an outer cutter set of multilevel force balanced cutting elements disposed on a fixed cutter rotary drill bit incorporating teachings of the present disclosure.
Figure 16B:
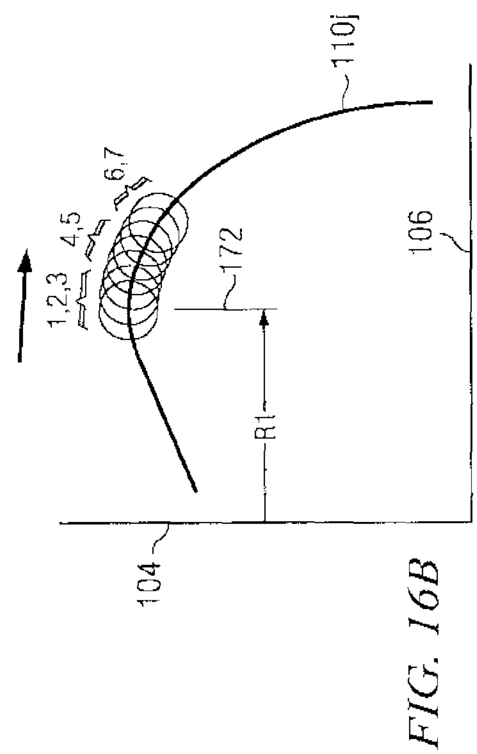

If cutter layout is outwards such as from a nose point to an associated gauge pad, then the outer cutter set is the same as the cutter set defined above. For example, for a seven blade bit using three cutter groups, outer cutter set may be [(1,4,6) (2,5) (3,7)]. FIGS. 16A and 16B show the cutter distributions on bit face 126*j* and bit face profile 110*j* for cutters in an outer cutter set. Bit face profile 110*j* in FIG. 16B indicates that outer cutting elements in each cutter group satisfy the general rule that radial distance from an associated rotational axis to the second cutting element in a cutter group must be greater than the radial distance to the adjacent to the first cutting element. It is noted that the radial location of the cutters within the outer cutter set meets the following rule:

$$R_{i+1}>R_i \quad i=1, 2, 3 \ldots$$

Inner Cutter Set

If cutter layout is inwards such as from nose point to bit center, then the blade order in an inner cutter set is reverse of the blade order of the outer cutter set. For example, if the outer cut set is [(1,4,6) (2,5) (3,7)], then the inner cutter set is: [(7,3) (5,2) (6,4,1)]. FIGS. 16C and 16D show the cutter distributions on bit face and on bit profile for cutters in an inner cutter set.

Blade Order for All Outer Cutters

If cutter layout is outward from a nose point on a cutting face profile and more than one outer cutter set is required, the blade order for all outer cutters is a repeat of the first outer cutter set. For an eight blade bit using cutter set [(1,5) (3,7) (2,6) (4,8)], the blade order for all outer cutters is: [1 5 3 7 2 6 4 8, 1 5 3 7 2 6 4 8, 1 5 3 7 2 6 4 8, . . . ]

Blade Order for All Inner Cutters

If cutter layout is inward from a nose point on a cutting face profile and more than one inner cutter set is required, the blade order for all inner cutters is a repeat of the first inner cutter set. For an eight blade bit using cutter set [(1,5) (3,7) (2,6) (4,8)], the blade order for all inner cutter sets is: [8 4 6 2 7 3 5 1, 8 4 6 2 7 3 5 1, 8 4 6 2 7 3 5 1, . . . ].

Figure 18:
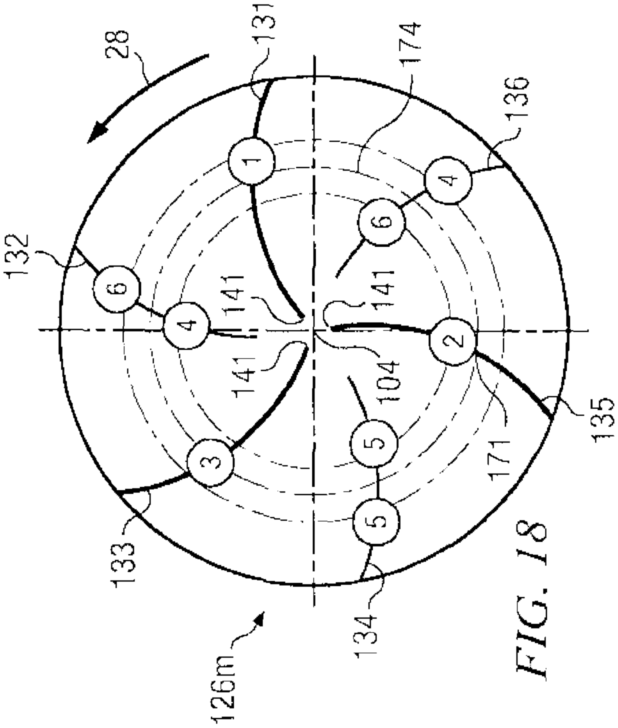
FIG. 18 is a schematic drawings showing examples of selecting or laying out locations for installing cutting elements relative to a nose point on an associated composite cutting face profile in accordance with teachings of the present disclosure.
Figure 17:
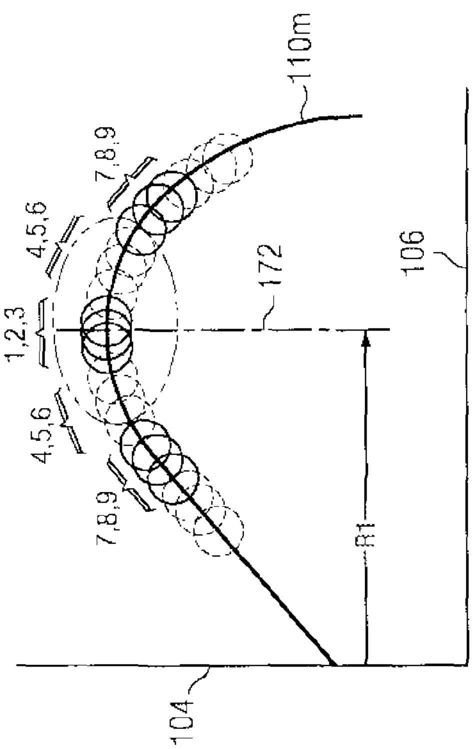
FIG. 17 is a schematic drawings showing examples of selecting or laying out locations for installing cutting elements relative to a nose point on an associated composite cutting face profile in accordance with teachings of the present disclosure.

FIGS. 17 and 18 show two examples of selecting or laying out cutting elements numbered 1-6 starting at or near a nose point on an associated composite cutting face profile where the cutting elements numbered 1-6 are selected from different cutter types such as $\mathbf{60}_h$ or $\mathbf{60}_l$ based on a respective blade type $\mathbf{130}_1$ or $\mathbf{130}_h$ on which the cutter 1-6 may be placed. The resulting cutter groups may be arranged pseudo-symmetrical relative to the nose point on the composite cutting face profile. Pseudosymmetrical arrangements of cutter groups are also described in copending PCT Patent Application entitled "Multilevel Force Balanced Downhole Drilling Tools and Methods," Ser. No. PCT/US09/067263, filed Dec. 4, 2009.

Portions of cutting face shown in FIGS. 17 and 18 may include primary blades 131, 133 and 135. First end 141 of each primary blade may be spaced closely adjacent to associated bit rotational axis 104. The location for installing cutting element 1 on primary blade 131 may be selected to be closely adjacent to nose point 171 and associated nose circle 174. The location for installing second cutting element 2 may be selected on primary blade 135 spaced radially inward relative to cutting element 1 and also in a radial direction opposite from the direction of rotation indicated by arrow 28. Cutting element 3 may also be disposed proximate the associated nose point. As a result, cutting elements 1, 2 and 3 may be disposed generally symmetrical to each other around nose axis 172 on the associated composite cutting face profile 110*m* as shown in FIG. 17. A first group of outer cutting elements 4, 5 and 6 may be disposed or at locations on exterior portions of associated blades extending at a greater radial distance from the nose point 171. Cutting elements 4, 5 and 6 may be laid out outwardly from nose point 171 to an associated gage pad or gage cutter. The blade order for installing the outer cutting elements 4, 5 and 6 may follow the predefined order so that transient imbalance forces associated with all outer cutter elements may be balanced. After layout of the location for all outer cutting elements, a first group of inner cutting elements 4, 5 and 6 may then be disposed at locations spaced radially inward relative to dotted circle 174 as shown in FIG. 18 and nose axis 172 as shown in FIG. 17. The locations for additional inner cutting elements may also be laid out extending from nose point 171 to bit rotational axis 104. The resulting gaps may be substantially minimized and desired overlap provided with respect to the inner cutters and the outer cutters (as shown in FIGS. 17 and 18).

For some embodiments not expressly shown, the initial location for installing the first cutting element, numbered 1, may be selected on a secondary blade such as secondary blade 132, 134 or 136. Since the location for installing the first cutting element is no longer required to be immediately adjacent to the bit rotational axis, the locations for installing the first cutting element may be selected on the secondary blades. The blade order for secondary locations for respective cutting elements may proceed in the predefined order to minimize transient imbalance forces. The importance of selecting locations for laying out or installing cutting elements from a nose point or near a nose point are shown in FIGS. 22A-22F.

For example, as explained in FIG. 17, cutting elements 1, 2 and 3 may be disposed at locations generally symmetrically or arranged relative to nose point 171 and nose axis 172. The first group of outer cutters (4,5,6) may also be balanced with respect to each other and with respect to nose cutters (1,2,3). The first group of inner cutters (4,5,6) may be balanced with respect to each other and with respect to nose cutters (1,2,3). As a result, contact between downhole drilling tool having a composite cutting face profile such as in FIG. 17 may substantially reduce or eliminate imbalance forces resulting in engagement with downhole formations during transition drilling such as shown in FIGS. 11A and 12A-12C.

One aspect of the present disclosure may include laying out cutting elements starting from the nose or near nose of a composite bit face profile. If cutter layout starts from the nose point, then outwards to bit gauge pad, blade order of all outer cutters can follow exactly the pre-defined order so that transient imbalance forces associated with all outer cutters can be balanced. After layout outer cutters, inner cutters are layout from nose point inwards to bit center.

Cutter layout may also start near the nose point. For example, the start layout point may be the start point of the secondary blade and the first cutter may be located on the secondary blade. In this way, blade order of cutters outside of the start point can follow exactly the pre-defined order so that transient imbalance force can be balanced for these outside cutters.

The importance of starting layout cutters from a nose point or near a nose point on an associated composite cutting face profile may be further demonstrated by comparing FIGS. 22A-221 with 24A-24J-2. If cutter layout starts from the nose point, then cutter groups on left and right sides of nose point may be first placed so imbalance forces associated with these cutters may be balanced.

Cutter Arrangement Within Nose Zone

FIG. 17 shows the benefits of placing at least three cutter groups proximate an associated nose zone in accordance with some embodiments of the present disclosure. The first cutter group, cutters (1,2,3), is located around the nose point, the second cutter group, cutters (4,5,6), is on the outside of the first group and the third cutter group, inner cutters (4,5,6), is on the inner side of the first cutter group. The cutter groups should be arranged so that imbalanced forces associated with each cutter group are balanced and imbalance forces associated with the three groups are also balanced. This type of cutter arrangement may be called pseudo-symmetrical cutter groups around nose point.

Usually if bit hydraulics is allowed, at least three cutter sets should be placed around nose zone. The first cutter set is located around the nose point, the second cutter set is on the outside of the first cuter set and the third cutter set is on the inner side of the first cutter set. These cutter sets should be arranged so that imbalance forces associated with each cutter set are balanced and imbalance forces associated with these three cutter sets are also balanced.

Generally, placing more pseudo-symmetrical cutter sets around a nose point may improve force balancing of a downhole drilling tool. Carefully selecting the location of the first end of secondary blades may be important to ensure that a resulting cutter layout includes pseudo-symmetrical arrangement of cutting elements relative to a nose axis. This usually requires at least the first end of secondary blades associated with the third cutter group or cutter set is within the nose radius.

Figure 25A:
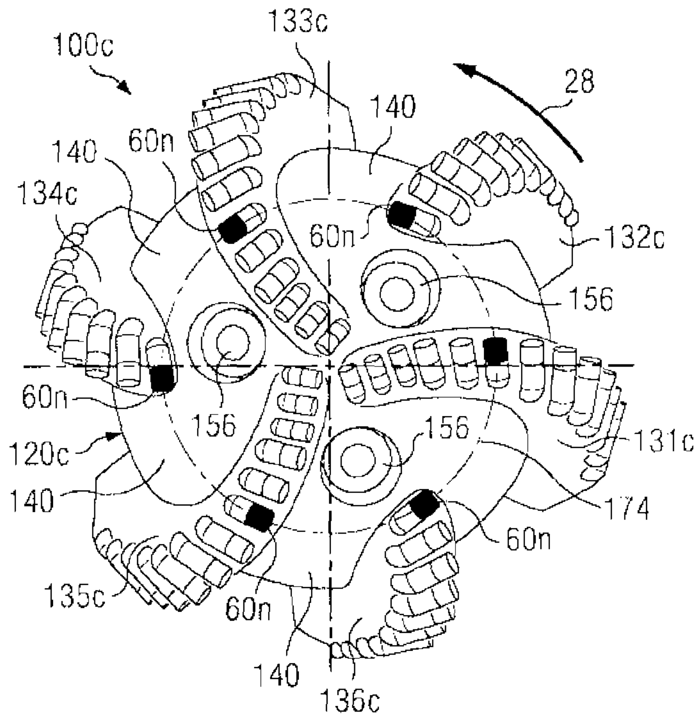
FIG. 25A is a schematic drawing showing an end view of a fixed cutter rotary drill bit incorporating teachings of the present disclosure.
Figure 25B:
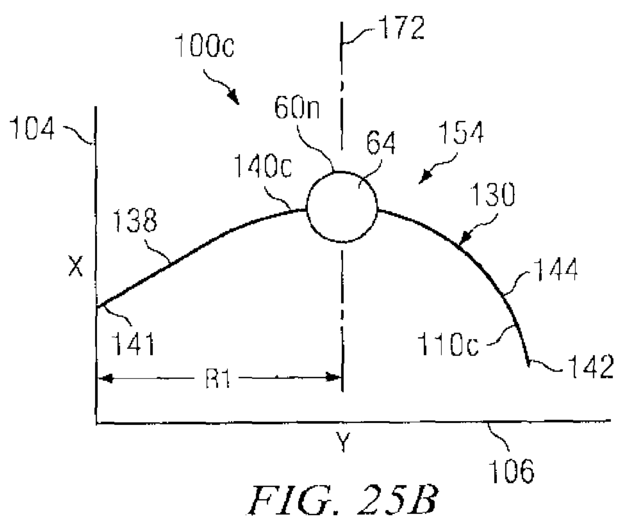
FIG. 25B is a schematic drawing showing portions of a bit profile resulting from placing cutting elements proximate the nose portions of the drill bit in FIG. 25A in accordance with teachings of the present disclosure.

FIG. 25A is a schematic drawing showing an end view of fixed cutter rotary drill bit 100*c*. Fixed cutter rotary drill bit 100*c* may have a plurality of blades 131*c*-136*c* disposed on exterior portions of associated bit body 120*c* having different cutting elements 60 (such as 60*i*, 60*o*, 60*s*, 60*g*, 60*c*, 60*n*, 60*na*, 60*nb*, 60*t*) disposed thereon. As per the present disclosure all the cutting elements 60 (including 60*i*, 60*o*, 60*s*, 60*g*, 60*c*, 60*n*, 60*na*, 60*nb*, and 60*t*) are either $\mathbf{60}_h$ or $\mathbf{60}_l$ type cutters based on which blade they are placed on ($\mathbf{130}_h$ or $\mathbf{130}_l$). Dotted circle 174 may correspond with respective nose point 171 on exterior portions of respective blades 131*c*-136*c*. Radius of dotted circle 174 may correspond with the distance between bit rotational axis 104 and nose axis 172 as shown in FIG. 25B. For some applications, respective cutting elements 60*n* may be disposed closely proximate to nose points 171 on each blade 131*c*-136*c*. Resulting bit face profile 110*c* is shown in FIG. 25B.

For this embodiment, cutting elements 60*n* have approximately 100% overlap with each other on bit face profile 110*c*. Therefore, cutting elements 60*n* do not meet the requirement of "neighbor cutters" for purposes of multilevel force balancing techniques. However, installing a large number of cutting elements proximate the nose point of rotary drill bits and other downhole drilling tools may substantially improve stability during initial contact with a downhole formation or during transition drilling from a first generally hard formation from a first generally soft formation into a second generally harder formation.

For the other applications, nose cutters 60*n* may only be disposed on nose points associated with primary blades 131*c*, 133*c* and 135*c* (not expressly shown) at approximately the same angle relative to each other and relative to bit rotational axis 104. For such applications cutting elements 60*n* may be located at approximately the same radial distance from associated bit rotational axis 104 and at the height from reference line 108 extending generally perpendicular to bit rotational axis 104. For other applications two blades (not expressly shown) may be spaced approximately one hundred eighty degrees (180°) from each other or four blades (not expressly shown) may be spaced approximately ninety degrees (90°) from each other or five blades (not expressly shown) approximately seventy two degrees (72°) from each other or six blades (not expressly shown) may be spaced approximately sixty degrees) (60°) from each other or seven blades (not expressly shown) may be spaced approximately 51.42° from each other, etc.

Algorithm 1: Two Blade Groups

Figure 19A:
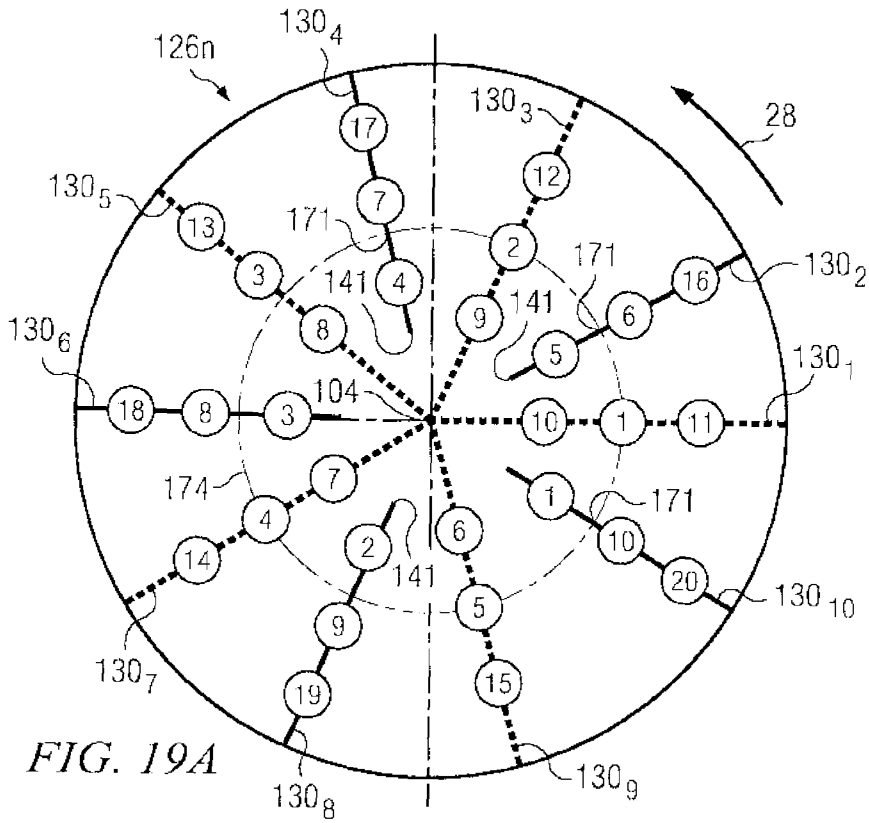
FIGS. 19A-19D are schematic drawings showing various examples for selecting locations to install cutting elements on exterior portions of a downhole drilling tool having ten blades using blade groups and cutter sets in accordance with teachings of the present disclosure.

Following or prior to layout of one or more types of cutting elements such as 60$_h$ and 60$_l$ based on the rock volume removed by the respective blade(s) and/or on the loadings and/or impact force on cutters of the respective blade(s) on which respective cutters are located according to the present disclosure, for multilevel force balancing embodiments, according to one embodiment, if an algorithm for two blade groups is used, then the preferred number of blades in each blade group should be as close as possible. For downhole drilling tool with ten (10) blades, the preferred two blade groups may be (1,3,5,7,9) and (2,4,6,8,10). If the primary blades are (1,3,5,7,9) and cutter layout starts from the nose point 171 or near nose point 171, then the preferred cutter set is [(1 3 5 7 9) (2 4 6 8 10)]. FIG. 19A shows cutting face 126*n* with resulting layout for nose cutters 1, 2, 3, 4 and 5 disposed at or near respective nose points 171 corresponding with circle 174 when a two blade groups' algorithm is used.

If the primary blades are (1,3,5,7,9) or 131, 133, 135, 137 and 139 as shown in FIG. 19A and layout cutter starts from a start point of one of the secondary blades 132, 134, 136, 138 or 140, then the preferred cutter set becomes [(2,4,6,8,10) (1,3,5,7,9)]. Other two blade groups may be used to layout or select locations for installing cutting elements on a downhole drilling with 10 blades. For example, two blade groups may be used because 10=4+6, the first blade group will have four blades and the second blade group will have six blades.

Algorithm 2: Pair Blade Groups

Figure 19B:
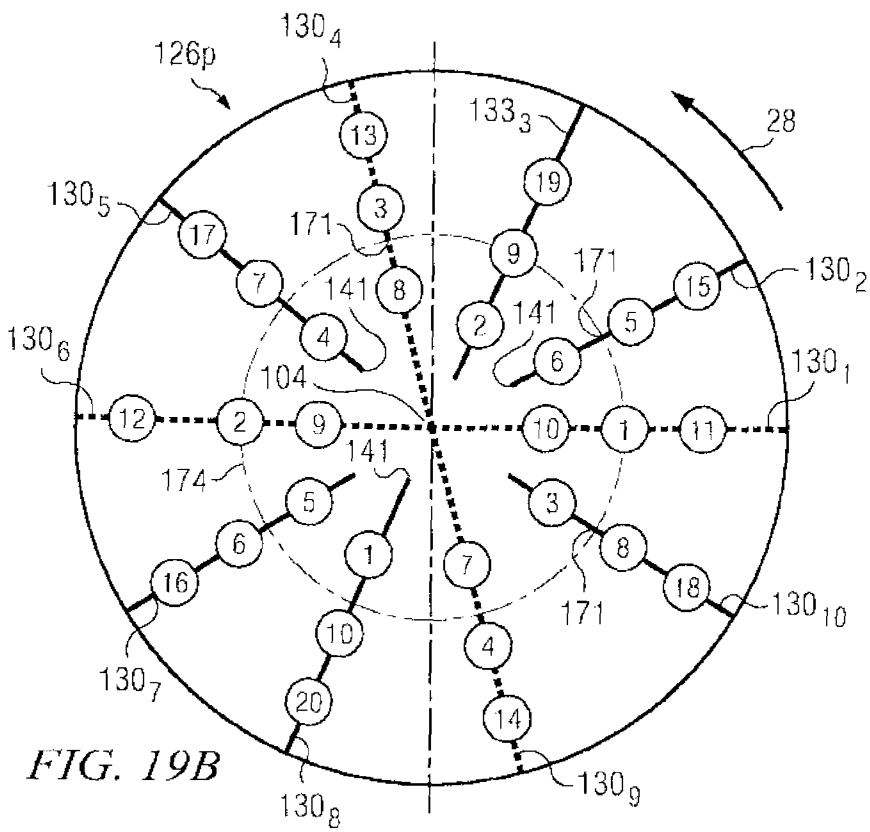

Following or prior to layout of one or more types of cutting elements such as 60$_l$ and 60$_h$ based on the rock volume removed by the respective blade(s) and/or on the loadings and/or impact force on cutters of the respective blade(s) on which respective cutters are located according to the present disclosure, according to one embodiment, there are five possible pair groups for a downhole drilling tool with ten blades: (1,6), (2,7), (3,8), (4,9), (5,10). If the primary blades are (1,4,6,9) as shown in FIG. 19B, then the preferred cutter set is [(1,6) (4,9) (2,7) (5,10) (3,8)].

As listed in Table 301 of FIG. 26A, there may be other types of cutter sets for a ten blade downhole drilling tool by reordering the blade groups, for example, cutter set [(1,6) (2,7) (3,8) (4,9) (5,10)] may be used for cutter layout. However, cutter set [(1,6) (2,7) (3,8) (4,9) (5,10)] may only be level three force balanced. The preferred cutter set [(1,6) (4,9) (2,7) (5,10) (3,8)] may be level four force balanced. Therefore, using the preferred cutter set for cutter layout ten blade downhole drilling tool may provide better lateral stability.

Algorithm 3: Three Blade Groups

Figure 19C:
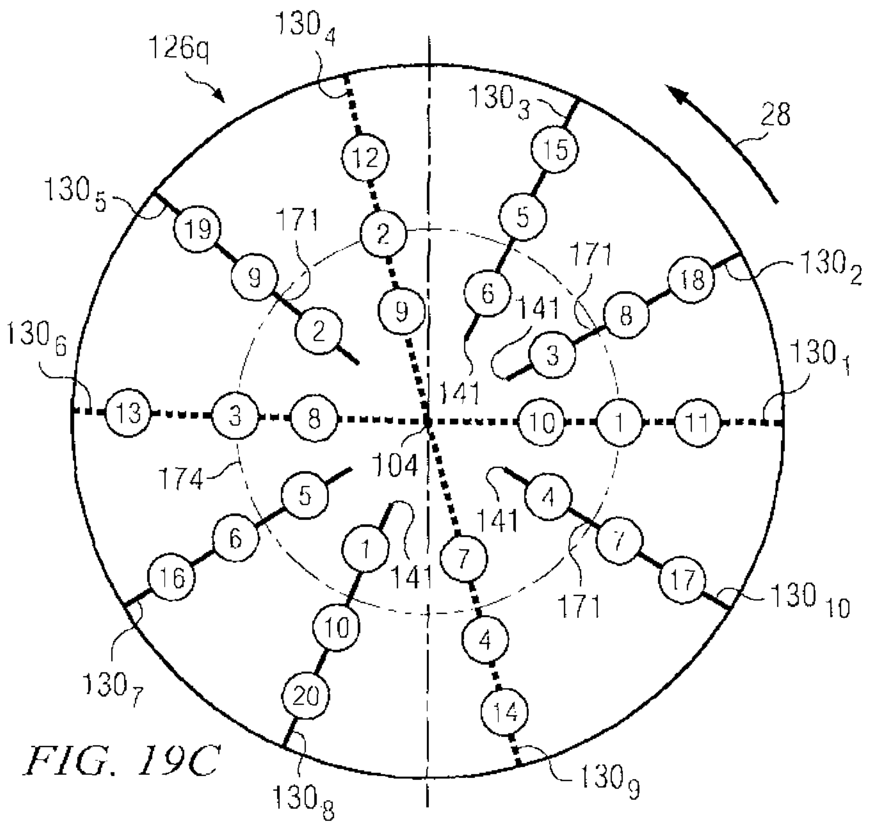

Cutting face 126*q* as shown in FIG. 19C four primary blades 131, 134, 136 and 139. The blades may be divided into three blade groups [(1,4,6,9) (2,5,8) (3,7,10)]. Following or prior to layout of one or more types of cutting elements such as 60$_l$ and 60$_h$ based on the rock volume removed by the respective blade(s) and/or on the loadings and/or impact force on cutters of the respective blade(s) on which respective cutters are located according to the present disclosure, for multilevel force balancing embodiments, the preferred cutter set is [(1,4,6,9), (3,7,10), (2,5,8)] which is level four force balanced. FIG. 19C depicts the cutters layout when three groups algorithm is used.

As listed in Table 301 of FIG. 26B, there may be other types of cutter set for a ten blade downhole drilling tool using three blade groups. For example, cutter set [(1,3,6,8) (2,5,9) (4,7,10)] may be used to layout cutters but it may be only level three force balanced.

Algorithm 4: Four Blade Groups

Figure 19D:
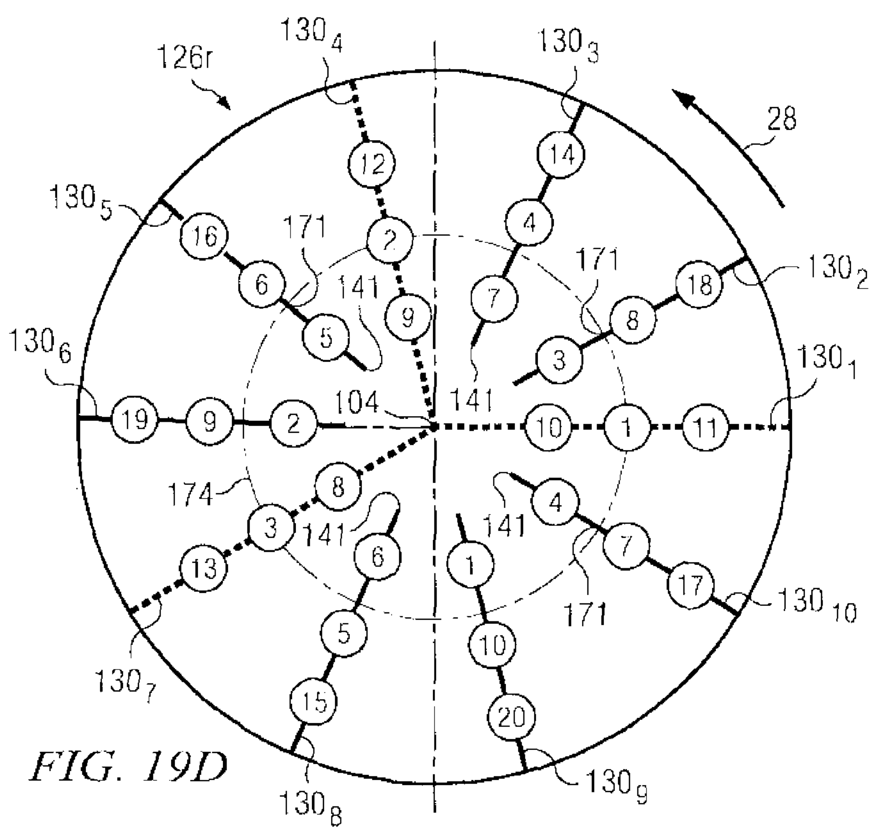

Cutting face in FIG. 19D has only three primary blades 131, 134 and 137. Four cutter groups and cutter set [(1,4,7) (3,8) (5,10) (2,6,9)] may be used to select or layout locations for installing cutting elements on exterior portions of blades 131-140, in addition to layout of one or more types of cutting elements such as 60$_h$ and 60$_l$ based on the rock volume removed by the respective blade(s) and/or on the loadings and/or impact force on cutters of the respective blade(s) on which respective cutters are located according to the present disclosure, for a multilevel force balancing embodiment as described herein. This cutter set may only be level three force balanced. Examples of other cutter sets which may also be used are shown in Table 301 of FIG. 26B.

Other Algorithms: Five Blade Groups, Six Blade Groups and Seven Blade Groups

If the number of blades on a downhole drilling tool is M, then the maximum number of blade groups may be estimated by the integer part of M/2. For example, for a downhole drilling tool has fifteen (15) blades, the blades may be divided into a maximum of 7 groups. Therefore, for a downhole drilling tool with 15 blades, at least six algorithms may be used:

Two blade groups: 15=7+8;

Three blade groups: 15=5+5+5;

Four blade groups: 15=3+4+4+4;

Five blade groups: 15=3+3+3+3+3;

Six blade groups: 15=3+3+3+2+2+2;

Seven blade groups: 15=3+2+2+2+2+2+2;

Selected cutter sets for some of algorithms are listed in Table 301 in FIGS. 26A, 26B and 27. For multilevel force balancing embodiments, in addition to layout of one or more types of cutting elements such as $60_h$ and $60_l$ based on the rock volume removed by the respective blade(s) and/or on the loadings and/or impact force on cutters of the respective blade(s) on which respective cutters are located according to the present disclosure, selected cutter sets and algorithms as described herein may be used.

Blade Order Violations & Algorithm

There are two cases in which the above pre-defined blade orders, especially blade orders for inner cutter sets, may violate multilevel force balancing requirements.

Case 1: Minimal and Maximal Distance Between Two Neighbor Cutters on the Same Blade The distance between any two adjacent cutters (not on the same blade) on an associated composite cutting face profile is determined by a given design overlap ratio of neighbor cutting surface. Overlap ratio of two cutters is defined by the shared area divided by the sum of areas of two cutters. For example, 100% overlap of neighbor cutting surfaces results in zero distance between the two cutters on the composite cutting face profile. The desired overlap between any two neighbor cutters on an associated cutting face profile is usually less than 100% and most often between 20% to 90% in accordance with teachings of the present disclosure.

The pre-defined overlap and pre-defined blade orders may lead to the distance between two neighbor cutters on the same blade being either too small or too large. If this distance is too small, there may be not enough space on a blade to install a cutting element. If this distance is too large, then at least one of the cutters may remove too much rock and may subject to increased forces as compared to cutters with proper overlap.

Satisfaction of distance requirement between two neighbor cutters on the same blade may lead to violation of blade orders, especially blade order for inner cutters. Iteration is usually needed to avoid this situation by carefully adjusting overlap ratio, cutter size, side rake angle and other design parameters.

Case 2: Incomplete Cutter Group or Incomplete Cutter Set

The pre-defined blade orders, either for inner cutters or for outer cutters, are repeated by cutter set. The number of cutters on a downhole drilling tool divided by the number of cutters in a cutter set may be not equal an integer. Several last cutters may not belong to any pre-defined cutter groups or cutter sets.

For example, for an eight blade on a downhole drilling tool using cutter set [(1,5) (3,7) (2,6) (4,8)], and starting layout cutters from the nose point, then the predefined blade orders for all inner cutters are: [8 4 6 2 7 3 5 1, 8 4 6 2 7 3 5 1]

However, if only 9 cutters may be put on inner blades and the resulted blade order for the 9 cutters becomes: [8 4 6 2 7 3 5 1, 8]. The last cutter (or the cutter closet to bit center), cutter 9 is on blade 8 and does not belong to any cutter group. The imbalance forces created by cutter 9 may not be balanced.

If the start radii of the secondary blades 2 and 6 are outside of the nose point, then the blade orders for inner cutters may become: [8 4 7 3 5 1, 7 3 5 1]. The first cutter set becomes incomplete. The imbalance forces associated with an incomplete cutter set may not be balanced.

Figure 31:
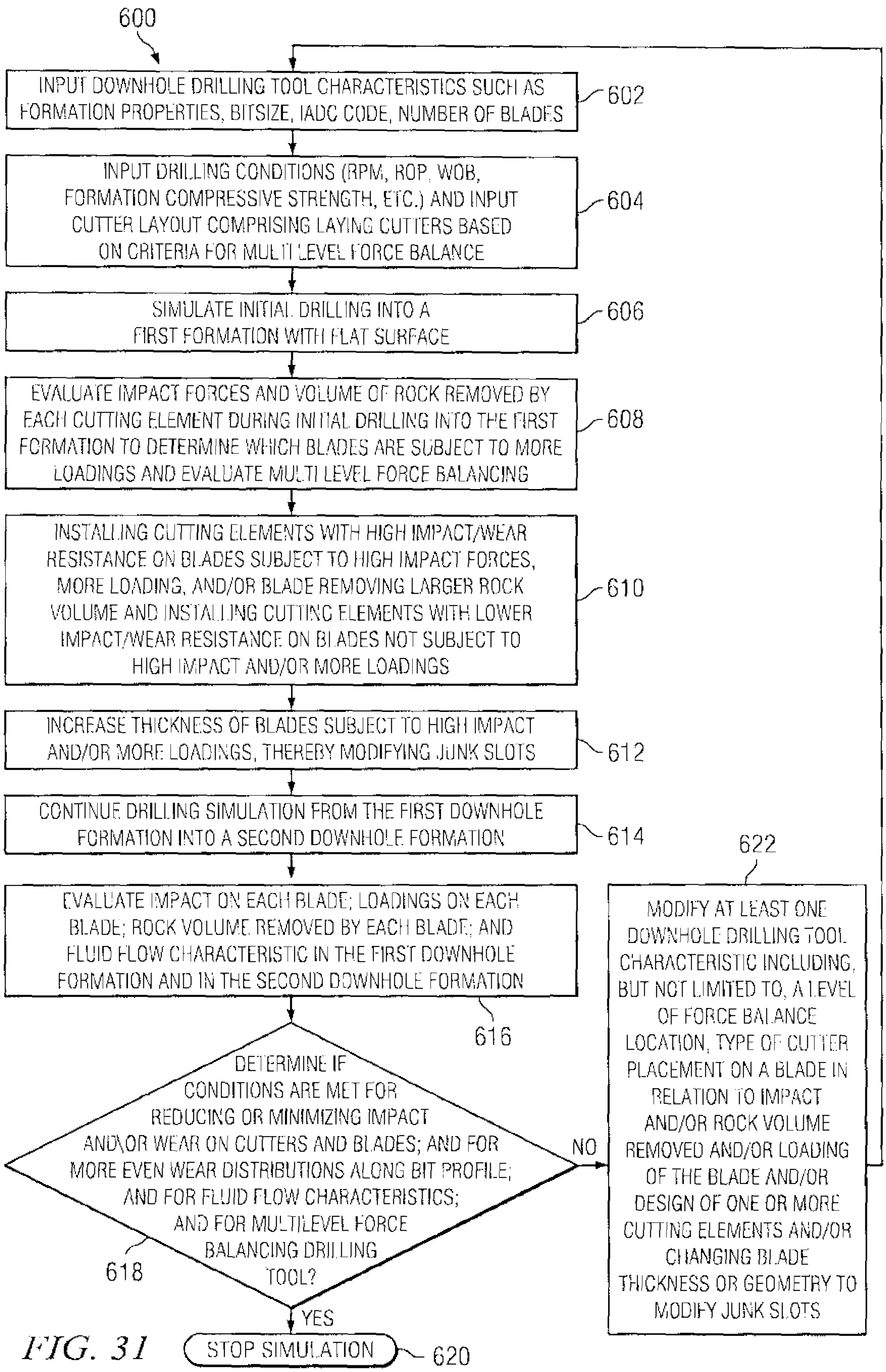
FIG. 31 is a process diagrams showing an example of techniques or procedures which may be used to design various downhole drilling tools in accordance with one embodiment of the present disclosure.

A downhole drilling tool of method 500*a* or 500*b* shown in FIG. 6A or 6B and FIG. 31 may be needed to avoid this situation by adjusting the starting point of cutter layout, overlap ratio for inner cutters, cutter size, side rake angle, phase angle and other design features according to the present embodiments.

Choice of Cutter Layout Algorithms

Many algorithms may be used for a downhole drilling tool with a given number of blades. For each cutter layout algorithm, there may be many cutter sets to choose from. A downhole drilling tool designer should first choose which algorithm to use and then choose which cutter set to use. Selected cutter sets for a given number of blades are listed if FIGS. 26A, 26B and 27.

Three rules should generally be followed for choosing a cutter layout algorithm and choosing a force balanced cutter set.

First Rule: Preferred number of cutters in a blade group is either 2 or 3. If the number of blades is even, then pair blade group algorithm should be used. For example, for an eight blade bit, the preferred cutter layout algorithm should be pair blade group algorithm. If the number of blades is odd, then number of blade in each blade group should be either 2 or 3. For a downhole drilling tool with seven blades, the preferred number of blade groups should be three, namely, 7=3+2+2. Therefore, the three blade group algorithm should be used.

Second Rule: The number of cutters in each cutter group should be as close as possible. For the two blade group algorithm, if the number of blades is even, then the first and second blade groups will have the same number of blades. If the number of blades is odd, then one blade group has K blades and another blade group has K+1 blades where 2K+1 equals the number of blades.

A downhole drilling tool with nine blades may be used to further demonstrate this rule. Two algorithms may be used as listed in FIGS. 26A and 26B:

Three blade groups: 9=3+3+3; and

Four blade groups: 9=3+2+2+2.

The three blade group algorithm may be better than the four blade group algorithm because the three blade group algorithm may create more symmetrical cutting structure than the four blade group algorithm.

Third Rule: Level four force balanced cutter sets should be as preferred over level three force balanced cutter sets. This rule was demonstrated for a downhole drilling tool with eight blades in FIG. 15D. The preferred cutter set [(1,5) (3,7) (2,6) (4,8)] may be level four force balanced which should be used in cutter layout.

Figure 20:
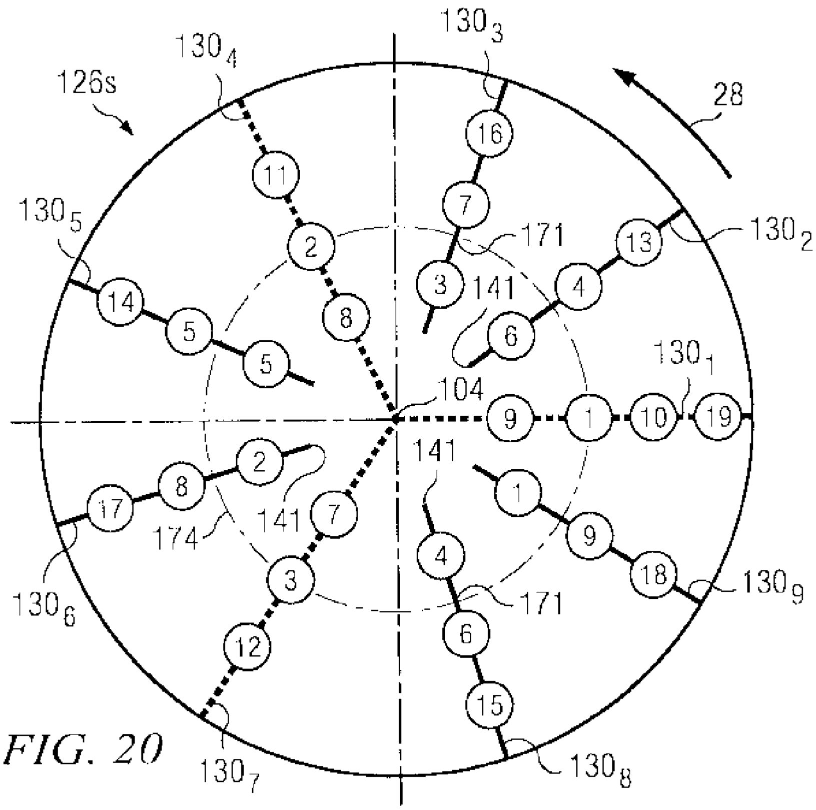
FIG. 20 is a schematic drawing showing one example of techniques to select locations for installing cutting elements on exterior portions of a downhole drilling tool having nine blades using three blade groups in accordance with teachings of the present disclosure.

Rule three may be further demonstrated for a downhole drilling tool with nine blades and imbalance forces created by any three neighbor cutter group: [(1,2,3) (2,3,4) (3,4,5) (4,5,6) (5,6,7) (6,7,8) (7,8,9)]. If the three cutter group algorithm and the preferred cutter set [(1,4,7) (2,5,8) (3,6,9)] are used, the cutter layout is shown in FIG. 20. Imbalance forces associated with any three neighbor cutters [1,2,3) (2,3,4) (3,4,5) (4,5,6) (5,6,7) (6,7,8), (7,8,9) may be balanced or minimized because the degrees of separation between any these cutters relative to rotational axis 104 is over one hundred eighty (180°) degrees.

Figure 21:
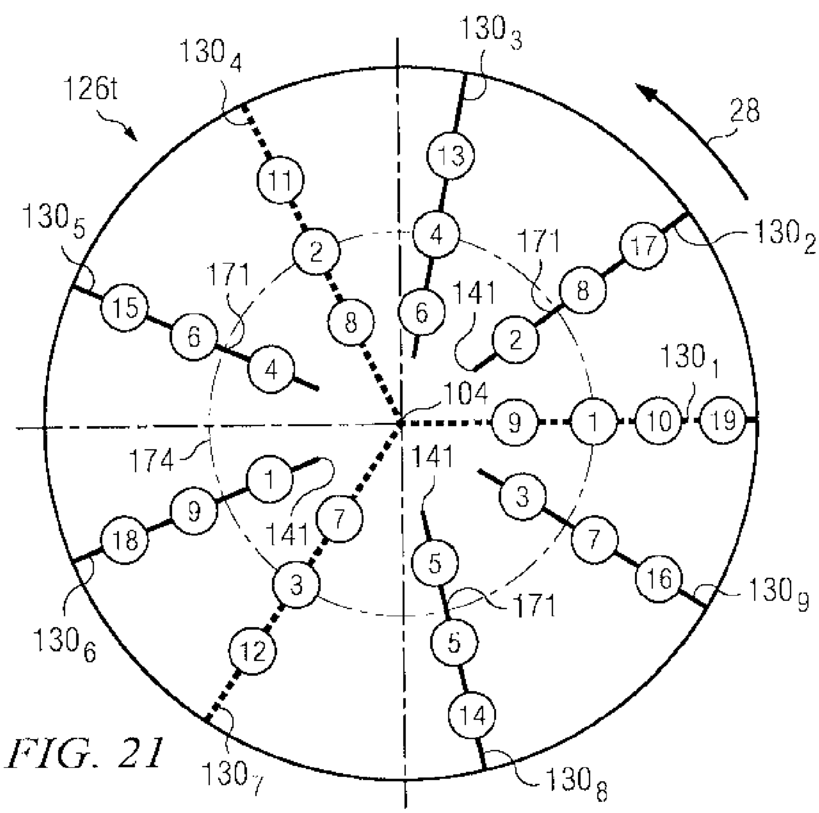
FIG. 21 is a schematic drawing showing one example of techniques to select locations for installing cutting elements on exterior portions of a downhole drilling tool having nine blades using four blade groups in accordance with teachings of the present disclosure.

On the other hand, FIG. 21 shows cutter layout where four group algorithm is used with cutter set [(1,4,7) (3,8) (5,9) (2,6)]. Among any three neighbor cutters (1,2,3) (2,3,4) (3,4,5) (4,5,6) (5,6,7) (6,7,8) (7,8,9) imbalance force associated with (2,3,4), (5,6,7) and (7,8,9) may not be balanced or minimized because three cutters are located on the same side of cutting face 110A.

Therefore, a nine blade bit designed by three group algorithm using cutter set [(1,4,7) (2,5,8) (3,6,9)] should be more stable than that designed by four group algorithm using cutter set [(1,4,7) (3,8) (5,9) (2,6)] using multilevel force balancing procedures.

Figure 22D:
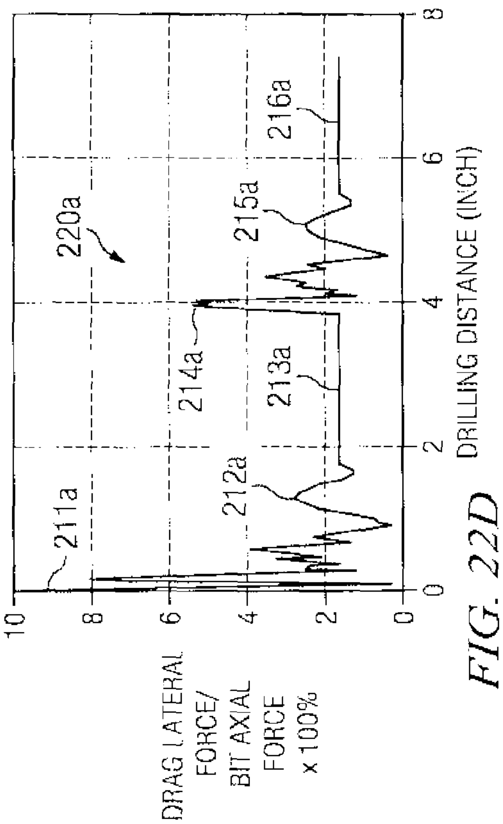
FIGS. 22C-22I are graphs showing imbalanced force levels during transition drilling which may result from installing cutting element on the drill bit shown in FIGS. 22A and 22B and using prior art techniques to force balance such cutting elements.
Figure 22C:
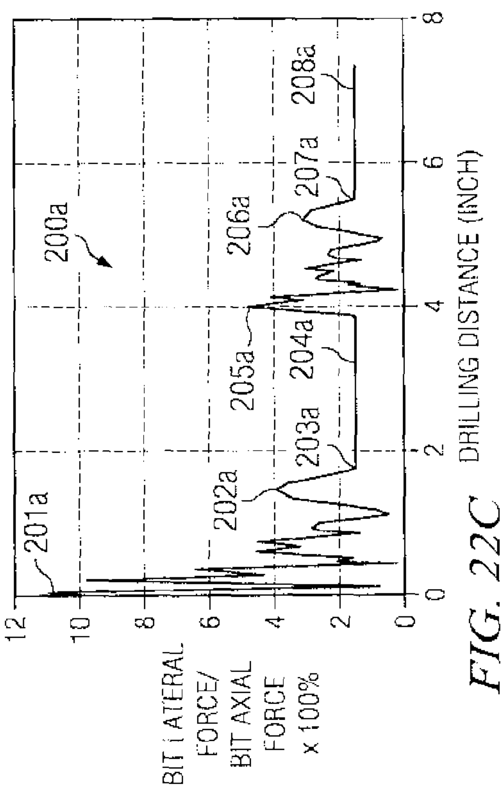
Figure 22F:
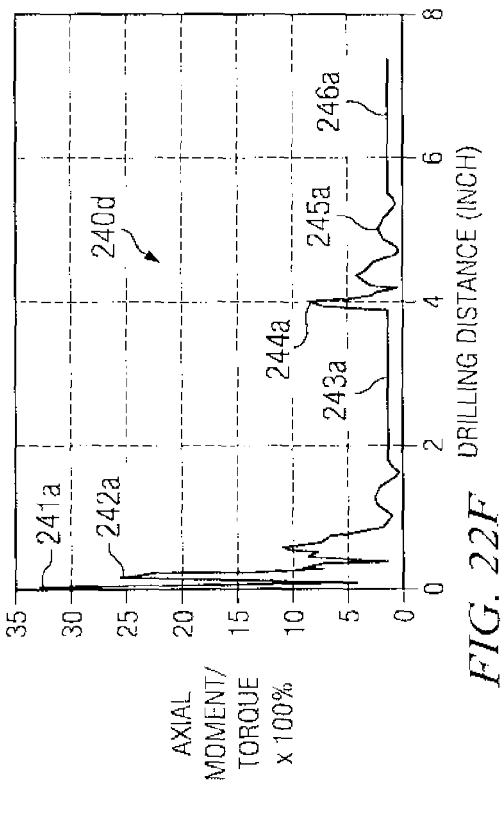
Figure 22E:
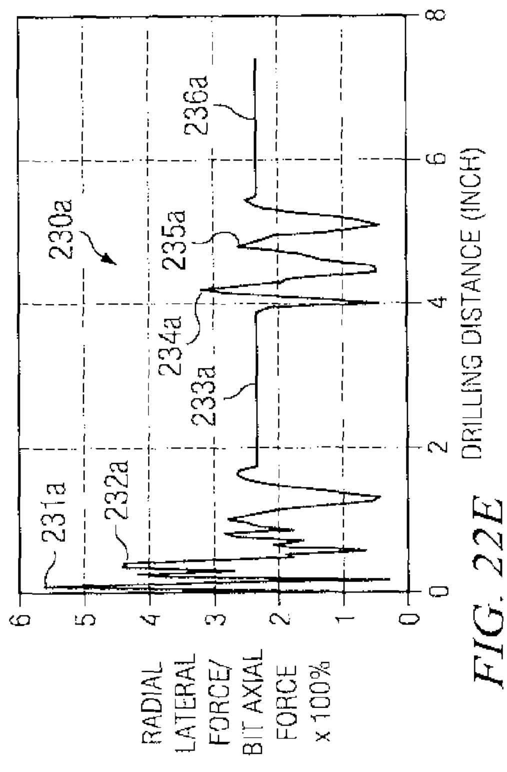
Figure 22G:
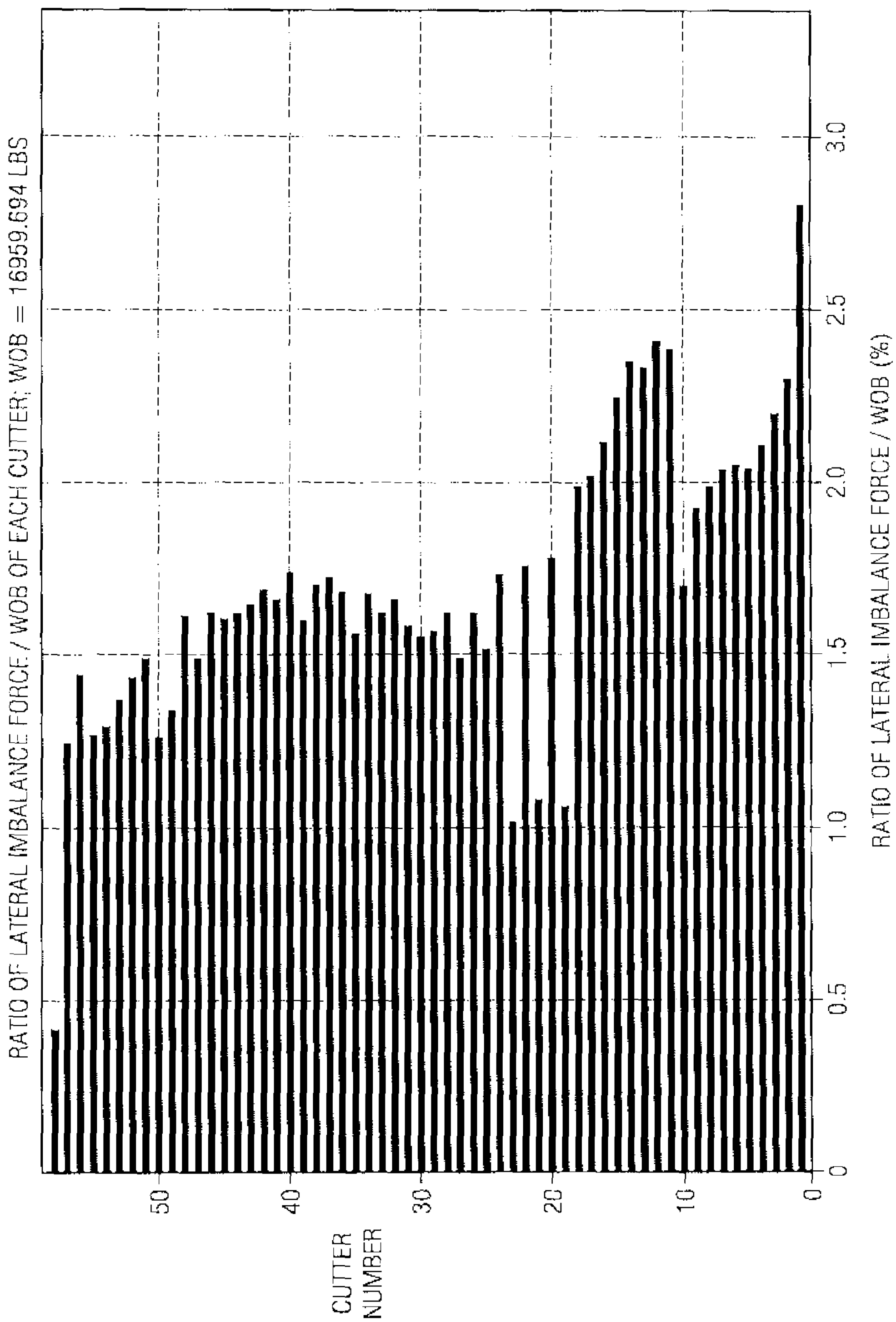
Figure 22H:
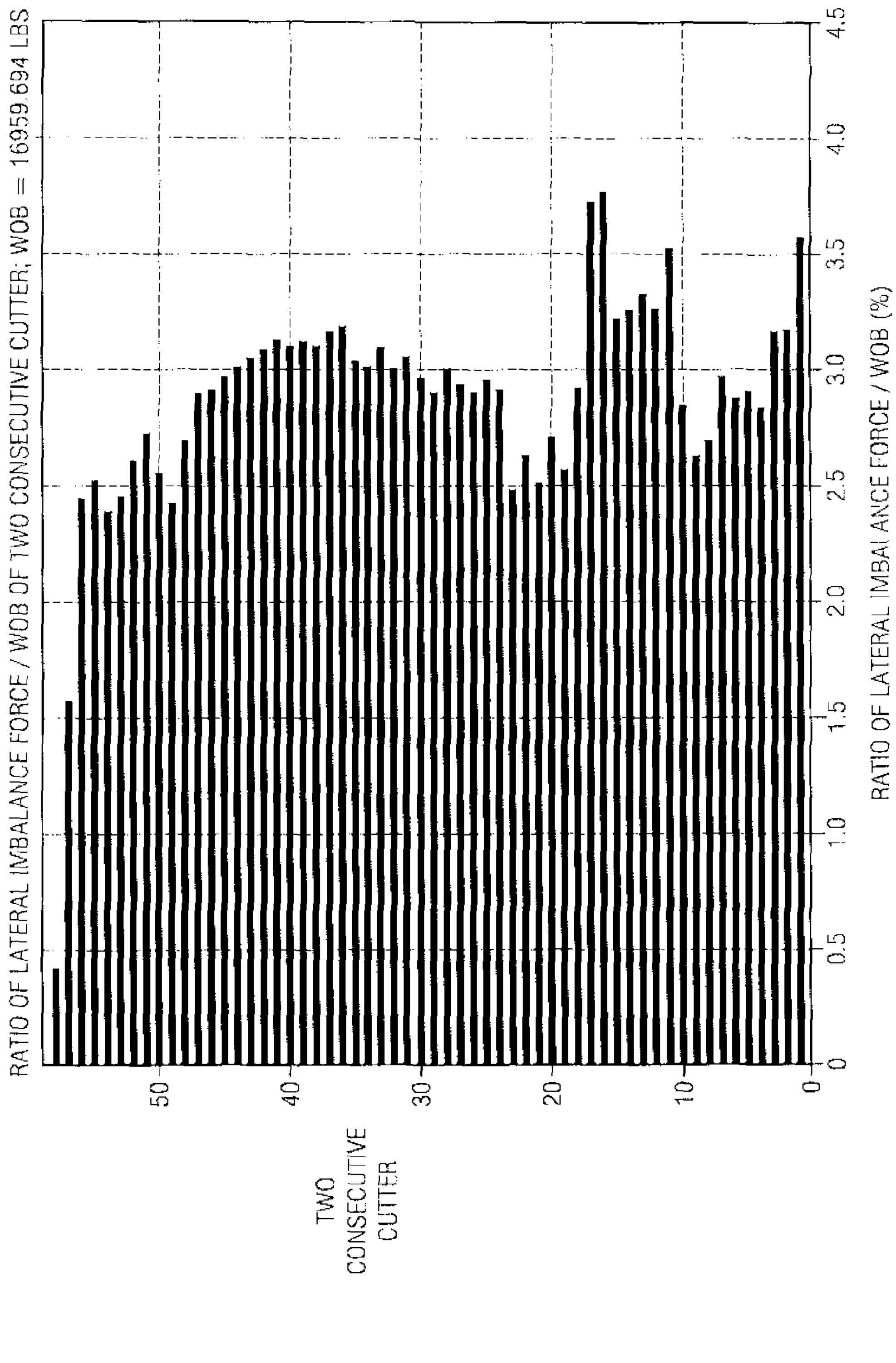
Figure 22I:
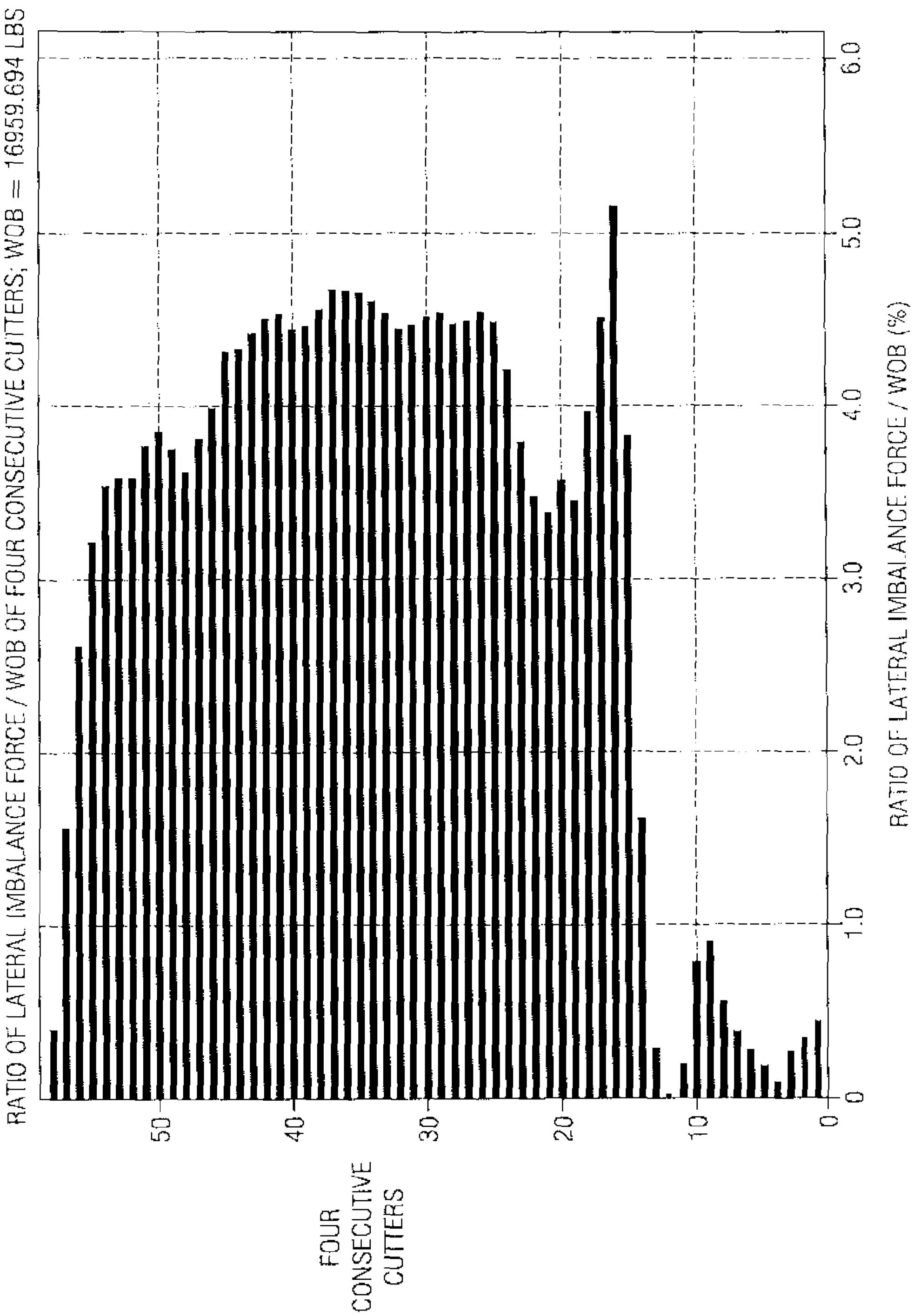
Figure 23A:
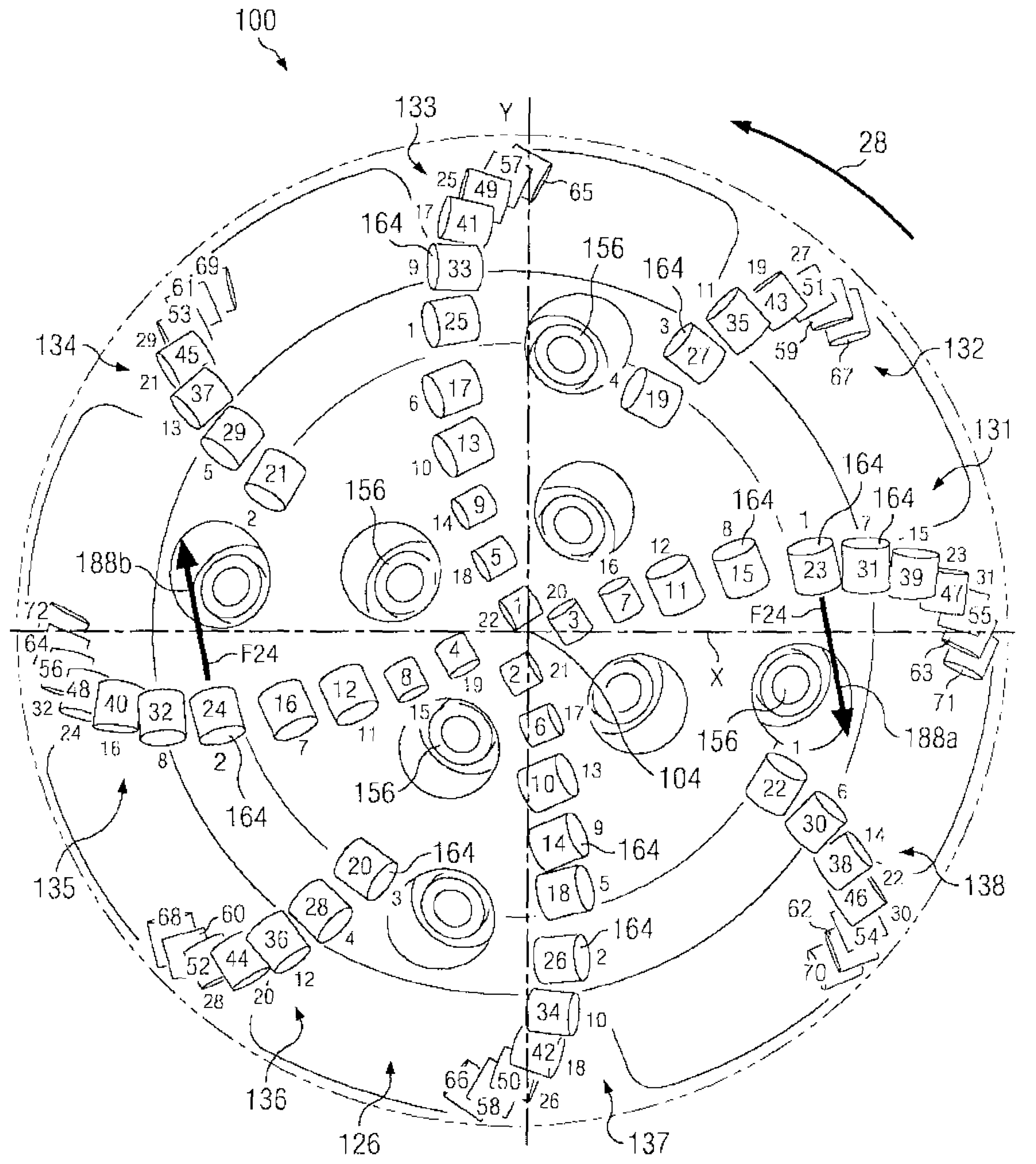
FIGS. 23A and 23B are schematic drawings showing one example of a fixed cutter rotary drill bit with cutting element disposed thereon according to multilevel force balancing, according to one example embodiment of the present disclosure.

Design Procedure for Embodiments with Multilevel Force Balanced Downhole Drilling Tool FIGS. 11A-11F and 12A-12C show various features associated with rotary drill bit 90*a* which may be force balanced using traditional one level force balancing techniques and traditional cutter layout procedures starting from bit rotational axis 104. FIGS. 22C-22I show examples of transient imbalance forces which have not been satisfactorily balanced based on simulations of prior art rotary drill bit 90*a* as shown in FIG. 22A while forming a wellbore through non-uniform downhole drilling conditions. In contrast, FIGS. 24A-24J-2 show various examples of imbalance forces acting on rotary drill bit 100 as shown in FIG. 23A which may be substantially reduced or eliminated (balanced) by designing and manufacturing fixed cutter rotary drill bit 100 based at least in part on multilevel force balancing techniques and cutter layout procedures incorporating teachings of the present disclosure.

Rotary drills bits 90*a* and 100 may be generally described as eight blade fixed cutter rotary drill bits. Respective blades 91-98 on rotary drill bit 90*a* and blades 131-138 on rotary drill bit 100 may have the same configuration and dimensions relative to respective bit rotational axis 104. Rotary drill bit 90*a* and 100 may have the same number, size and type of cutting elements.

FIGS. 22C-22F show the bit imbalance forces during transition drilling of a generally non-uniform formation such as shown in FIGS. 12A-12C of drill bit 90*a* shown in FIG. 22A having cutting elements numbered 1-75, corresponding bit face profile of which is shown in FIG. 22B. FIG. 22G shows the magnitude of the lateral force ratio of each individual cutter when all of the cutters on composite bit face profile 126 drill into a uniform formation. FIG. 22H shows the magnitude of the lateral force ratio of any two consecutive neighbor groups of cutters when all of the cutters drill into a uniform formation. FIG. 22I shows the magnitude of the lateral force ratio of any four consecutive neighbor groups of cutters when all of the cutters drill into a uniform formation.

Except for some inner cutters (1-12), lateral imbalance forces associated with the four neighbor cutter groups are greater than lateral imbalances forces with each individual cutting element 1-75. See FIGS. 22A and 22B. The maximum lateral imbalance force shown in FIG. 22C may be as high as approximately 11% of the total axial force applied to rotary drill bit 90*a*. The maximum bending moment applied to rotary drill bit 90*a* may be as high as 35% of bit torque during initial engagement with the end of a wellbore. See FIG. 22F. During transition drilling from one downhole formation with a compressive strength of approximately 5,000 psi to a second downhole formation with a compressive strength of approximately 18,000 psi transient bit lateral imbalance forces may be as high as 5% of the bit axial force. The axial bending moment applied to fixed cutter rotary drill bit 90*a* during transit drilling from formation layer 41 to formation layer 42 may be approximately 7.5% of the associated bit torque. Bit imbalance forces only return to a satisfactory level when all cutting elements disposed on exterior portions of rotary drill bit 90*a* are engaged with a generally uniform downhole formation either formation layer 41 or 42.

Locations for installing cutting elements 1-72 on cutting face 126 of rotary drill bit 100 may be selected starting from nose point 171 or nose axis 172 as described in sections above. See for example FIG. 26B.

In FIG. 23A two numbers are provided for each cutting element. The numbers written in front of cutting face 164 of each cutting element corresponds with the sequence in which locations were selected or laid out for installing each cutting element on respective blades 131-138. A second number is written on top of each cutting element corresponding with the sequence in which each cutting element may be installed on exterior portions of associated blade 131-138. Cutting elements are often installed in pockets or sockets disposed (not expressly shown) on exterior portions of a blade.

Figure 23B:
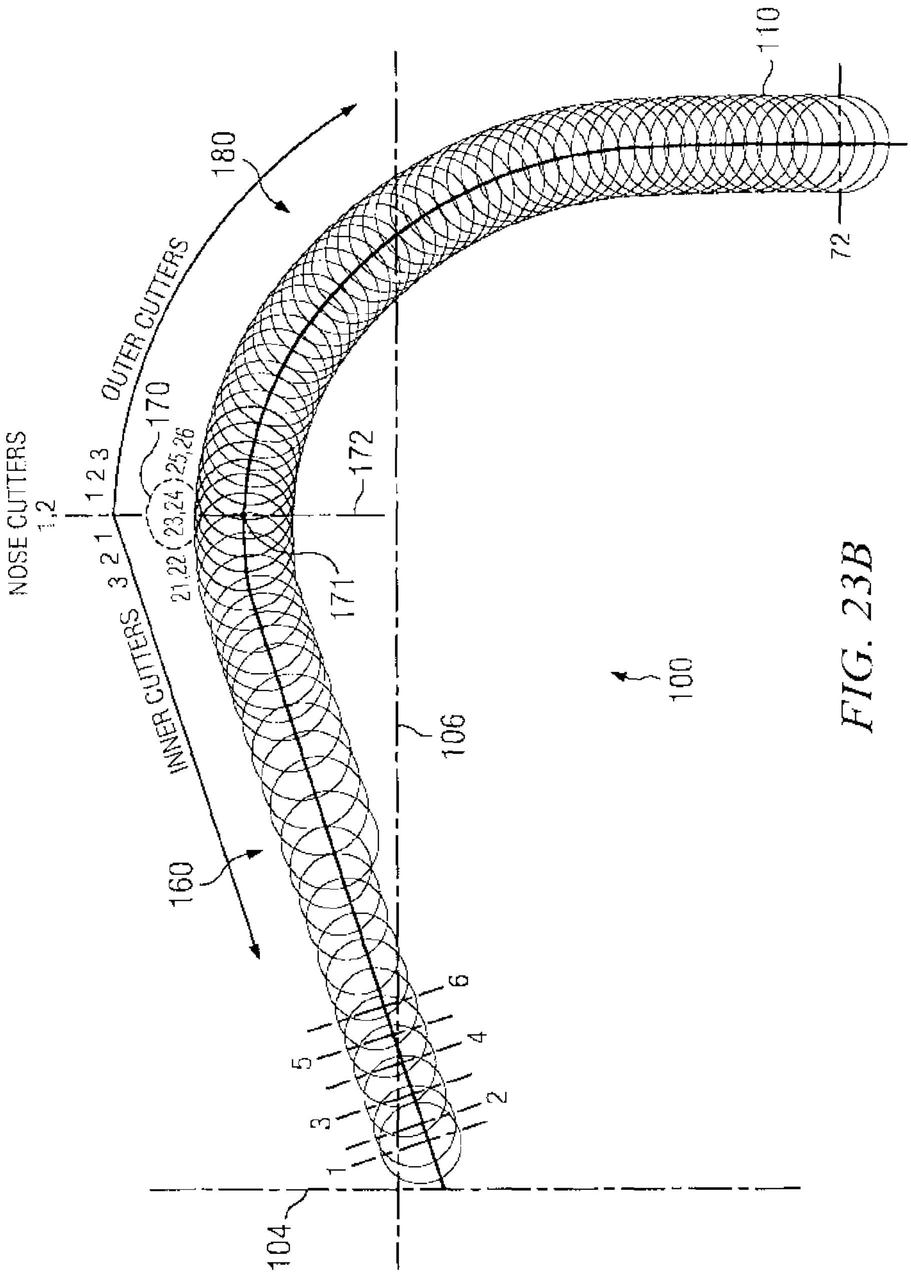

Fixed cutter rotary drill bit 100 may be generally described as rotary drill bit 90*a* with locations for installing cutting elements 1-72 redesigned using the pair group algorithm for an eight blade downhole drill tool shown on table 302 in FIG. 27. The preferred level four force balanced cutter set is [(1,5,) (3,7) (2,6) (4,8)] on table 302. The starting point for installing cutting elements on the exterior portions of fixed cutter rotary drill bit 100 is preferably nose point 171 or nose axis 172 on composite bit face profile 110 as indicated in FIG. 23B. Nose cutters 1 and 2 as shown in FIG. 23B may correspond generally with nose cutters 60*n* as shown in FIG. 1B. In FIG. 23A respective phase angles represented as arrows 188*a* and 188*b* are shown extending from nose cutters 1 and 2 as shown in FIG. 23B. As previously noted, the pair group algorithm for an eight bladed bit was used to select locations for installing cutting elements 1-72 on exterior portions of blades 131-138. Nose cutters 1 and 2 as shown in FIGS. 23A and 23B may also be described as the pair cutter group proximate nose point 171.

The location for installing cutting elements in outer segment 180 may be selected starting from nose cutter 2 on blade 135. Phase angle arrow 188*b* extends from nose cutter 2. For the embodiment shown in FIG. 23A, the location for installing the first outer cutter is selected on primary blade 133. The location for installing the second outer cutter is shown on blade 137.

Large bold numbers 1 and 2 in FIG. 23A correspond with nose cutters 1 and 2 in FIG. 23B. The location for installing additional cutting element for additional outer cutters may be selected in a direction corresponding with the direction of rotary drill bit 100 as indicated by arrow 28.

Inner cutters disposed on exterior portions of fixed cutter rotary drill bit 100 may be selected or laid out as shown in FIG. 23B extending from nose axis 172 to bit rotational axis 104.

FIGS. 24A-24D indicate that bit imbalance forces during transition drilling such as shown in FIGS. 11A and 12A-12C may be substantially reduced or eliminated (e.g., balanced). The cutter numbers listed in FIGS. 24E-24J correspond with the sequence in which the cutting elements are installed on rotary drill bit 100 starting from a location 1 proximate bit rotational axis 104.

Figure 24A:
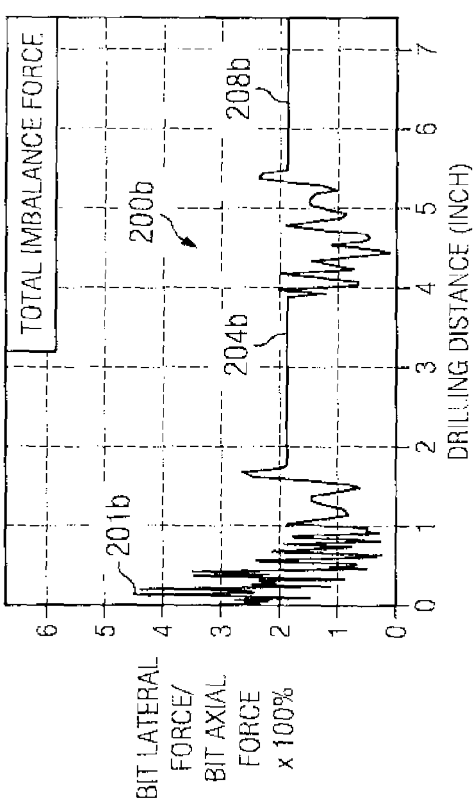
FIGS. 24A-24D are graphs showing reduced imbalance forces during transition drilling resulting from multilevel force balancing and installing cutting elements on the drill bit shown in FIGS. 23A and 23B in accordance with teachings of the present disclosure.
Figure 24B:
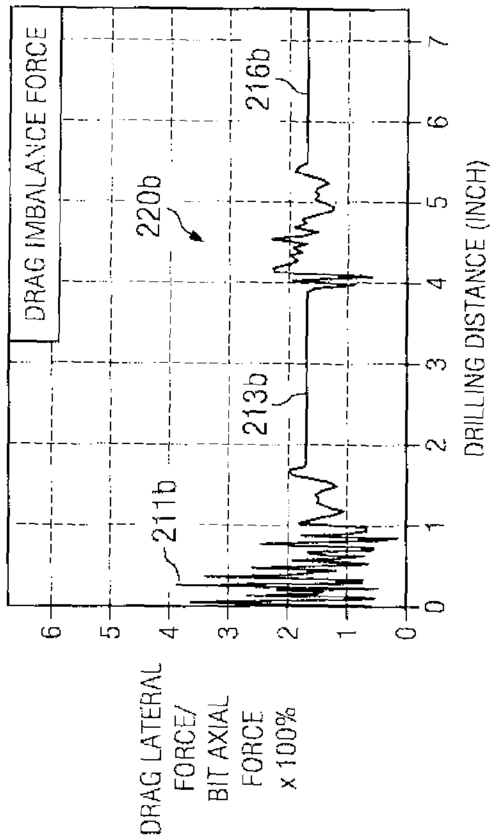
Figure 24C:
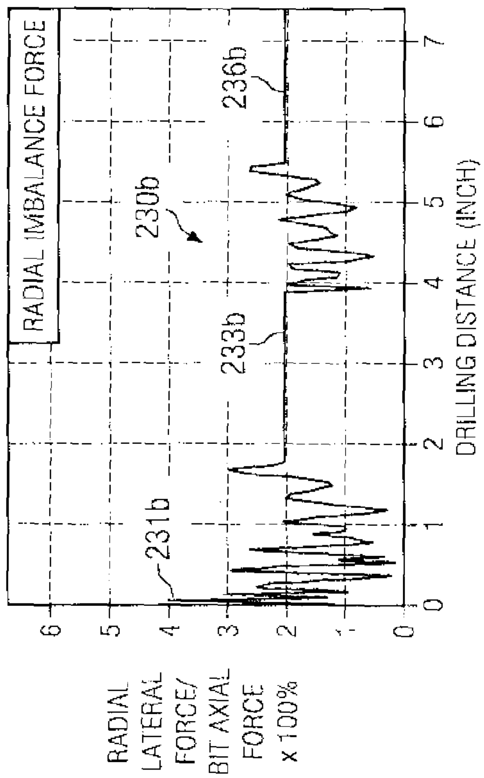
Figure 24D:
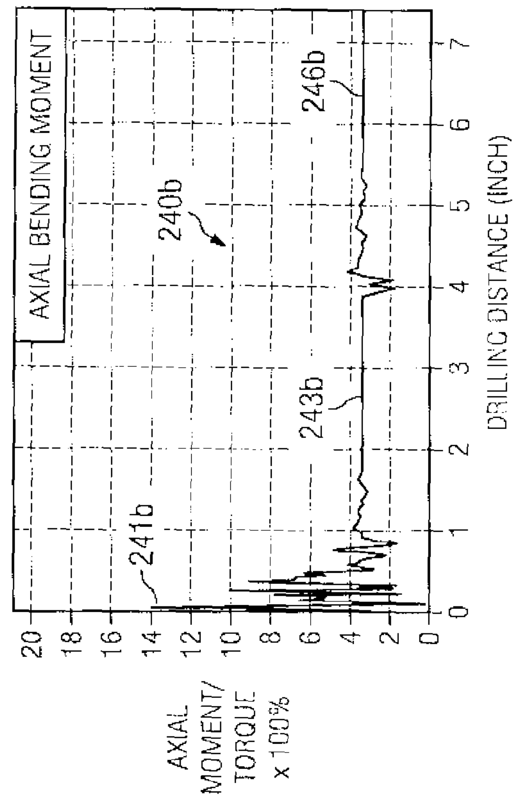
Figure 24E:
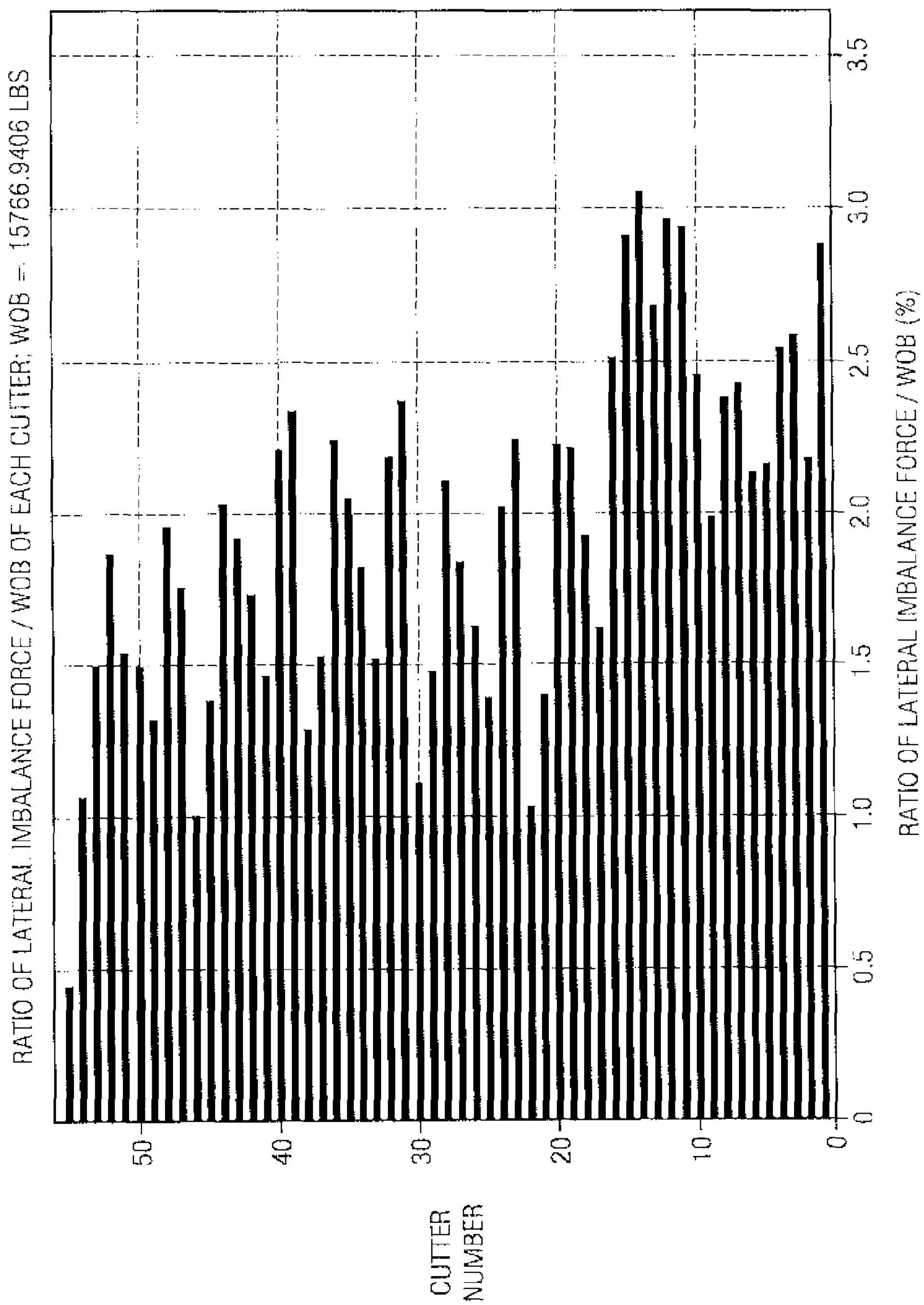
FIGS. 24E and 24F are graphs showing lateral forces and phase angles of each individual cutter of the drill bit shown in FIGS. 23A and 23B in accordance with teachings of the present disclosure.
Figure 24F:
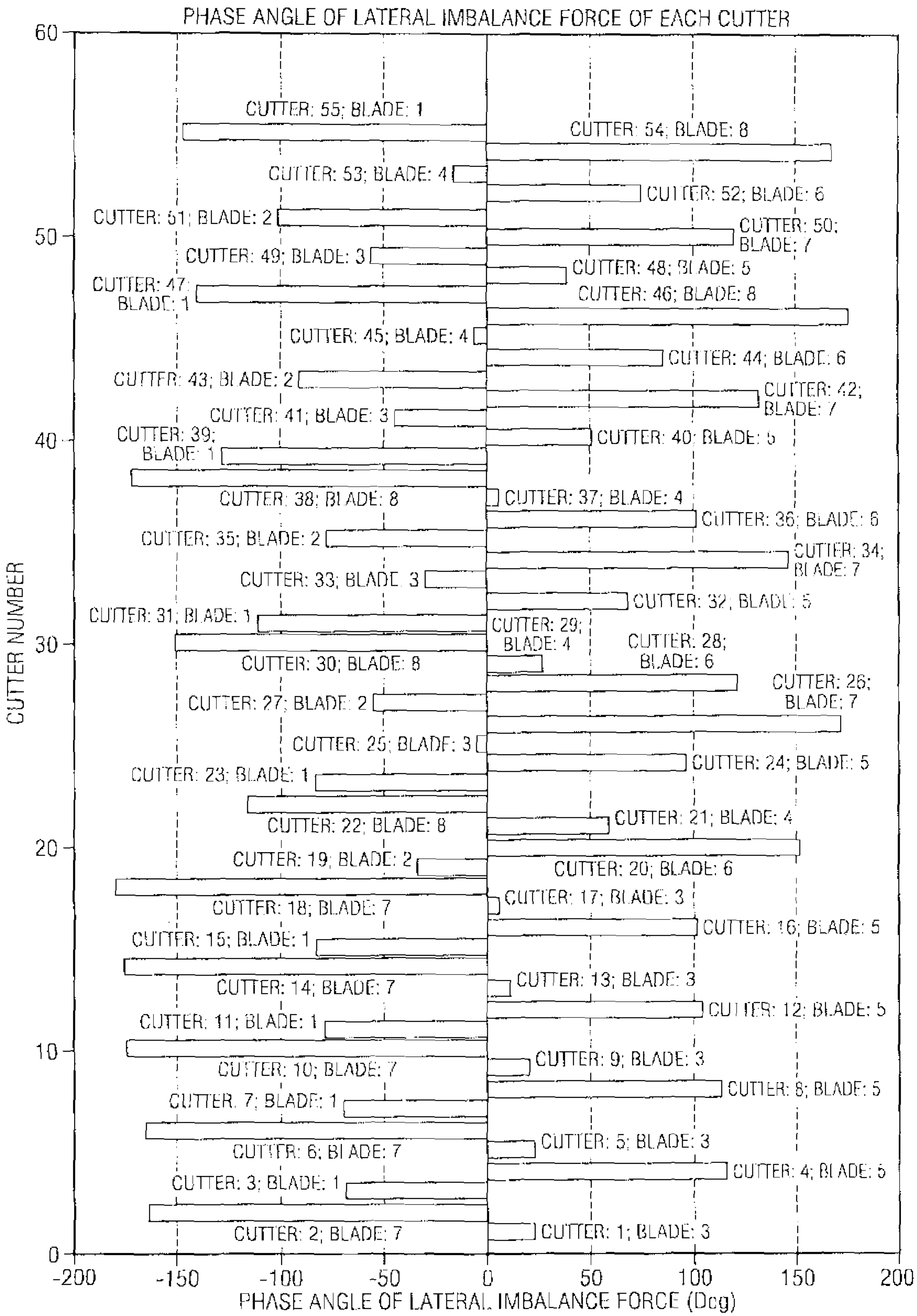

FIG. 24E shows the magnitude of the lateral force ratio of each individual cutter when all of the cutters drill into a uniform formation. The magnitude of the lateral force of each cutter is between approximately 1% and approximately 3% of the bit axial force. FIG. 24F shows the phase angle of the lateral force of each individual cutter.

Figure 24G:
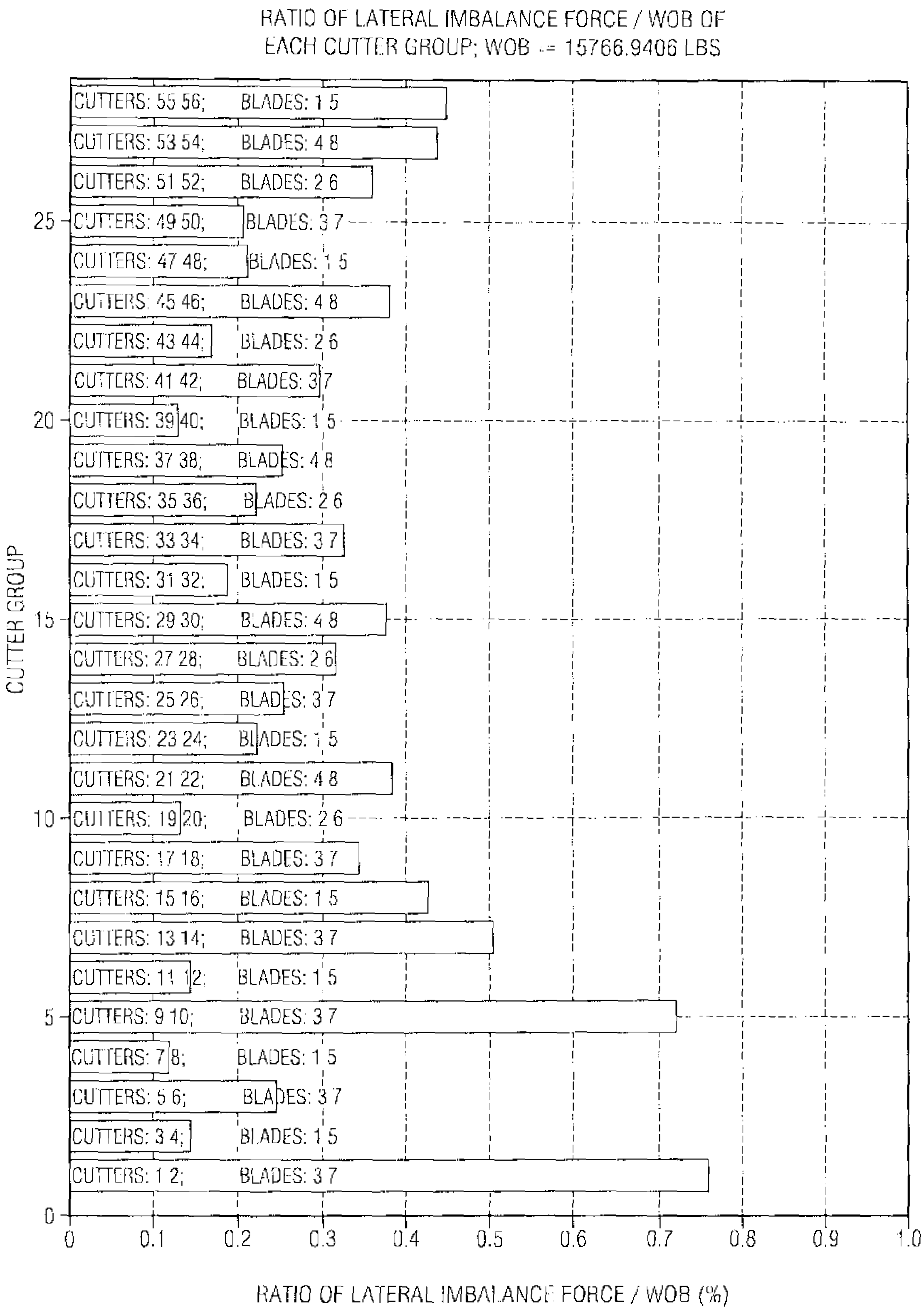
FIG. 24G is a graph showing level one force balancing of the drill bit shown in FIGS. 23A and 23B in accordance with teachings of the present disclosure.

FIG. 24G shows the magnitude of the lateral force ratio of each cutter group when all of the cutters drill into a uniform formation. The lateral force of each cutter group is less than that of an individual cutter in the same group. The magnitude of the lateral force for most cutter groups is between approximately 0.3% and approximately 0.77% of the bit axial force. Therefore, drill bit 100 is level one force balanced.

Figure 24H:
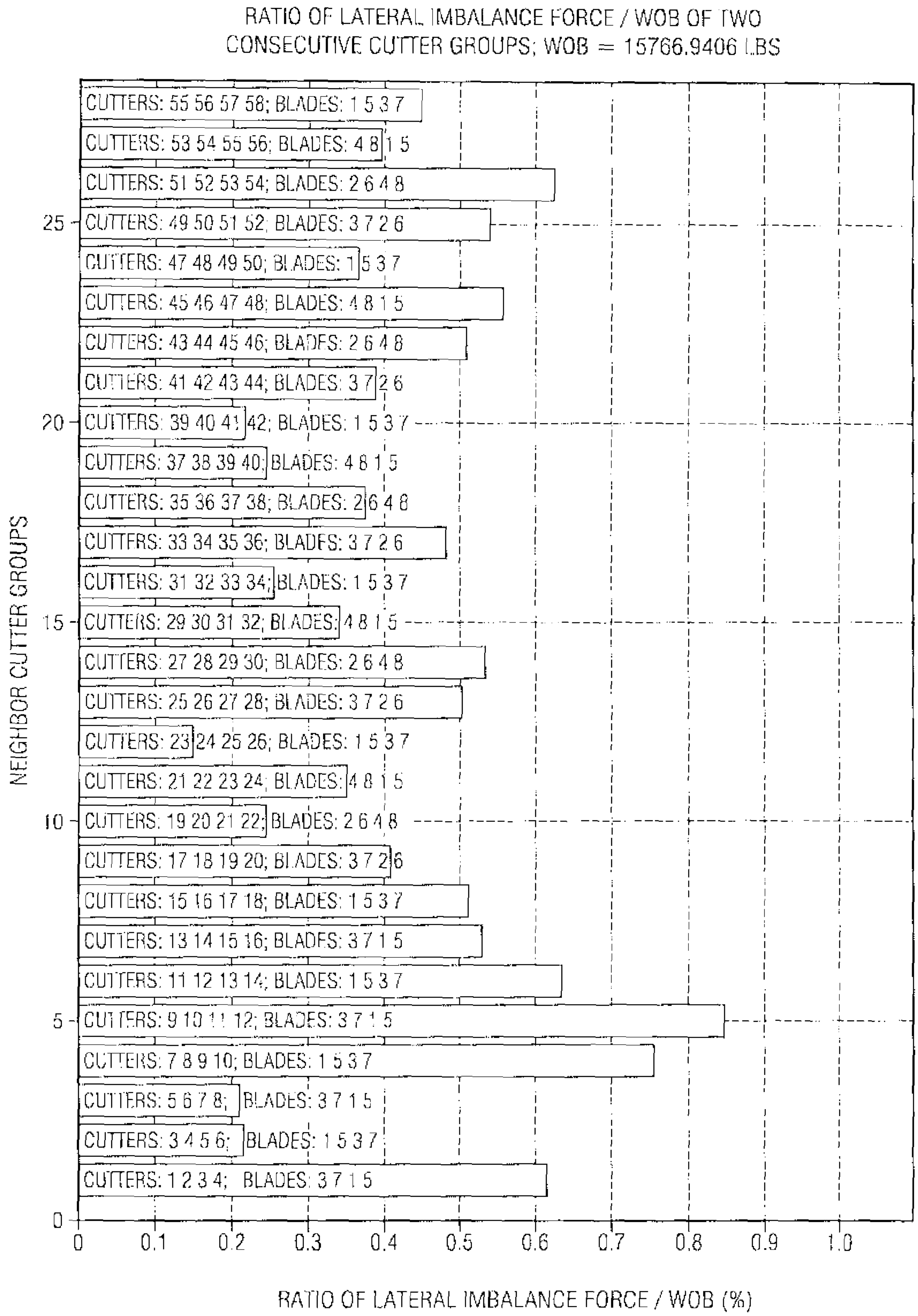
FIG. 24H is a graph showing level two force balancing of the drill bit shown in FIGS. 23A and 23B in accordance with teachings of the present disclosure.

FIG. 24H shows the magnitude of the lateral force ratio of any two consecutive neighbor groups of cutters when all of the cutters drill into a uniform formation. The lateral force of each of the two consecutive neighbor groups is less than that of an individual cutter in the same two neighbor groups. The magnitude of the lateral force for most two neighbor cutter groups is between approximately 0.45% and approximately 0.85% of the bit axial force. Therefore, drill bit 100 is level two force balanced.

Figure 24I:
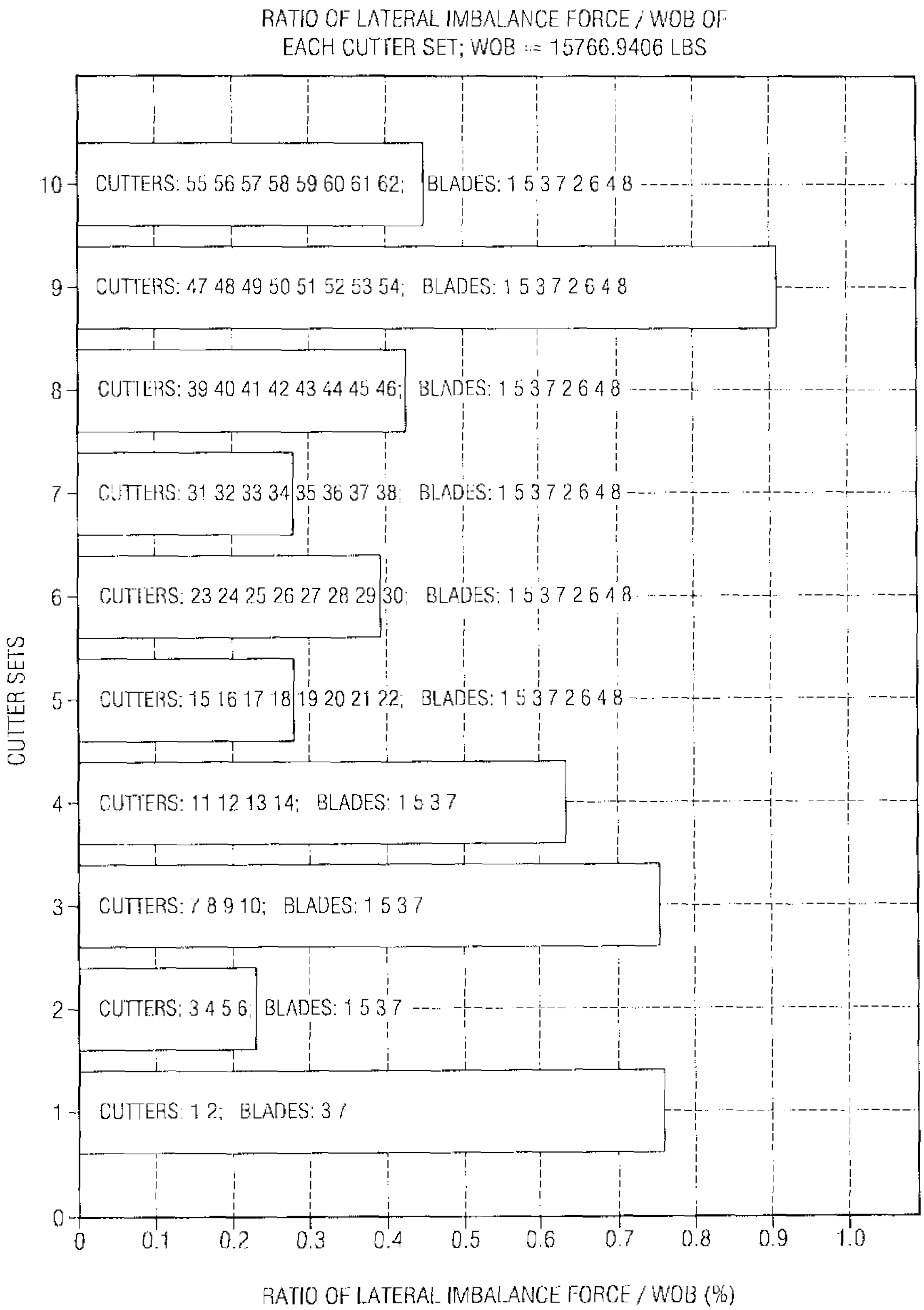
FIG. 24I is a graph showing level three force balancing of the drill bit shown in FIGS. 23A and 23B in accordance with teachings of the present disclosure.

FIG. 24I shows the magnitude of the lateral force ratio of each cutter set when all the cutters drill into a uniform formation. The lateral force of each cutter set is less than that of an individual cutter in the same set. The maximum magnitude of the lateral force for all cutter sets is less than approximately 0.91% of the bit axial force. Therefore, drill bit 100 is level three force balanced.

Figures 1, 24J:
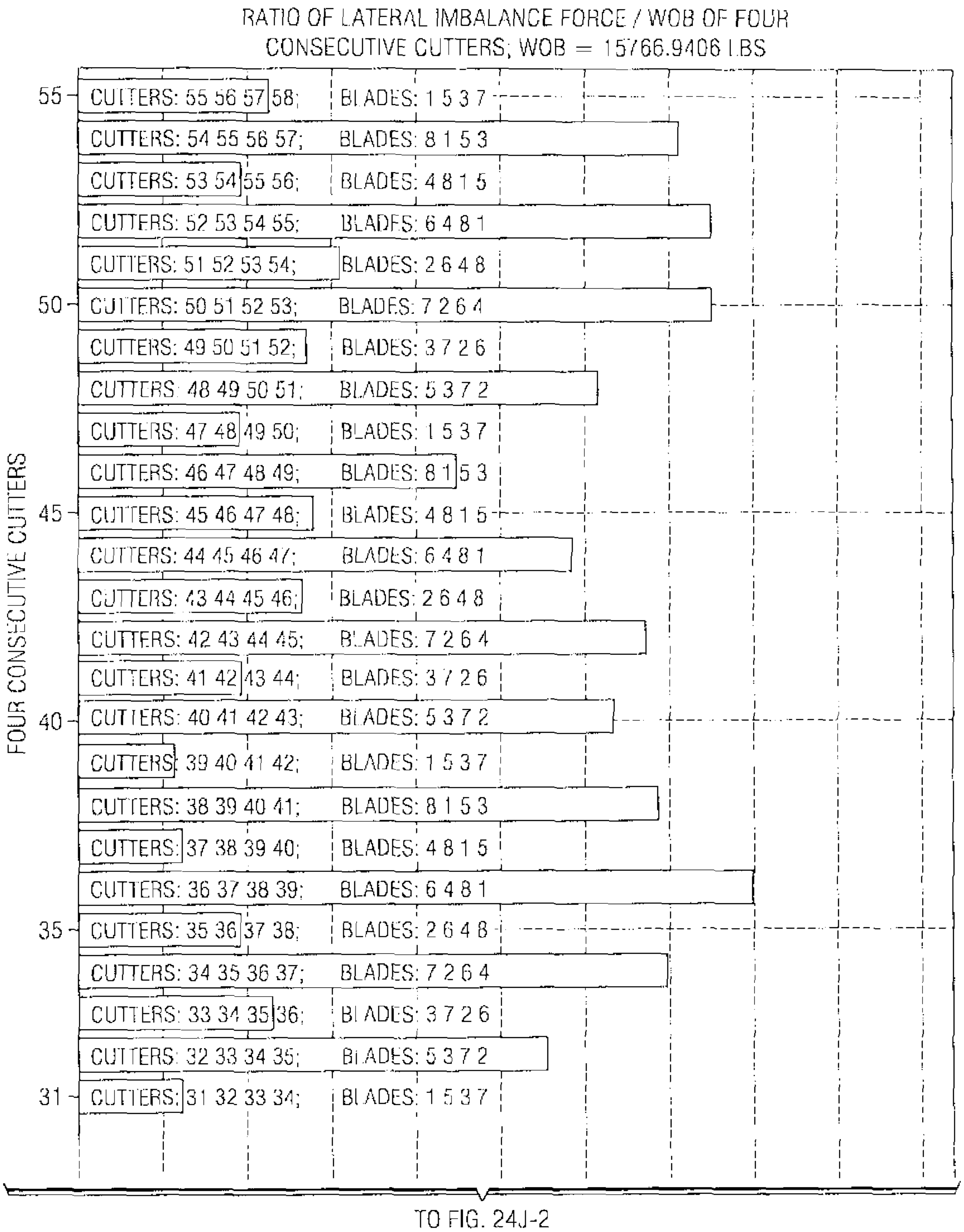
Figures 2, 24J:
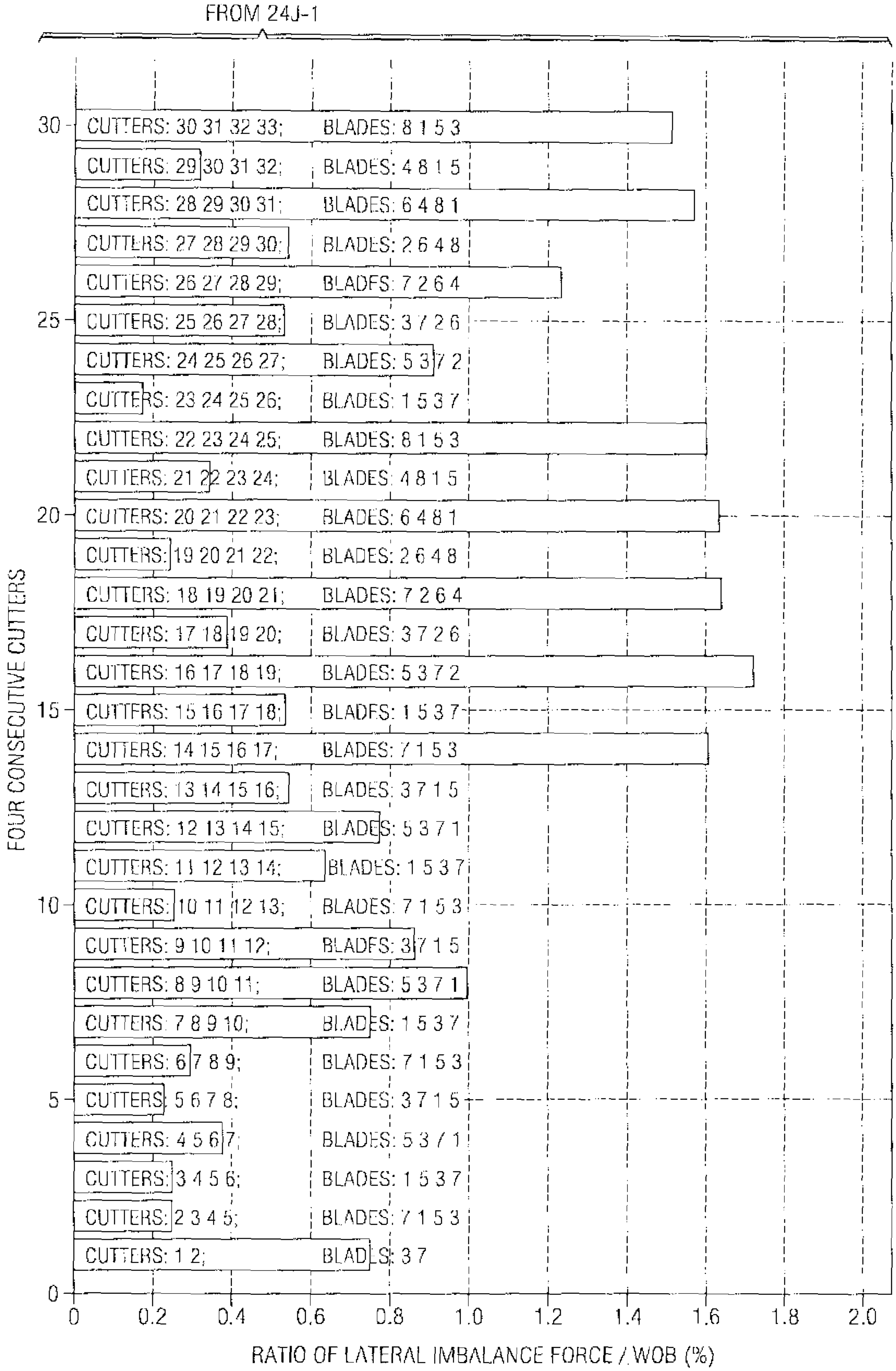

FIGS. 24J-1 and 24J-2 show the magnitude of the lateral force ratio of any four consecutive neighbor groups of cutters when all of the cutters drill into a uniform formation. The lateral force of each of the four consecutive neighbor cutters is less than the maximum lateral force of each individual cutter in the same four consecutive neighbor groups of cutters. The maximum magnitude of the lateral force for any four consecutive neighbor groups of cutters is less than approximately 1.72%, where most magnitudes of the lateral force are less than approximately 0.6% of the bit axial force. Therefore, drill bit 100 is level four force balanced.

Graph 200*b* of FIG. 24A shows the results of simulating drilling wellbores 30*a* and 30*b* as shown in FIG. 12A-12C using fixed cutter rotary drill bit 100. The maximum bit lateral imbalance force represented by peak 201*b* is approximately 4.5%. The remaining peaks associated with graph 200*b* are generally less than 3% which corresponds favorably with generally flat segments 204*b* and 208*b* when cutting elements 1-72 are engaged with generally uniform downhole formation layers 41 and 42 respectively. In graph 220*b* of FIG. 24B, the maximum drag lateral imbalance force at peak 21*b* is approximately only 4% of total bit axial force. FIG. 24B also shows that drag lateral imbalance force during generally flat segments 213*b* and 216*b* is less than 2% of total bit axial force. The same comments apply with respect to graphs 230*b* and 240*b* respectively shown in FIGS. 24C and 24D. The peak radial imbalance force is approximately 4% of the bit axial force at peak 231*b*. Transient axial bending moment at peak 241*b* is approximately 14%.

FIGS. 24A-24D also show that when all cutters are engaged with a uniform formation, either formation layer 41 (see sections 204*b*, 213*b*, 233*b*, 243*b*) or formation layer 42 (see sections 208*b*, 216*b*, 236*b*, 246*b*), the lateral imbalance force, the radial imbalance force, the drag imbalance force and the axial bending moment are all well balanced showing that drill bit 100 is level five force balanced. This type of "level five" force balancing is the same as traditional "one level" force balancing used in the design of prior downhole drill tools.

FIGS. 24A-24D also show that when all cutters are engaged with a non-uniform formation, from formation layer 41 to formation layer 42 where some of the cutting elements are in formation layer 42 and some of the cutting elements are in formation layer 41, the lateral imbalance force, the radial imbalance force, the drag imbalance force and the axial bending moment are all well balanced showing that drill bit 100 is level five force balanced. For example, between section 213*b* and section 216*b* of FIG. 24B, some of the cutting elements are in formation layer 42 and some of the cutting elements are in formation layer 41, the drag imbalance force of bit 100 is about 2.2% of the bit axial force. This type of "level five" force balancing is different from traditional "one level" force balancing used in the design of prior downhole drill tools.

For some applications, calculating the phase angle represented by arrows 188*a* and 188*b* in FIG. 23A of lateral imbalance forces acting on each cutting element may provide substantial benefits during multilevel force balancing embodiments of the present disclosure. FIG. 24E indicates that the magnitude of lateral force acting on cutter 23 (nose cutter 1 in FIG. 23B) is equal to approximately 2.4% of total bit axial force. As previously noted, bit axial force may often be considered approximately equal to weight on bit (WOB). The value of bit axial force is approximately 15,767 pounds. Therefore, the lateral force acting on cutter 23 is approximately three hundred and forty five pounds (345 lbs). FIG. 24E shows that the magnitude of lateral force acting on cutter 24 (nose cutter 2 in FIG. 23A) is approximately 2.28% of total bit axial force or approximately 320 pounds. From FIG. 24F, the phase angle of lateral force represented by arrow 188*b* acting on cutting element 23 is approximately −83.5°. The phase angle of lateral force represented by arrow 188*a* acting on cutter 24 is approximately 5.1°. Resulting lateral imbalance force associated with cutters 23 and 24 may be calculated as follows:

F23 on x axis=F23 times cos(−83.5°)=40

F23 on y axis=F23 times sin(−83.5°)=351.7

F24 on x axis=F24 times cos(95.1°)=−28.4

F24 on y axis=F24 times sin(95.1°)=318.7

Resulting force or total imbalance force=square root of $(F23\text{-}x+F24\text{-}x)^2+(F23\text{-}y+F24\text{-}y)^2$=35 lbs or 0.22% of WOB (15767 lbs).

A comparison of FIGS. 22I and 24J provides an even greater example of the improvement of lateral imbalance forces of greater reduction in the lateral imbalance forces associated with the four neighbor cutter groups on composite bit face profile 192 of rotary drill bit 90*a* as compared with the substantially reduced lateral imbalance forces associated with each four neighbor cutter group on composite bit profile 110 of rotary drill bit 100. The information shown in FIGS. 24F-24J further demonstrate the benefits of multilevel force balancing techniques to select or layout locations for installing cutting elements on a downhole drilling tool using multilevel force balancing techniques and selecting the first location for each cutting element proximate a nose point or nose axis of an associated composite cutting face profile.

Various cutter layout algorithms have been developed for the design of multilevel force balanced downhole drilling tools as described in copending PCT Patent Application entitled "Multilevel Force Balanced Downhole Drilling Tools and Methods," Ser. No. PCT/US09/067263, filed Dec. 4, 2009 may be used in conjunction with the teachings of the present disclosure. One common feature of these algorithms is starting cutter layout from a nose point or near a nose point to provide cutters in an associated nose zone arranged pseudo-symmetrical about the nose point and most predefined force balanced cutter sets follow from the nose zone cutter layout. Pseudo-symmetrical cutter layout around a nose point or nose axis may significantly enhance bit lateral stability during transit formation drilling.

A multilevel force balanced downhole drilling tool, according to the present disclosure, may have at least one of the following four levels: (a) at cutter group level where imbalance forces associated with cutters in each cutter group are balanced or minimized; (b) at two neighbor groups of cutter level where imbalance forces associated with any two neighbor groups of cutters on composite bit face profile are balanced or minimized (level two force balanced); (c) at cutter set level where imbalance force associated with cutters in a cutter set are balanced or minimized; and (d) at all cutters level where imbalance forces associated with all cutters are balanced or minimized (level five force balanced).

For some downhole drilling tools an additional level of force balancing may exist (level four force balanced). For example, for a bit with 8 blades using pair cutter groups, imbalance forces associated with any four neighbor cutters may be balanced or minimized. Another example is a bit with 9 blades using three cutter groups, imbalance forces associated with any three neighbor cutters may be balanced or minimized. FIG. 27 lists level four force balanced cutter set for given number of blades. Downhole drilling tools with level four force balanced are expected to be more stable even if one or more cutters are damaged during drilling.

In some embodiments of the present disclosure, a rotary drill bit or other downhole drilling tool may be designed based at least in part on simulations using selecting locations for laying out cutters and disposing cutters in various zones of a bit face profile in a spiral direction of bit rotation and in some embodiments further based on multilevel force balancing techniques to limit: (a) maximum transient lateral imbalance force to less than approximately 8% (and often preferably less than approximately 6%) of associated transient axial force; (b) lateral imbalance force, when all cutters are engaged with a general uniform downhole formation, to less than approximately 4% of bit actual force; (c) maximum transient radial lateral imbalance forces to less than approximately 6% (preferably less than approximately 4%) of associated transient axial force; (d) radial lateral imbalance force, when all cutters are engaged with a generally uniform downhole formation, to less than approximately 2.5% of associated bit axial force; (e) maximum transient drag lateral imbalance force to less than approximately 6% (and often preferably less than approximately 4%) of associated transient axial force; (f) drag lateral imbalance force while all cutters are engaged with a general uniform downhole formation to less than approximately 2.5% of associated bit axial force; (g) maximum axial movement to less than approximately 15% of associated transient torque; and (h) axial moment, when all cutters are engaged with a general uniform downhole formation, to less than approximately 4% of associated bit torque. Traditional, prior art force balancing techniques which use only one level such as all cutting elements engaged with a generally uniform downhole formation often only meet a limited number of the above conditions such as items (b), (d), (f) and (h).

Force Balance Procedure

In most cases, downhole drilling tools designed using procedures such as shown in FIGS. 6A. 6B and later in FIG. 31 will satisfy requirements for multilevel force balancing. However, if blade order is violated due to, for example, the start radii of secondary blades, then multilevel force balancing may be also violated. If this situation occurs, it may become necessary to modify the geometry and orientation of individual cutters or individual cutter groups. The following steps may be used:

(1) Evaluate imbalance forces contributed by each individual cutter and each cutter group, respectively;

(2) Identify which cutter or cutter group contributes most to bit imbalance forces;

(3) Modify back rake, or side rake, or cutter size of the cutter or cutters in the cutter group;

(4) Re-run drilling simulation to see if design requirements are met or not. If not, go back to step 1 and repeat the procedure.

If the above procedure could not balance the downhole drilling tool, then it may be necessary to re-run the computer cutter layout procedure of FIGS. 6A, 6B and 31, by changing some of the parameters used for cutter layout, such as start radii of secondary blades, cutter layout starting point, cutter overlap, cutter size, back rake and side rake.

Simulation methods 500*a* and 500*b* described in FIGS. 6A and 6B may be used to determine or select high impact blades and low impact blades. Based on this determination and in combination with criteria for multilevel force balancing as described in sections above, rotary drill bits and other drilling tools may be designed and manufactured according to the present disclosure. Some examples of rotary drill bits designed and manufactured in accordance with the present disclosure are described in FIGS. 28-30 and 32-34.

Figure 28:
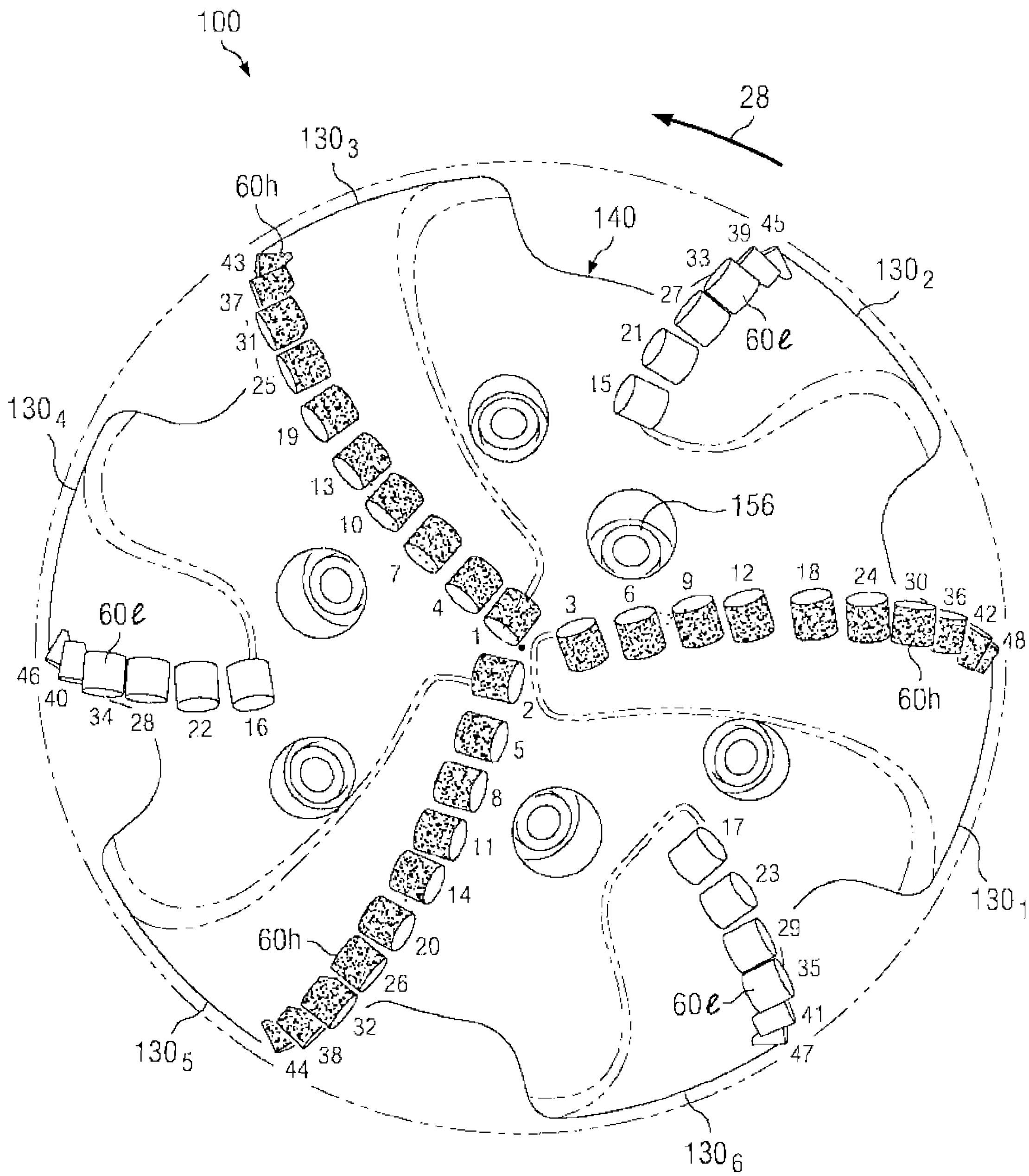
FIG. 28 is a schematic drawing showing one example of a fixed cutter rotary drill bit with cutting elements disposed thereon in accordance with multilevel force balancing criteria and further installing different types of cutting elements (e.g., $\mathbf{60}_h$ or $\mathbf{60}_l$) onto selected blades such that stronger $\mathbf{60}_h$ type cutting elements are installed on blades subject to high impact forces and/or large loadings and/or blades that remove large rock volumes and $\mathbf{60}_l$ type of cutting elements may be installed on other blades, according to one example embodiment of the disclosure.

FIG. 28 is a schematic drawing showing one example of a fixed cutter rotary drill bit 100 in accordance with some embodiments of the present disclosure having six blades $\mathbf{130}_1$-$\mathbf{130}_6$ with cutting elements 60 numbered individually as 1-48 disposed thereon according to multilevel force balancing criteria in two cutter groups, with cutter set [(1 3 5), (2 4 6)] and further having different types of cutting elements (e.g., $\mathbf{60}_h$ or $\mathbf{60}_l$) disposed onto respective selected blades such that stronger $\mathbf{60}_h$ type cutting elements are installed on blades $\mathbf{130}_1$, $\mathbf{130}_3$, and $\mathbf{130}_5$ which are blades that are subject to high impact forces and/or large loadings and/or blades that remove large rock volumes while $\mathbf{60}_l$ type of cutting elements (with less impact/wear resistance) may be installed on blades $\mathbf{130}_2$, $\mathbf{130}_4$, and $\mathbf{130}_6$ that are identified as blades that remove lesser volume of rock and/or having lesser loadings and/or being subject to lower impact forces as compared to blades $\mathbf{130}_1$, $\mathbf{130}_3$, and $\mathbf{130}_5$ by simulation methods. Simulation methods used to determine or select high impact blades and low impact blades may be similar to the methods 500*a* and 500*b* described in FIGS. 6A and 6B.

Figure 29:
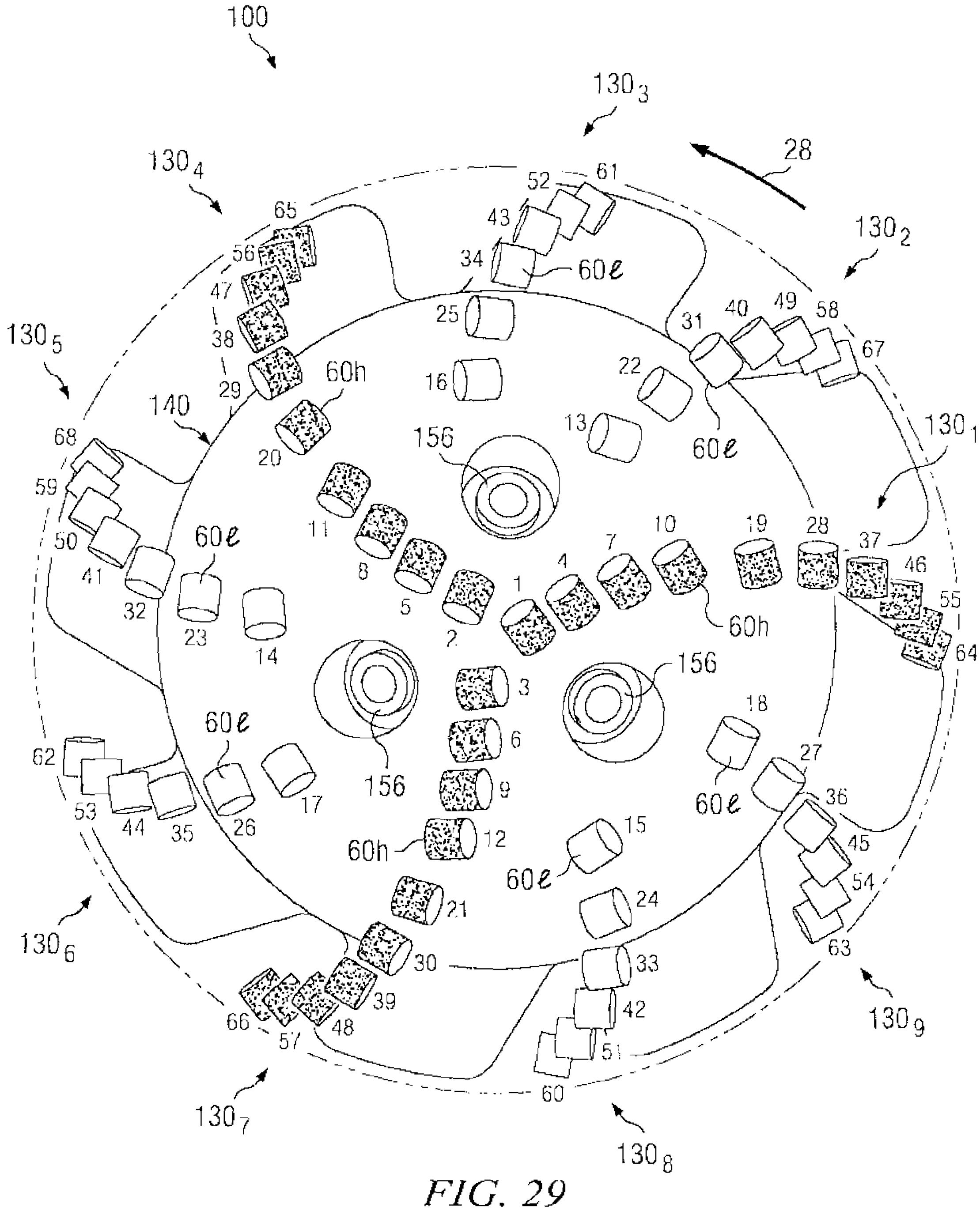
FIG. 29 is a schematic drawing showing one example of a fixed cutter rotary drill bit with cutting elements disposed thereon in accordance with multilevel force balancing criteria and further installing different types of cutting elements (e.g., $\mathbf{60}_h$ or $\mathbf{60}_l$) onto selected blades such that stronger $\mathbf{60}_h$ type cutting elements are installed on blades subject to high impact forces and/or large loadings and/or blades that remove large rock volumes and $\mathbf{60}_l$ type of cutting elements may be installed on other blades, according to one example embodiment of the disclosure.

FIG. 29 is a schematic drawing showing one example of a fixed cutter rotary drill bit 100 in accordance with some embodiments of the present disclosure having nine blades $\mathbf{130}_1$-$\mathbf{130}_9$ with cutting elements 60 numbered individually as 1-68 disposed thereon according to multilevel force balancing criteria in three cutter groups, with cutter set [(1 4 7), (2 5 8), (3 6 9)] and further having different types of cutting elements (e.g., $\mathbf{60}_h$ or $\mathbf{60}_l$) disposed onto respective selected blades such that stronger $\mathbf{60}_h$ type cutting elements are installed on blades $\mathbf{130}_1$, $\mathbf{130}_4$, $\mathbf{130}_7$ which are identified as high impact blades $\mathbf{130}_h$ and in this example as blades that remove large rock volumes while $\mathbf{60}_l$ type of cutting elements may be installed on blades $\mathbf{130}_2$, $\mathbf{130}_3$, $\mathbf{130}_5$, $\mathbf{130}_6$ and $\mathbf{130}_8$ which are identified as low impact blades $\mathbf{130}_l$ by simulation methods and in this example as blades that remove lesser volume of rock as compared to blades $\mathbf{130}_1$, $\mathbf{130}_4$, and $\mathbf{130}_7$.

In some embodiments, simulation methods used to determine blades for laying out different type of cutting elements for drill bit 100 of FIG. 29 show that cutters on blades $\mathbf{130}_1$, $\mathbf{130}_4$, $\mathbf{130}_7$ and $\mathbf{130}_8$ are subject to higher impact forces or loadings than cutters on blades $\mathbf{130}_2$, $\mathbf{130}_3$, $\mathbf{130}_5$, $\mathbf{130}_6$ and $\mathbf{130}_9$. See FIG. 8D. Accordingly, stronger $\mathbf{60}_h$ type cutting elements may be installed on blades $\mathbf{130}_1$, $\mathbf{130}_4$, $\mathbf{130}_7$ and $\mathbf{130}_8$ which are blades that are subject to more impact forces while $\mathbf{60}_l$ type of cutting elements (with low impact/wear resistance) may be installed on blades 130$_2$, 130$_3$, 130$_5$ and 130$_6$ (not expressly depicted).

Figure 30:
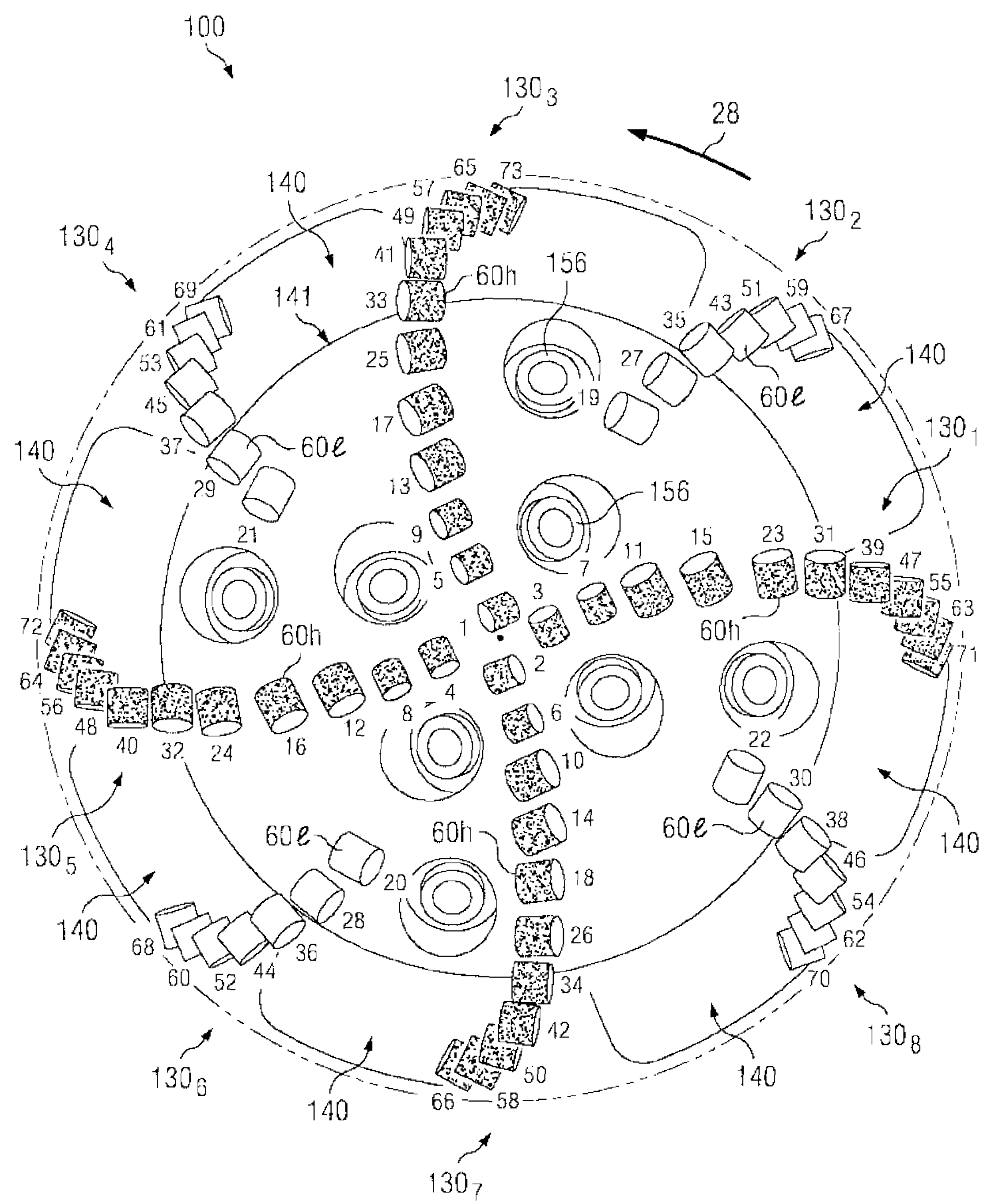
FIG. 30 is a schematic drawing showing one example of a fixed cutter rotary drill bit with cutting elements disposed thereon in accordance with multilevel force balancing criteria and further installing different types of cutting elements (e.g., $\mathbf{60}_h$ or $\mathbf{60}_l$) onto selected blades such that stronger $\mathbf{60}_h$ type cutting elements are installed on blades subject to high impact forces and/or large loadings and/or blades that remove large rock volumes and $\mathbf{60}_l$ type of cutting elements may be installed on other blades, according to one example embodiment of the disclosure.

FIG. 30 is a schematic drawing showing another example of a fixed cutter rotary drill bit 100 in accordance with some embodiments of the present disclosure having eight blades 130$_1$-130$_8$ with cutting elements 60 numbered individually as 1-73 disposed thereon following multilevel force balancing criteria in pair cutter groups, with cutter set [(1 5), (3 7), (2 6), (4, 8)] and further having different types of cutting elements (e.g., 60$_h$ or 60$_l$) disposed onto respective selected blades such that stronger 60$_h$ type cutting elements are installed on blades 130$_1$, 130$_3$, 130$_5$ and 130$_7$ which are blades that remove large rock volumes while 60$_l$ type of cutting elements (with less impact/wear resistance) may be installed on blades 130$_2$, 130$_4$, 130$_6$ and 130$_8$, that are identified as blades that remove lesser volume of rock as compared to blades 130$_1$, 130$_3$, 130$_5$ and 130$_7$ by simulation methods.

In some embodiments, simulation methods used to determine blades for laying out different type of cutting elements for drill bit 100 of FIG. 30 show that cutters on blades 130$_1$, 130$_2$, 130$_5$, 130$_6$ and 130$_7$ are subject to more impact forces or loadings than cutters on blades 130$_3$, 130$_4$, and 130$_8$. See FIG. 9D. Accordingly, stronger 60$_h$ type cutting elements may be installed on blades 130$_1$, 130$_2$, 130$_5$, 130$_6$ and 130$_7$ which are blades that are subject to more impact forces while 60$_l$ type of cutting elements (with less impact/wear resistance) may be installed on blades 130$_3$, 130$_4$, and 130$_8$ (not expressly depicted).

Some embodiments of the present disclosure relate to designing well tools such as drill bits 100 wherein blades that are subject to higher impact and/or more loadings and/or blades that remove more rock volume 130$_h$ are designed to be thicker than blades that are not subject to higher impact and/or blades with less loadings and/or blades that remove lesser volume of rock 130$_l$. Since junk slots 140 are disposed between two adjacent blades, changing the thickness of a blade changes the volume and the geometry of associated respective junk slots 140, thereby modifying fluid flow characteristics of a drill bit or other well tool.

Fluid flow from a junk slot 140 may optimize downhole performance by removing downhole debris, lifting formation cuttings, and/or cleaning cutting structures associated with drilling thereby minimizing, eliminating or preventing balling and/or accumulation of downhole cuttings. Changing the dimensions, volume and/or geometry of junk slots 140, in accordance with teachings of the present disclosure, may be used to enhance and optimize fluid flow to (or from) structures in exterior portions of a drill bit or any wellbore tool. For some applications, direction of fluid flow may be changed and fluid flow may be directed into a junk slot, or away from a junk slot, towards a cutting surface, or away from a cutting surface.

In other examples, changing the dimensions, volume and/or geometry of junk slots 140, in accordance with teachings of the present disclosure, may be advantageously used to: increase or decrease: the amount or volume of fluid flow; the pressure of fluid flow; and/or turbulence of fluid flow. This may reduce or eliminate turbulent flow and/or eddy currents and may facilitate obtaining a streamlined flow and/or a laminar flow. Decreasing the volume and/or pressure of fluid flow to exterior portions of a drill bit and reducing or eliminating turbulent flow may reduce erosion of drill bit structures.

Accordingly, in some embodiments, the present disclosure describes methods to design and manufacture a rotary drill bit 100 or other downhole tools operable to form a wellbore comprising modifying one or more junk slots 140. FIG. 31 describes method 600 which may be used to determine parameters relating the thickness of blades for optimizing fluid flow in accordance with the present disclosure.

Method 600 describes an example simulation method which may be used to design fixed cutter rotary drill bits 100 and other downhole drilling tools based at least in part on laying out a plurality of a first type of cutters 60$_h$ and a plurality of a second type of cutters 60$_l$ on different blades 130 based on the impact the respective blade is subject during drilling and/or the loading a respective blade is subject to and/or the volume of rock removed by a respective blade to substantially reduce, decrease or minimize impact forces and to substantially reduce, decrease or minimize wear on cutters and other parts of a rotary drill bit and other downhole drilling tools; and on part in laying out cutters in cutter groups and pairs based on multilevel force balancing criteria and in part based on modifying the thickness of blades 130.

As shown in FIG. 31, an example method 600 may begin at step 602 by inputting into a computer (a general purpose computer or a special purpose computer (not expressly shown)) various characteristics of a downhole drilling tool such as rotary drill bits 100, core bit 500 and/or reamer 600 such as but not limited to bit size, IADC code, number of blades. Examples of such downhole drilling tool characteristics are shown in Appendix A at the end of this Written Description.

At step 604 various downhole drilling conditions such as RPM, ROP, WOB, formation compressive strength, may be inputted into a computer. Examples of such downhole drilling conditions are shown in Appendix A. In some embodiments, at step 604, additional conditions that may be inputted into a computer may comprise inputting layout of cutters based on criteria for multilevel force balancing including laying out cutters in cutter groups and cutter sets.

At step 606 a drilling simulation may start with initial engagement between one or more cutters of a fixed cutter drill bit or other downhole drilling tool and a generally flat surface of a first downhole formation layer at the downhole end of a wellbore. A standard set of drilling conditions may include one hundred twenty (120) revolutions per minute (RPM), rate of penetration (ROP), thirty (30) feet per hour, first formation strength 5,000 psi and second formation strength 18,000 psi.

Parameters such as 1) impact on each blade, 2) volume of rock removed by each blade, 3) loadings on each blade and 4) multilevel force balance criteria may be evaluated at step 608 during the simulated drilling into a first downhole formation to determine respective blades of at least two types: 1) blades 130$_h$ that are subject to more impact and/or more loadings and/or blades that remove more rock volume; and 2) blades 130$_l$ that are subject to low impact and/or less loadings and/or blades that remove lesser rock volume.

Multilevel force balance criteria may comprise evaluating at step 608: 1) respective forces acting on cutting elements disposed on the fixed cutter drill bit or other downhole drilling tool during initial contact between each cutting element and the first downhole formation; 2) evaluating respective forces acting on each cutting element may be evaluated versus depth of penetration of the rotary drill bit or other downhole drilling tool into the first downhole formation; and/or 3) calculating resulting forces acting on the associated rotary drill bit or other downhole drilling tool as a function of drilling depth for multilevel force balancing criteria.

Step 610 may comprise installing a first type of cutting element having impact resistance and/or wear resistance (e.g., $\mathbf{60}_h$) on blades $\mathbf{130}_h$ that are subject to more impact and/or more loadings and/or blades that remove more rock volume and installing at least a second type of cutting element having lower impact/wear resistance (e.g., $\mathbf{60}_l$) on blades $\mathbf{130}_1$ that are subject to low impact and/or less loadings and/or blades that remove lesser rock volume.

Step 612 may comprise increasing the thickness of blades $\mathbf{130}_h$ in comparison to the thickness of blades $\mathbf{130}_1$, thereby modifying respective junk slots 140 disposed between respective blades. The drilling simulation may continue to step 614 corresponding with forming the wellbore through the first downhole formation and into a second downhole formation. Step 616 may comprise evaluating parameters such as 1) impact on each blade; 2) volume of rock removed by each blade; 3) loadings on each blade during the simulated drilling in the first downhole formation and in the second downhole formation; 4) criteria for multilevel force balancing; and 5) CFD programs may be used to determine fluid flow characteristics.

CFD programs have been described in earlier sections of this application and may be tailored based on anticipated fluid flow for the type/size of pump that may be used on a drilling rig. CFD programs may be also modeled based on the size of the drill bit that may be used.

Evaluating criteria for multilevel force balancing in step 616 may comprise evaluating respective forces acting on each cutting element engaged with the first downhole formation and respective forces acting on each cutting element engaged with the second downhole formation may then be evaluated. Resulting forces acting on the fixed cutter rotary drill bit or other downhole drilling tool may then be evaluated as a function of drilling depth. Resulting forces acting on the fixed cutter rotary drill bit or other downhole drilling tool may be displayed as a function of drilling depth.

If the resulting forces acting on the fixed cutter rotary drill bit or other downhole drilling tool meet design requirements for 1) minimized, reduced or decreased impact forces and force balancing of the drilling tool; 2) improved impact resistance and wear of cutters on the drill tool; and 3) optimized fluid flow characteristics at step 618, the simulation may stop at step 620. The downhole drill tool characteristics used in this simulation may then be used to design and manufacture the fixed cutter rotary drill bit or other downhole drilling tool in accordance with teachings of the present disclosure.

If the resulting forces acting on the fixed rotary cutter drill bit or other downhole drilling tool do not meet design requirements for a drilling tool having reduced, decreased or minimized impact forces and wear, optimized force balance and optimized fluid flow characteristics at step 618, the simulation may proceed to step 622 and at least one downhole drilling tool characteristic may be modified. For example parameters such as but not limited to, the type of cutter disposed on a respective blade may be varied; material of cutter, number of cutters, layout of cutter with respect force balanced cutter groups or cutter sets may be modified and/or the thickness of blades $\mathbf{130}_h$ and $\mathbf{130}_1$ may be modified, geometry of blades $\mathbf{130}_h$ and $\mathbf{130}_1$ may be varied to obtain a resulting modification in associated junk slots 140 thereby changing fluid flow characteristics. Additionally, the configuration, dimensions and/or orientation of one or more blades disposed on exterior portions of the downhole drilling tool may be modified.

The simulation may then return to step 602 and method 600 may be repeated. If the simulations based on the modified downhole drilling tool characteristics are satisfactory at step 618, the simulation may stop. If the conditions for a drilling tool having optimized balanced forces and optimized wear resistance of blades and/or impact resistance are not satisfied at step 618, further modifications may be made to at least one downhole drilling tool characteristic at step 622 and the simulation continued starting at step 602 and method 600 repeated until the conditions for minimized impact forces, minimized wear, optimized force balance based on multilevel force balancing and optimized fluid flow characteristics of a downhole drilling tool are met at step 618. Fluid flow optimization methods for designing and manufacturing well bore tools according to the present disclosure may decrease erosion, wear and increase life and performance of components of a drill bit 100 or other wellbore tool.

In some embodiments, fixed cutter drill bits 100 may be configured with one or more nozzle exits 156 and spaced at regular intervals along the exterior portions of a drill bit or a wellbore tool. Fluid from a nozzle 156 may impact a downhole formation by removing rock cuttings and debris. A nozzle 156 may be used in a fixed cutter drill bit 100 at or near the center of a drill bit, or around the peripheral edge of a bit, to facilitate cone cleaning by removal of debris from a borehole bottom and/or to cool the face of a drill bit. Accordingly number, orientation, configuration and location of nozzles 156 on a blade may be changed to improve fluid flow.

In some embodiments, a method 600 may also comprise placing one or more nozzles 156 or changing the placement of nozzles 156 prior to or following a simulation (such as at steps 610, 612 and/or step 622) to determine by CFD programs if placement/changing of nozzles further modifies the fluid flow characteristics advantageously.

In some embodiments, one or more diffusers (not expressly depicted) may be formed and/or placed at optimum locations on portions of one or more blades which may serve to additionally optimize fluid flow exiting from a nozzle 156. Diffusers may be used to direct fluid flow towards a cutting surface or away from a cutting surface. In some embodiments, a diffuser may be used to enhance fluid flow or enhance the turbulence of fluid flow to one or more elements of a drill bit or a wellbore tool that require cleaning. In some embodiments of this disclosure, a CFD program may be used to determine optimum locations for forming and/or placing a diffuser next to a nozzle 156 on a portion of a drill bit. Various configurations of nozzles, such as but not limited to jet nozzles, may be used in conjunction with a diffuser to enhance cone cleaning, protection against bit balling, and increased total flow of drilling fluid through a drill bit without creating washout problems.

In some embodiments, changes in blade geometry in combination with one or more diffusers formed and/or placed at optimum locations may be used to optimize downhole performance. In some embodiments, changes to the configuration, geometry, or placement of a junk slot 140 as well as the formation and/or placement of one or more diffusers at nozzles 156 may be used to change a fluid flow. In addition to simulations as described here, testing drill bits in the field and/or scanning of used drill bits indicates areas of high erosion or areas where more debris accumulates. Scanning tools may be used in the field or after use of a drill bit to determine locations for placing one or more diffusers. This information may then be used to find appropriate locations for diffuser formation/placement and/or changing blade thickness, configuration or placement and/or for modifying junk slot geometry, configuration or placement in accordance to the present disclosure, thereby optimizing performance of a drill bit.

Figure 32:
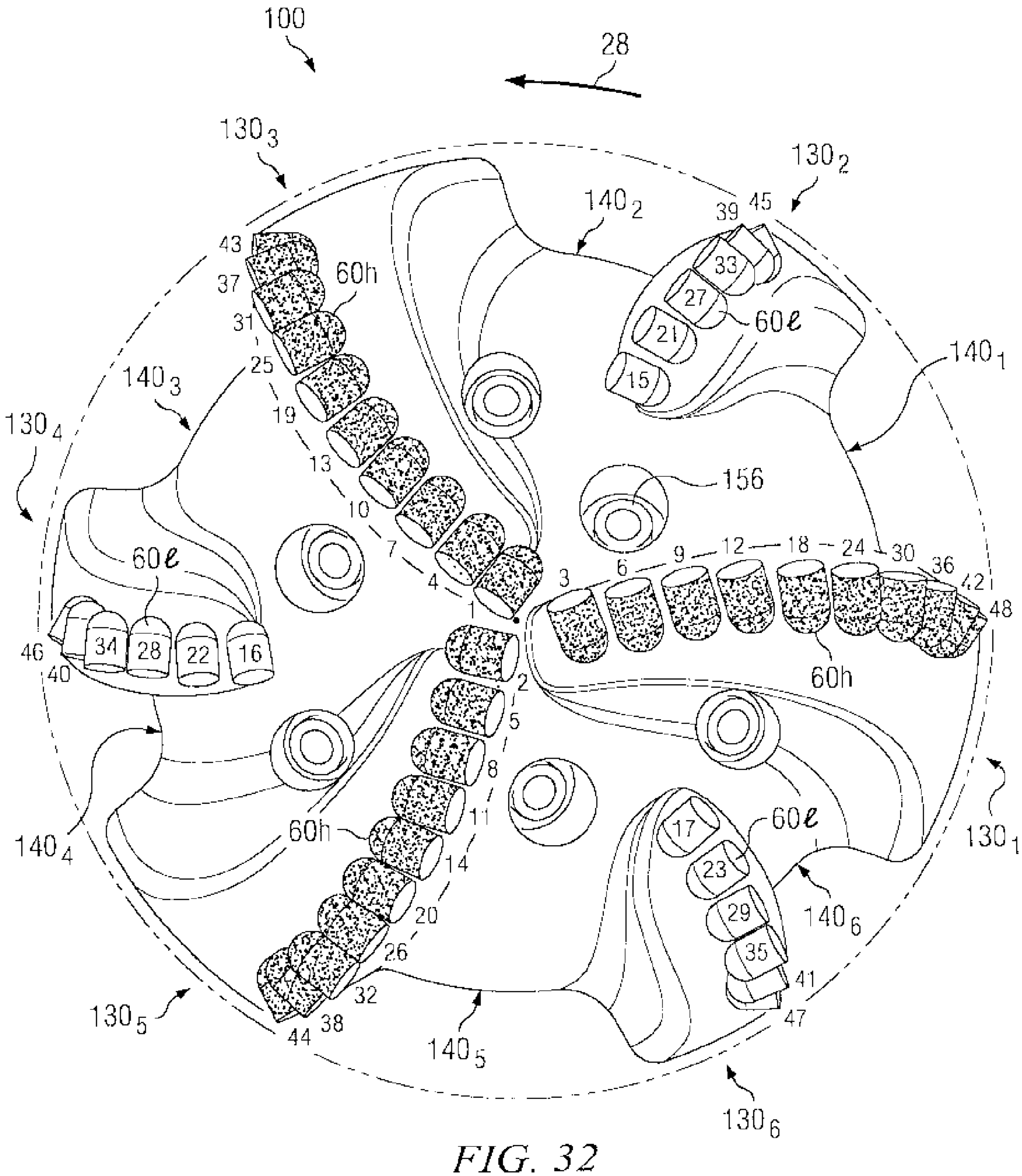
FIG. 32 is a schematic drawing showing one example of a fixed cutter rotary drill bit having six blades $\mathbf{130}_1$-$\mathbf{130}_6$ with cutting elements disposed thereon in accordance with multilevel force balancing criteria and further installing different types of cutting elements (e.g., $\mathbf{60}_h$ or $\mathbf{60}_l$) onto selected blades such that stronger $\mathbf{60}_h$ type cutting elements are installed on blades subject to high impact forces and/or large loadings and/or blades that remove large rock volumes and $\mathbf{60}_l$ type of cutting elements may be installed on other blades and wherein blades subject to more loadings are thicker than blades subject to less loadings, thereby changing the junk slot $\mathbf{140}_1$-$\mathbf{140}_6$ volume and fluid flow characteristics of the drill bit, according to one example embodiment of the present disclosure.
Figure 33:
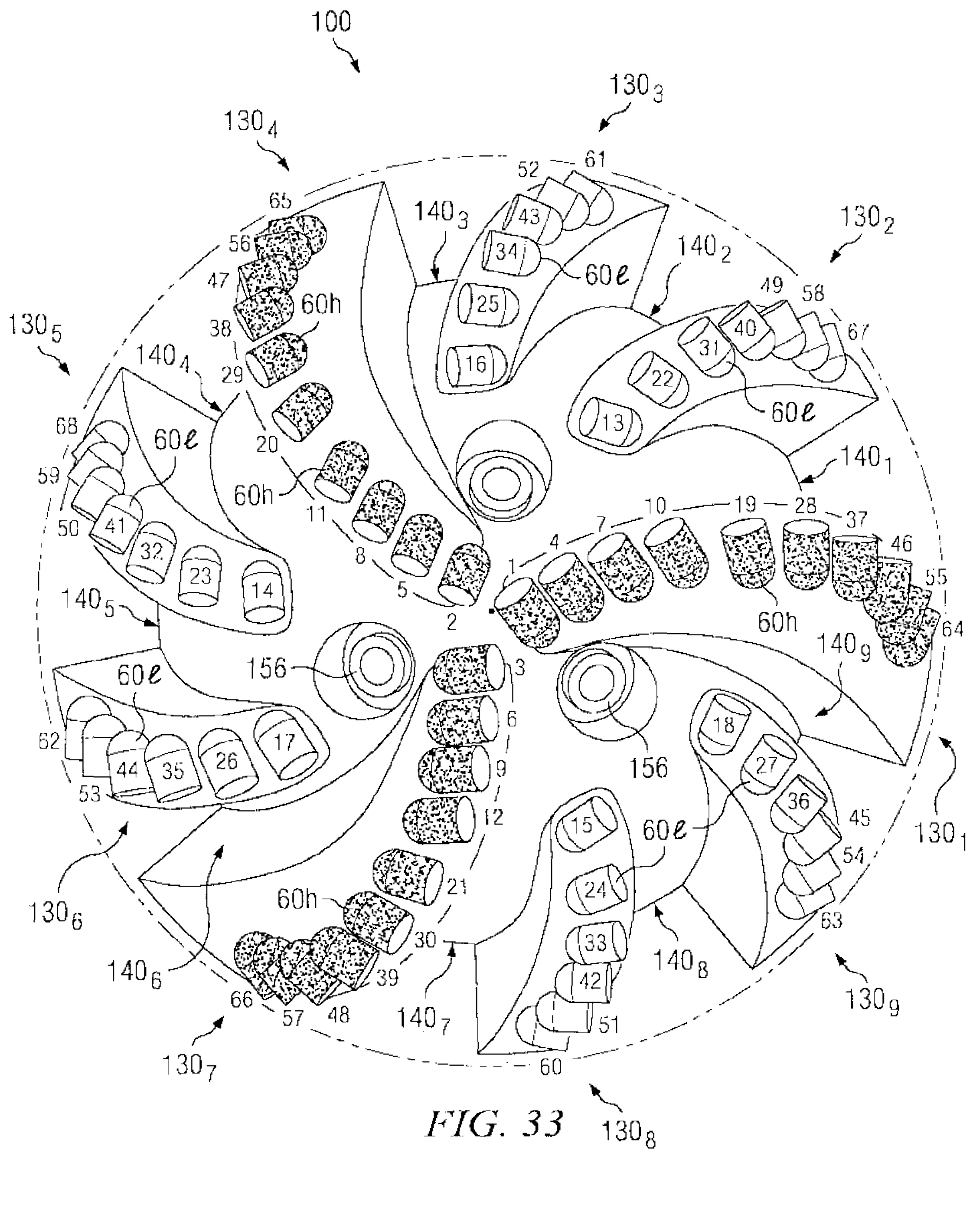
FIG. 33 is a schematic drawing showing one example of a fixed cutter rotary drill bit having nine blades $\mathbf{130}_1$-$\mathbf{130}_9$ with cutting elements disposed thereon in accordance with multilevel force balancing criteria and further installing different types of cutting elements (e.g., $\mathbf{60}_h$ or $\mathbf{60}_l$) onto selected blades such that stronger $\mathbf{60}_h$ type cutting elements are installed on blades subject to high impact forces and/or large loadings and/or blades that remove large rock volumes and $\mathbf{60}_l$ type of cutting elements may be installed on other blades and wherein blades subject to more loadings are thicker than blades subject to less loadings, thereby changing the junk slot $\mathbf{140}_1$-$\mathbf{140}_9$ volume and fluid flow characteristics of the drill bit, according to one example embodiment of the present disclosure.
Figure 34:
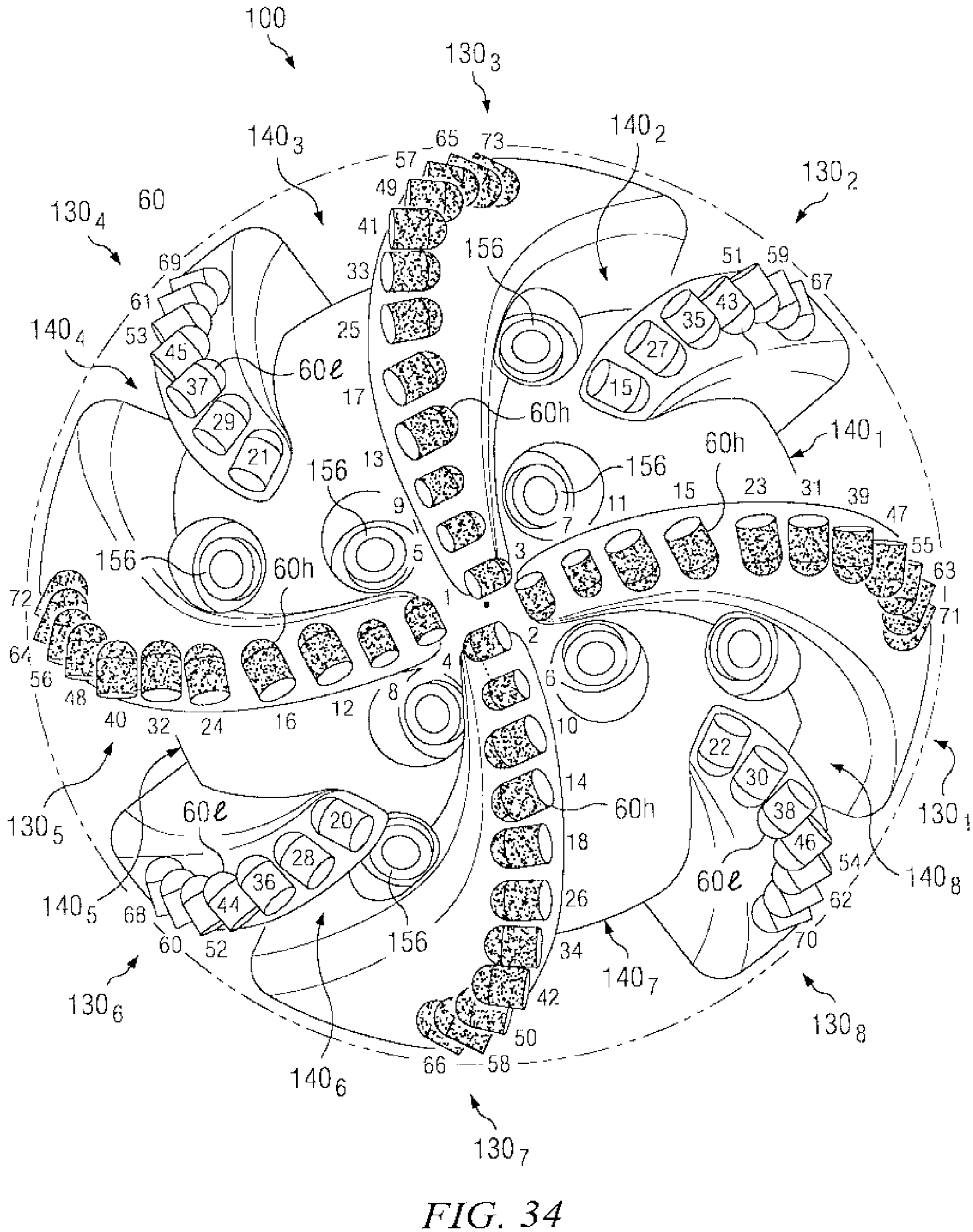
FIG. 34 is a schematic drawing showing one example of a fixed cutter rotary drill bit having eight blades $\mathbf{130}_1$-$\mathbf{130}_8$ with cutting elements disposed thereon in accordance with multilevel force balancing criteria and further installing different types of cutting elements (e.g., $\mathbf{60}_h$ or $\mathbf{60}_l$) onto selected blades such that stronger $\mathbf{60}_h$ type cutting elements are installed on blades subject to high impact forces and/or large loadings and/or blades that remove large rock volumes and $\mathbf{60}_l$ type of cutting elements may be installed on other blades and wherein blades subject to more loadings are thicker than blades subject to less loadings, thereby changing the junk slot $\mathbf{140}_1$-$\mathbf{140}_8$ volume and fluid flow characteristics of the drill bit, according to one example embodiment of the present disclosure.

Exemplary drill bits 100 designed in accordance with method 600 as described in FIG. 31 are described in FIGS. 32-34. FIG. 32 is a schematic drawing showing one example of a fixed cutter rotary drill bit 100 having six blades 130$_1$-130$_6$ with cutting elements 60 numbered individually as 1-48 disposed thereon in accordance with: 1) multilevel force balancing criteria in two cutter groups, with cutter set [(1 3 5), (2 4 6)]; and 2) further installing different types of cutting elements (e.g., 60$_h$ or 60$_l$) onto selected blades such that, a) stronger 60$_h$ type cutting elements are installed on blades 130$_h$ which are subject to high impact forces and/or large loadings and/or blades that remove large rock volumes identified by simulation methods in this example embodiment as blades 130$_1$, 130$_3$, and 130$_5$; and 3) installing 60$_l$ type of cutting elements (i.e., cutters with less impact/wear resistance) on blades 130$_l$ that remove lesser volume of rock and/or having lesser loadings and/or being subject to lower impact forces which are identified by simulation methods in this example to be blades 130$_2$, 130$_4$, and 130$_6$; and 4) modifying blade thickness such that blades 130$_h$ (e.g., blades 130$_1$, 130$_3$, and 130$_5$ in this example) may be designed to be thicker than blades 130$_l$ (e.g., blades 130$_2$, 130$_4$, and 130$_6$ in this example), thereby changing the volume of associated junk slots 140$_1$-140$_6$ and the fluid flow characteristics of drill bit 100 shown in FIG. 32.

FIG. 33 is a schematic drawing showing one example of a fixed cutter rotary drill bit 100 having nine blades 130$_1$-130$_9$ with cutting elements 60 numbered individually as 1-68 disposed thereon in accordance with: 1) multilevel force balancing three cutter groups, with cutter set [(1 4 7), (2 5 8), (3 6 9)]; and 2) further installing different types of cutting elements (e.g., 60$_h$ or 60$_l$) onto selected blades such that, a) stronger 60$_h$ type cutting elements are installed on blades 130$_h$ which are subject to high impact forces and/or large loadings and/or blades that remove large rock volumes identified by simulation methods in this example embodiment as blades 130$_1$, 130$_4$, 130$_7$; and installing 60$_l$ type of cutting elements (i.e., cutters with less impact/wear resistance) on blades 130$_l$ that remove lesser volume of rock and/or having lesser loadings and/or being subject to lower impact forces which are identified by simulation methods in this example to be blades 130$_2$, 130$_3$, 130$_5$, 130$_6$, 130$_8$ and 130$_9$; and 3) modifying blade thickness such that blades 130$_h$ (e.g., blades 130$_1$, 130$_4$, 130$_7$ in this example) may be designed to be thicker as compared to blades 130$_l$ (e.g., blades 130$_2$, 130$_3$, 130$_5$, 130$_6$, 130$_8$ and 130$_9$ in this example), thereby changing the volume of associated junk slots 140$_1$-140$_9$ which changes fluid flow characteristics of drill bit 100 shown in FIG. 33.

In one embodiment, simulation methods used to determine blades for laying out different type of cutting elements for drill bit 100 of FIG. 33 show that cutters on blades 130$_1$, 130$_4$, 130$_7$ and 130$_8$ are subject to more impact forces or loadings than cutters on blades 130$_2$, 130$_3$, 130$_5$, 130$_6$ and 130$_9$. See FIG. 8D. Accordingly, blades 130$_1$, 130$_4$, 130$_7$ and 130$_8$ may be designed to be thicker than blades 130$_2$, 130$_3$, 130$_5$ and 130$_6$ and stronger 60$_h$ type cutting elements may be installed on blades 130$_1$, 130$_4$, 130$_7$ and 130$_8$ while 60$_l$ type of cutting elements (with less impact/wear resistance) may be installed on blades 130$_2$, 130$_3$, 130$_5$ 130$_6$ and 130$_9$.

FIG. 34 is a schematic drawing showing one example of a fixed cutter rotary drill bit 100 having eight blades 130$_1$-130$_8$ with cutting elements 60 numbered individually as 1-73 disposed thereon in accordance with: 1) multilevel force balancing criteria in pair cutter groups, with cutter set [(1 5), (3 7), (2 6), (4, 8)]; and 2) further installing different types of cutting elements (e.g., 60$_h$ or 60$_l$) onto selected blades such that, a) stronger 60$_h$ type cutting elements are installed on blades 130$_h$ which are subject to high impact forces and/or large loadings and/or blades that remove large rock volumes identified by simulation methods in this example embodiment as blades 130$_1$, 130$_3$, 130$_5$ and 130$_7$, and installing 60$_l$ type of cutting elements (i.e., cutters with less impact/wear resistance) on blades 130$_l$ that remove lesser volume of rock and/or having lesser loadings and/or being subject to lower impact forces which are identified by simulation methods in this example to be blades 130$_2$, 130$_4$, 130$_6$ and 130$_8$; and 3) modifying blade thickness such that blades 130$_h$ (e.g., blades 130$_1$, 130$_3$, 130$_5$ and 130$_7$ in this example) may be designed to be thicker than blades 130$_l$ (e.g., blades 130$_2$, 130$_4$, 130$_6$ and 130$_8$, in this example), thereby changing the volume of associated junk slots 140$_1$-140$_8$ and the fluid flow characteristics of drill bit 100 shown in FIG. 34.

In one embodiment, simulation methods used to determine blades for laying out different type of cutting elements for drill bit 100 of FIG. 34 show that cutters on blades 130$_1$, 130$_2$, 130$_5$, 130$_6$ and 130$_7$ are subject to more impact forces or loadings than cutters on blades 130$_3$, 130$_4$, and 130$_8$. See FIG. 9D. Accordingly, blades 130$_1$, 130$_2$, 130$_5$, 130$_6$ and 130$_7$ may be designed to be thicker than blades 130$_3$, 130$_4$, and 130$_8$ and stronger 60$_h$ type cutting elements may be installed on blades 130$_1$, 130$_2$, 130$_5$, 130$_6$ and 130$_7$ while 60$_l$ type of cutting elements may be installed on blades 130$_3$, 130$_4$, and 130$_8$.

In some embodiments, drill bits and other downhole drilling tools designed according to embodiments where respective thickness blades are modified, thereby modifying associated junk slot configurations and volumes may advantageously have optimize fluid-flow through associated junk slot. Hydraulic optimization may in some embodiments be due to an increase in available volume for junk slots. In addition, an increased area for nozzle placement and/or diffuser placement may be used to optimize and improve fluid flow.

Although the present disclosure and its advantages have been described in detail, it should be understood that various changes, substitutions and alternations can be made herein without departing from the spirit and scope of the disclosure as defined by the following claims.

APPENDIX A

DOWNHOLE DRILLING TOOL CHARACTERISTICS DESIGN PARAMETERS

| | | | |
|---|---|---|---|
| bit face profile | cutting depth | cutting face profile | cutter phase angle |
| bit geometry | cutting structure | bit face geometry | gap between cutters |
| cutter diameter | cutter groups | cutting face geometry | cutter overlap ratio |
| cutter radial position | force balanced cutter groups | worn (dull) bit data | nose point |

APPENDIX A-continued

| | | | |
|---|---|---|---|
| blade (length, number, spiral, width) | neighbor cutters | cutter length | start radii of secondary blades |
| bottom hole assembly | neighbor cutter groups | cutter type | bit size |
| cutter (type, size, number) | level three force balanced | cutter length | hydraulic flow areas |
| cutter density | level four force balances | back rake angle | hydraulic flow rate |
| cutter location (cone, nose, shoulder, gage pad) | cutter sets | side rake angle | |
| cutter orientation (back rake, side rake) | force balanced cutter sets | IADC Bit Model | |
| cutting face surface area | blade groups | impact arrestor (type,. size, number) | |

DRILLING CONDITIONS
OPERATING PARAMETERS

| | | | |
|---|---|---|---|
| axial penetration rate | weight on bit (WOB) | torque on bit (TOB) | tilt rate |
| rate of penetration (ROP) | revolutions per minute (RPM) | lateral or side penetration rate | |
| rotational speed (RPM) | straight hole drilling | | |

DRILLING CONDITIONS
WELLBORE PROPERTIES

| | | | |
|---|---|---|---|
| bottom hole configuration | inside diameter | straight hole | |

DRILLING CONDITIONS
FORMATION PROPERTIES

| | | | |
|---|---|---|---|
| compressive strength | formation strength | porosity | shale plasticity |
| down dip angle | inclination | rock pressure | up dip angle |
| layer thickness | lithology | rock strength | hard stringers |
| formation plasticity | number of Layers | first layer second layer | |

EXAMPLES OF COMPUTER MODELS TO EVALUATE
CUTTER FORCES AND DRILL BIT IMBALANCE FORCES

1. Glowka D. A., "Use of Single-Cutter Data in the Analysis of PDC Bit Designs: Part 1 - Development of a PDC Cutting Force Model," *SPE Journal of Petroleum Technology*, 41 (1989) pp. 797-849.
2. Behr S. M., Warren T.M., Sinor L. A., Brett, J.F." ., "3D PDC Bit Model Predicts Higher Cutter Loads", SPE Drilling & Completion, No. 4, Vol. 8, March 1993.
3. Clayton R., Chen S. and Lefort., "New Bit Design, Cutter Technology Extend PDC Applications to Hard Rock Drilling", SPE/IADC 91840, Feb., 2005
4. Chen S., Arfele R., Glass K., "Modeling of the Effects of Cutting Structure, Impact Arrestor, and Gage Geometry on PDC Bit Steerability", paper AADE-07-NTCE-10 presented at 2007 AADE Technical Conference held in Houston, TX, Apr. 10-12, 2007.
5. Chen S., Collins G. J., Thomas M.B., "Reexamination of PDC Bit Walk in Directional and Horizontal Wells", IADC/SPE 112641, March 2008.

What is claimed is:

1. A method for designing a downhole drilling tool that is impact resistant comprising:

inputting into a computer a plurality of downhole drilling tool characteristics;

inputting into the computer a plurality of downhole drilling conditions;

simulating drilling a wellbore extending from a flat surface in a first downhole formation having a first compressive strength;

simulating drilling the wellbore with the downhole drilling tool into a second formation having a second compressive strength, wherein the second compressive strength is different than the first compressive strength;

evaluating impact forces acting on each blade during drilling into the first downhole formation and during drilling into the second downhole formation;

determining a plurality of high impact blades;

determining a plurality of low impact blades;

installing a plurality of a first type of cutting element on the plurality of high impact blades, wherein the first type of cutting elements are selected from a group consisting of high impact resistant cutters, high wear resistant cutters, and combinations thereof; and installing a plurality of a second type of cutting element on the plurality of low impact blades, wherein the second type of cutting element elements are selected from a group consisting of cutters that are low impact resistant cutters, cutters that are low wear resistant, and combinations thereof;

simulating drilling a wellbore into the first downhole formation and further into the second formation;

repeating evaluation of impact forces on each respective blade;

determining if conditions are met for reducing or minimizing impact on each respective blade;

modifying installing of one or more of the first type of cutting element on one or more respective blades and modifying installing of one or more of the second type of cutting element on respective blades if conditions are not met for reducing or minimizing impact on each respective blade; and repeating simulations to determine if conditions are met for reducing or minimizing impact on each respective blade and repeating further modifying installing of at least one of the first type of cutting element and at least one of the second type of cutting element on respective each blade until conditions are met for a downhole tool that has minimized impact forces on each respective blade.

2. The method of claim 1, further comprising evaluating loadings on each blade during drilling into the first formation and during drilling into the second formation.

3. The method of claim 1, further comprising evaluating volume of rock removed by each blade during drilling into the first formation and during drilling into the second formation.

4. The method of claim 1, further comprising evaluating wear on a blade or a part thereof following simulation of drilling into the first downhole formation and into the second downhole formation;

determining one or more respective blades subject to wear;

modifying installing of one or more of the first type of cutting element on one or more respective blades and modifying installing of one or more of the second type of cutting element on respective blades; and repeating simulation of drilling and repeating evaluating wear and modifying installing of one or more of the first type of cutting element on one or more respective blades and modifying installing of one or more of the second type of cutting element on respective blades, until conditions are met for a downhole tool with optimized wear of the cutting elements.

5. The method of claim 1, further comprising:

determining if the resulting forces acting on the downhole drilling tool are satisfactorily force balanced according to a criteria for multilevel force balancing during a first drilling simulation comprising engagement with the first downhole formation layer and a second drilling simulation during engagement with the second downhole formation layer comprising evaluating at least respective axial forces, respective lateral forces and respective bending moments on each cutter during simulated drilling into the first formation and the second formation;

modifying at least one location for installing respective cutting elements on exterior portions of the associated blades; and repeating the first drilling simulation and the second drilling simulation and repeating the determining if the resulting forces acting on the downhole drilling tool are satisfactorily force balanced according to the criteria for multilevel force balancing, until the bit imbalance forces meet selected design requirements for multilevel force balance.

6. The method of claim 5, wherein determining if the resulting forces acting on the downhole drilling tool are satisfactorily force balanced according to a criteria for multilevel force balancing during engagement with the first downhole formation layer and during engagement with the second downhole formation layer comprises:

determining locations for installing respective cutting elements on exterior portions of blades disposed on the downhole drilling tool;

simulating drilling a wellbore using the downhole drilling tool with each cutting element disposed at a respective first location on one of the blades and evaluating forces acting of each cutting element;

evaluating imbalance forces acting on the downhole drilling tool from each group of four neighbor cutting elements of the bit face profile; and modifying the location for installing at least one of cutting elements based on the simulated imbalance force acting of the downhole drilling tool.

7. The method of claim 6 further comprising:

selecting a first optimum location for installing each cutting element on exterior portions of one of the blades based at least in part on balancing the forces acting on the cutting elements to minimize resulting imbalance forces acting on the downhole drilling tool;

projecting the blades and the associated cutting elements onto the bit face profile;

simulating forces acting on all cutting elements while drilling a wellbore with the first downhole formation layer and during engagement with the second downhole formation layer; and evaluating imbalance forces acting on each group of three or four neighbor cutting elements on the bit face profile.

8. The method of claim 7, wherein evaluating imbalance forces on each group of four neighbor cutting elements further comprises:

numbering the cutting elements on the composite cutting face profile starting with the cutting element closest to the bit rotational axis as number one and the last cutting element located the greatest distance from the bit rotational axis as number n;

evaluating imbalance forces acting on the first group of cutting elements numbered 1, 2, 3, and 4;

evaluating imbalance forces acting on the second group of cutting element numbered 2, 3, 4, and 5 continuing to evaluate imbalance forces on the next consecutive group of cutting elements numbered 3, 4, 5, and 6; and continuing to evaluate imbalance forces acting on the consecutive groups of cutting elements until the last group of cutting elements numbered n−3, n−2, n−1, and n has been evaluated.

9. The method of claim 7, further comprising:

simulating forces acting on all cutting elements while drilling a wellbore; and evaluating imbalance forces acting on each group of three neighbor cutting elements on the bit face profile.

10. The method of claim 9, wherein evaluating imbalance forces on each group of three consecutive neighbor cutting elements further comprises:

numbering the cutting elements on the composite cutting face profile starting with the cutting element closest to the rotational axis as number one and the last cutting element on the bit face profile located the greatest distance as number n;

evaluating imbalance forces acting on the first group of cutting elements numbered 1, 2, and 3;

evaluating imbalance forces acting on the second group of cutting elements numbered 2, 3, and 4;

continuing to evaluate imbalance forces on the next consecutive group of cutting elements numbered 3, 4, and 5; and continuing the evaluation of imbalance forces acting on the consecutive groups of cutting elements until the last group of cutting elements number n−2, n−1, and n has been evaluated.

11. The method of claim 7, further comprising:

evaluating forces acting on the cutting elements in respective sets;

evaluating the forces acting on cutting elements in groups of sets; and evaluating bit forces acting on the rotary drilling bit during each engagement of respective cutting elements with adjacent portions of the first downhole formation and the second downhole formation.

12. The method of claim 5, further comprising evaluating each of the forces wherein:

maximum transient lateral imbalance force is less than 8% or less than 6% of associated transient axial force;

lateral imbalance force, when all cutters are engaged with a general uniform downhole formation, is less than 4% of bit actual force;

maximum transient radial lateral imbalance force is less than 6% or less than 4% of associated transient axial force;

radial lateral imbalance force, when all cutters are engaged with a generally uniform downhole formation, is less than 2.5% of associated bit axial force;

maximum transient drag lateral imbalance force is less than 6% or less than 4% of associated transient axial force;

drag lateral imbalance force when all cutters are engaged with a general uniform downhole formation, is less than 2.5% of associated bit axial force;

maximum axial movement is less than 15% of associated transient torque; and axial movement, when all cutters are engaged with a general uniform downhole formation, less than 4% of associated bit torque.

13. The method of claim 1, wherein the plurality of high impact blades comprises respective blades subject to high impact forces, large loadings, operable to remove large rock volumes or combinations thereof, during the simulated drilling during engagement with the first downhole formation and the second downhole formation.

14. The method of claim 1, wherein the plurality of low impact blades comprises respective blades subject to low impact forces, subject to small loadings, operable to remove small rock volumes or combinations thereof, during the simulated drilling during engagement with the first downhole formation and the second downhole formation.

15. A method for optimizing fluid flow in a rotary drill bit comprising:

inputting into a computer a plurality of downhole drilling tool characteristics;

inputting into the computer a plurality of downhole drilling conditions;

performing simulations to determine one or more blades subject to high impact during downhole drilling and to determine one or more blades subject to low impact during downhole drilling;

evaluating impact forces acting on each blade during downhole drilling;

increasing respective thickness of the blades that are subject to high impact during downhole drilling thereby changing configuration of a plurality of respective associated junk slots;

installing a plurality of a first type of cutting element on the plurality of high impact blades wherein the first type of cutting elements are selected from a group consisting of high impact resistant cutters, high wear resistant cutters, and combinations thereof; and installing a plurality of a second type of cutting element on the plurality of low impact blades, wherein the second type of cutting element elements are selected from a group consisting of cutters that are low impact resistant cutters, cutters that are low wear resistant, and combinations thereof;

performing computational fluid dynamics (CFD) program simulations to analyze fluid flow patterns; and modifying the thickness of the one or more blades subject to high impact during drilling thereby modifying the configuration of one or more respective associated junk slots; and repeating the CFD simulations until optimizing fluid flow of the drill bit is obtained.

16. The method of claim 15, further comprising evaluating loadings on each blade during downhole drilling.

17. The method of claim 15, further comprising evaluating volume of rock removed by each blade during downhole drilling.

18. The method of claim 15, wherein performing simulations to determine one or more blades subject to high impact comprises:

simulating drilling a wellbore extending from a flat surface in a first downhole formation having a first compressive strength;

simulating drilling the wellbore with the downhole drilling tool into a second formation having a second compressive strength, wherein the second compressive strength is different than the first compressive strength; and evaluating impact forces acting on each blade during drilling into the first downhole formation and during drilling into the second downhole formation.

19. The method claim 18, wherein performing simulations to determine one or more blades subject to high impact further comprises:

evaluating loadings on each blade during drilling into the first formation and during drilling into the second formation;

evaluating volume of rock removed by each blade during drilling into the first formation and during drilling into the second formation; and determining a plurality of high impact blades comprising respective blades subject to high impact forces, large loadings, operable to remove large rock volumes or combinations thereof, during the simulated drilling during engagement with the first downhole formation and the second downhole formation.

20. The method of claim 15, further comprising:

determining if the resulting forces acting on the downhole drilling tool are satisfactorily force balanced according to a criteria for multilevel force balancing during a first drilling simulation comprising engagement with the first downhole formation layer and a second drilling simulation during engagement with the second downhole formation layer comprising evaluating at least respective axial forces, respective lateral forces and respective bending moments on each cutter during simulated drilling into the first formation and the second formation;

modifying at least one location for installing respective cutting elements on exterior portions of the associated blades; and repeating the first drilling simulation and the second drilling simulation and repeating the determining if the resulting forces acting on the downhole drilling tool are satisfactorily force balanced according to the criteria for multilevel force balancing, until the bit imbalance forces meet selected design requirements for multilevel force balance.

* * * * *